US012642000B2

(12) United States Patent
Cho et al.

(10) Patent No.: US 12,642,000 B2
(45) **Date of Patent: *May 26, 2026**

(54) ORGANIC ELECTROLUMINESCENT COMPOUND, A PLURALITY OF HOST MATERIALS, AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Sang-Hee Cho, Gyeonggi-do (KR); So-Young Jung, Gyeonggi-do (KR); Mi-Ja Lee, Gyeonggi-do (KR); Su-Hyun Lee, Gyeonggi-do (KR); Jin-Ri Hong, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 171 days.

This patent is subject to a terminal disclaimer.

(21) Appl. No.: 17/186,496

(22) Filed: Feb. 26, 2021

(65) Prior Publication Data

US 2021/0296595 A1 Sep. 23, 2021

(30) Foreign Application Priority Data

Feb. 27, 2020 (KR) ........................ 10-2020-0024160
Dec. 22, 2020 (KR) ........................ 10-2020-0181050

(51) Int. Cl.
*H10K 85/60* (2023.01)

(52) U.S. Cl.
CPC ....... *H10K 85/6572* (2023.02); *H10K 85/622* (2023.02); *H10K 85/636* (2023.02); *H10K 85/654* (2023.02); *H10K 85/6574* (2023.02); *H10K 85/6576* (2023.02)

(58) Field of Classification Search
CPC .................... H01L 2251/5384; H10K 2201/90
See application file for complete search history.

(56) References Cited

U.S. PATENT DOCUMENTS

| | | | | |
|---|---|---|---|---|
| 2014/0231769 | A1* | 8/2014 | Nishimura | H01L 51/0056 257/40 |
| 2017/0104163 | A1* | 4/2017 | Lee | H10K 85/622 |
| 2018/0208837 | A1* | 7/2018 | Ahn | H01L 51/0074 |
| 2019/0288222 | A1 | 9/2019 | Moon et al. | |
| 2020/0013964 | A1* | 1/2020 | Lee | H10K 85/631 |
| 2020/0235307 | A1 | 7/2020 | Cho et al. | |
| 2021/0257556 | A1 | 8/2021 | Lee et al. | |
| 2021/0328154 | A1 | 10/2021 | Kim et al. | |

FOREIGN PATENT DOCUMENTS

| | | | | | |
|---|---|---|---|---|---|
| KR | 2017022865 | A | * | 3/2017 | C07D 251/12 |
| KR | 20170134264 | A | | 12/2017 | |
| KR | 2018099547 | A | * | 9/2018 | C07D 209/94 |

OTHER PUBLICATIONS

Search Report from China National Intellectual Property Administration for Chinese patent application No. 202110122153.3; Application Date: Sep. 14, 2021.
Request for the Submission of an Opinion from Korea Intellectual Property Office, Application No. 10-2020-0181050, Filing Date: Dec. 22, 2020.
Cited Reference from Japan Patent Office, Application No. 2021-012364, Filing Date: Jan. 28, 2021.

* cited by examiner

*Primary Examiner* — Sean M DeGuire
(74) *Attorney, Agent, or Firm* — G. Creston Campbell

(57) ABSTRACT

The present disclosure relates to an organic electroluminescent compound represented by formula 2-1, a plurality of host materials comprising a first host material comprising a compound represented by formula 1, and a second host material comprising a compound represented by formula 2, and an organic electroluminescent device comprising the same. By comprising the organic electroluminescent compound according to the present disclosure as a single host material, or the specific combination of compounds according to the present disclosure as a plurality of host materials, it is possible to provide an organic electroluminescent device having lower driving voltage, higher luminous efficiency, and/or improved lifetime properties, compared to conventional organic electroluminescent devices.

6 Claims, No Drawings

ORGANIC ELECTROLUMINESCENT COMPOUND, A PLURALITY OF HOST MATERIALS, AND ORGANIC ELECTROLUMINESCENT DEVICE COMPRISING THE SAME

TECHNICAL FIELD

The present disclosure relates to an organic electroluminescent compound, a plurality of host materials, and an organic electroluminescent device comprising the same.

BACKGROUND ART

A small molecular green organic electroluminescent device (OLED) was first developed by Tang, et al., of Eastman Kodak in 1987 by using TPD/ALq3 bi-layer consisting of a light-emitting layer and a charge transport layer. Thereafter, the development of OLEDs was rapidly effected and OLEDs have been commercialized. At present, OLEDs primarily use phosphorescent materials having excellent luminous efficiency in panel implementation.

However, in many applications such as TVs and lightings, OLED lifetime is insufficient and higher efficiency of OLEDs is still required. Typically, the higher the luminance of an OLED, the shorter the lifetime that OLED has. Therefore, an OLED having high luminous efficiency and/or long lifetime characteristics is required for long time use and high resolution of a display.

In order to enhance luminous efficiency, driving voltage and/or lifetime, various materials or concepts for an organic layer of an OLED have been proposed. However, they were not satisfactory in practical use.

Korean Patent Application Laying-Open No. 10-2017-0022865 discloses an OLED using phenanthrooxazole and phenanthrothiazole compounds as hosts. However, said reference does not specifically disclose a specific combination of a plurality of host materials of the present disclosure. In addition, the development of host materials for improving performances of OLEDs is still required.

DISCLOSURE OF INVENTION

Technical Problem

The objective of the present disclosure is to provide an organic electroluminescent compound having a new structure suitable for applying it to an organic electroluminescent device. Another objective of the present disclosure is to provide an improved organic electroluminescent material capable of providing an organic electroluminescent device having improved driving voltage, luminous efficiency, and/or lifetime properties. Further objective of the present disclosure is to provide an organic electroluminescent device having lower driving voltage, higher luminous efficiency, and/or improved lifetime properties by comprising a compound according to the present disclosure as a single host material, or a specific combination of compounds according to the present disclosure as a plurality of host materials.

Solution to Problem

As a result of intensive studies to solve the technical problems, the present inventors found that the above objective can be achieved by an organic electroluminescent compound represented by the following formula 2-1:

(2-1)

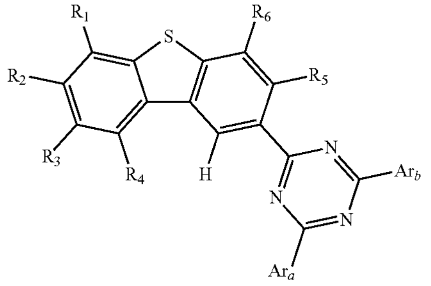

wherein $X_a$ represents O or S;

$Ar_a$ and $Ar_b$, each independently, represent a substituted or unsubstituted (C6-C18)aryl, with the proviso that at least one of $Ar_a$ and $Ar_b$ represents a substituted or unsubstituted naphthyl; and $R_1$ to $R_6$, each independently, represent hydrogen, deuterium, a substituted or unsubstituted phenyl, a substituted or unsubstituted naphthyl, or a combination thereof.

In addition, the present inventors noticed that the compounds having a core such as phenanthrooxazole or phenanthrothiazole have unusually a lower level of lowest unoccupied molecular orbital (LUMO) energy than typical hole type hosts, and studied hole type hosts capable of forming a proper energy gap with the above compounds. As a result, the present inventors found that when the combination of a compound represented by the following formula 1 and a compound represented by the following formula 2 is used in a light-emitting layer, the properties of hole and electron are balanced by proper HOMO and LUMO energy levels, thereby providing an organic electroluminescent device having lower driving voltage, higher luminous efficiency, and/or longer lifetime properties compared to conventional organic electroluminescent devices.

Specifically, the present inventors found that the above objective can be achieved by a plurality of host materials comprising a first host material comprising the compound represented by the following formula 1, and a second host material comprising the compound represented by the following formula 2.

(1)

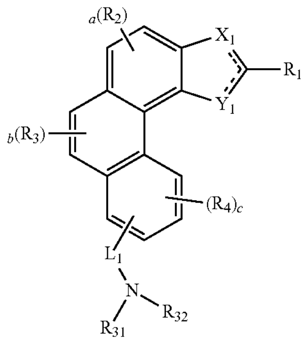

In formula 1, $X_1$ and $Y_1$, each independently, represent —N═, —NR—, —O—, or —S—, with the proviso that one of $X_1$ and $Y_1$ represents —N═, and the other of $X_1$ and $Y_1$ represents —$NR_5$—, —O—, or —S—;

$L_1$ represents a single bond, or a substituted or unsubstituted (C6-C30)arylene;

$R_{31}$ and $R_{12}$, each independently, represent a substituted or unsubstituted (3- to 30-membered)heteroaryl;

$R_1$ represents a substituted or unsubstituted (C6-C30)aryl, or a substituted or unsubstituted (3- to 30-membered) heteroaryl;

$R_2$ to $R_5$, each independently, represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-030) aromatic ring(s), or $-L_3-N(Ar)(Ar_2)$; or may be linked to an adjacent substituent to form a ring(s);

$L_3$, each independently, represents a single bond, a substituted or unsubstituted (C6-C30)arylene, or a substituted or unsubstituted (3- to 30-membered)heteroarylene;

$Ar_1$ and $Ar_2$, each independently, represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl; and a and b, each independently, represent an integer of 1 or 2, and c represents an integer of 1 to 3, where if a to c are an integer of 2 or more, each of $R_2$, each of $R_3$, and each of $R_4$ may be the same or different.

$$HAr—((L_2)_e—Ar_2)_d \quad (2)$$

In formula 2,

HAr represents a substituted or unsubstituted (3- to 20-membered)heteroaryl containing a nitrogen atom (s);

$L_2$, each independently, represents a substituted or unsubstituted (C6-C30)arylene;

$Ar_2$, each independently, represents a substituted or unsubstituted (C6-C30)aryl, or the folowing formula 3 or 4:

(3)

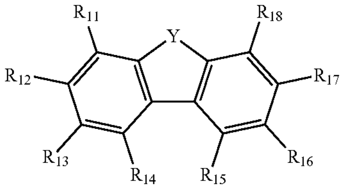

-continued (4)

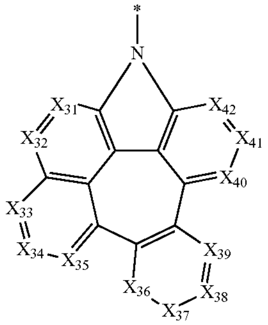

Y represents O, S, N—*, or $NR_{21}$;

$R_{21}$ represents a substituted or unsubstituted (C6-C30) aryl;

$R_{11}$ to $R_{18}$, each independently, represent a site linked to $L_2$; or represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30) arylsilyl, a substituted or unsubstituted tri(C6-C30) arylsilyl, a substituted or unsubstituted fused ring group of a (C3-C30) aliphatic ring(s) and a (C6-C30) aromatic ring(s), or $-L_4-N(Ar_3)(Ar_4)$; or may be linked to an adjacent substituent to form a ring(s);

$X_{31}$ to $X_{42}$, each independently, represent N or $CR_a$;

$R_a$, each independently, represents hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-030) aromatic ring(s), or $-L_5-N(Ar_5)(Ar_6)$; or may be linked to an adjacent substituent to form a ring(s);

$L_4$ and $L_3$, each independently, represent a single bond, a substituted or unsubstituted (C6-C30)arylene, or a substituted or unsubstituted (3- to 30-membered)heteroarylene;

$Ar_3$ to $Ar_8$, each independently, represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl;

d represents an integer of 1 to 3, where if d is an integer of 2 or more, each of $((L_2)_e-Ar_2)$ may be the same or different;

e represents an integer of 0 to 2, where if e is an integer of 2, each of $L_2$ may be the same or different; and

* represents a site linked to $L_2$.

Advantageous Effects of Invention

The organic electroluminescent compound according to the present disclosure exhibits the performances suitable for using it in an organic electroluminescent device. In addition, by comprising the compound according to the present disclosure as a single host material, or a specific combination of compounds according to the present disclosure as a plurality of host materials, an organic electroluminescent device having lower driving voltage, higher luminous efficiency, and/or improved lifetime properties compared to conventional organic electroluminescent devices can be provided, and it is possible to produce a display device or a lighting device using the same.

MODE FOR THE INVENTION

Hereinafter, the present disclosure will be described in detail. However, the following description is intended to explain the invention and is not meant in any way to restrict the scope of the present disclosure.

The term "organic electroluminescent compound" in the present disclosure means a compound that may be used in an organic electroluminescent device, and may be comprised in any layer constituting an organic electroluminescent device, as necessary.

The term "an organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc.

The term "a plurality of organic electroluminescent materials" in the present disclosure means an organic electroluminescent material comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials of the present disclosure may be a combination of at least two compounds, which may be comprised in at least one layer of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. The at least two compounds may be comprised in the same layer or different layers through methods used in the art. For example, the at least two compounds may be mixture-evaporated or co-evaporated, or may be individually evaporated.

The term "a plurality of host materials" in the present disclosure means a host material comprising a combination of at least two compounds, which may be comprised in any light-emitting layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of host materials of the present disclosure may be a combination of at least two host materials, and selectively may further comprise conventional materials comprised in an organic electroluminescent material. The plurality of host materials of the present disclosure may be comprised in any light-emitting layer constituting an organic electroluminescent device. At least two compounds comprised in the plurality of host materials of the present disclosure may be comprised together in one light-emitting layer or may respectively be comprised in different light-emitting layers, through methods used in the art. For example, the at least two compounds may be mixture-evaporated or co-evaporated, or may be individually evaporated.

Herein, the term "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, sec-butyl, tert-butyl, etc. The term "(C2-C30)alkenyl" is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30)aryl(ene)" is meant to be a monocyclic or fused ring radical derived from an aromatic hydrocarbon having 6 to 30 ring backbone carbon atoms, in which the number of the ring backbone carbon atoms is preferably 6 to 20. The above aryl(ene) may be partially saturated, and may comprise a spiro structure. The above aryl may include phenyl, biphenyl, terphenyl, naphthyl, binaphthyl, phenylnaphthyl, naphthylphenyl, phenylterphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, etc. More specifically, the above aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzo[a]fluorenyl, benzo[b]fluorenyl, benzo[c]fluorenyl, dibenzofluorenyl, 2-biphenylyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenylyl, 4"-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11, 11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-dlphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dlhydro-2-phenanthrenyl, 9,9,10,10-tetramethyl-9,10-dihydro-3-phenanthrenyl, 9,9,10,10-tetramethyl-9,10-dihydro-4-phenanthrenyl, etc.

The term “(3- to 30-membered)heteroaryl(ene)” is meant to be an aryl(ene) having 3 to 30 ring backbone atoms, and including at least one, preferably 1 to 4 heteroatoms selected from the group consisting of B, N, O, S, Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, and pyridazinyl, and a fused ring-type heteroaryl such as benzofuranyl, benzothiophenyl, isobenzofuranyl, dibenzofuranyl, dibenzothiophenyl, benzonaphthofuranyl, benzonaphthothiophenyl, diazadibenzofuranyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, isoquinolyl, benzoisoquinolyl, cinnolinyl, quinazolinyl, benzoquinazolinyl, quinoxalinyl, benzoquinoxalinyl, naphthyridinyl, triazanaphthyl, benzothienopyrimidinyl, carbazolyl, benzocarbazolyl, dibenzocarbazolyl, phenoxazinyl, phenothiazinyl, phenanthridinyl, benzodioxolyl, dihydroacridinyl, pyridopyrazinyl, benzofuropyridyl, benzofuropyrimidinyl, dibenzoselenophenyl, benzofuroquinolinyl, benzofuroquinazolinyl, benzofuronaphthyridinyl, naphthofuropyrimidinyl, benzothienoquinolinyl, benzothienoquinazolinyl, benzothienonaphthyridinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzotriazolphenazinyl, imidazopyridyl, chromenoquinazolinyl, thiochromenoquinazolinyl, dimethylbenzoperimidinyl, indolocarbazolyl, indenocarbazolyl, etc. More specifically, the above heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-tert-butyl-1-indolyl, 4-tert-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, I0-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2, 1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1, 2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2, 3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2, 1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrrimidinyl, 2-benzothio[3,2-d]pyrimidinyl, 6-benzothio[3,2-d] pyrrimidinyl, 7-benzothio[3,2-d]pyrirnidinyl, 8-benzothio [3,2-d]pyrimidinyl, 9-benzothio[3,2-d]pyrirmidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. Furthermore, "halogen" includes F, Cl, Br, and I.

The term "fused ring group of a (C3-C30) aliphatic ring(s) and a (C6-C30) aromatic ring(s)" is meant to be a ring functional group in which at least one aliphatic ring having 3 to 30 ring backbone carbon atoms, preferably 3 to 25 ring backbone carbon atoms, and more preferably 3 to 18 ring backbone carbon atoms, and at least one aromatic ring having 6 to 30 ring backbone carbon atoms, preferably 6 to 25 ring backbone carbon atoms, and more preferably 6 to 18 ring backbone carbon atoms, are fused. The above fused ring group may include a fused ring group of at least one benzene and at least one cyclohexane, a fused ring group of at least one naphthalene and at least one cyclopentane, etc. The carbon atoms of the fused ring group of a (C3-C30) aliphatic ring(s) and a (C6-C30) aromatic ring(s) may be replaced with at least one heteroatom selected from the group consisting of B, N, O, S, Si, and P, and preferably the group consisting of N, O, and S.

Herein, "substituted" in the expression "substituted or unsubstituted" means that a hydrogen atom in a certain functional group is replaced with another atom or another functional group, i.e., a substituent, and also includes that the hydrogen atom is replaced with a group formed by a linkage of two or more substituents. For example, the "group formed by a linkage of two or more substituents" may be pyridine-triazine. That is, pyridine-triazine may be interpreted as one heteroaryl substituent, or as substituents in which two heteroaryl substituents are linked. The substituent (s) of the substituted alkyl, the substituted alkenyl, the substituted aryl, the substituted arylene, the substituted heteroaryl, the substituted heteroarylene, the substituted heteroaryl containing a nitrogen atom(s), the substituted cycloalkyl, the substituted alkoxy, the substituted trialkylsilyl, the substituted dialkylarylsilyl, the substituted alkyldiarylsilyl, the substituted triarylsilyl, and the substituted fused ring group of an aliphatic ring(s) and an aromatic ring(s) in the formulas of the present disclosure, each independently, are at least one selected from the group consisting of deuterium; a halogen; a cyano; a carboxyl; a nitro; a hydroxyl; a phosphineoxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of a (C1-C30)alkyl(s) and a (3- to 30-membered)heteroaryl(s); a tri(C1-C30)alkylsilyl; a tri (C6-C30)arylsilyl; a di(C1-C30)alkyl(C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono- or di-(C1-C30)alkylamino; a mono- or di-(C2-C30)alkenylamino; a (C1-C30)alkyl(C2-C30)alkenylamino; a mono- or di-(C6-C30)arylamino; a (C1-C30) alkyl(C6-C30)arylamino; a mono- or di-(3- to 30-membered)heteroarylamino; a (C1-C30)alkyl(3- to 30-membered)heteroarylamino; a (C2-C30)alkenyl(C6-C30)arylamino; a (C2-C30)alkenyl(3- to 30-membered)heteroarylamino; a (C6-C30)aryl(3- to 30-rmembered)heteroarylamino; a (C1-C30)alkylcarbonyl; a (C1-C30) alkoxycarbonyl; a (C6-C30)arylcarbonyl; a (C6-C30) arylphosphine; a di(C6-C30)arylboronyl; a di(C1-C30) alkylboronyl; a (C1-C30)alkyl(C6-C30)arylboronyl; a (C6-C30)aryl(C1-C30)alkyl; and a (C1-C30)alkyl(C6-C30)aryl. According to one embodiment of the present disclosure, the substituent(s), each independently, are at least one selected from the group consisting of a (C1-C10)alkyl; a (C6-C20) aryl; a (3- to 20-membered)heteroaryl unsubstituted or substituted with a (C6-C20)aryl(s); and a di(C6-C20)arylamino. According to another embodiment of the present disclosure, the substituent(s), each independently, are at least one selected from the group consisting of a $(C_1-C_6)$alkyl; a (C6-C12)aryl; a (5- to 15-membered)heteroaryl unsubstituted or substituted with a (C6-C12)aryl(s); and a di(C6-C12)arylamino. For example, the substituent(s), each independently, may be at least one selected from the group consisting of a methyl, a phenyl, a naphthyl, a pyridyl, a carbazolyl, a phenylquinoxalinyl, and a diphenylamino.

In the formulas of the present disclosure, a ring formed by a linkage of adjacent substituents may be a substituted or unsubstituted, mono- or polycyclic, (3- to 30-membered) alicyclic or aromatic ring, or the combination thereof. In addition, the formed ring may contain at least one heteroatom selected from B, N, O, S, Si, and P, preferably at least one heteroatom selected from N, O, and S. According to one embodiment of the present disclosure, the number of the ring backbone atoms is 5 to 20. According to another embodiment of the present disclosure, the number of the ring backbone atoms is 5 to 15. For example, the fused ring may be a substituted or unsubstituted dibenzothiophene ring, a substituted or unsubstituted dibenzofuran ring, a substituted or unsubstituted naphthalene ring, a substituted or unsubstituted phenanthrene ring, a substituted or unsubstituted fluorene ring, a substituted or unsubstituted benzothiophene ring, a substituted or unsubstituted benzofuran ring, a substituted or unsubstituted indole ring, a substituted or unsubstituted indene ring, a substituted or unsubstituted benzene ring, or a substituted or unsubstituted carbazole ring.

In the formulas of the present disclosure, heteroaryl, heteroarylene, and heterocycloalkyl may, each independently, contain at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered) heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, and a substituted or unsubstituted (C1-C30)alkyl (C6-C30)arylamino.

Hereinafter, the compounds represented by formulas 1 and 2 will be described in more detail.

In formula 1, $X_1$ and $Y_1$, each independently, represent —N═, —$NR_5$—, —O—, or —S—, with the proviso that one of $X_1$ and $Y_1$ represents —N═, and the other of $X_1$ and $Y_1$ represents —$NR_5$—, —O—, or —S—. According to one embodiment of the present disclosure, one of $X_1$ and $Y_1$ represents —N═, and the other of $X_1$ and $Y_1$ represents —O— or —S—. For example, $X_1$ may be —N═, and $Y_1$ may be —O— or —S—.

In formula 1, $L_1$ represents a single bond, or a substituted or unsubstituted (C6-C30)arylene. According to one embodiment of the present disclosure, $L_1$ represents a single bond, or a substituted or unsubstituted (C6-C25)arylene. According to another embodiment of the present disclosure, $L_1$ represents a single bond, or an unsubstituted (C6-C18) arylene.

For example, $L_1$ may be a single bond, a substituted or unsubstituted phenylene, or a substituted or unsubstituted naphthylene.

In formula 1, $R_{31}$ and $R_{32}$, each independently, represent a substituted or unsubstituted (3- to 30-membered)heteroaryl. According to one embodiment of the present disclosure, $R_{31}$ and $R_{32}$, each independently, represent a substituted or unsubstituted (5- to 25-membered)heteroaryl. According to another embodiment of the present disclosure, $R_{31}$ and $R_{32}$, each independently, represent a (5- to 18-membered)heteroaryl unsubstituted or substituted with at least one of a (C6-C18)aryl(s) and a (5- to 18-membered)heteroaryl(s). Specifically, $R_{31}$ and $R_{32}$, each independently, may be a substituted or unsubstituted dibenzofuranyl, a substituted or unsubstituted dibenzothiophenyl, a substituted or unsubstituted benzofuropyridyl, a substituted or unsubstituted benzonaphthofuranyl, or a substituted or unsubstituted benzonaphthothiophenyl. For example, $R_{31}$ and $R_{32}$, each independently, may be a dibenzofuranyl unsubstituted or substituted with at least one of a phenyl(s) and a pyridyl(s), a dibenzothiophenyl, a benzofuropyridyl, a benzonaphthofuranyl, or a benzonaphthothiophenyl.

In formula 1, $R_1$ represents a substituted or unsubstituted (C6-C30)aryl, or a substituted or unsubstituted (3- to 30-membered)heteroaryl. According to one embodiment of the present disclosure, $R_1$ represents a substituted or unsubstituted (C6-C15)aryl, or a substituted or unsubstituted (5- to 15-membered)heteroaryl. According to another embodiment of the present disclosure, $R_1$ represents an unsubstituted (C6-C15)aryl, or an unsubstituted (5- to 15-membered) heteroaryl. For example, $R_1$ may be a phenyl, a biphenyl, a pyridyl, a quinolyl, or an isoquinolyl.

In formula 1, $R_2$ to $R_5$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or -$L_3$-N($Ar_1$)($Ar_2$); or may be linked to an adjacent substituent to form a ring(s). For example, two $R_2$'s, two $R_3$'s, two $R_4$'s, $R_2$ and $R_3$, $R_3$ and $R_4$, $R_5$ and $R_2$, and/or R, and $R_4$ may be linked to each other to form a ring(s). According to one embodiment, $R_2$ to $R_4$, each independently, represent hydrogen.

In formula 1, $L_3$, each independently, represents a single bond, a substituted or unsubstituted (C6-C30)arylene, or a substituted or unsubstituted (3- to 30-membered)heteroarylene.

$Ar_1$ and $Ar_2$, each independently, represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-030) aromatic ring(s), a substituted or unsubstituted (C6-C30)aryl, or a substituted or unsubstituted (3- to 30-membered)heteroaryl.

In formula 1, a and b, each independently, represent an integer of 1 or 2, and c represents an integer of 1 to 3, where if a to c are an integer of or more, each of $R_2$, each of $R_3$, and each of $R_4$ may be the same or different.

According to one embodiment of the present disclosure, the formula 1 may be represented by at least one of the following formulas 1-1 and 1-2.

(1-1)

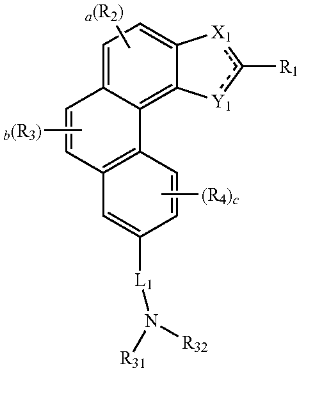

-continued (1-2)

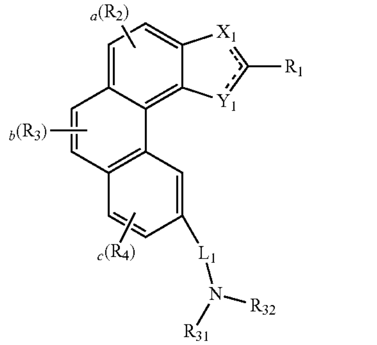

In formulas 1-1 and 1-2, $X_1$, $Y_1$, $L_1$, $R_{31}$, $R_{32}$, $R_1$ to $R_4$, and a to c are as defined in formula 1.

In formula 2, HAr represents a substituted or unsubstituted (3- to 20-membered)heteroaryl containing a nitrogen atom(s). According to one embodiment of the present disclosure, HAr represents a substituted or unsubstituted (3- to 15-membered)heteroaryl containing a nitrogen atom(s). According to another embodiment of the present disclosure, HAr represents an unsubstituted (5- to 15-membered)heteroaryl containing a nitrogen atom(s). Specifically, HAr may be a pyridyl, a pyrimidinyl, a triazinyl, a quinolyl, a quinazolinyl, a quinoxalinyl, a naphthyridinyl, a pyridopyrazinyl, a benzoquinazolinyl, a benzoquinoxalinyl, a benzofuropyrimidinyl, etc.

In formula 2, $L_2$, each independently, represents a single bond, or a substituted or unsubstituted (C6-C30)arylene. According to one embodiment of the present disclosure, $L_2$, each independently, represents a substituted or unsubstituted (C6-C20)arylene. According to another embodiment, $L_2$, each independently, represents a (C6-C20)arylene unsubstituted or substituted with a (C6-C20)arylene(s). Specifically, $L_2$, each independently, may be a phenylene unsubstituted or substituted with a naphthyl(s), a naphthylene, a biphenylene, a phenylnaphthylene, naphthylphenylene, etc.

In formula 2, $Ar_2$, each independently, represents a substituted or unsubstituted (C6-C30)aryl, or formula 3 or 4. According to one embodiment of the present disclosure, $Ar_2$, each independently, represents a (C6-C30)aryl substituted with a $(C_1-C_6)$alkyl(s); a (C6-C30)aryl substituted with a (5- to 15-mnembered)heteroaryl substituted with a (C6-C12) aryl(s); a (C6-C30)aryl substituted with a di(C6-C12)arylamino(s); an unsubstituted (C6-C30)aryl; or formula 3 or 4. Specifically, $Ar_2$, each independently, may be a phenyl, a naphthyl, a phenylnaphthyl, a naphthylphenyl, a biphenyl, a terphenyl, a phenanthrenyl, a triphenylenyl, a dimethylfluorenyl, diphenylfluorenyl, dimethylbenzofluorenyl, a diphenylbenzofluorenyl, a phenyl substituted with a phenylquinoxalinyl(s), a phenyl substituted with a diphenylarnino(s), a phenyl substituted with a naphthyl(s), formula 3 or 4, etc.

In formula 3, Y represents O, S, N—*, or $NR_{21}$; and * represents a site linked to $L_2$.

In formula 3, $R_{21}$ represents a substituted or unsubstituted (C6-C30)aryl. According to one embodiment of the present disclosure, $R_{21}$ represents a substituted or unsubstituted (C6-C18)aryl. According to another embodiment of the present disclosure, $R_{21}$ represents an unsubstituted (C6-C12) aryl. Specifically, $R_{21}$ may be a phenyl, etc.

In formula 3, $R_{11}$ to $R_{18}$, each independently, represent a site linked to $L_2$; or represent hydrogen, deuterium, a halogen, a cyano, a substituted or unsubstituted (C1-C30) alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or $-L_4-N(Ar_3)(Ar_4)$; or may be linked to an adjacent substituent to form a ring(s). According to one embodiment of the present disclosure, $R_{11}$ to $R_{18}$, each independently, represent a site linked to $L_2$; or represent hydrogen, a substituted or unsubstituted (C1-C20) alkyl, a substituted or unsubstituted (C6-C25)aryl, or a substituted or unsubstituted (5- to 25-membered)heteroaryl. According to another embodiment of the present disclosure, $R_{11}$ to $R_{18}$, each independently, represent a site linked to $L_2$; or represent hydrogen, or an unsubstituted (C6-C18)aryl. For example, $R_{11}$ to $R_{18}$, each independently, may be a site linked to $L_2$; or may be hydrogen, a phenyl, a naphthyl, a naphthylphenyl, a phenylnaphthyl, etc.

In formula 4, $X_{31}$ to $X_{42}$, each independently, represent N or $CR_a$. For example, $X_{31}$ to $X_{42}$, each independently, may be $CR_a$.

$R_a$, each independently, represents hydrogen, deuterium, a halogen, a cyano, a substituted or unsubstituted (C1-C30) alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or $-L_5-N(Ar_5)(Ar_6)$; or may be linked to an adjacent substituent to form a ring(s). According to one embodiment of the present disclosure, $R_a$, each independently, represents hydrogen, or a substituted or unsubstituted (C6-C12)aryl; or may be linked to an adjacent substituent to form a ring(s). According to another embodiment of the present disclosure, $R_a$, each independently, represents hydrogen, or an unsubstituted (C6-C12)aryl; or may be linked to an adjacent substituent to form a ring(s). Specifically, $R_a$, each independently, may be hydrogen, a phenyl, etc.; or may be linked to an adjacent substituent to form a benzene ring, etc.

$L_4$ and $L_3$, each independently, represent a single bond, a substituted or unsubstituted (C6-C30)arylene, or a substituted or unsubstituted (3- to 30-membered)heteroarylene.

$Ar_3$ to Are, each independently, represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl.

In formula 2, d represents an integer of 1 to 3, where if d is an integer of 2 or more, each of $((L_2)_e-Ar_2)$ may be the same or different. For example, d may be an integer of 2 or 3, and each of $((L_2)_e-Ar_2)$ may be the same or different.

In formula 2, e represents an integer of 0 to 2, where if e is an integer of 2, each of $L_2$ may be the same or different.

In formula 4, * represents a site linked to $L_2$.

According to one embodiment of the present disclosure, the formula 2 may be represented by at least one of the following formulas 2-1 to 2-3.

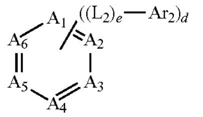
(2-1)

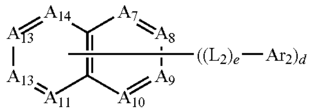
(2-2)

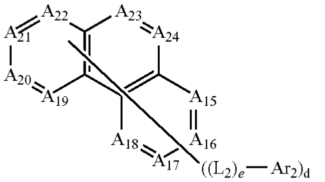
(2-3)

In formulas 2-1 to 2-3, $A_1$ to $A_{24}$, each independently, represent $CR_{10}$ or N, in which at least one of $A_1$ to $A_6$ represents N, at least one of $A_7$ to $A_{14}$ represents N, and at least one of $A_{15}$ to $A_{24}$ represents N. According to one embodiment of the present disclosure, one to three of $A_1$ to $A_6$ represent N, and the remainings of $A_1$ to $A_6$ represent $CR_{10}$. According to another embodiment of the present disclosure, one to three of $A_7$ to $A_{14}$ represent N, and the remainings of $A_7$ to $A_{14}$ represent $CR_{10}$. According to further embodiment of the present disclosure, two of $A_1$- to $A_{24}$ represent N, and the remainings of $A_{15}$ to $A_{24}$ represent $CR_{10}$.

$R_{10}$, each independently, represents hydrogen or $-L_2-Ar_2$; or two adjacent $R_{10}$'s may be linked to each other to form a ring(s), where if a plurality of $R_{10}$'s are present, each of $R_{10}$ may be the same or different. According to one embodiment of the present disclosure, $R_{10}$, each independently, represents hydrogen or $-L_2-Ar_2$, where if a plurality of $R_{10}$'s are present, each of $R_{10}$ may be the same or different. For example, $R_{10}$, each independently, represents hydrogen or $-L_2-Ar_2$; or two adjacent $R_{10}$'s may be linked to each other to form a benzofuran ring.

In formulas 2-1 to 2-3, $L_2$, $Ar_2$, d, and e are as defined in formula 2.

The compound represented by formula 1 may be at least one selected from the following compounds, but is not limited thereto.

H-1

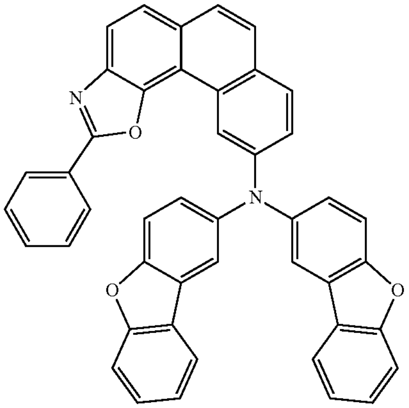

H-2

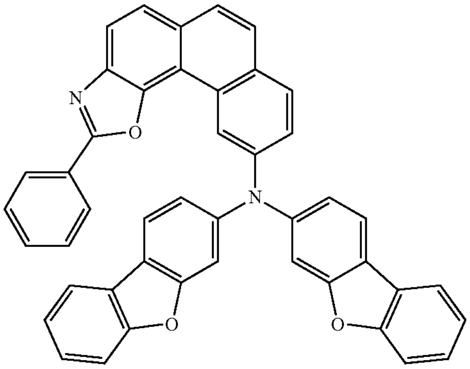

H-3

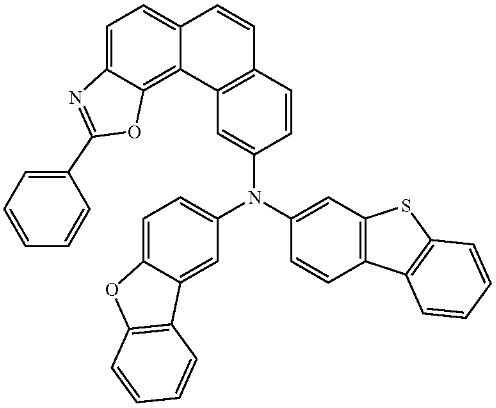

H-4

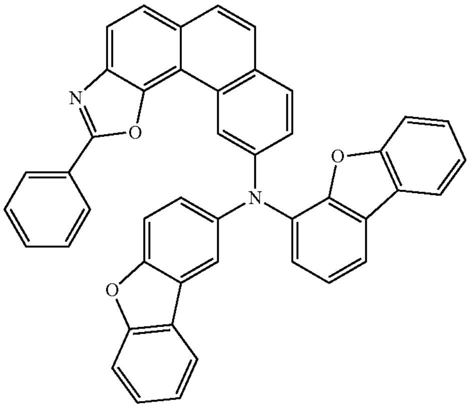

-continued
H-5
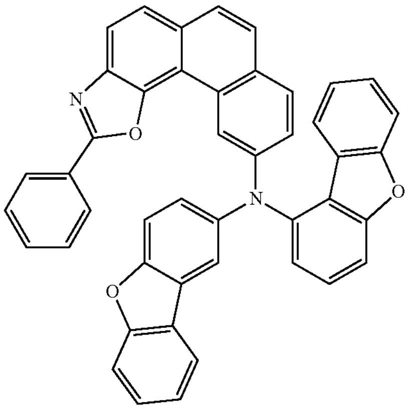
H-6
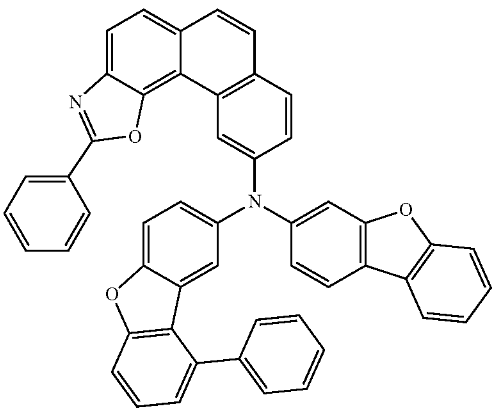
H-7
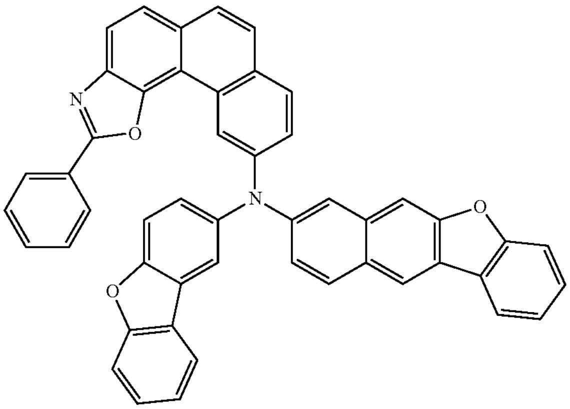
-continued
H-8
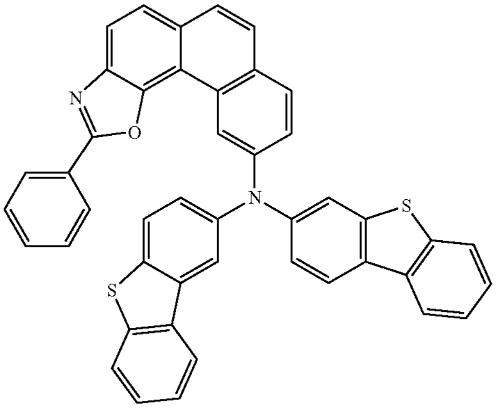
H-9
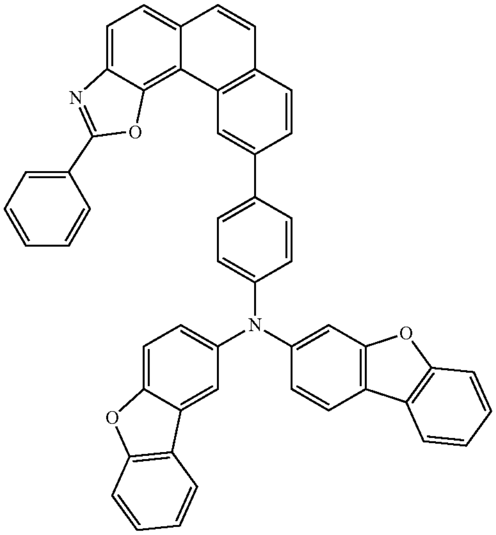
H-10
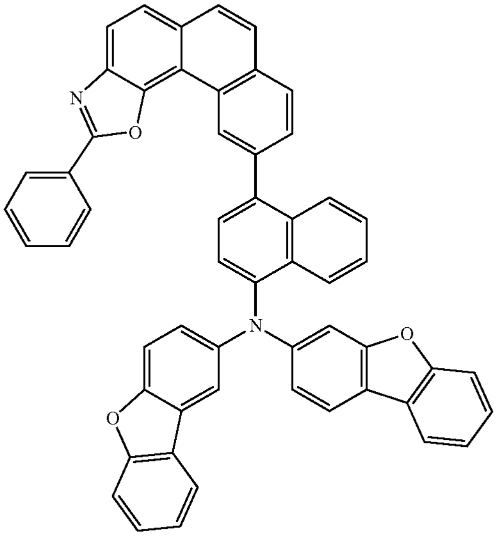

-continued
H-11
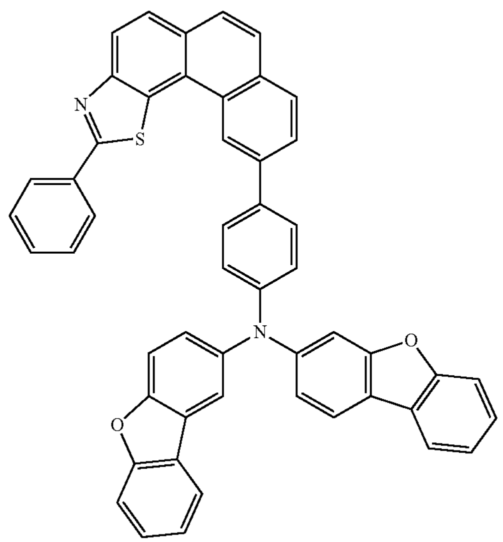
H-12
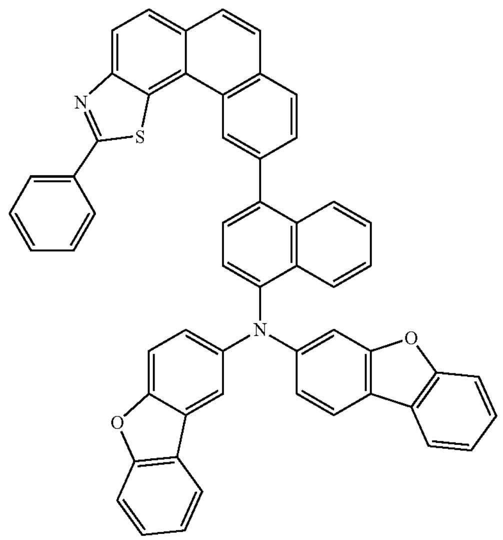
H-13
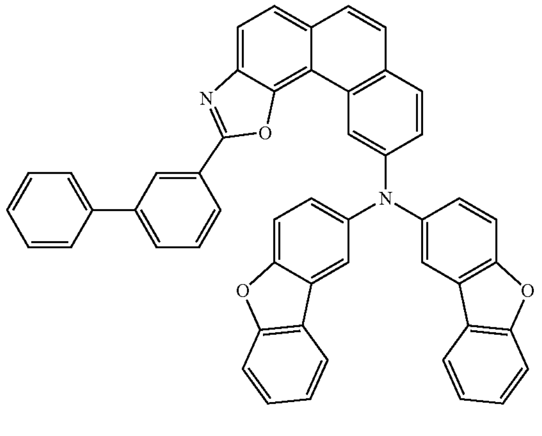
-continued
H-14
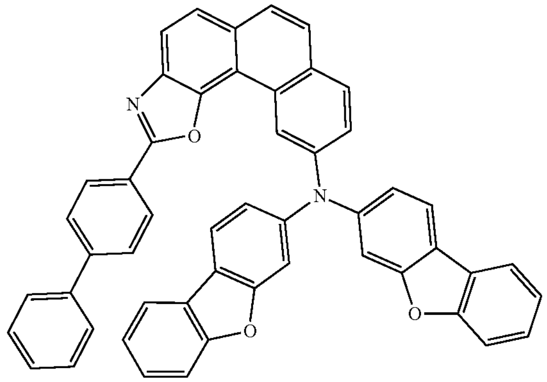
H-15
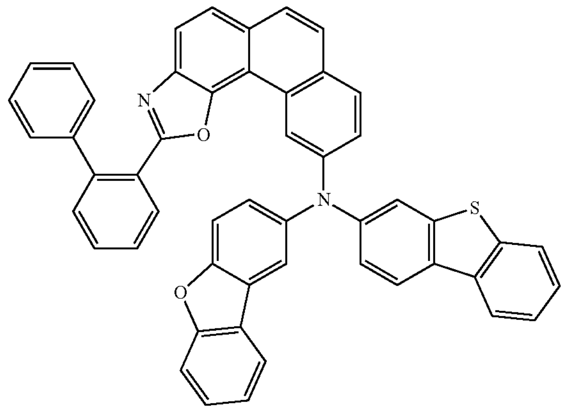
H-16
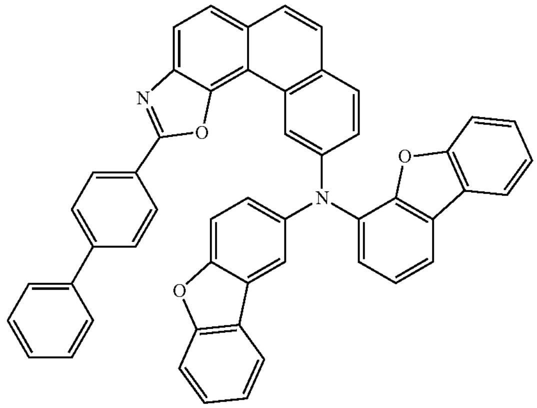

H-17
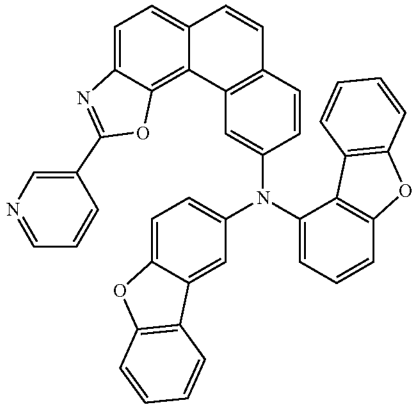
H-18
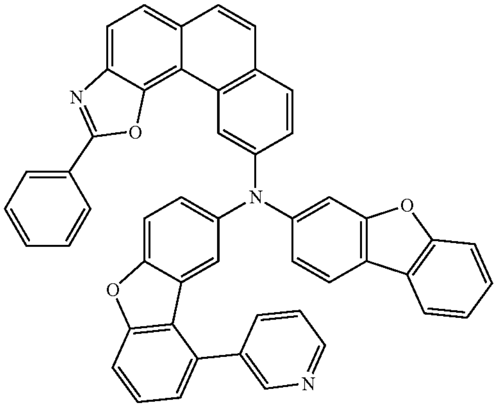
H-19
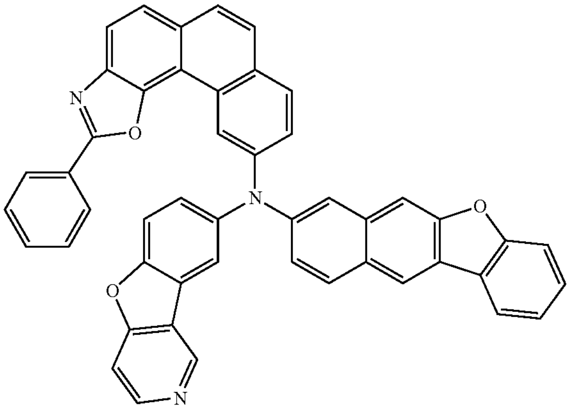
H-20
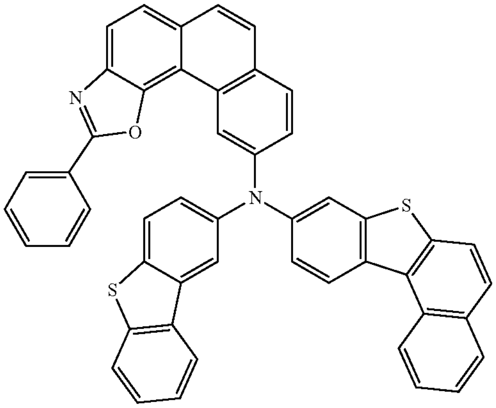
H-21
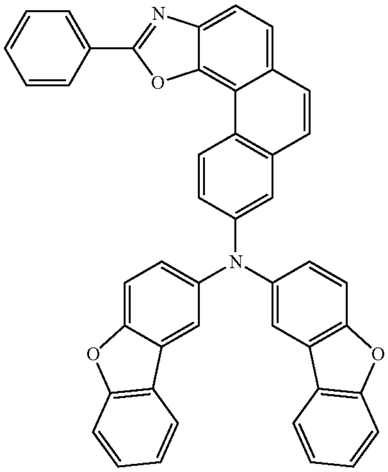
H-22
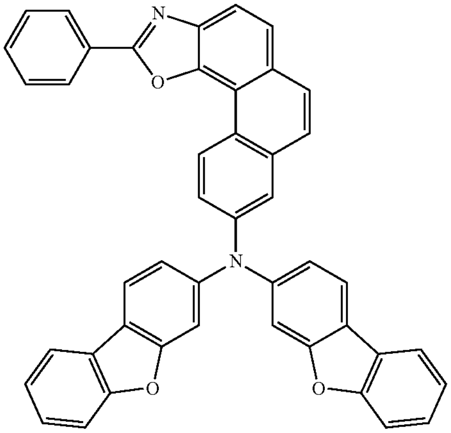

-continued
H-23
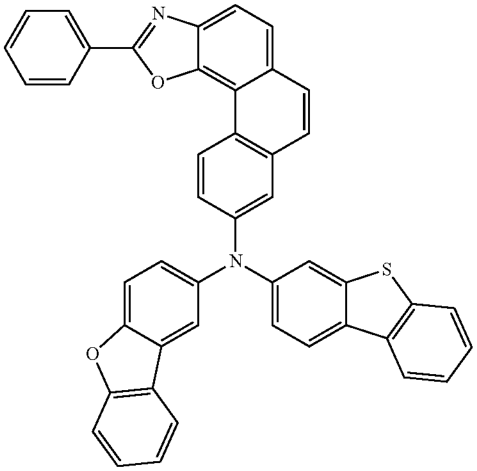
H-24
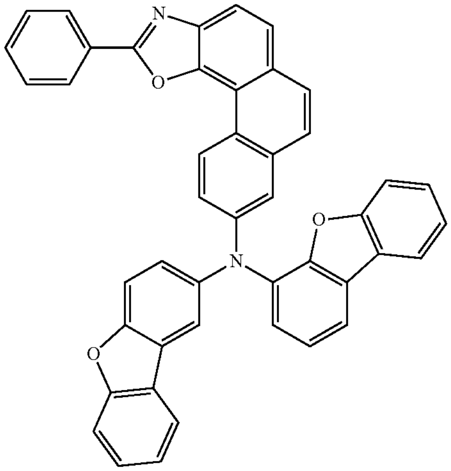
H-25
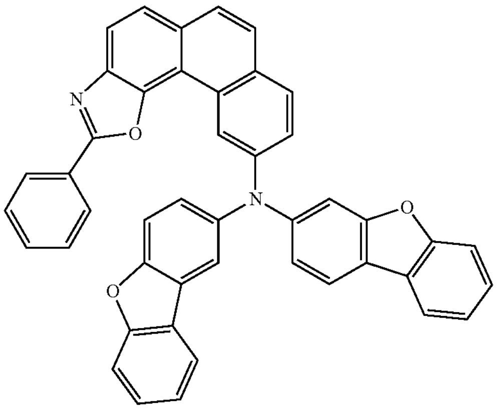
-continued
H-26
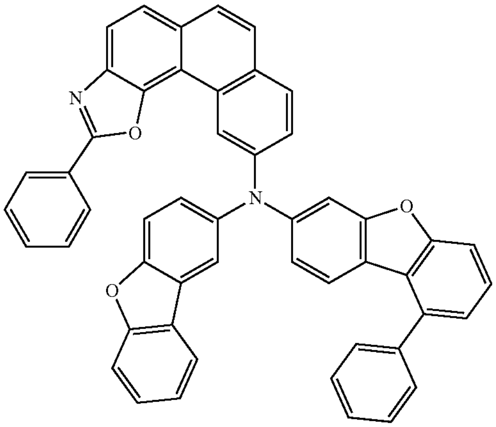
H-27
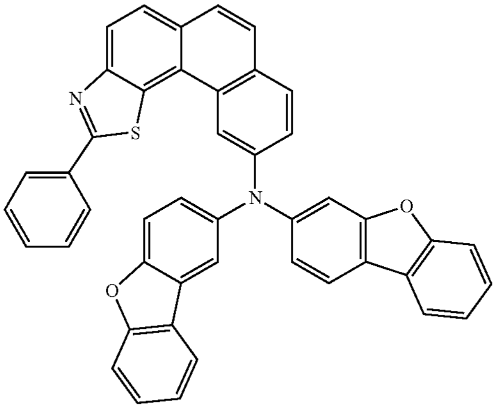
H-28
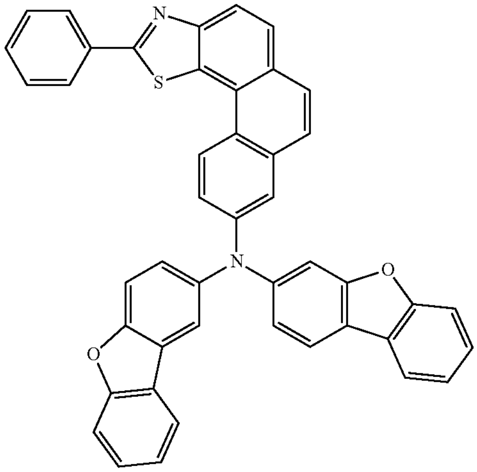
The compound represented by formula 2 may be at least one selected from the following compounds, but is not limited thereto.

-continued
C-1
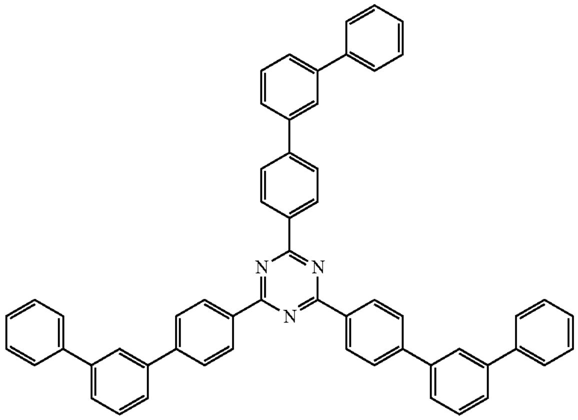
C-2
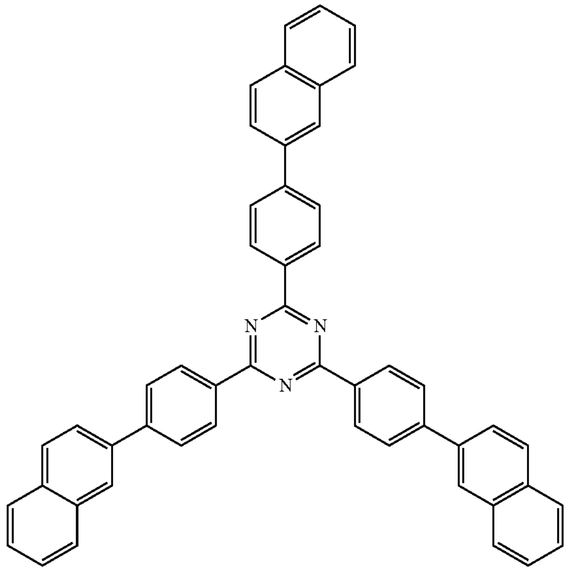
C-3
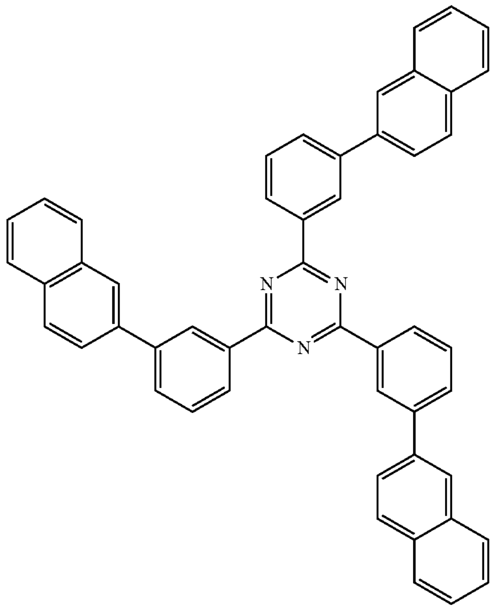
C-4
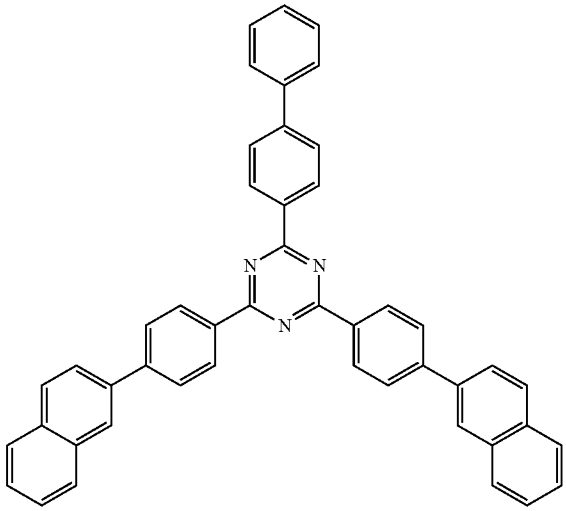
C-5
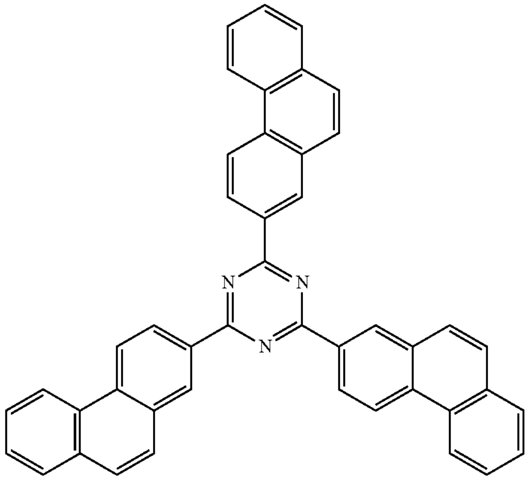
C-6
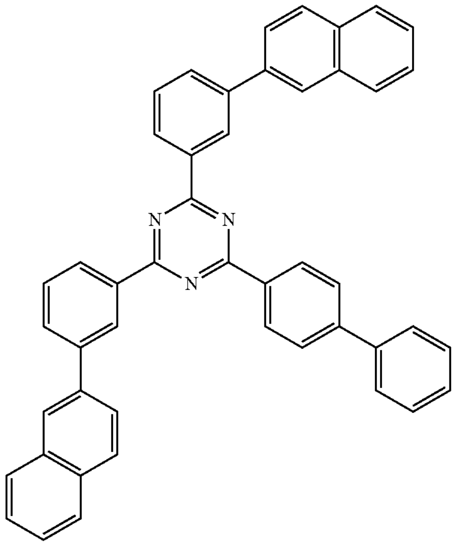

C-7
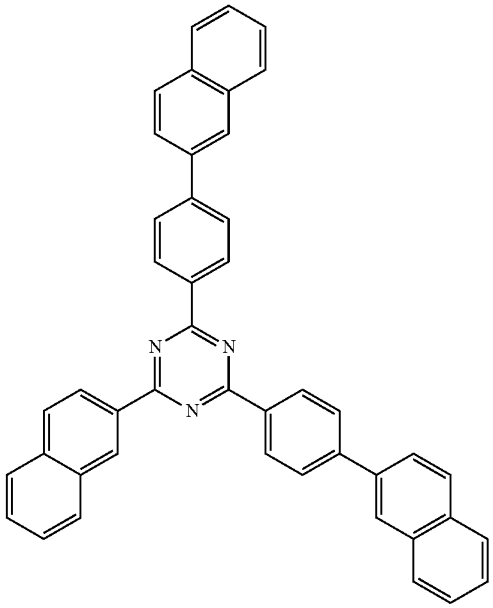
C-8
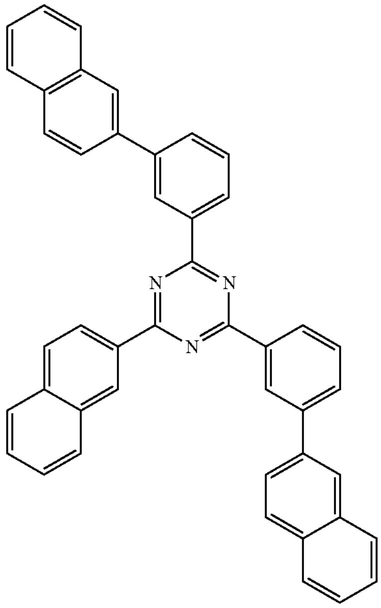
C-9
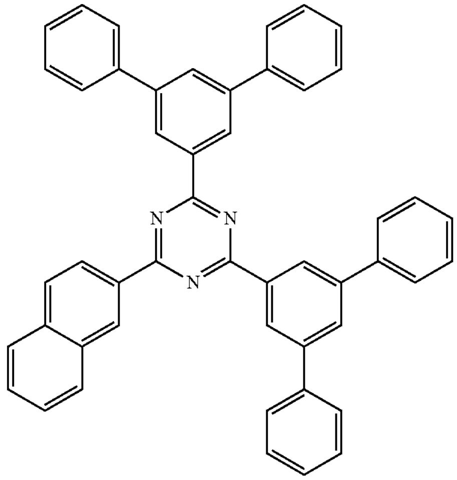
C-10
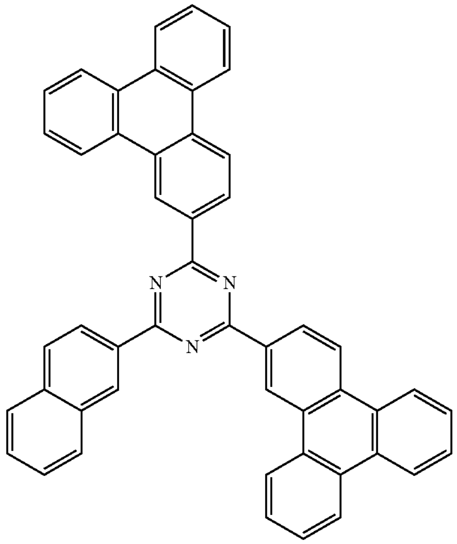
C-11
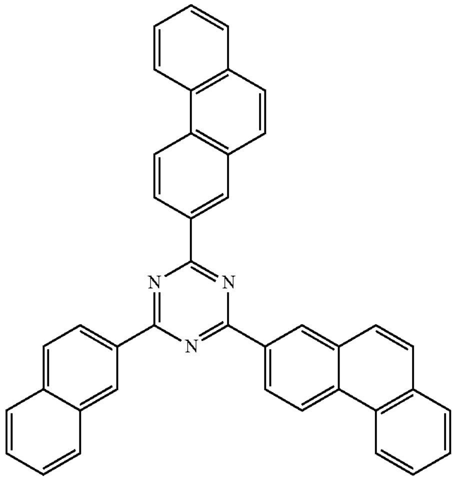

-continued
C-12
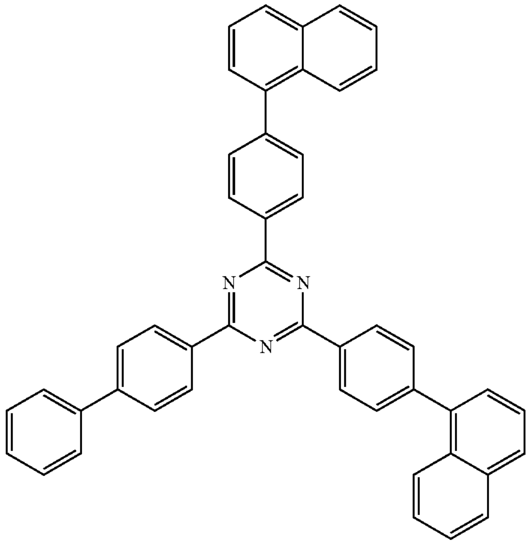
C-13
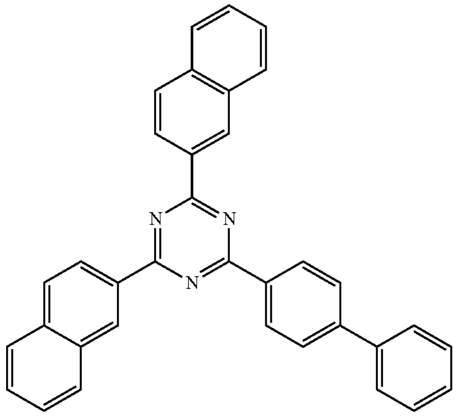
C-14
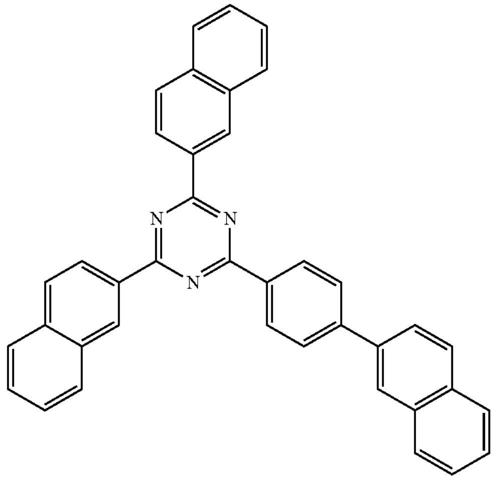
-continued
C-15
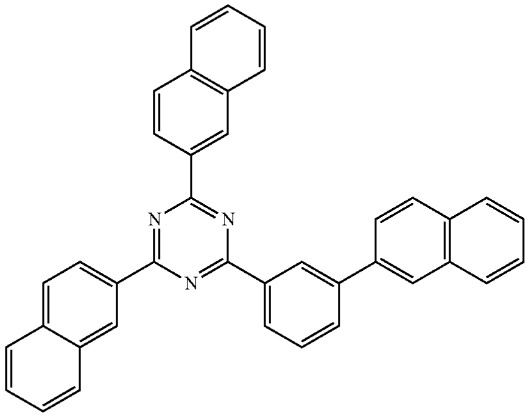
C-16
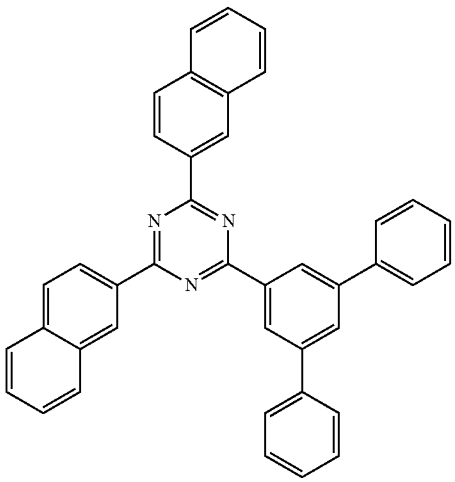
C-17
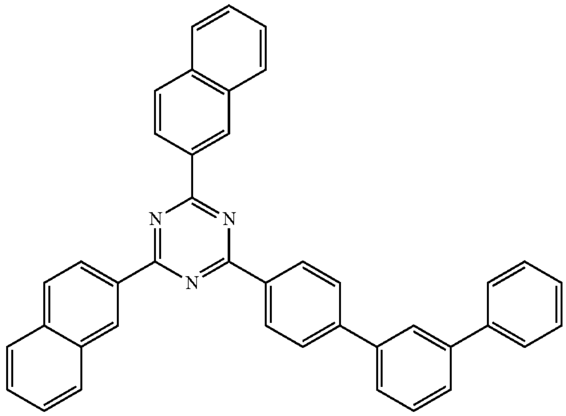

-continued
C-18
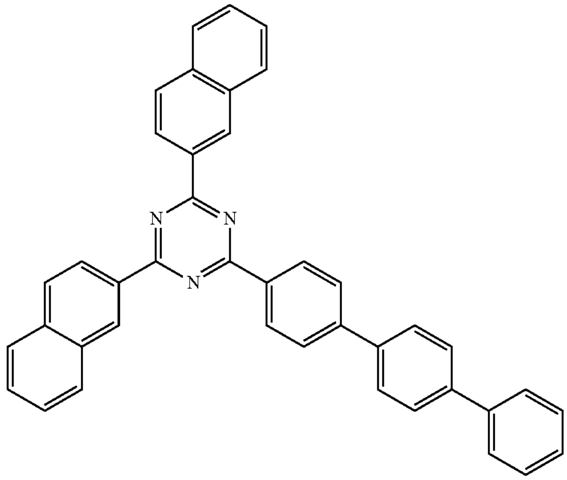
C-19
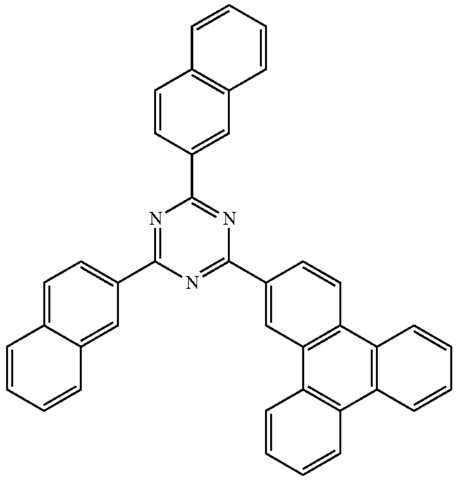
C-20
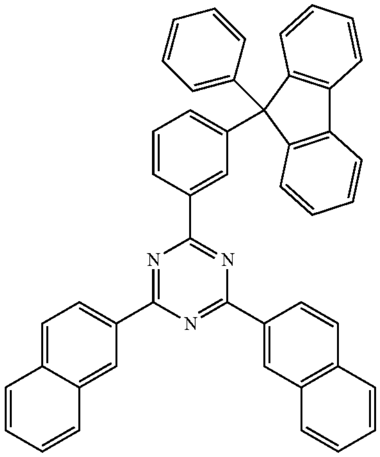
-continued
C-21
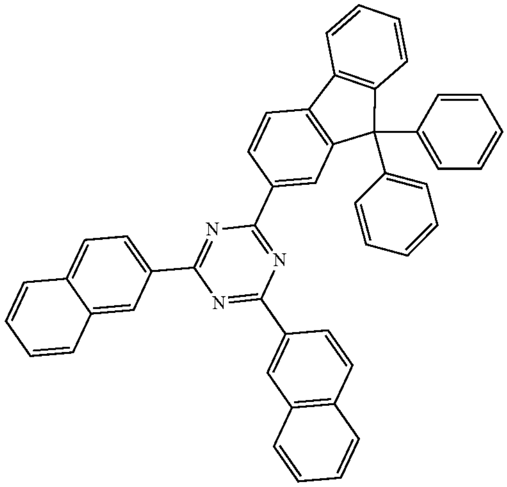
C-22
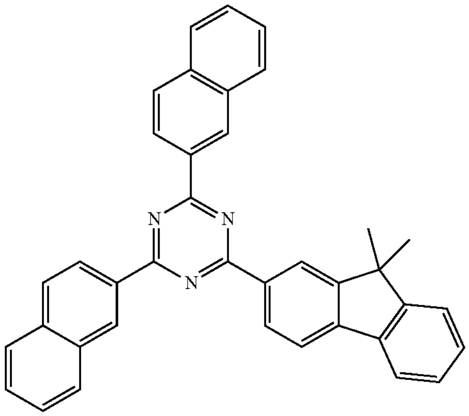
C-23
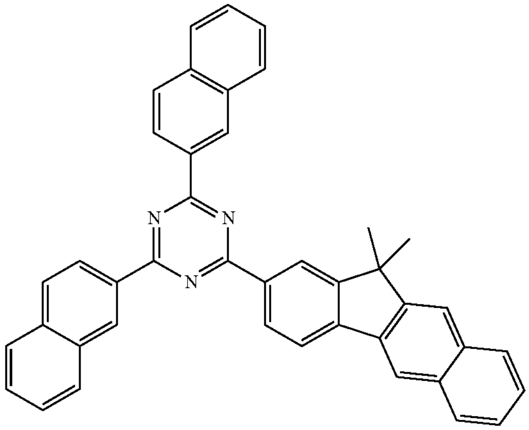

-continued
C-24
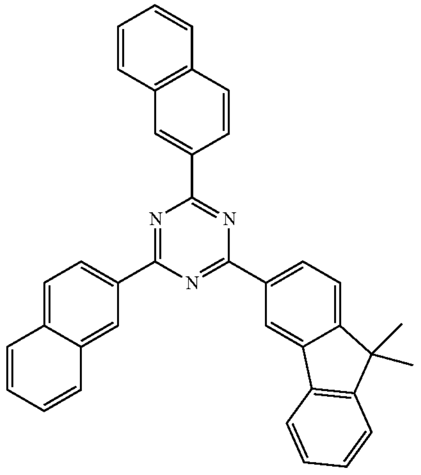
C-25
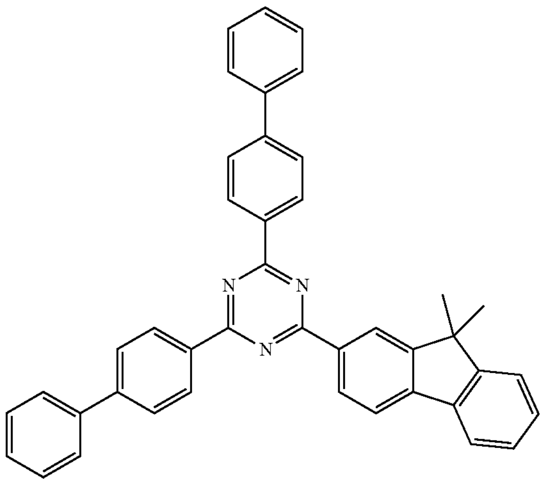
C-26
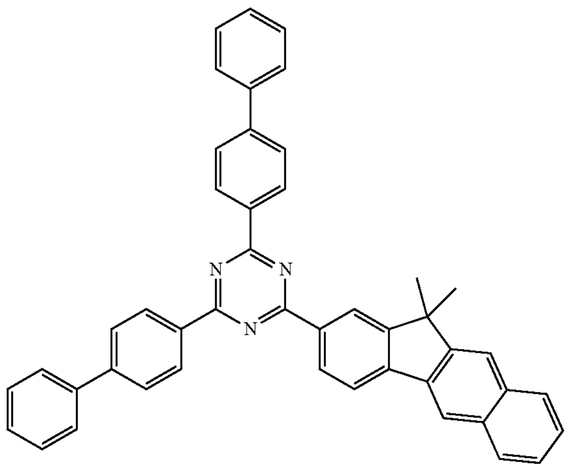
-continued
C-27
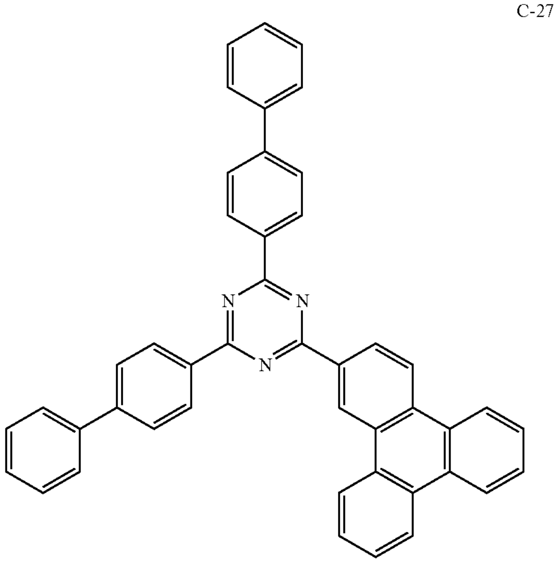
C-28
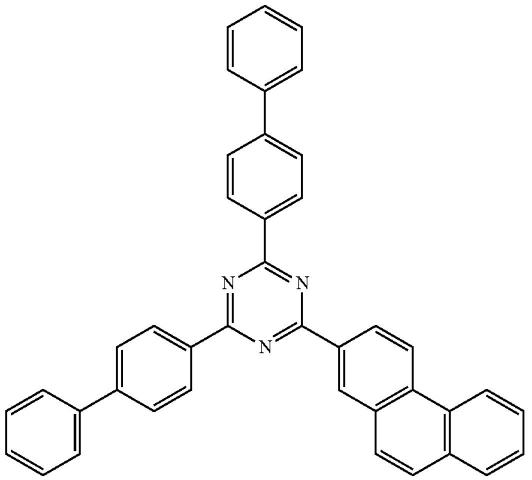
C-29
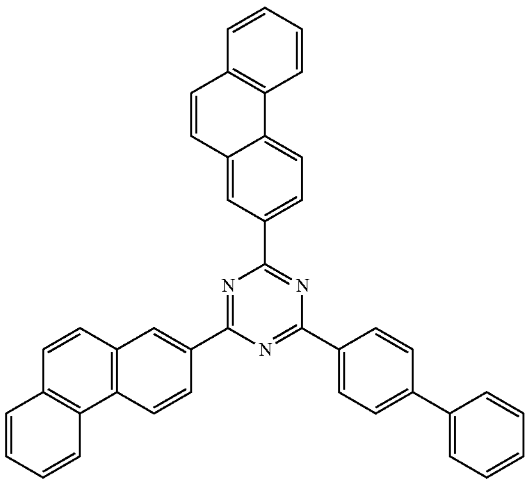

-continued
C-30
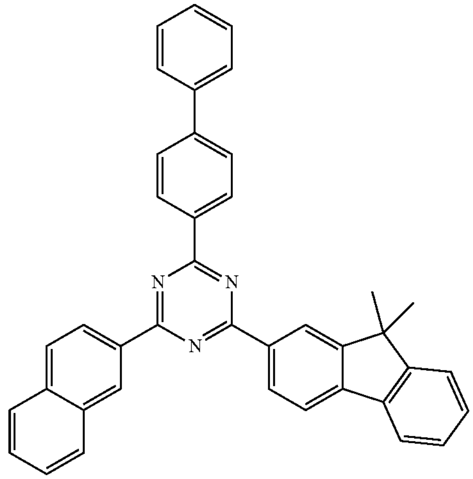
C-31
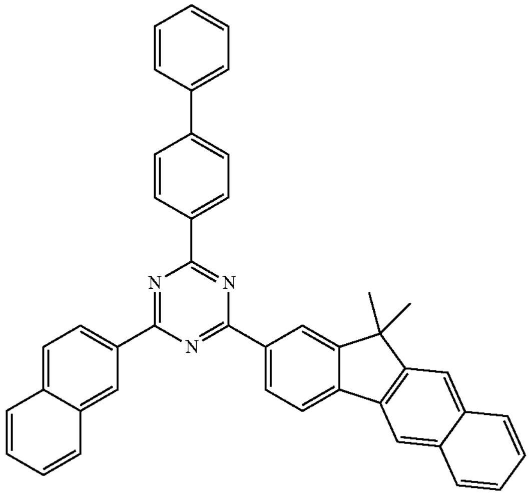
C-32
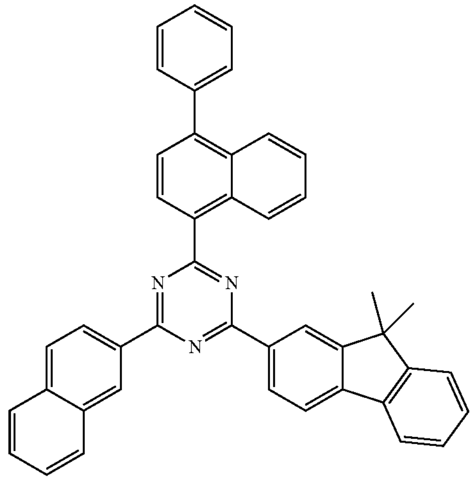
-continued
C-33
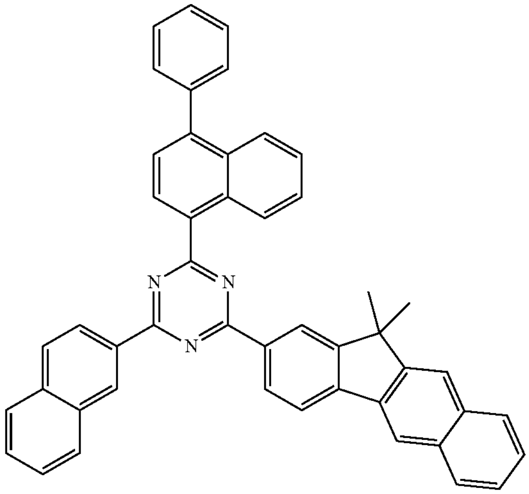
C-34
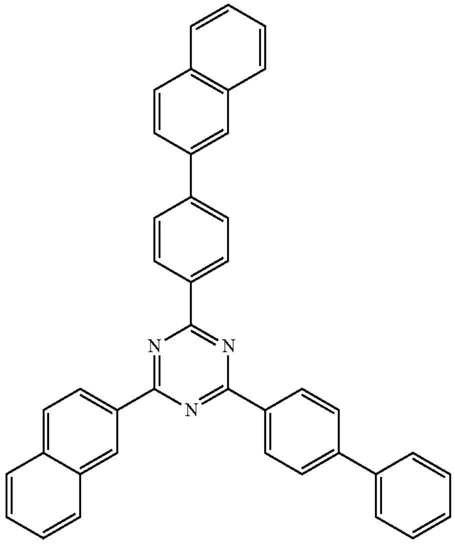
C-35
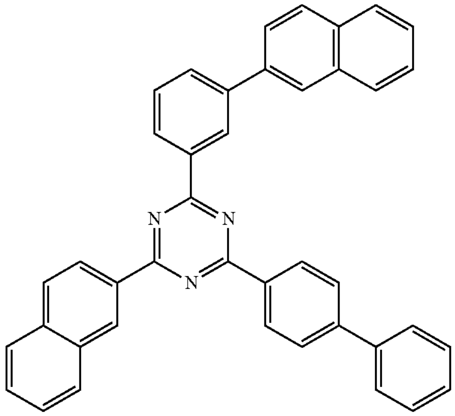

-continued
C-36
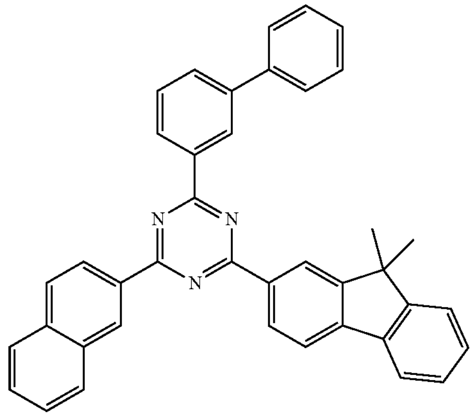
C-37
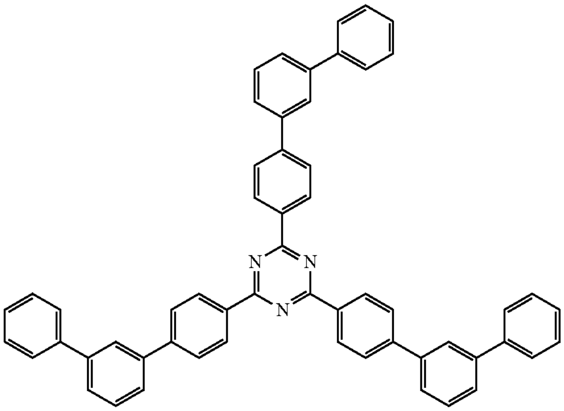
C-38
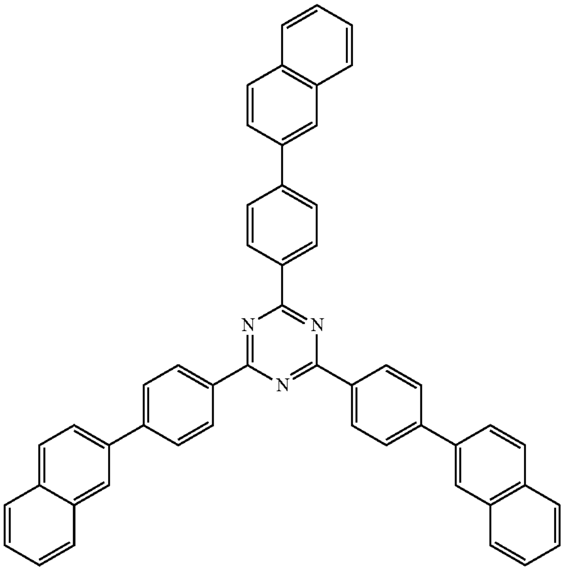
-continued
C-39
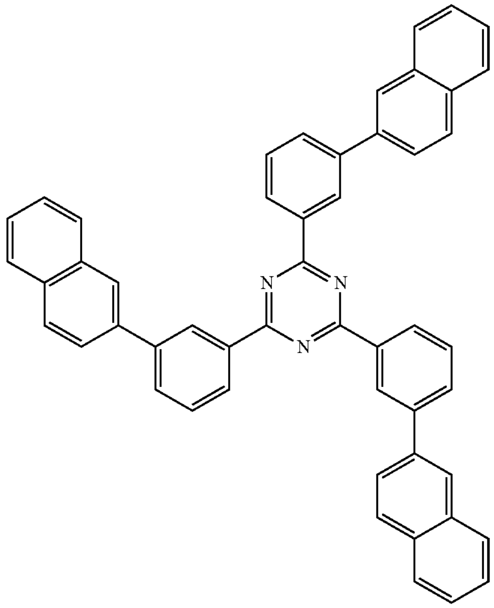
C-40
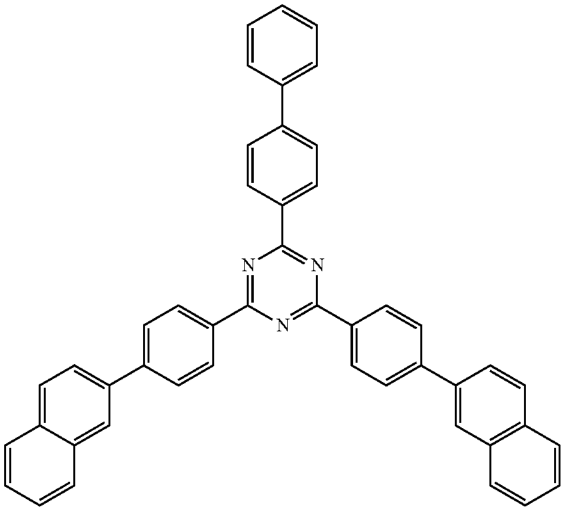
C-41
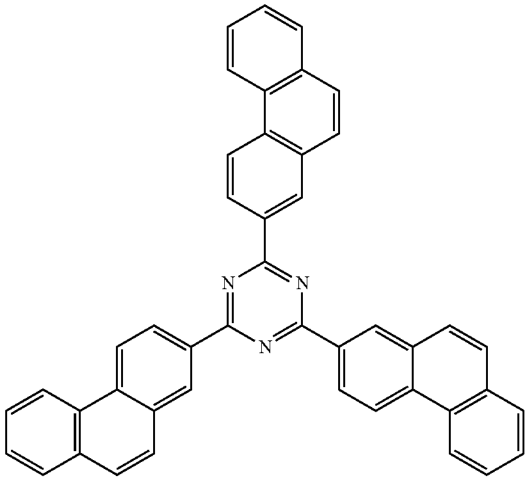

C-42
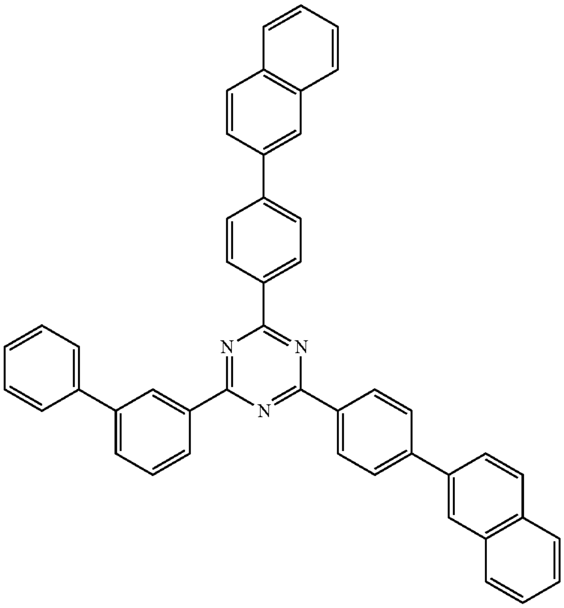
C-43
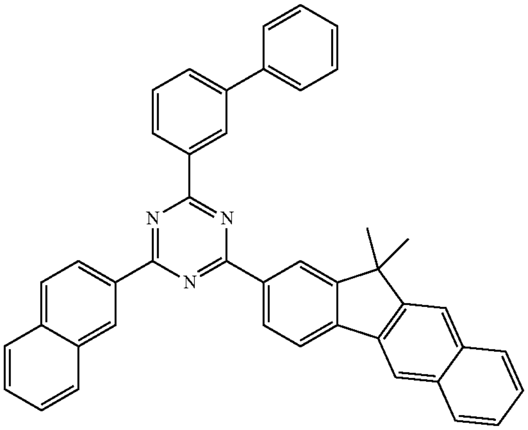
C-44
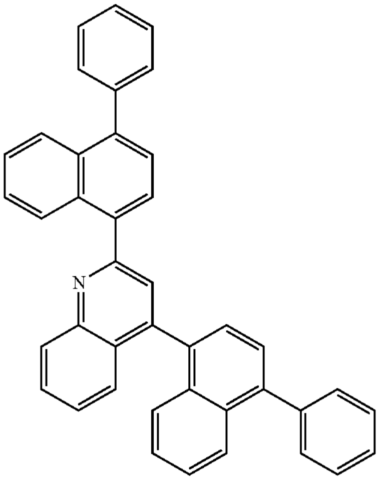
C-45
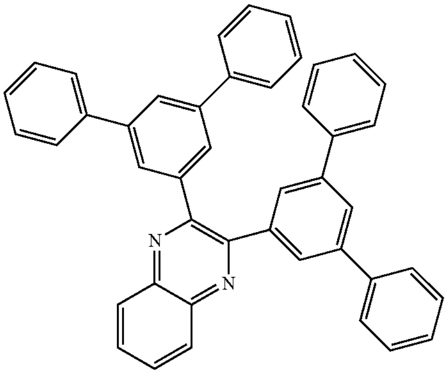
C-46
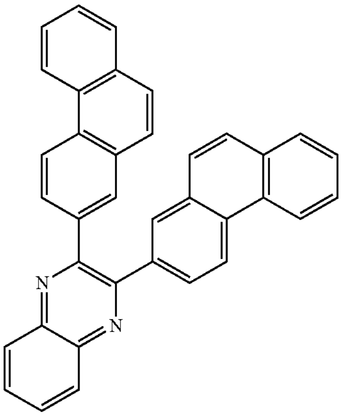
C-47
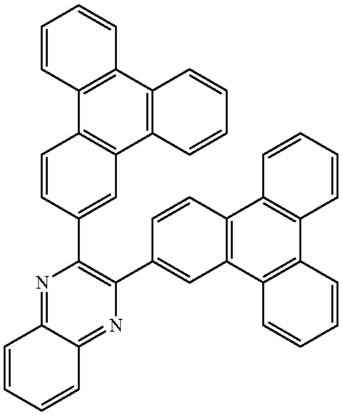

-continued
C-48
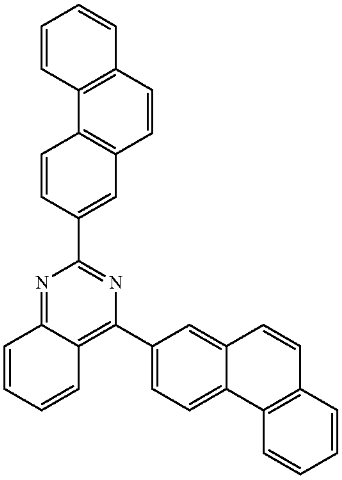
C-49
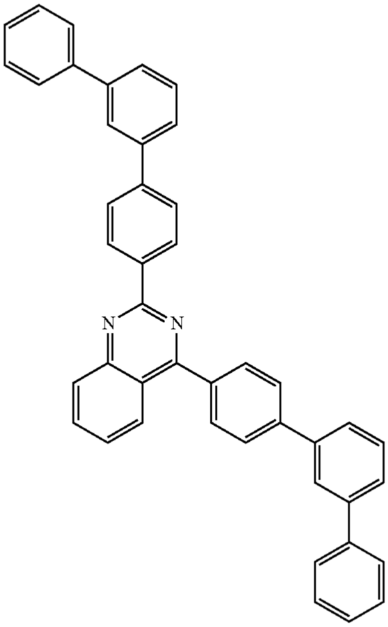
C-50
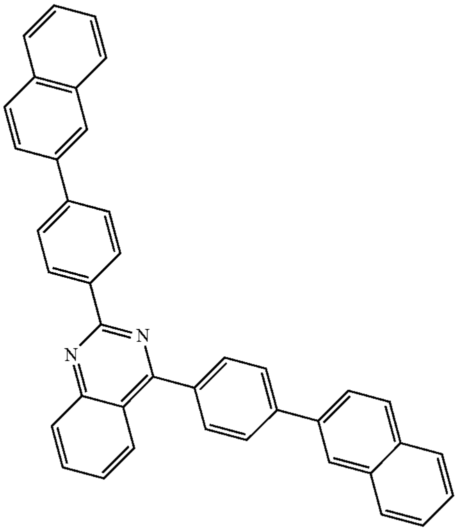
-continued
C-51
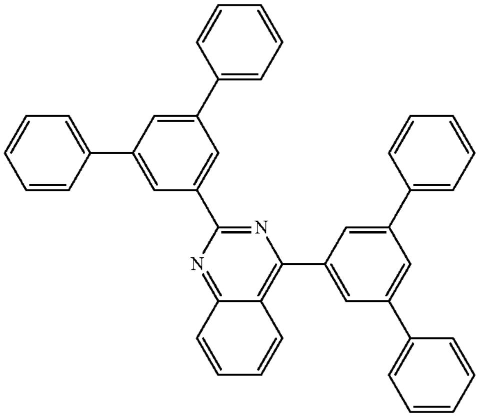
C-52
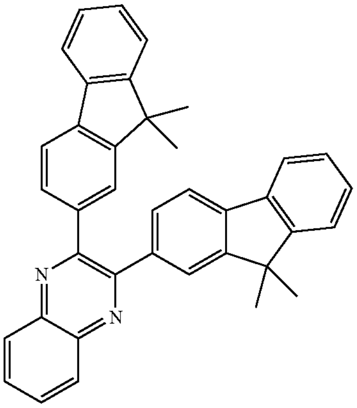
C-53
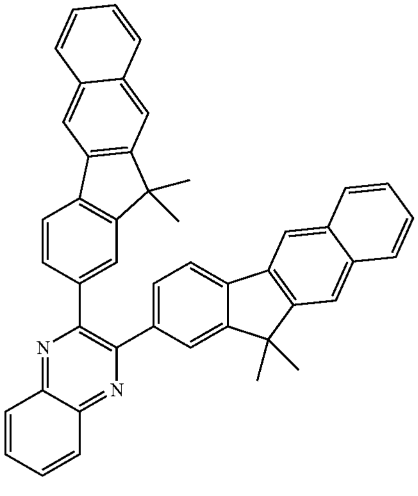

-continued
C-54
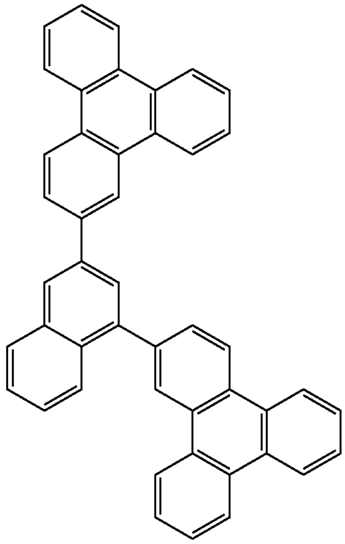
C-55
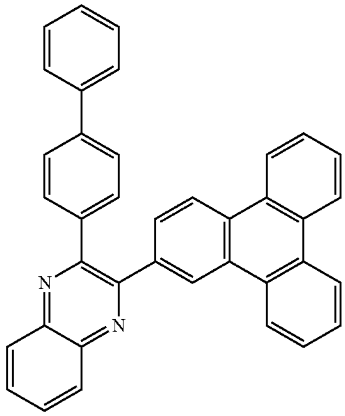
C-56
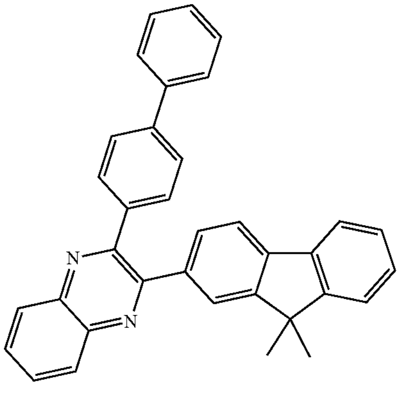
-continued
C-57
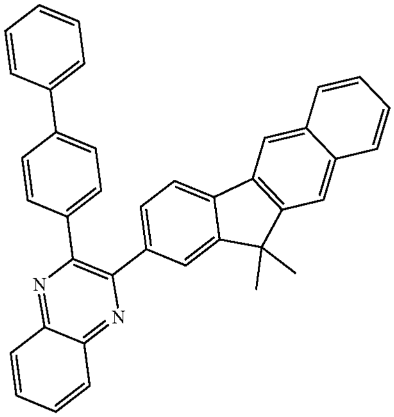
C-58
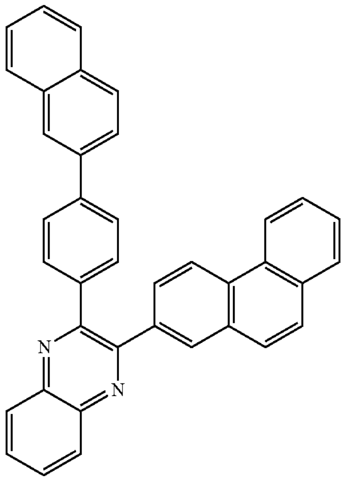
C-59
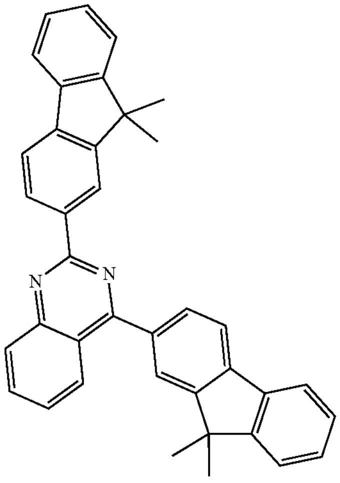

-continued
C-60
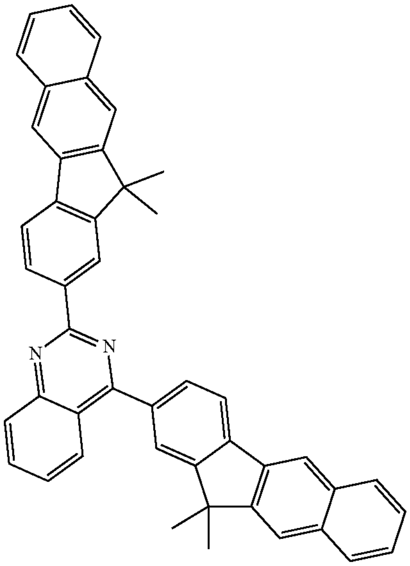
C-61
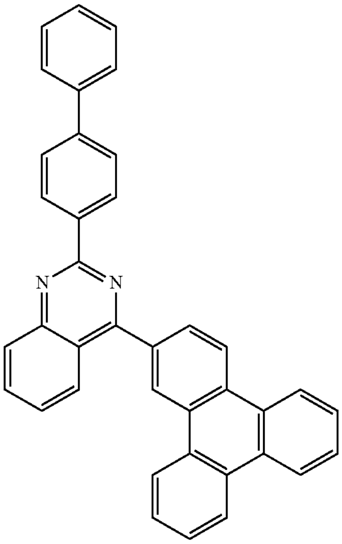
C-62
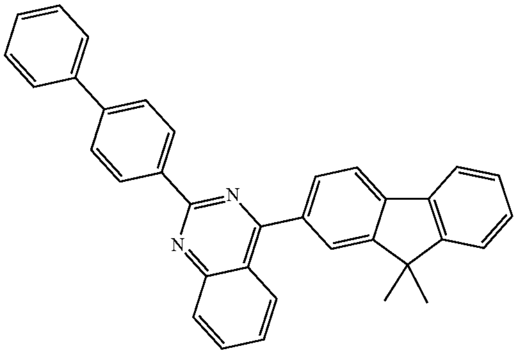
-continued
C-63
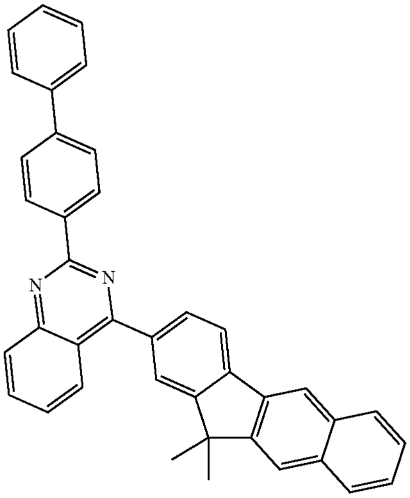
C-64
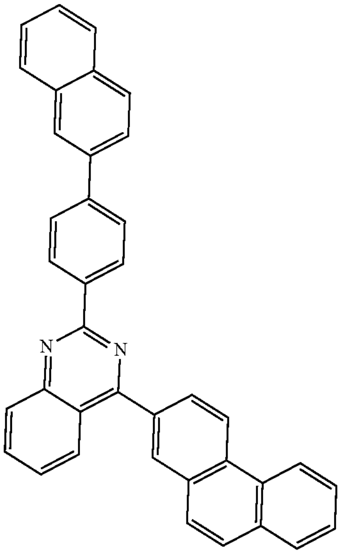
C-65
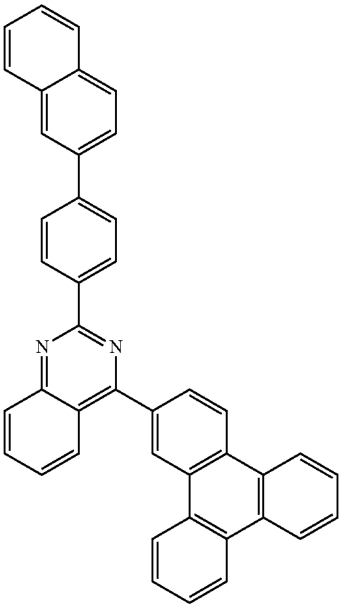

-continued
C-66
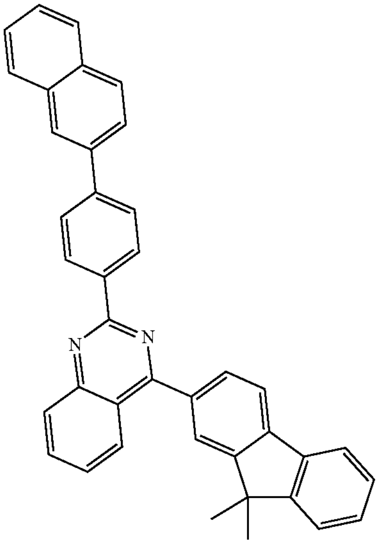
C-67
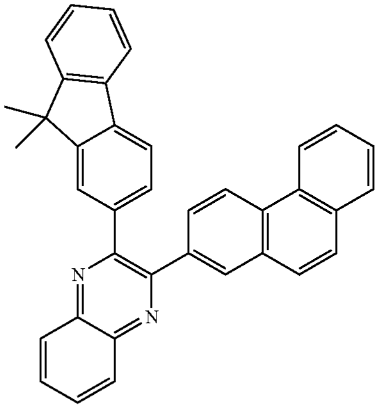
C-68
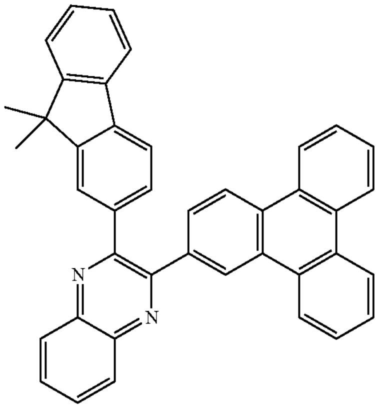
-continued
C-69
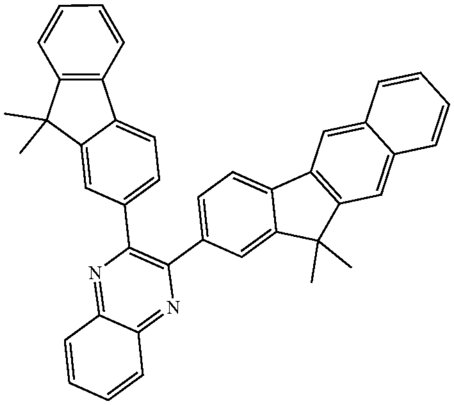
C-70
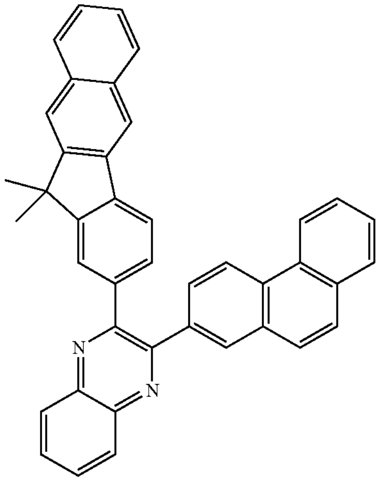
C-71
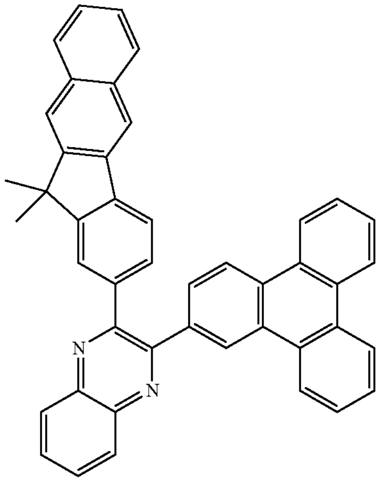

-continued
C-72
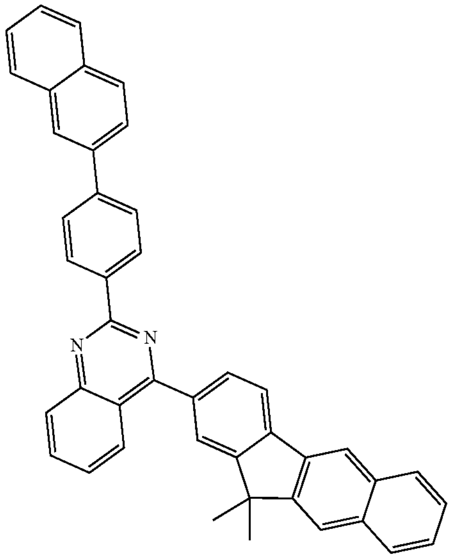
C-73
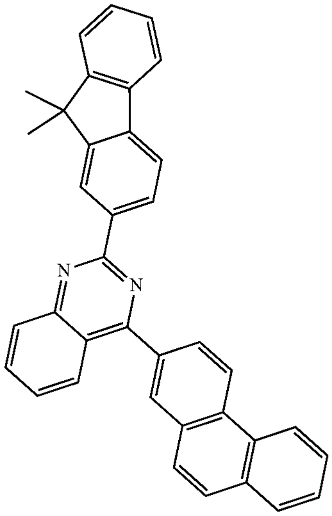
C-74
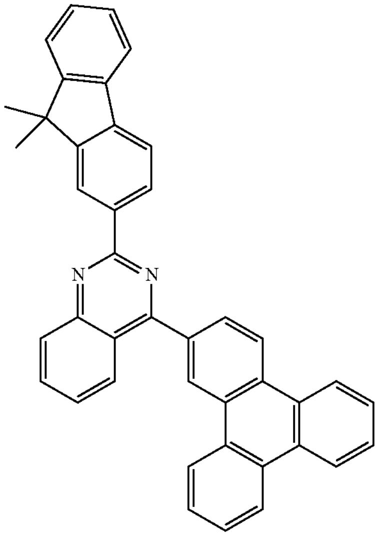
-continued
C-75
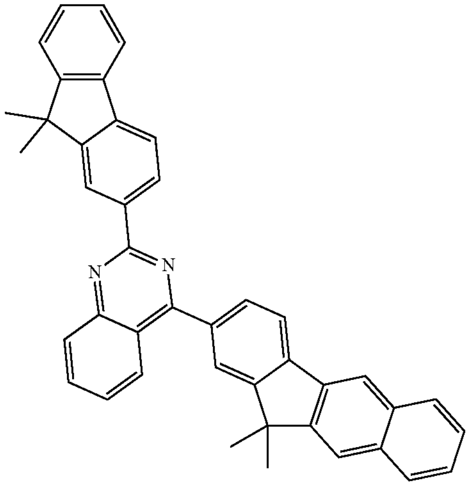
C-76
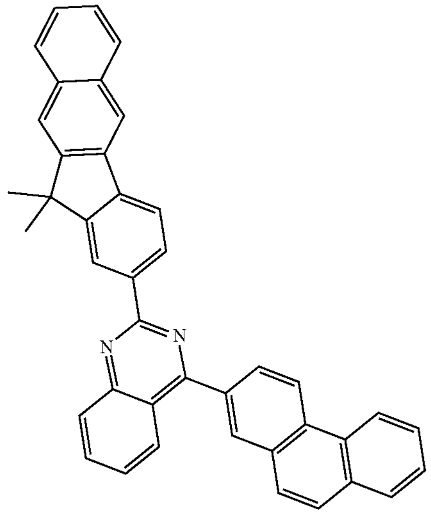
C-77
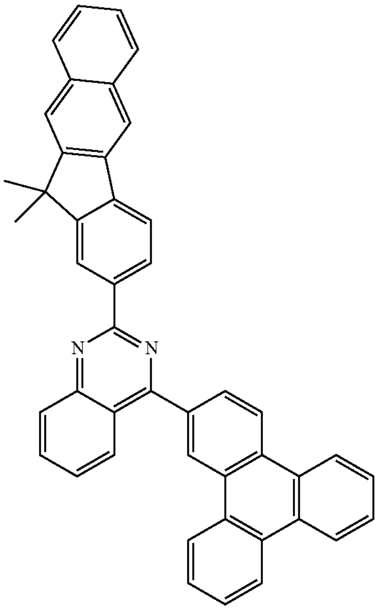

-continued
C-78
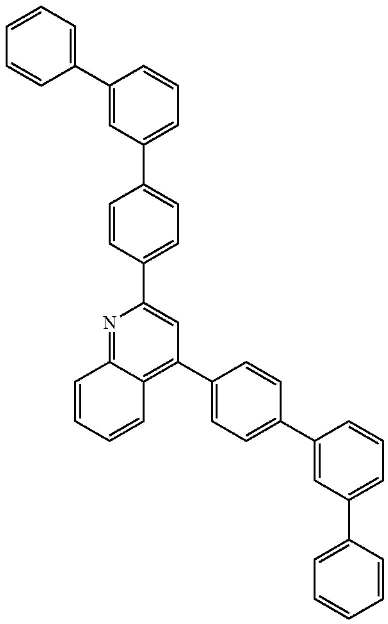
C-79
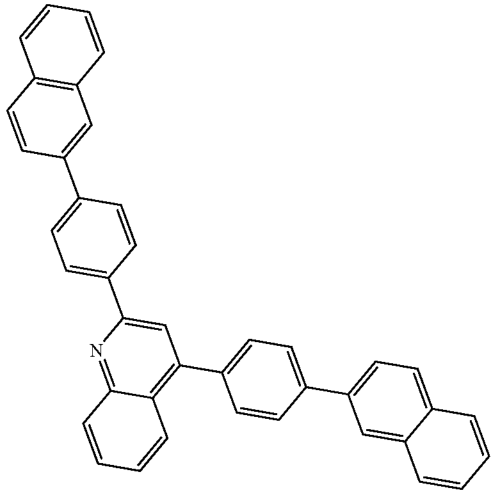
-continued
C-80
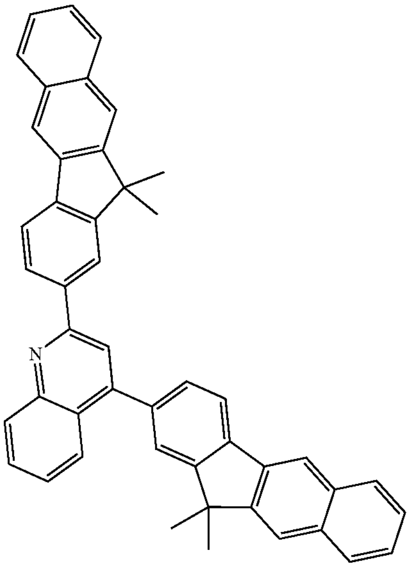
C-81
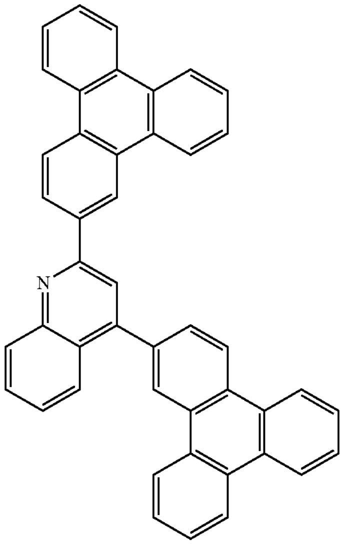
C-82
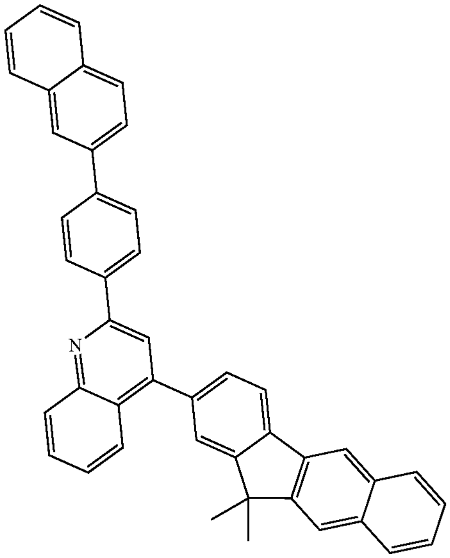

-continued
C-83
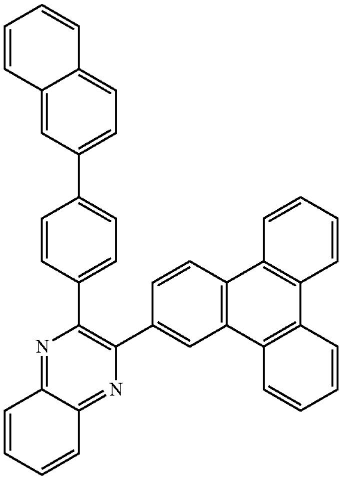
C-84
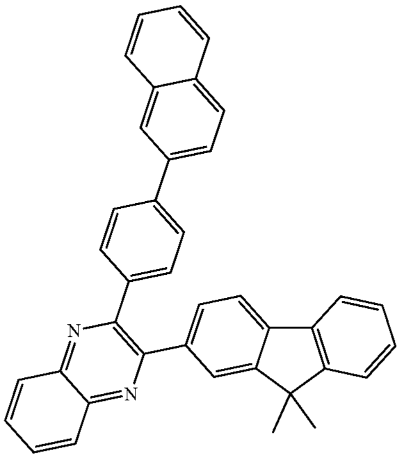
C-85
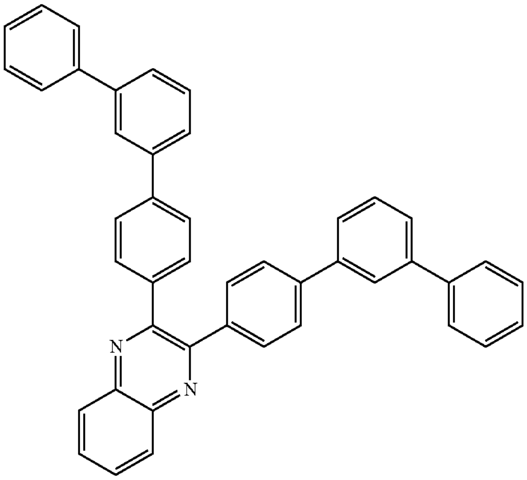
-continued
C-86
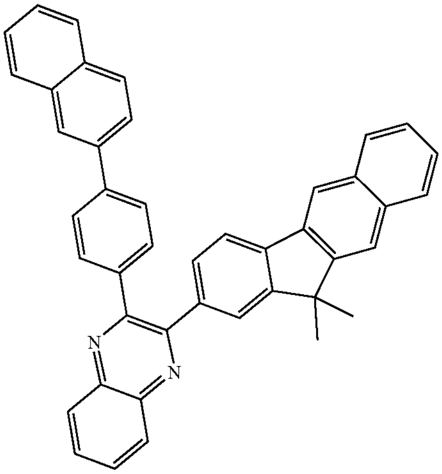
C-87
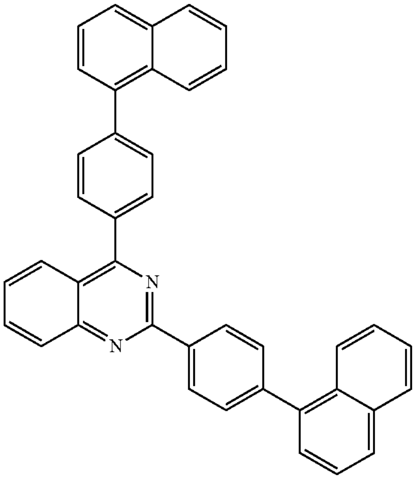
C-88
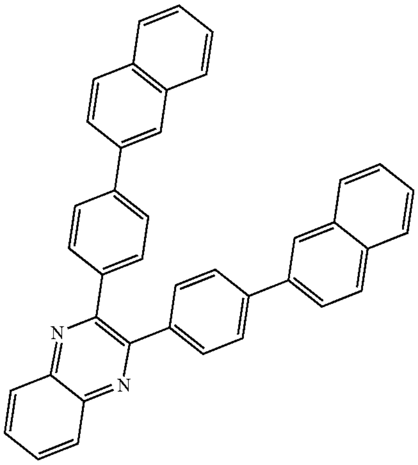

-continued
C-89
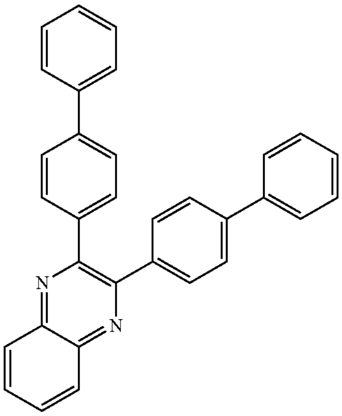
C-90
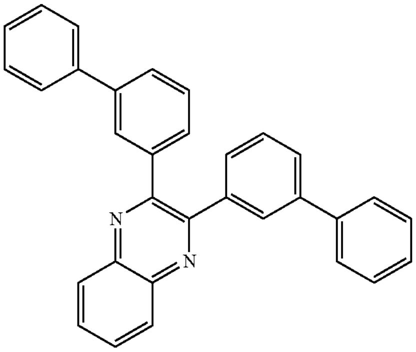
C-91
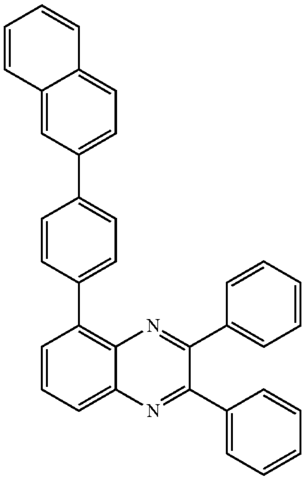
-continued
C-92
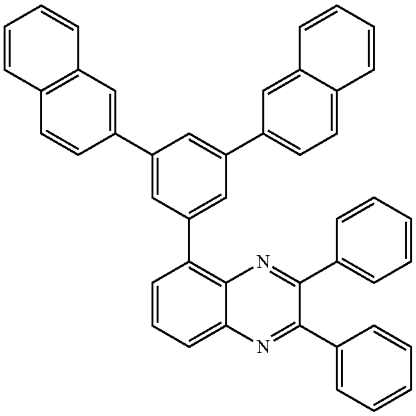
C-93
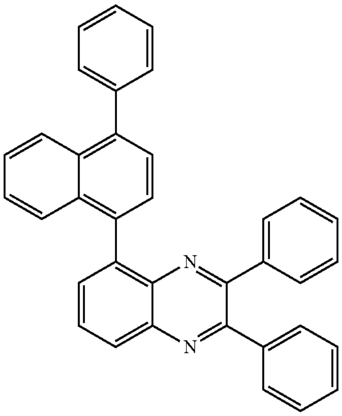
C-94
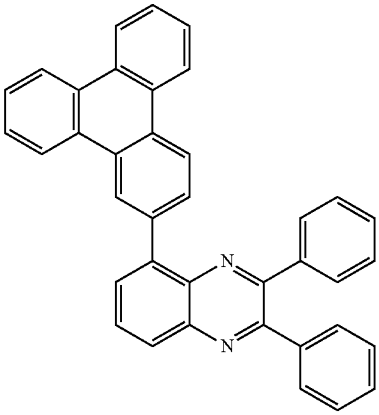

-continued
C-95
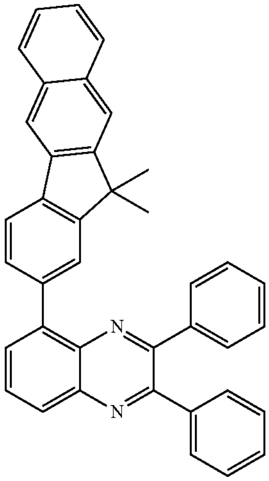
C-96
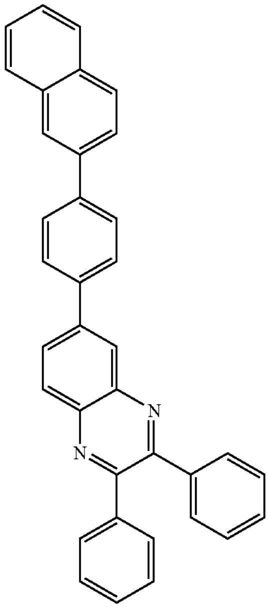
C-97
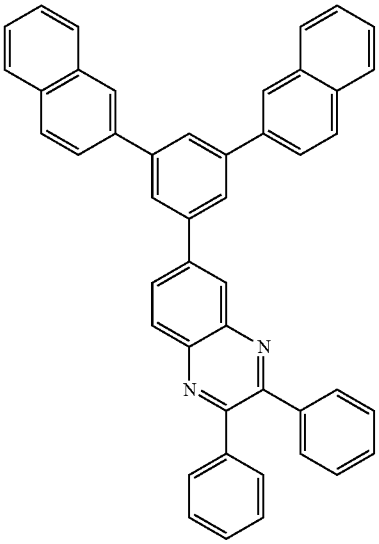
-continued
C-98
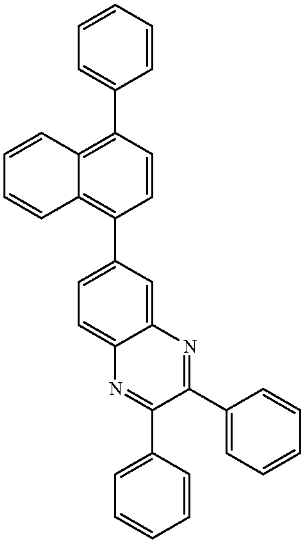
C-99
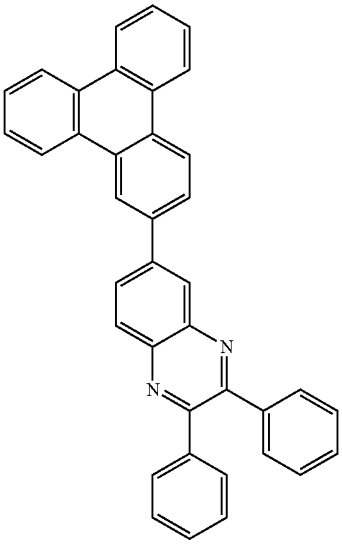

-continued
C-100
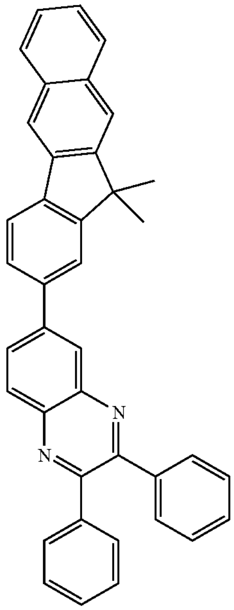
C-101
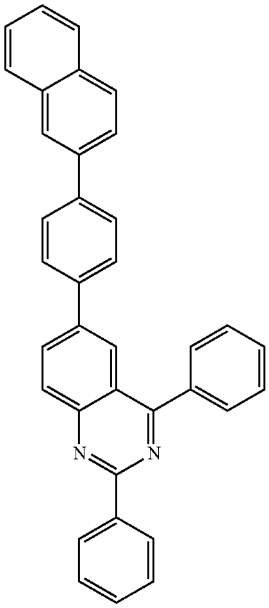
-continued
C-102
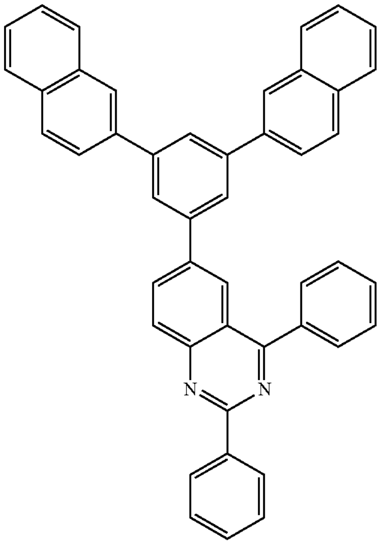
C-103
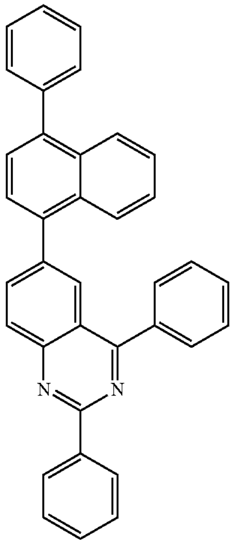
C-104
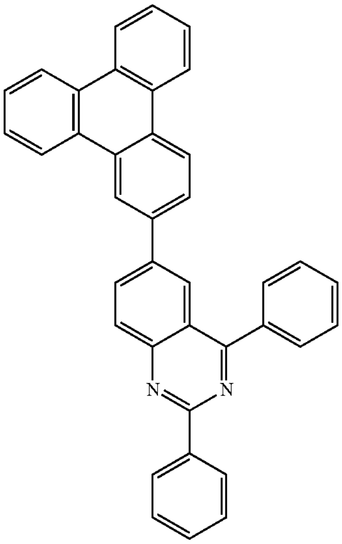

-continued
C-105
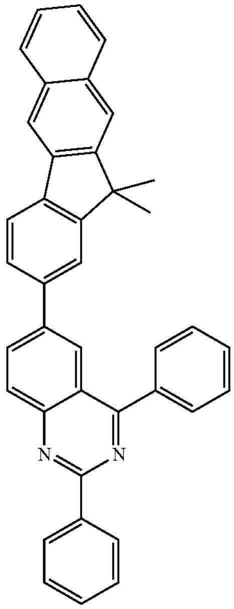
C-106
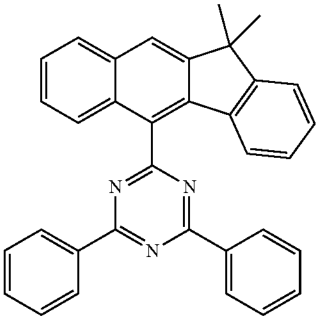
C-107
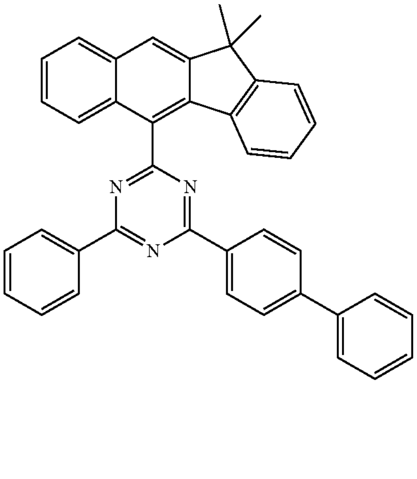
-continued
C-108
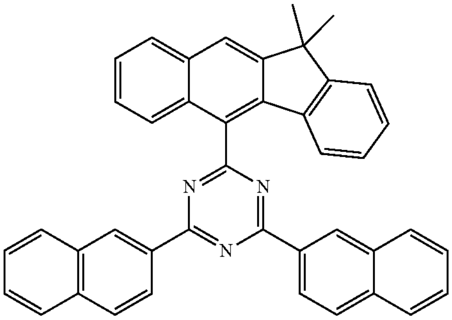
C-109
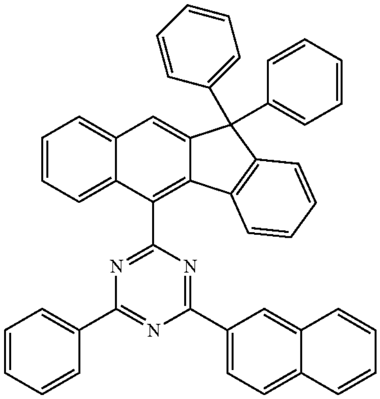
C-110
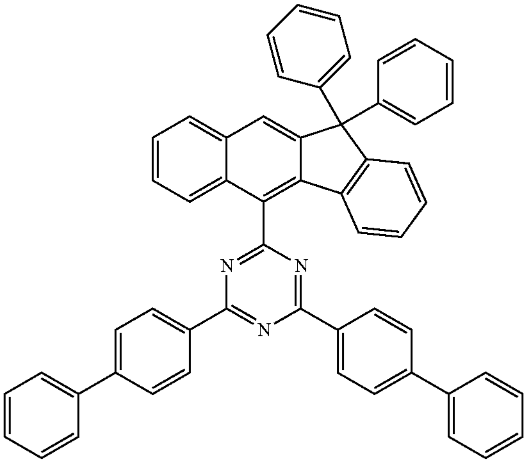
C-111
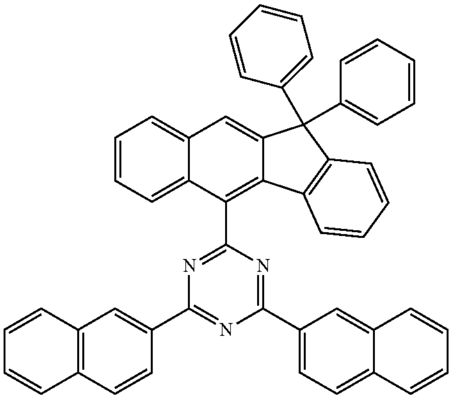

-continued
C-112
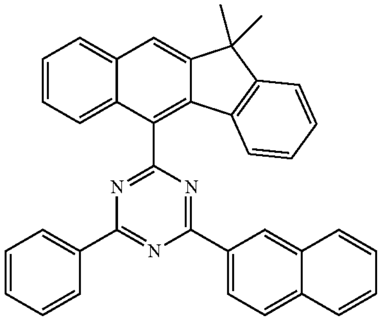
C-113
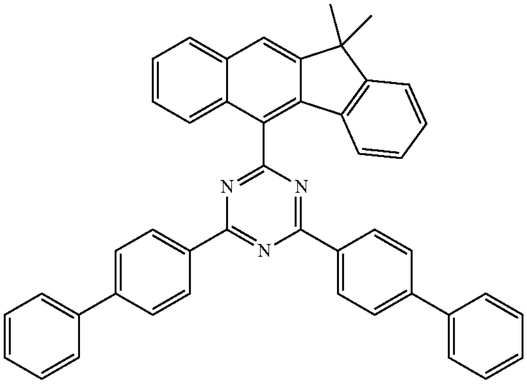
C-114
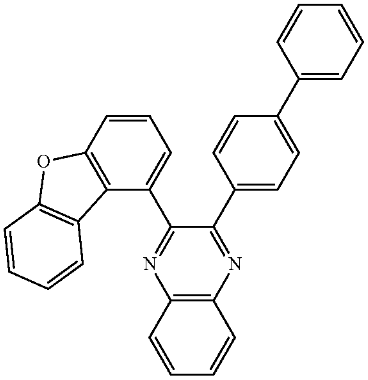
C-115
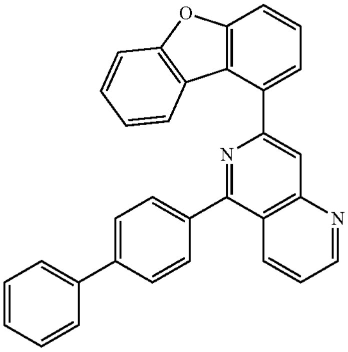
-continued
C-116
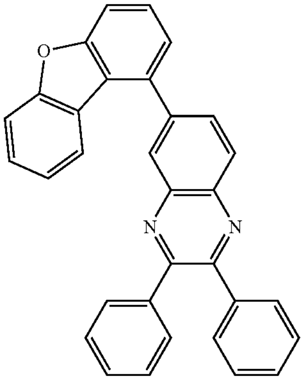
C-117
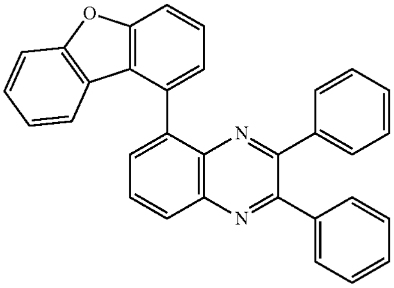
C-118
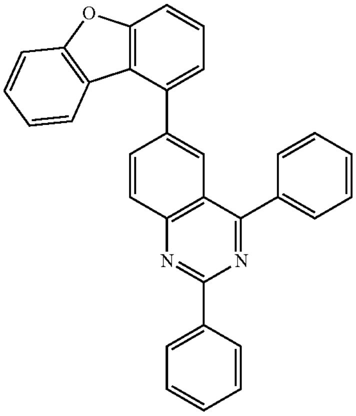
C-119
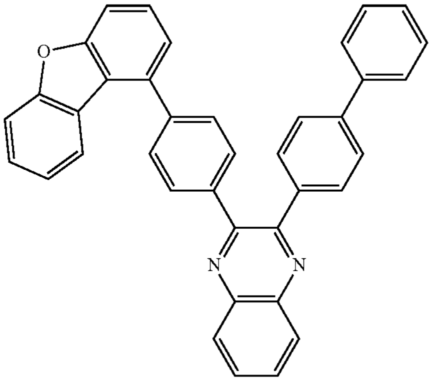

-continued
C-120
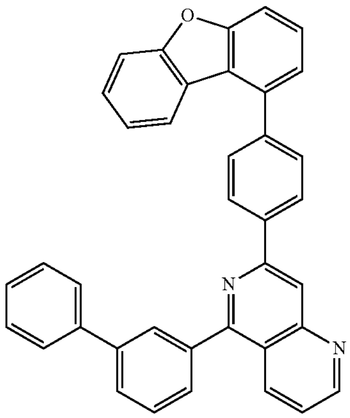
C-121
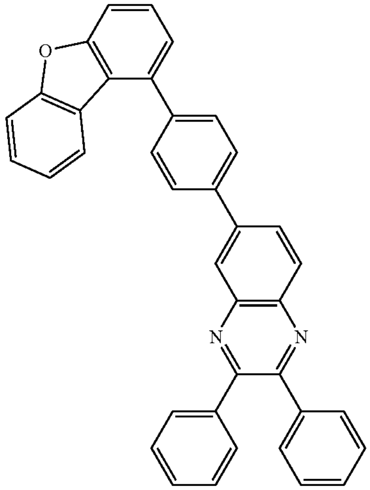
C-122
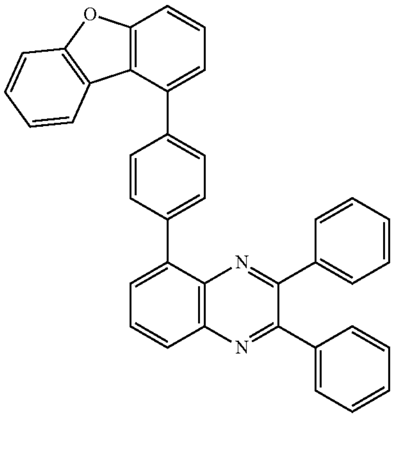
-continued
C-123
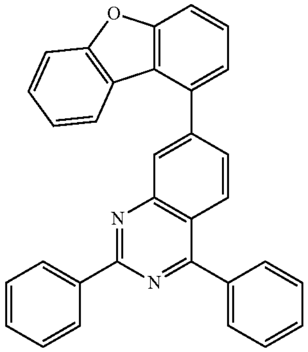
C-124
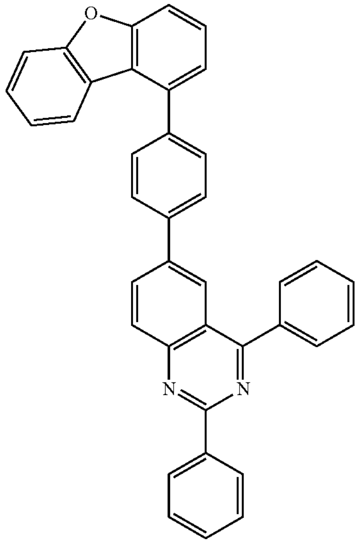
C-125
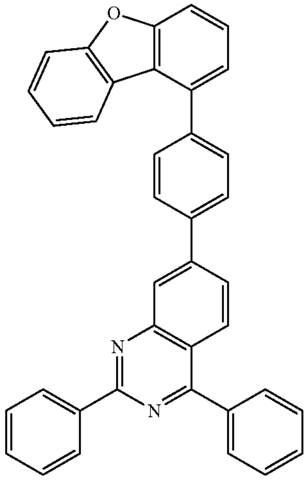

-continued
C-126
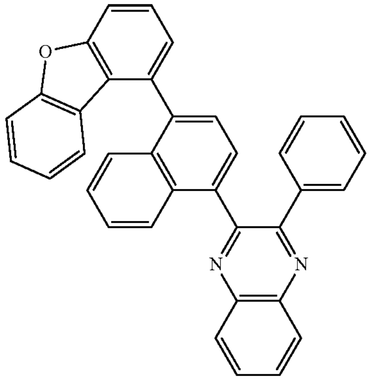
C-127
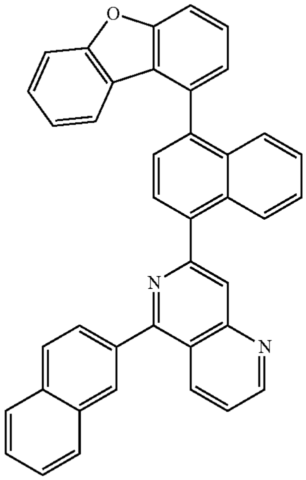
C-128
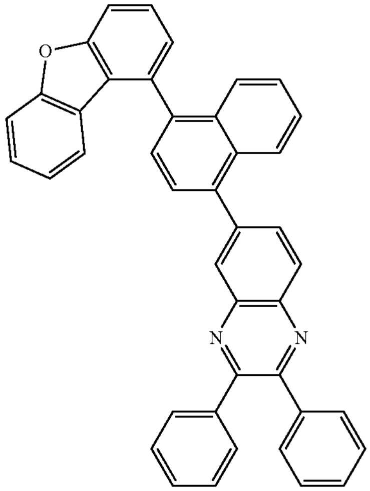
-continued
C-129
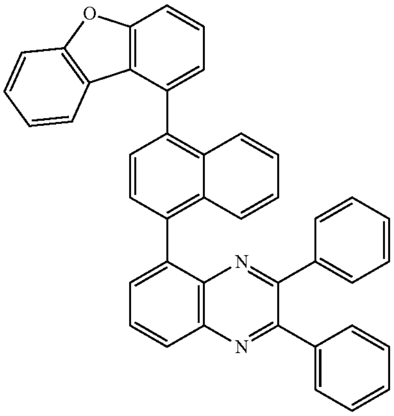
C-130
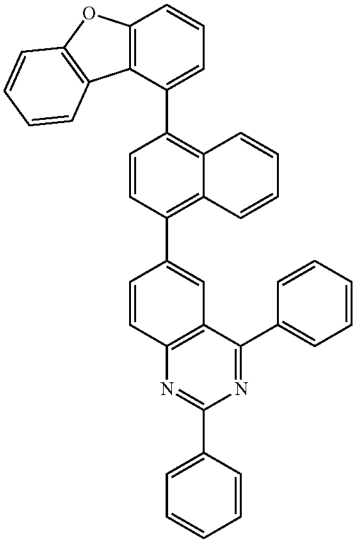
C-131
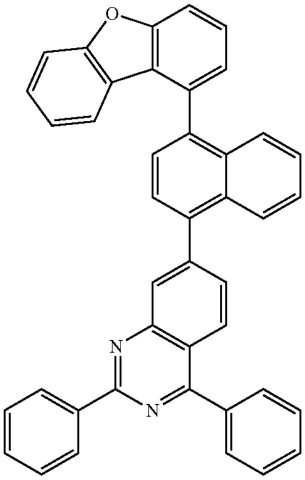

-continued
C-132
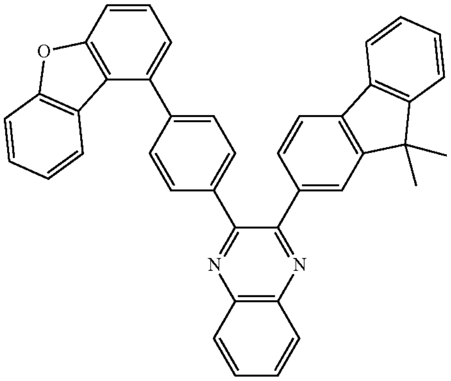
C-133
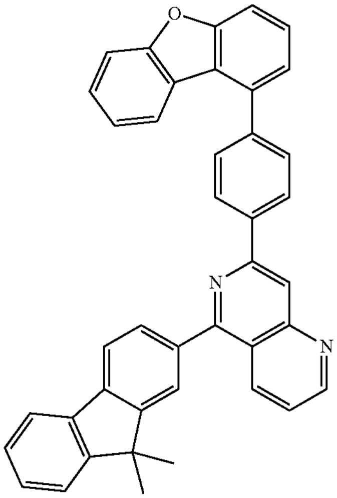
C-134
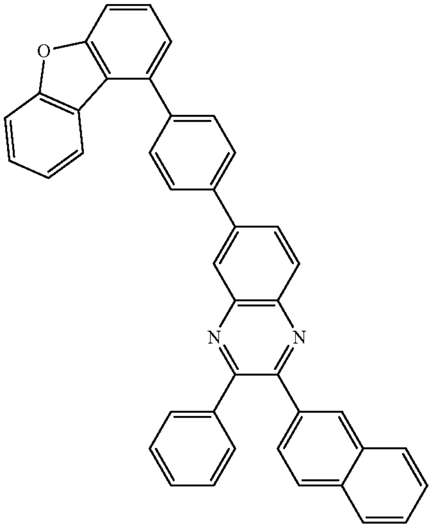
-continued
C-135
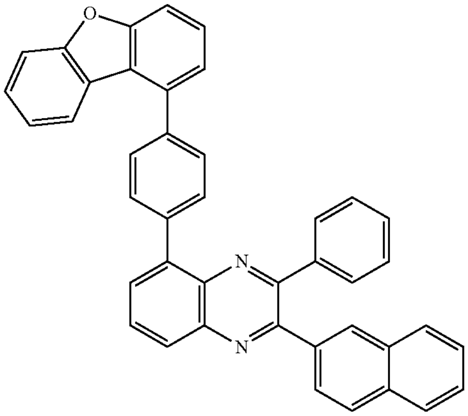
C-136
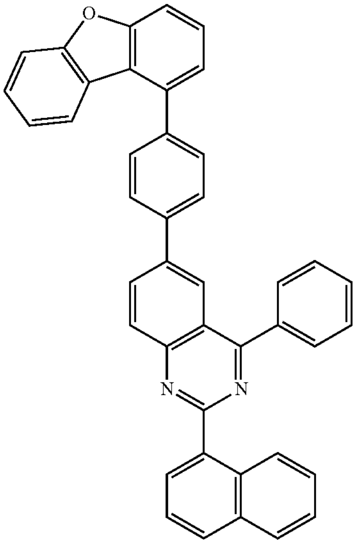
C-137
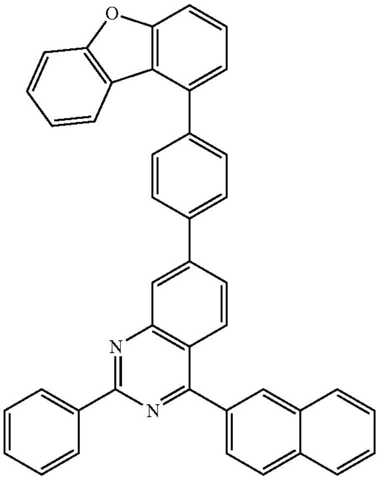

-continued
C-138
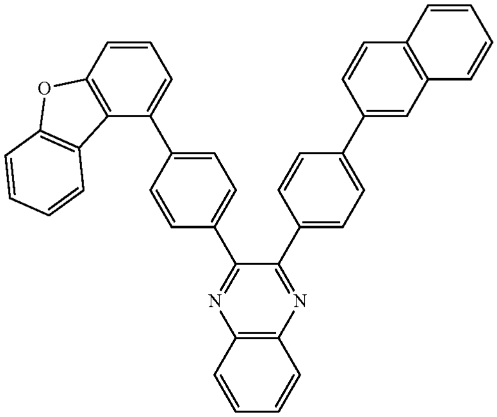
C-139
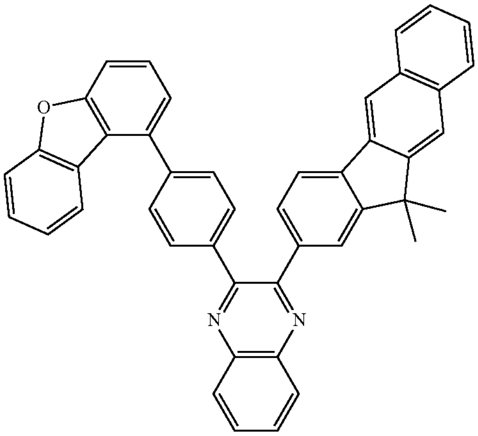
C-140
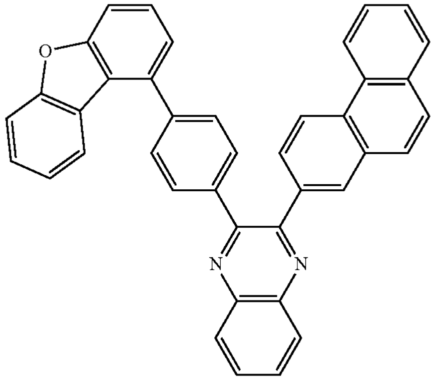
C-141
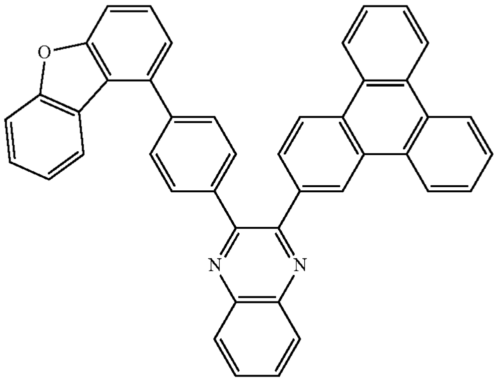
-continued
C-142
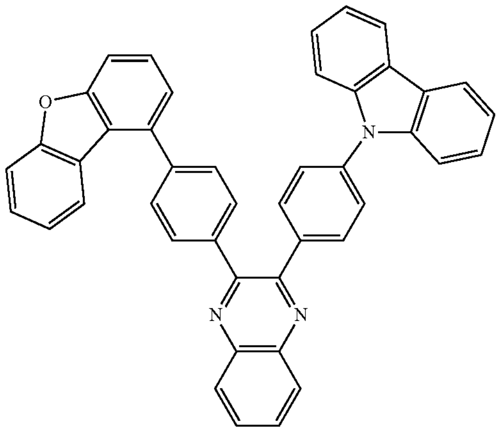
C-143
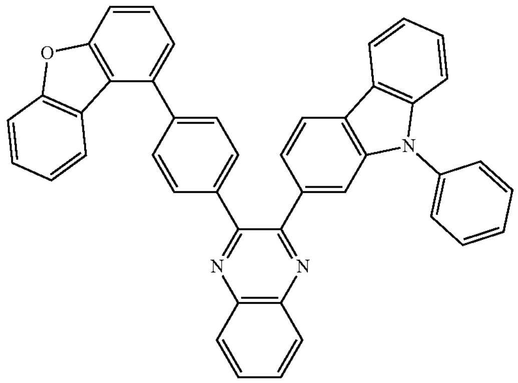
C-144
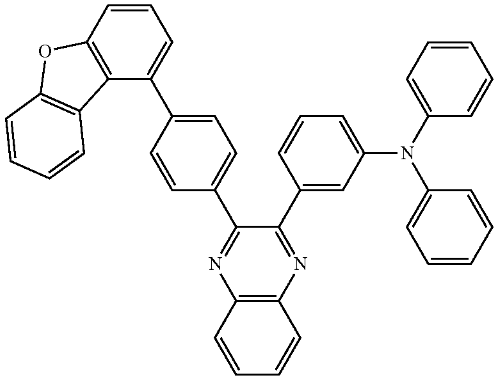
C-145
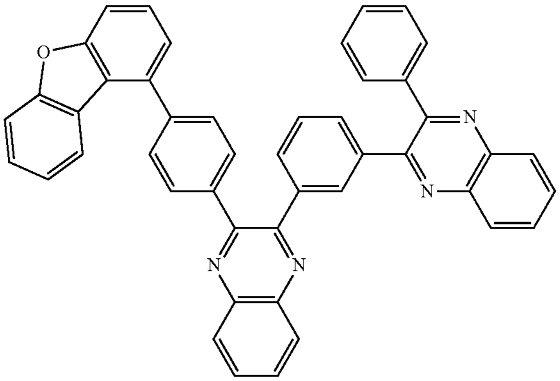

-continued
C-146
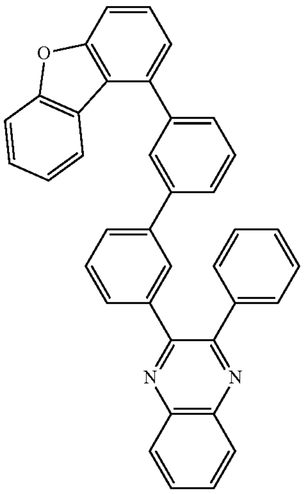
C-147
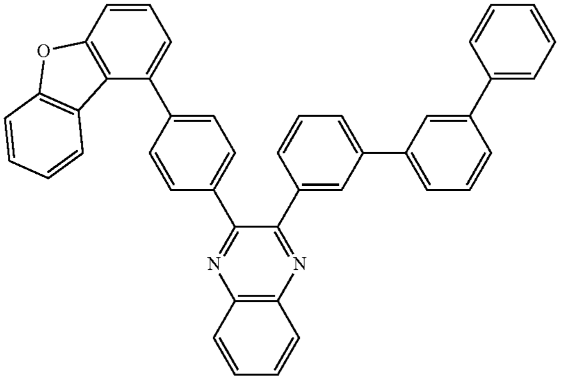
C-148
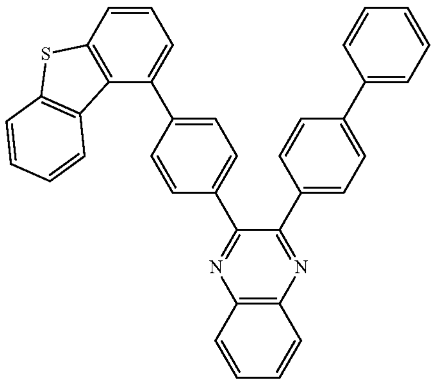
-continued
C-149
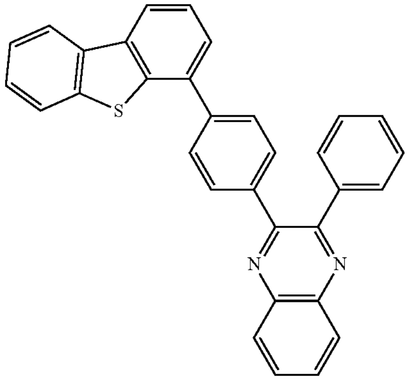
C-150
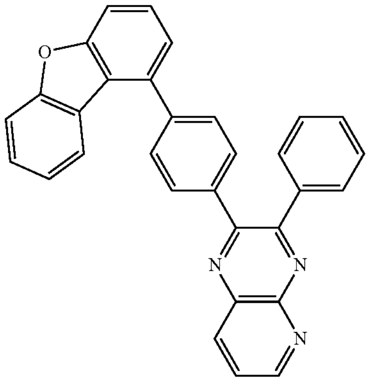
C-151
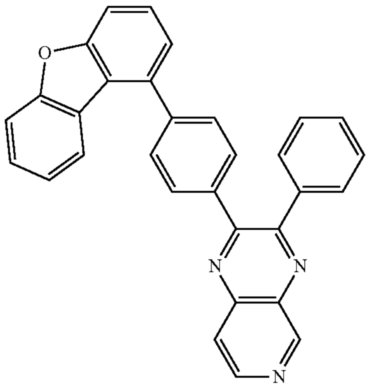
C-152
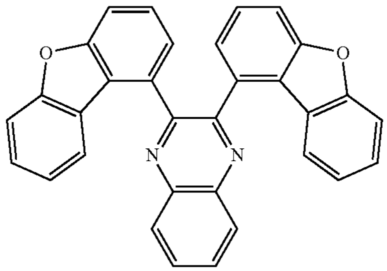

-continued
C-153
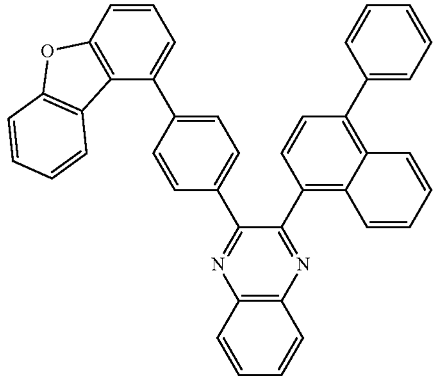
C-154
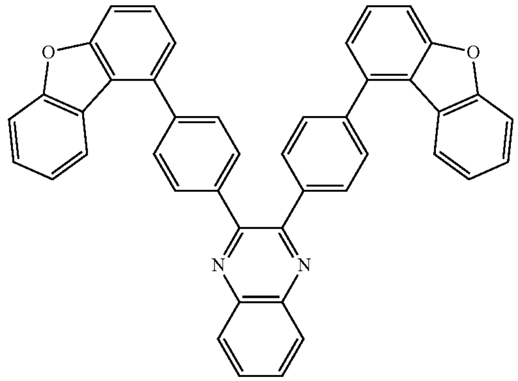
C-155
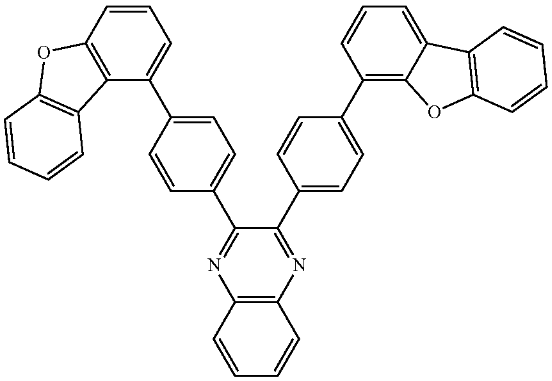
C-156
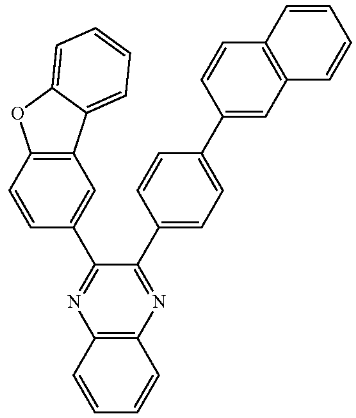
C-157
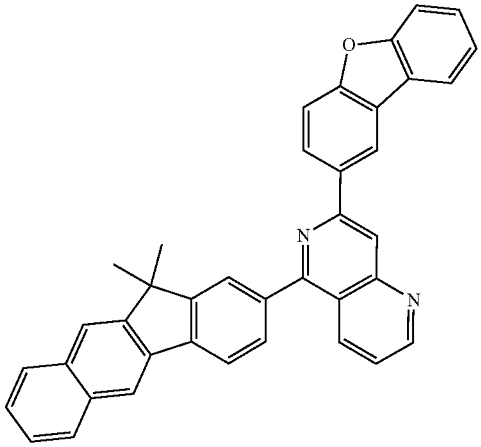
C-158
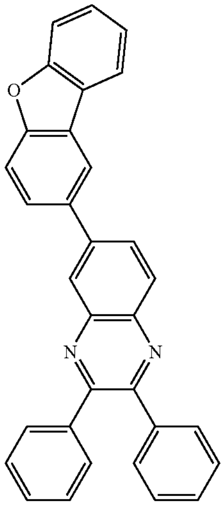

-continued
C-159
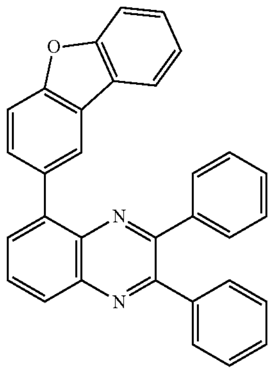
C-160
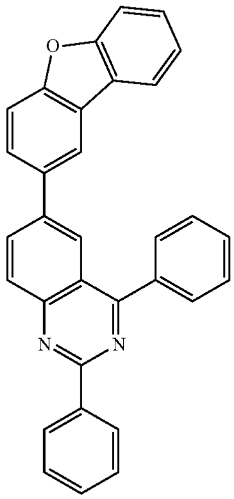
C-161
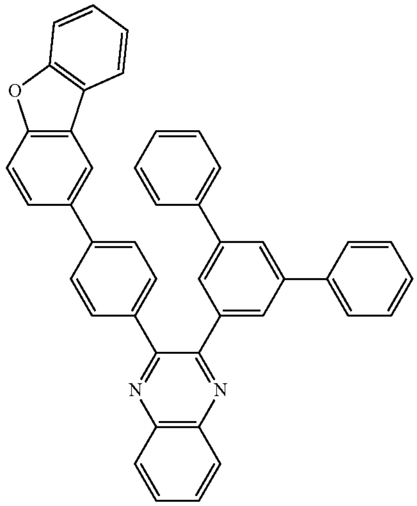
-continued
C-162
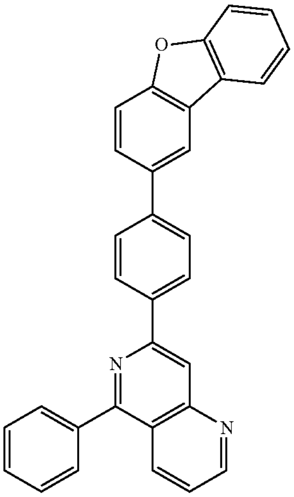
C-163
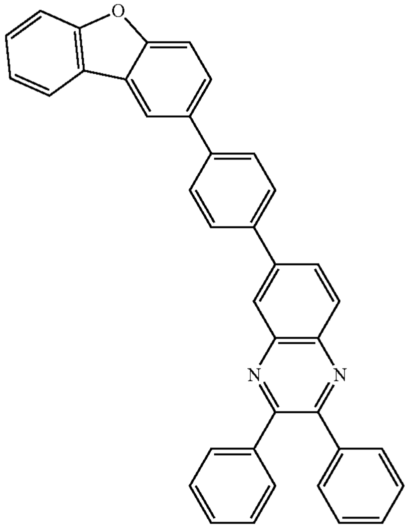
C-164
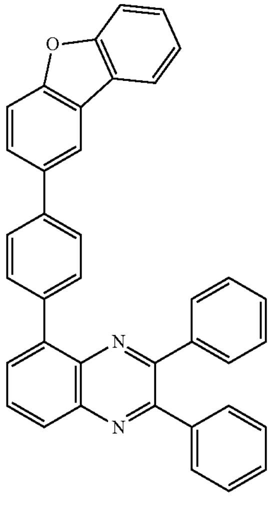

-continued
C-165
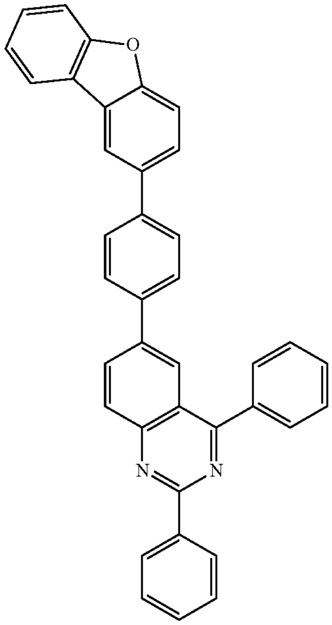
C-166
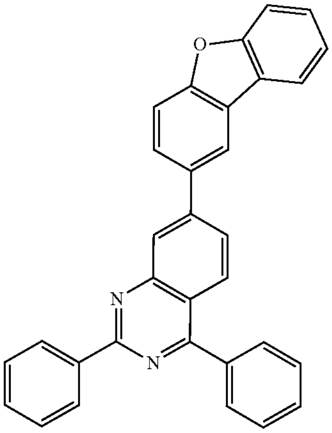
C-167
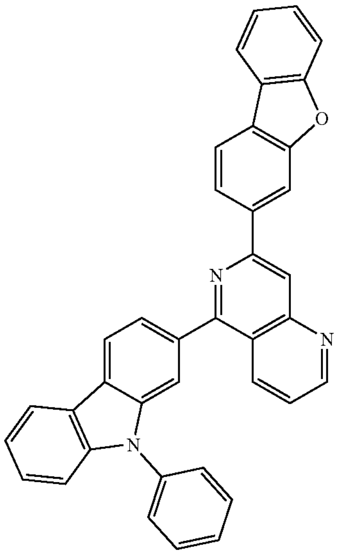
-continued
C-168
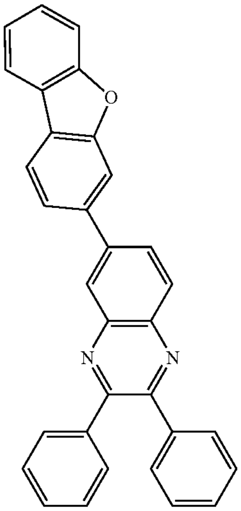
C-169
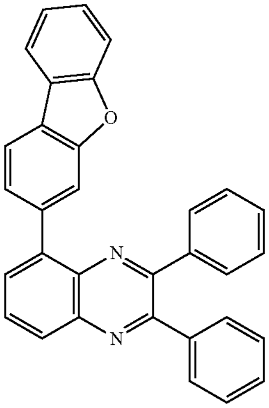
C-170
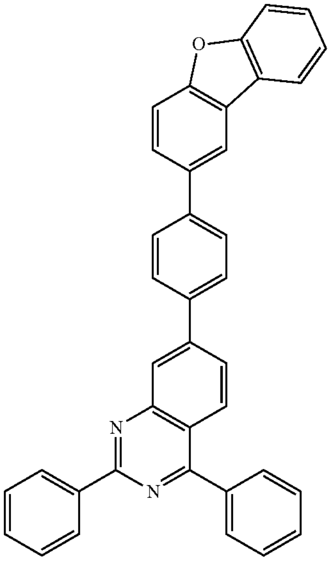

-continued
C-171
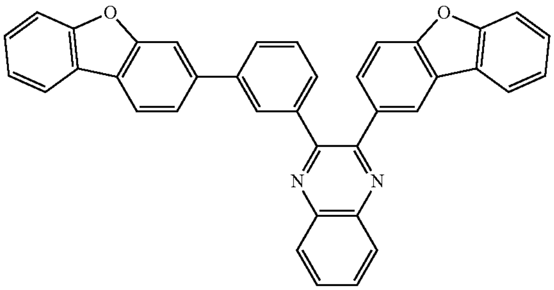
C-172
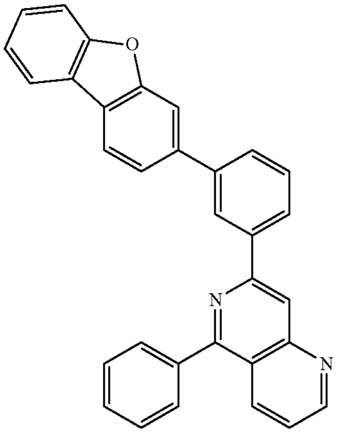
C-173
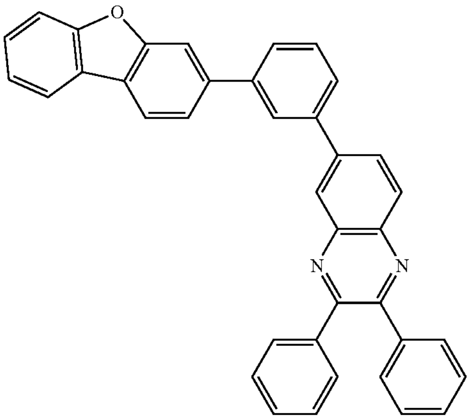
C-174
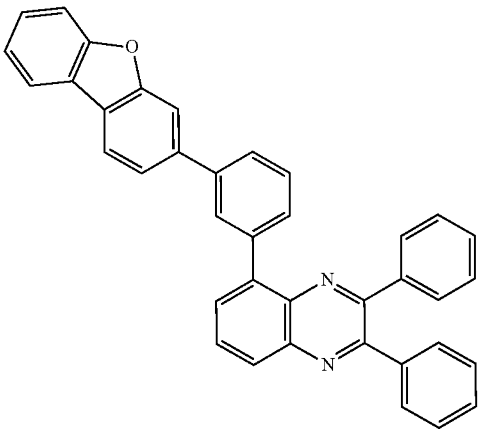
-continued
C-175
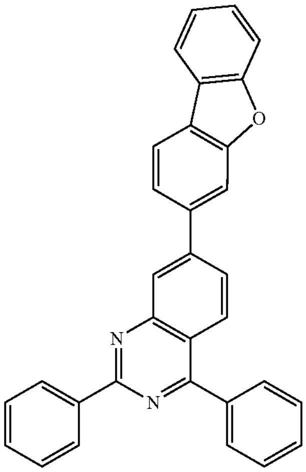
C-176
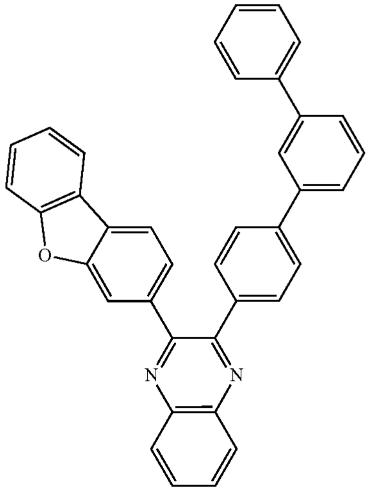
C-177
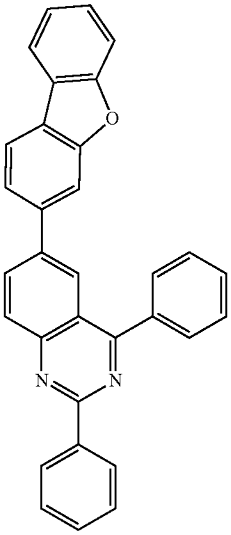

-continued
C-178
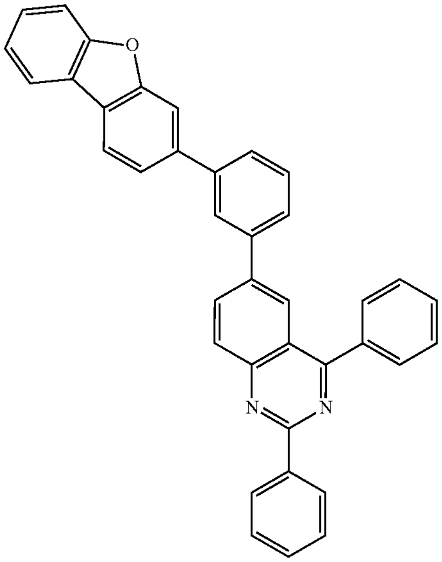
C-179
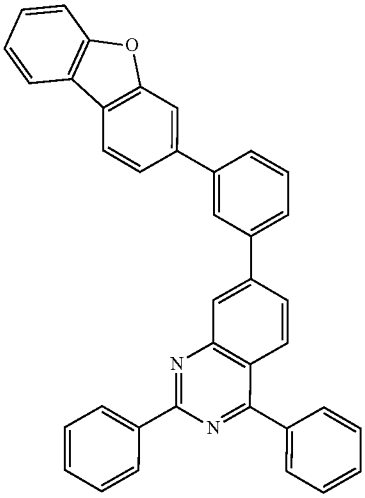
C-180
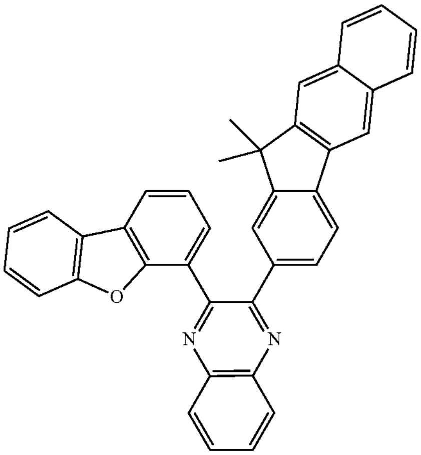
-continued
C-181
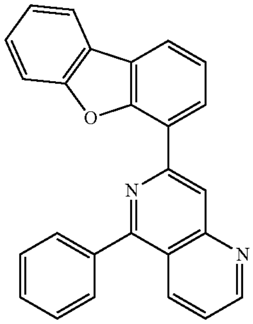
C-182
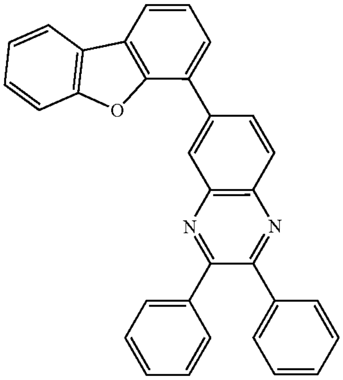
C-183
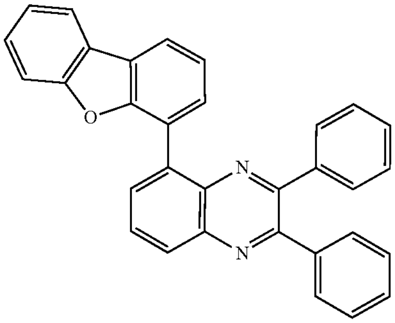
C-184
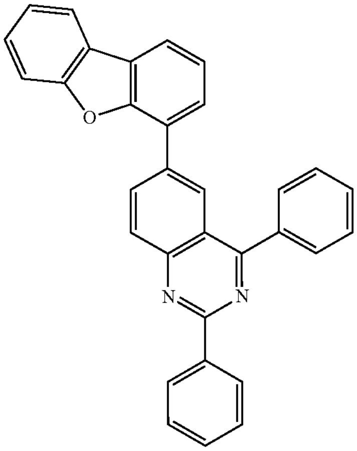

-continued
C-185
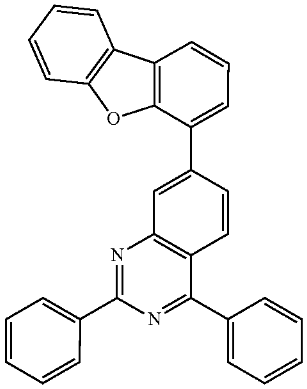
C-186
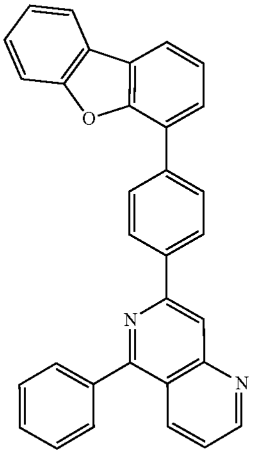
C-187
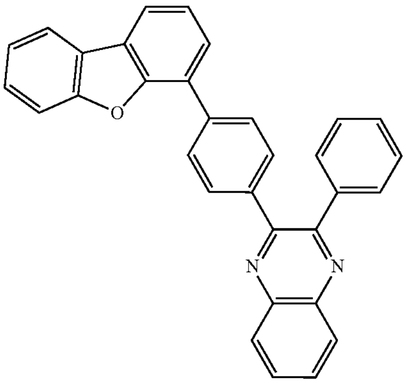
-continued
C-188
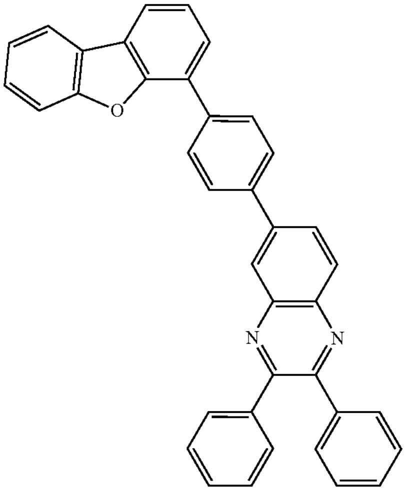
C-189
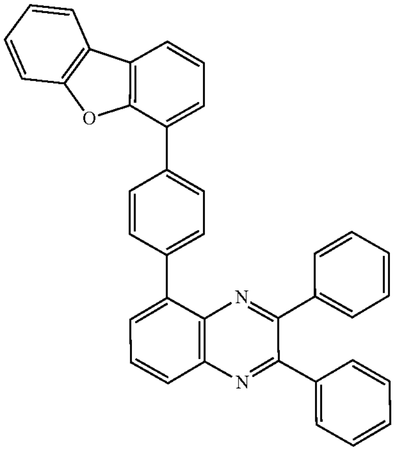
C-190
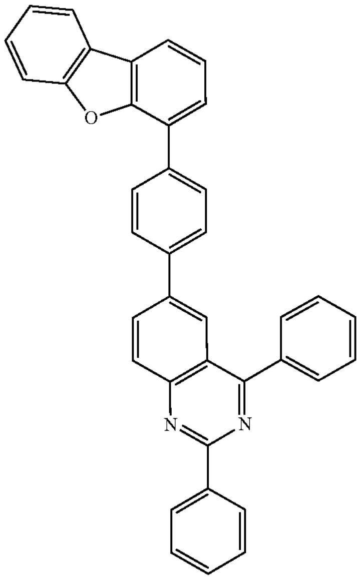

-continued
C-191
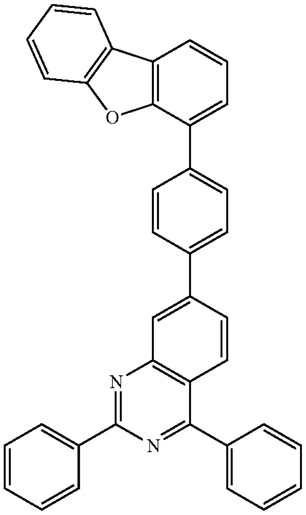
C-192
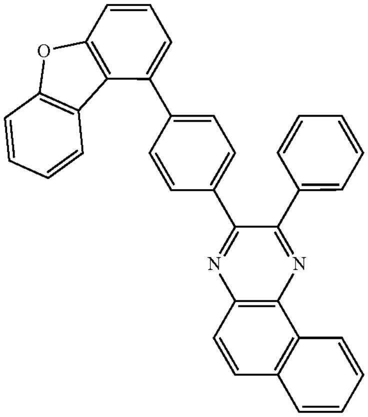
C-193
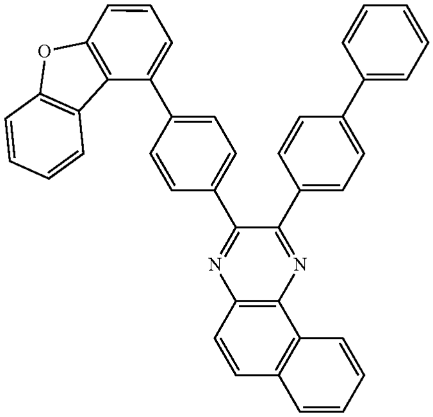
-continued
C-194
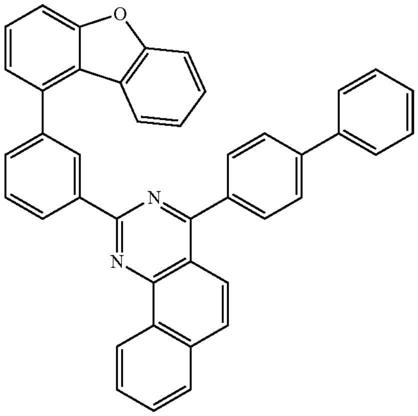
C-195
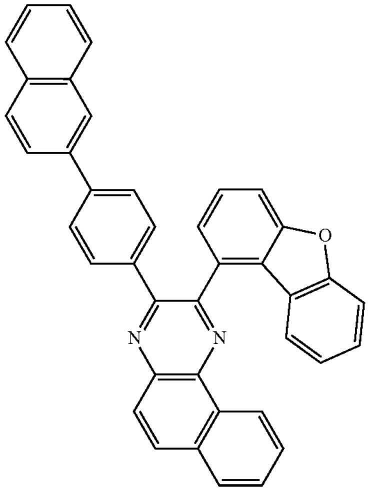
C-196
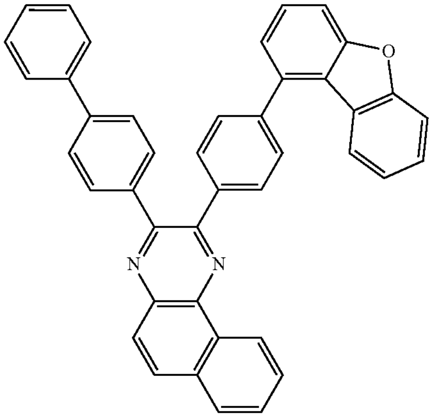

-continued
C-197
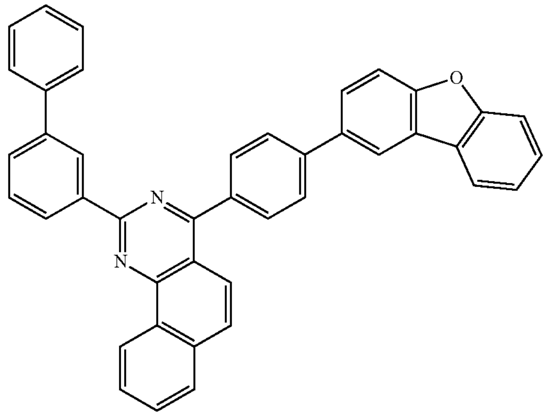
C-198
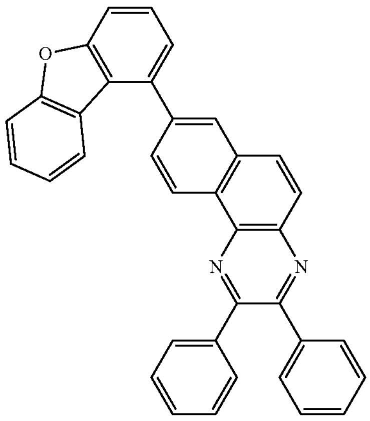
C-199
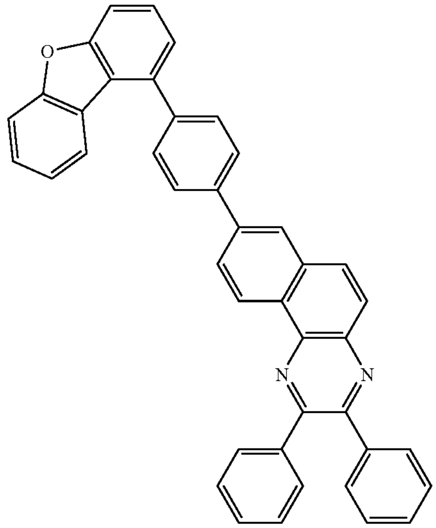
-continued
C-200
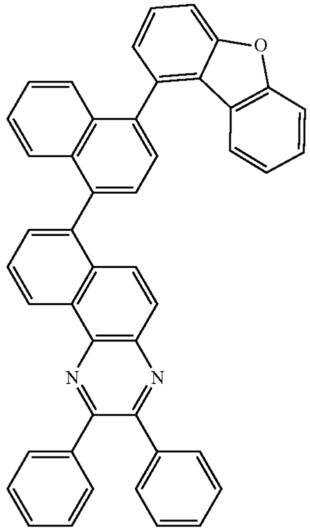
C-201
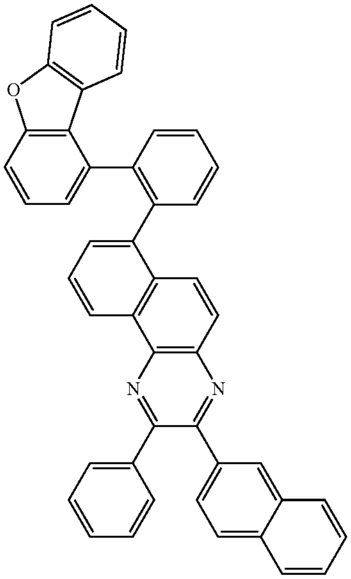
C-202
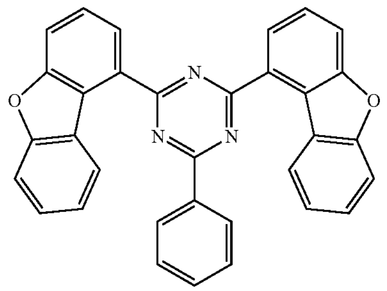

-continued
C-203
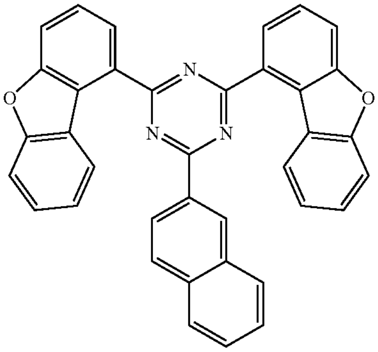
C-204
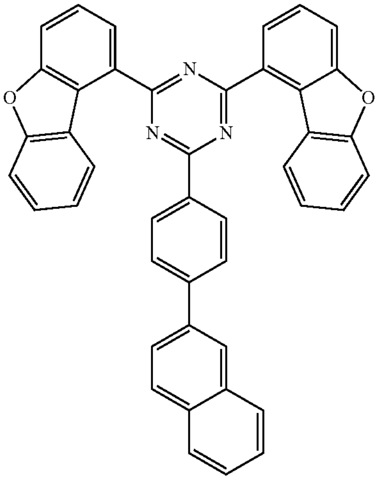
C-205
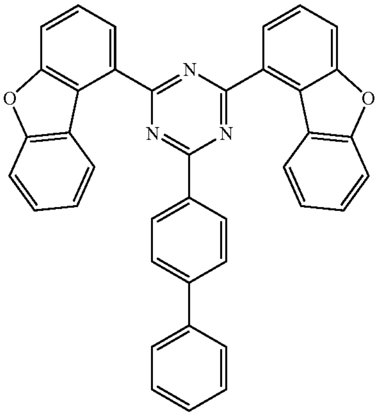
C-206
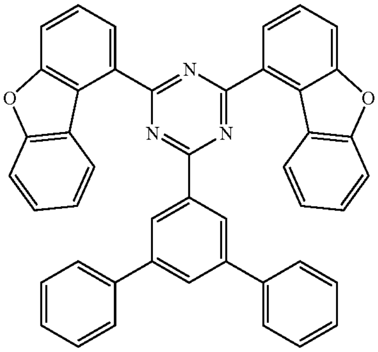
-continued
C-207
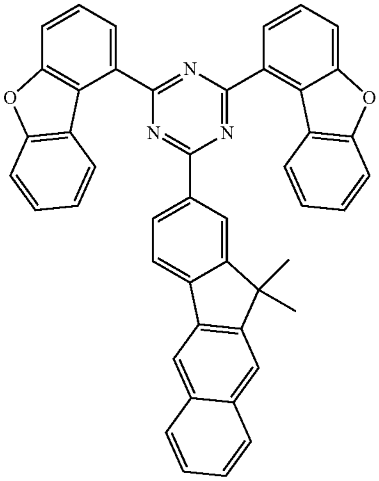
C-208
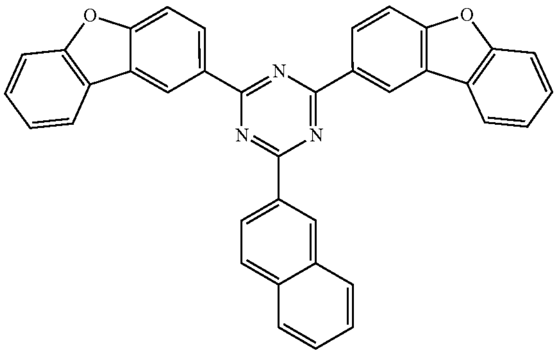
C-209
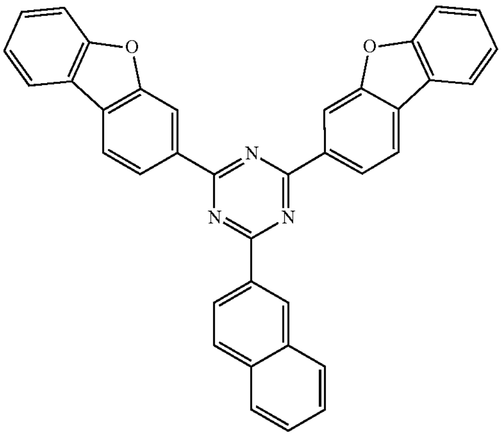

-continued
C-210
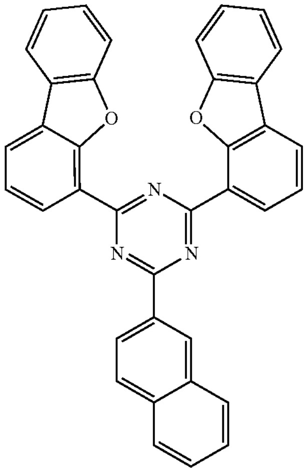
C-211
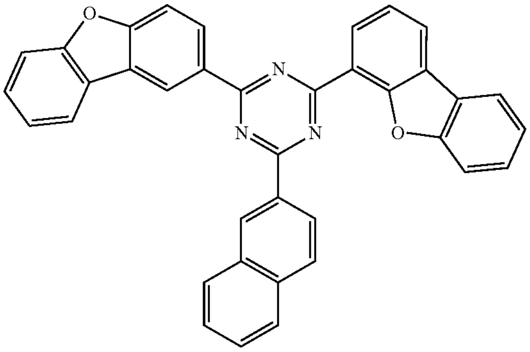
C-212
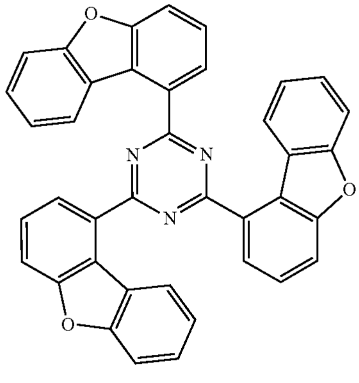
C-213
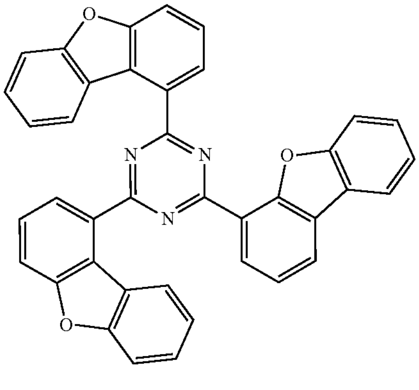
-continued
C-214
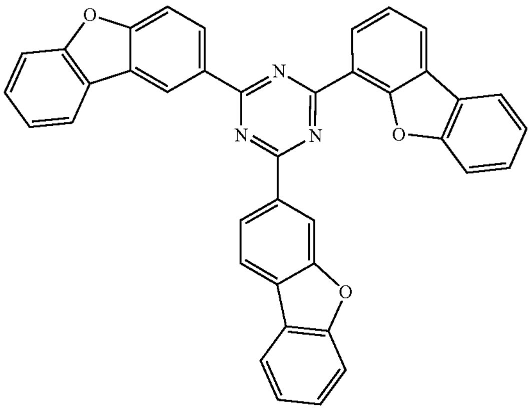
C-215
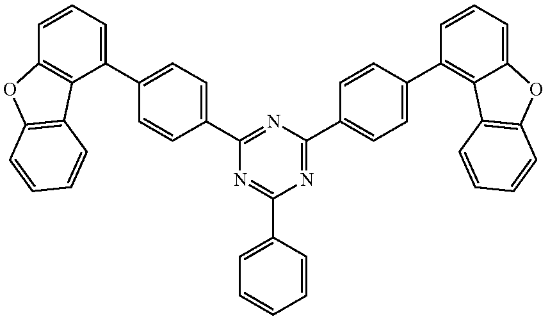
C-216
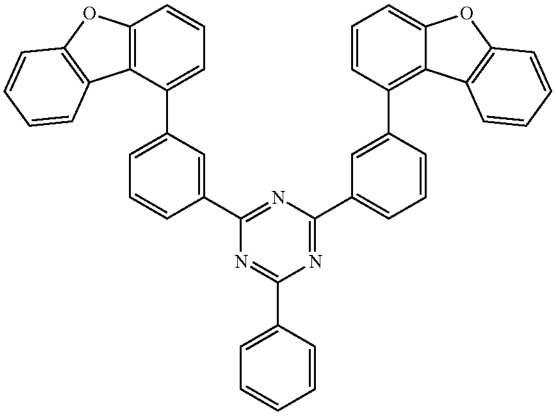
C-217
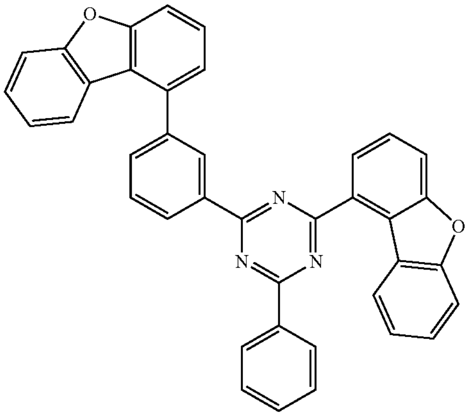

C-218
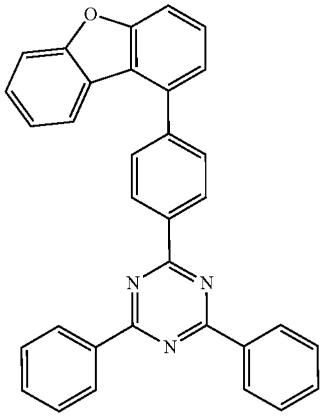
C-219
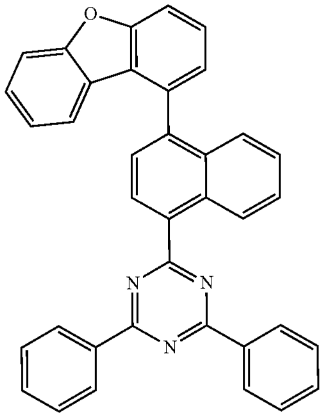
C-220
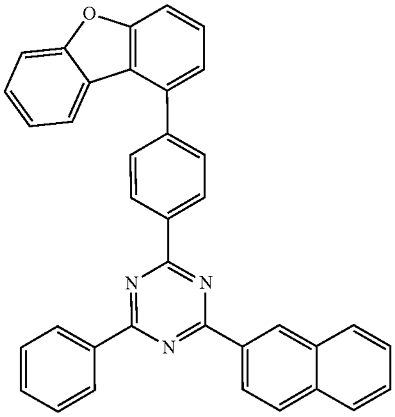
C-221
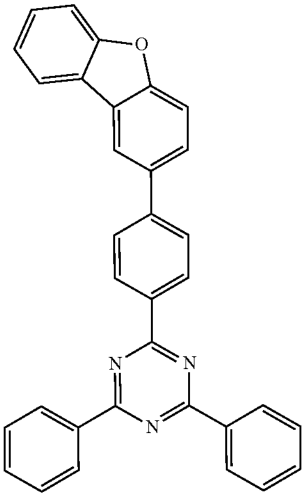
C-222
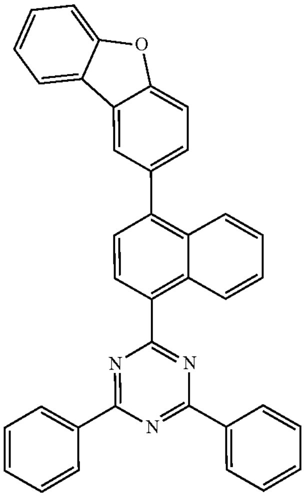
C-223
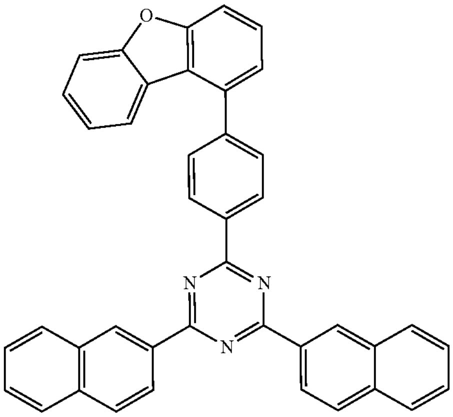

-continued
C-224
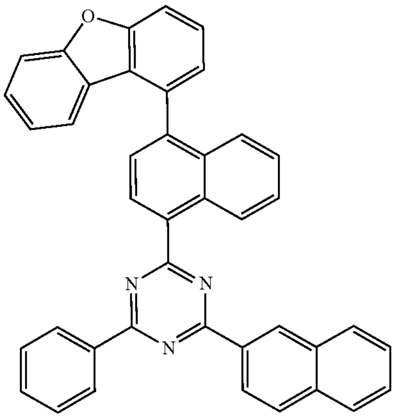
C-225
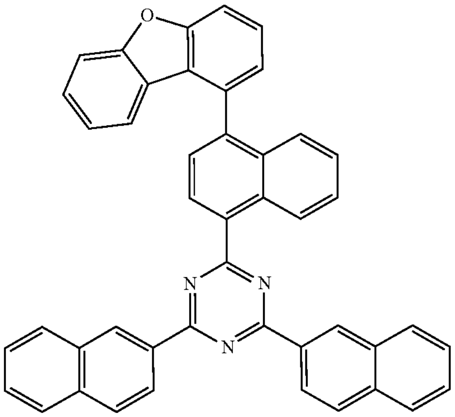
C-226
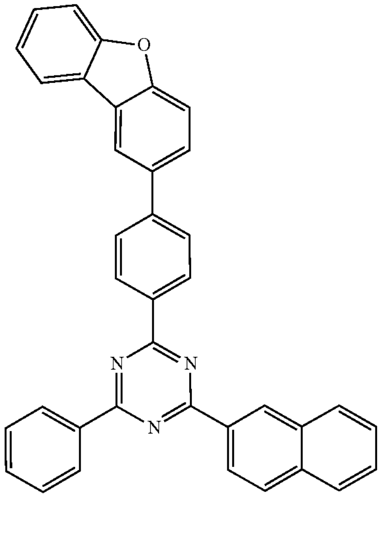
-continued
C-227
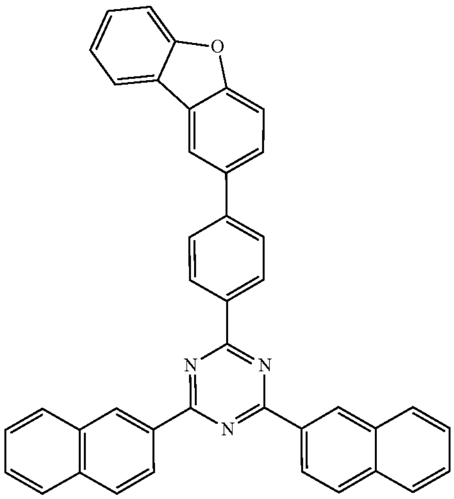
C-228
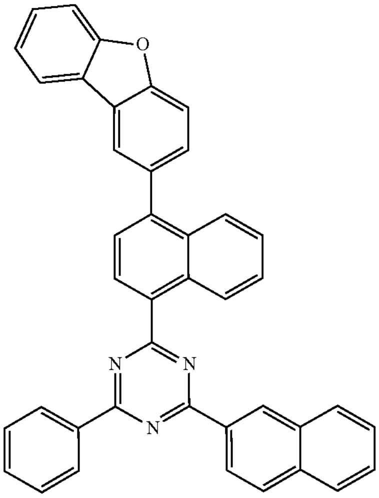
C-229
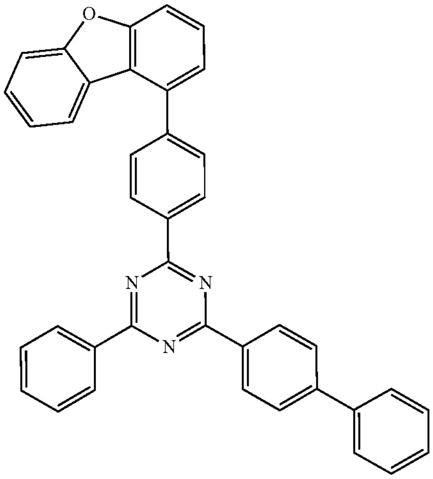

-continued
C-230
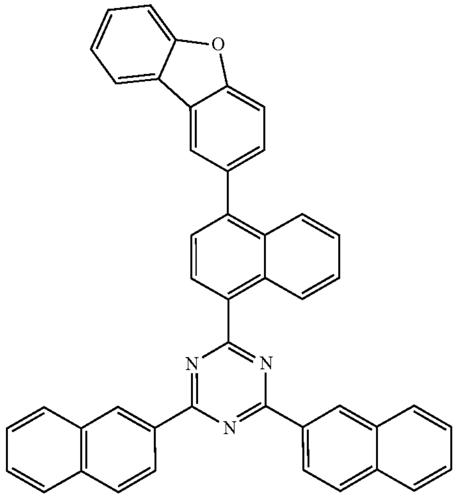
C-231
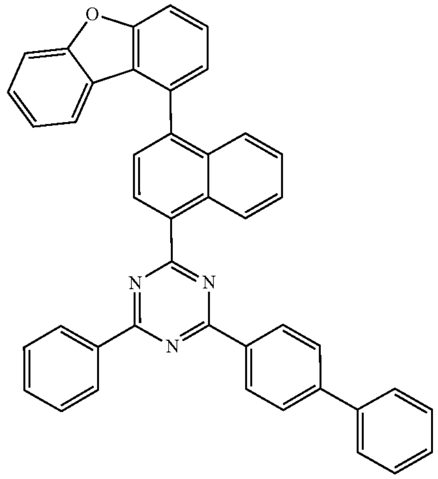
C-232
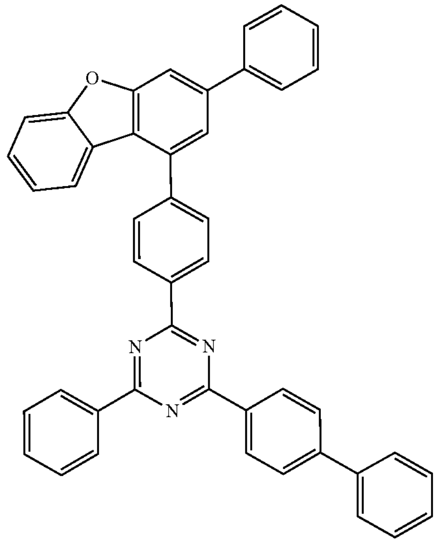
-continued
C-233
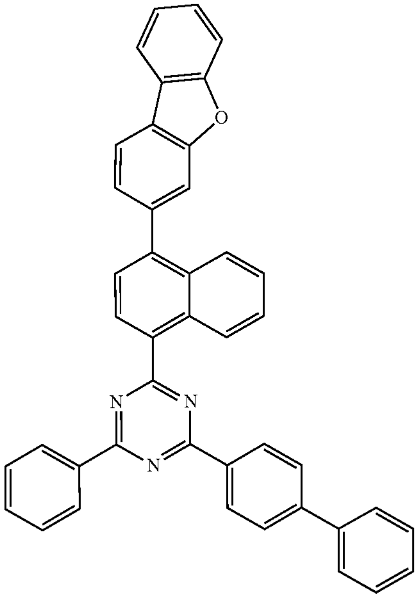
C-234
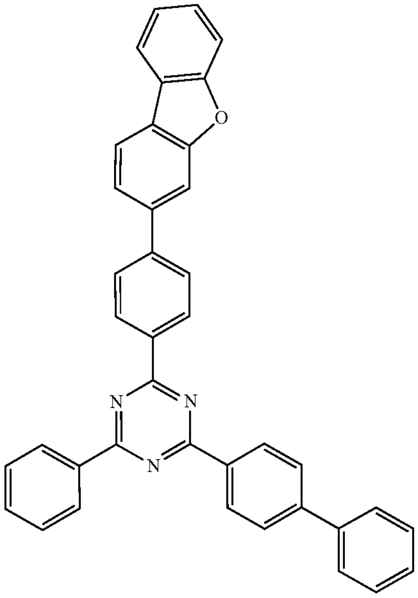

-continued
C-235
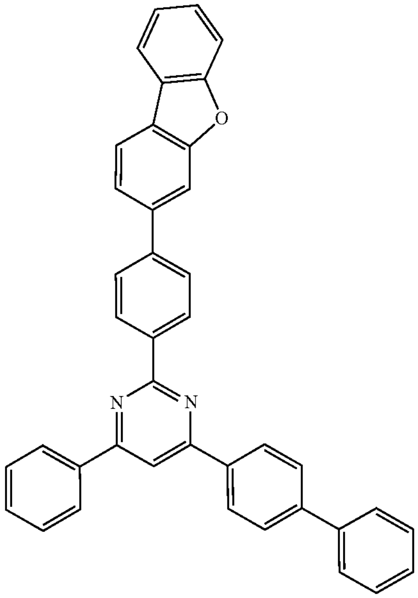
C-236
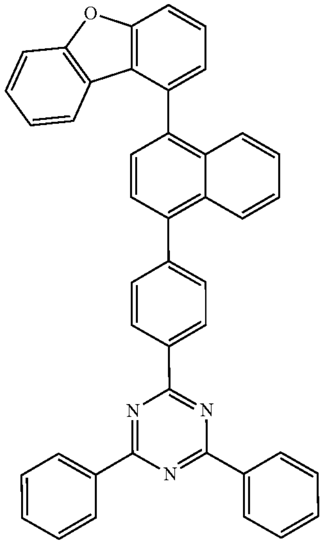
C-237
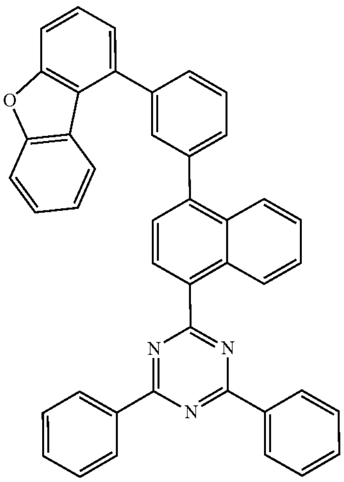
-continued
C-238
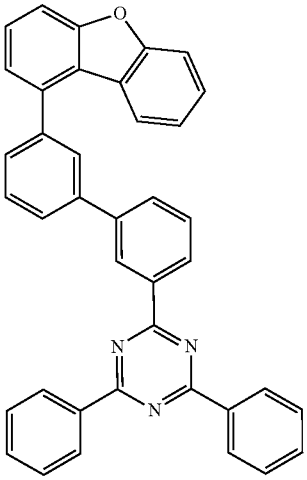
C-239
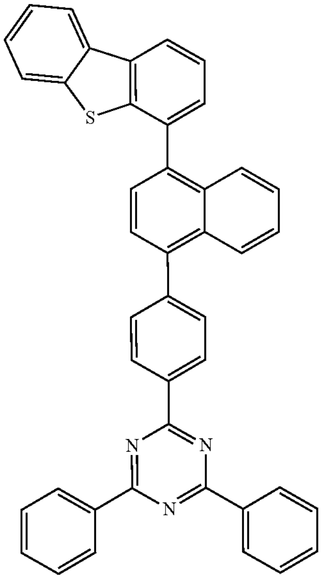
C-240
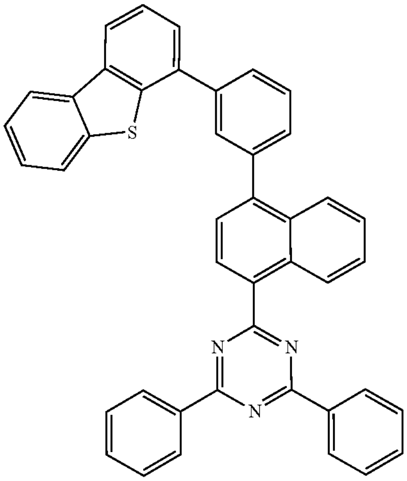

-continued
C-241
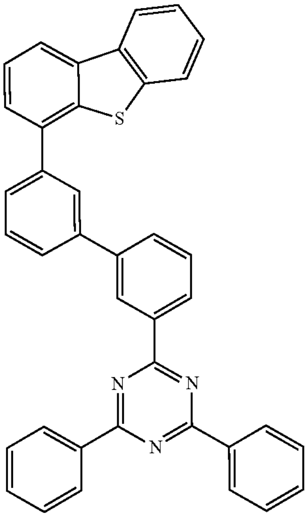
C-242
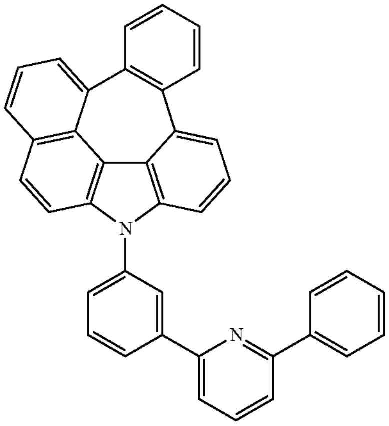
C-243
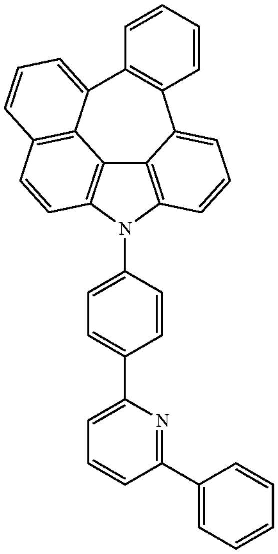
-continued
C-244
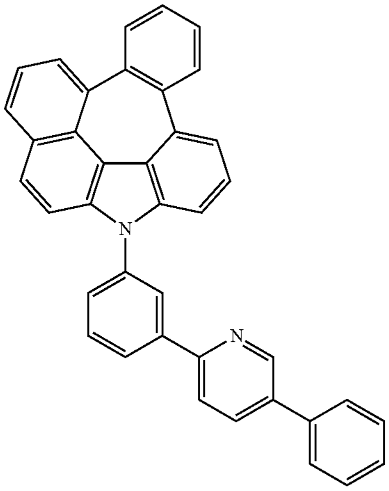
C-245
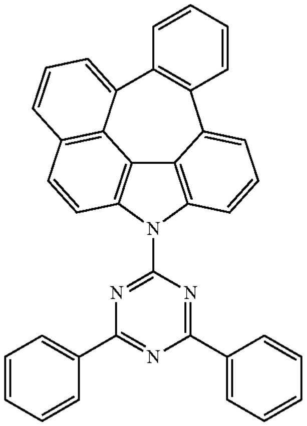
C-246
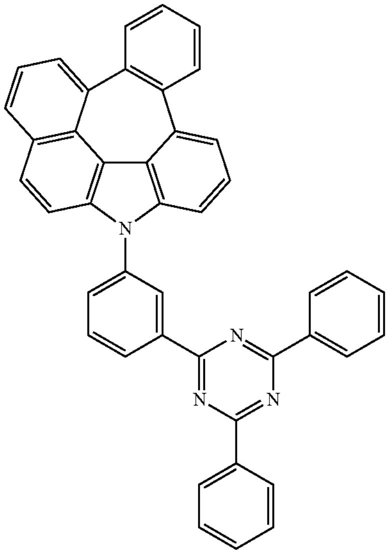

-continued
C-247
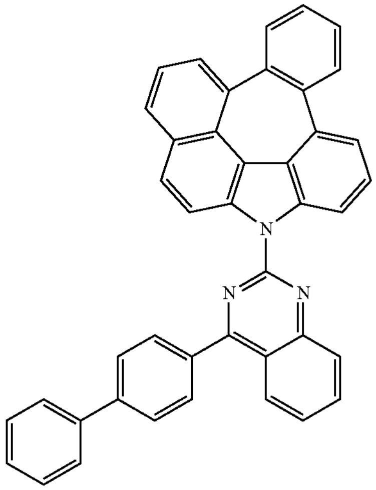
C-248
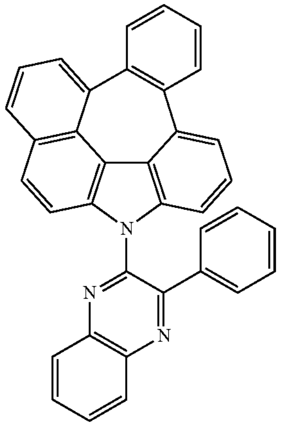
C-249
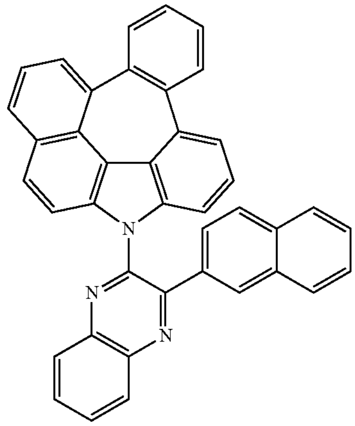
-continued
C-250
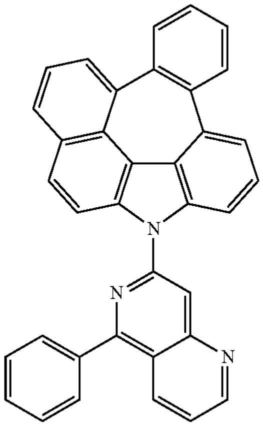
C-251
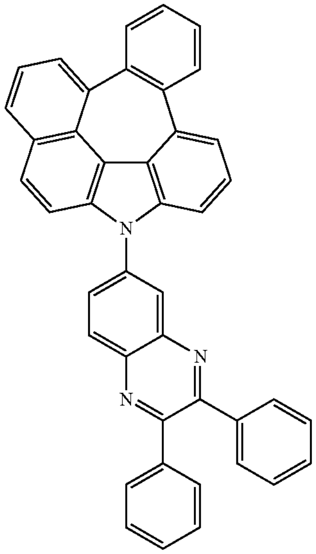
C-252
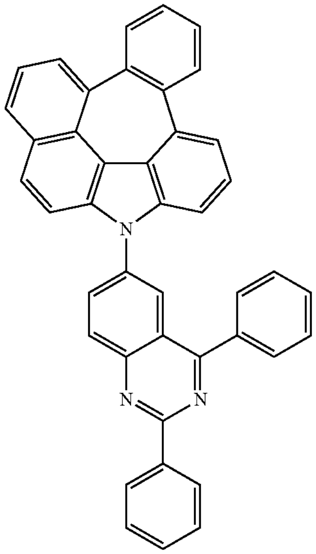

-continued
C-253
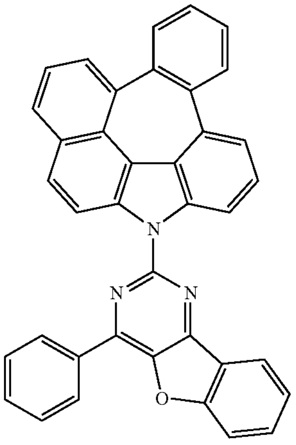
C-254
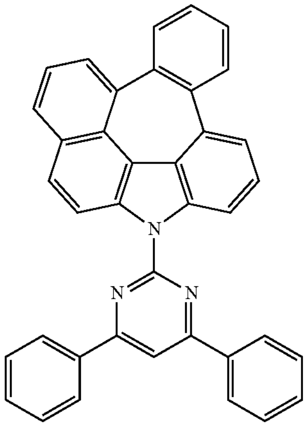
C-255
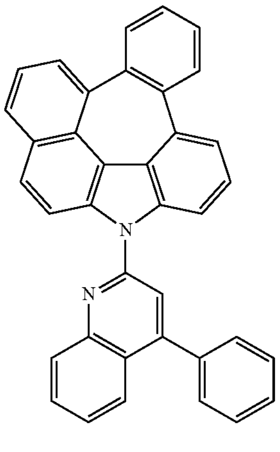
-continued
C-256
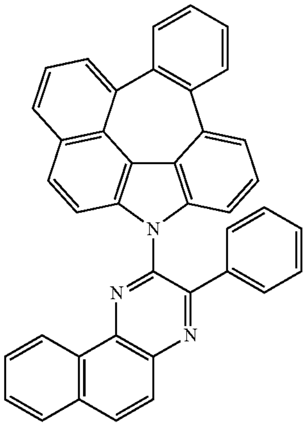
C-257
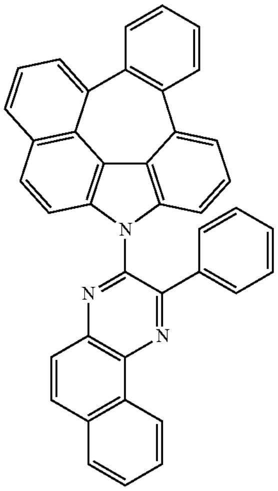
C-258
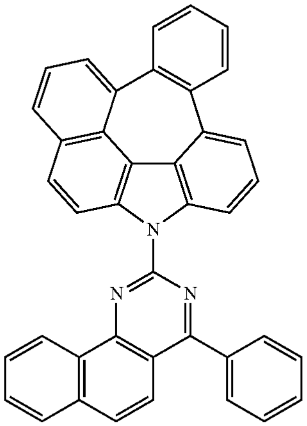

-continued
C-259
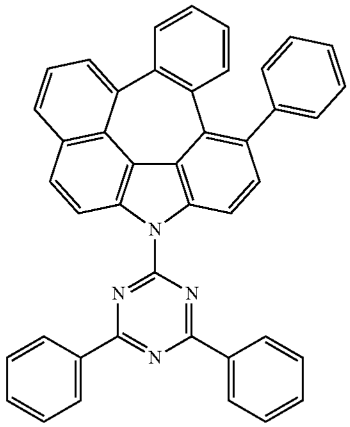
C-260
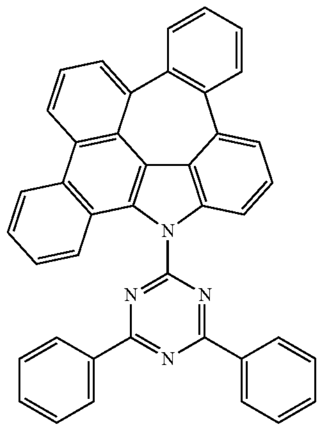
C-261
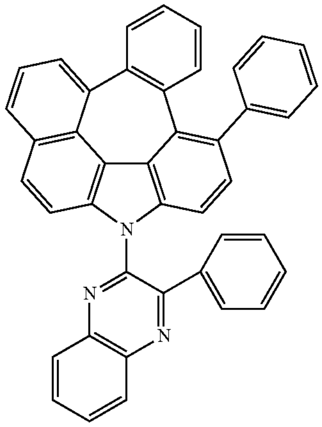
-continued
C-262
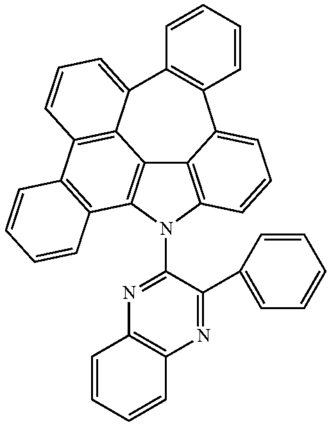
C-263
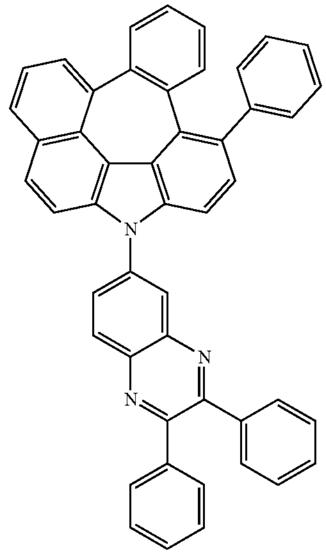
C-264
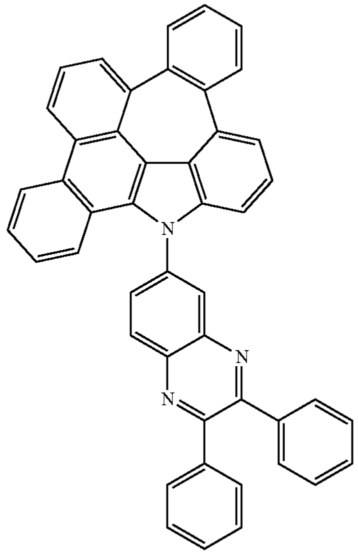

-continued
C-265
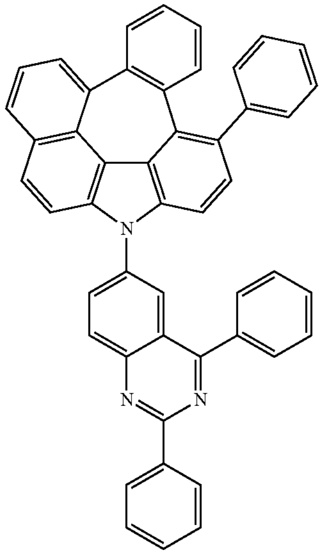
C-266
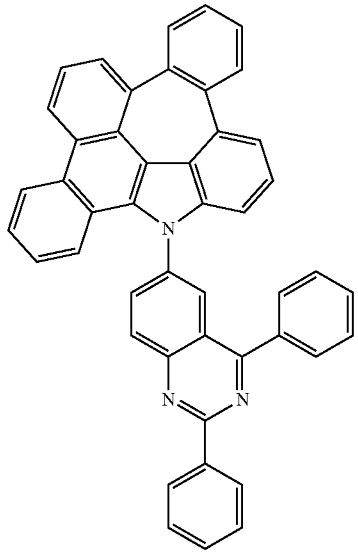
C-267
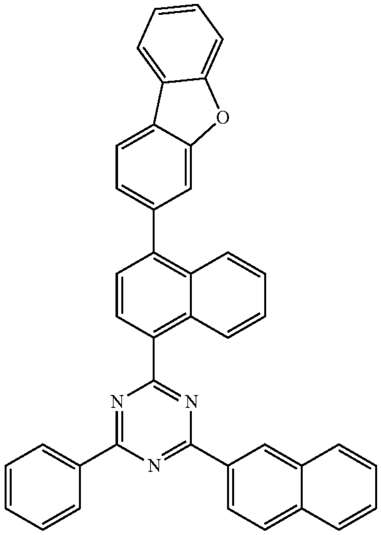
-continued
C-268
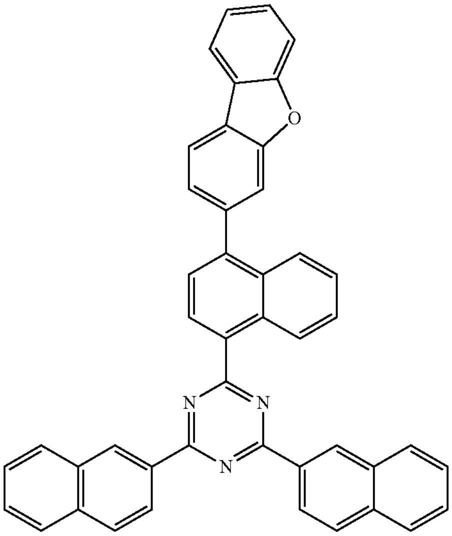
C-269
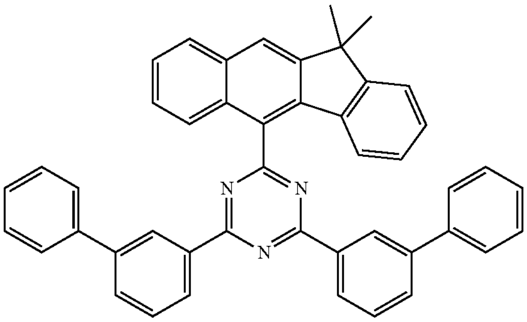
C-270
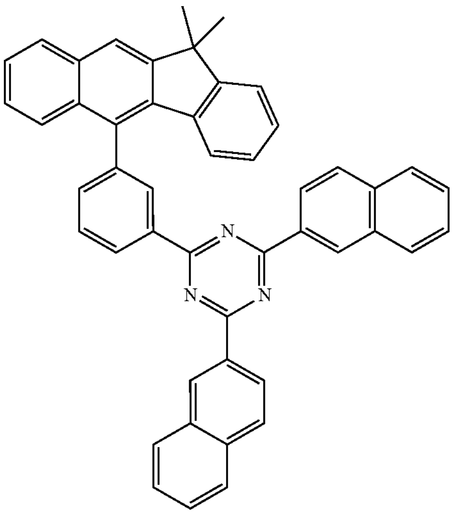

-continued
C-271
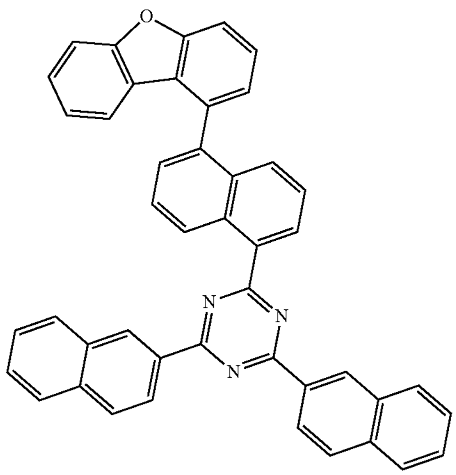
C-272
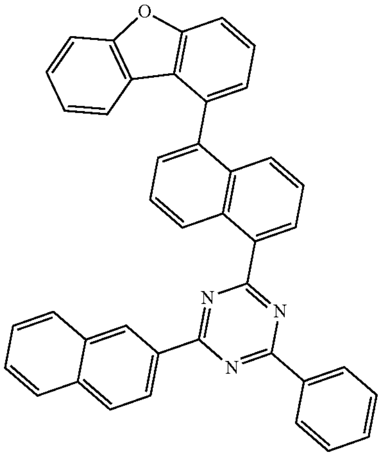
C-273
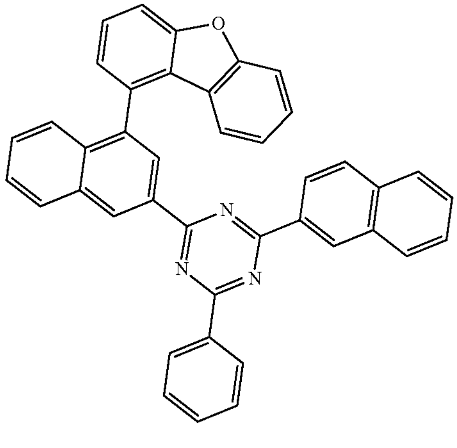
-continued
C-274
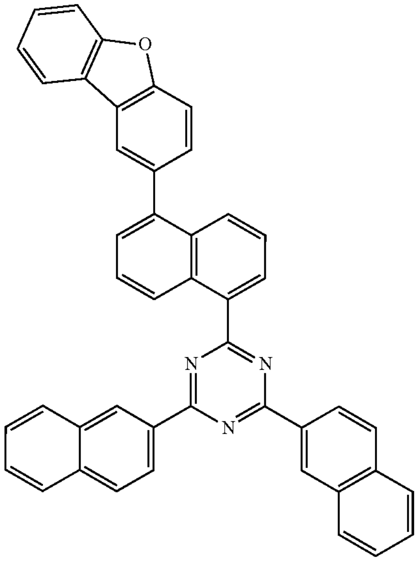
C-275
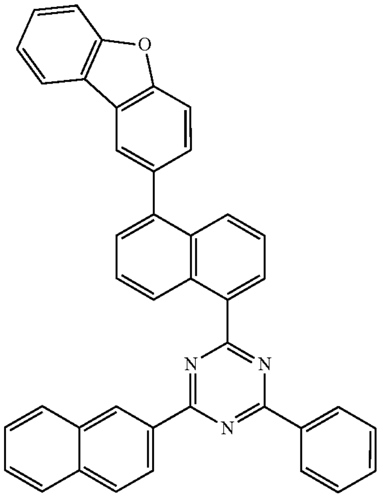
C-276
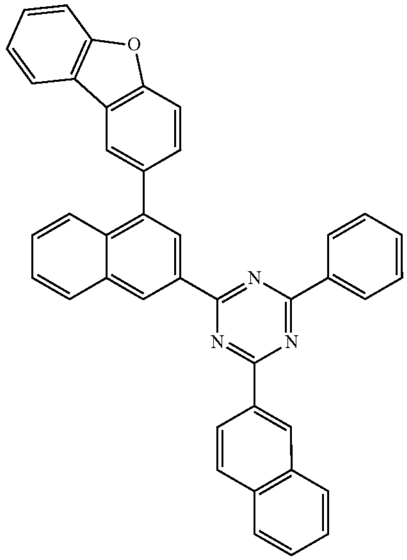

-continued
C-277
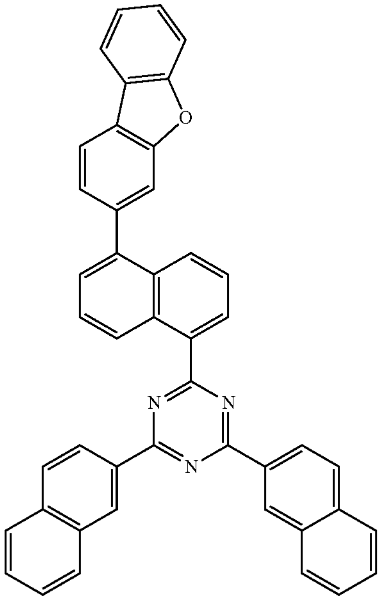
C-278
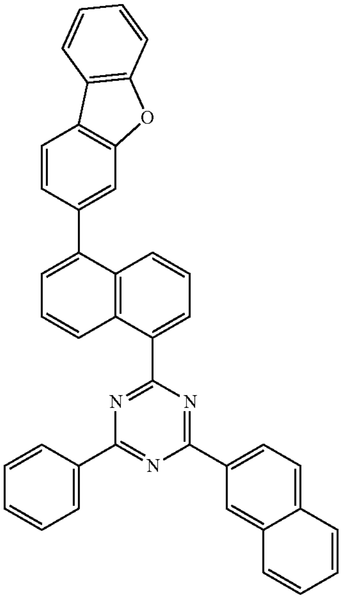
-continued
C-279
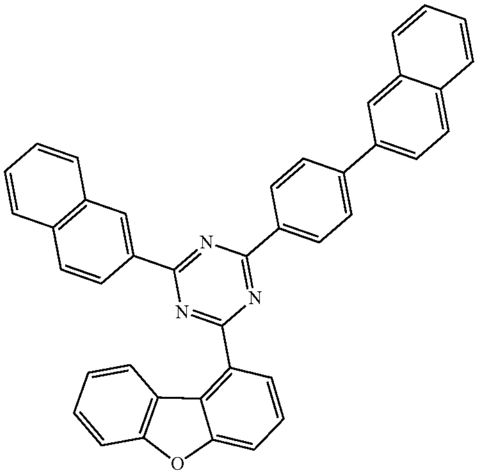
C-280
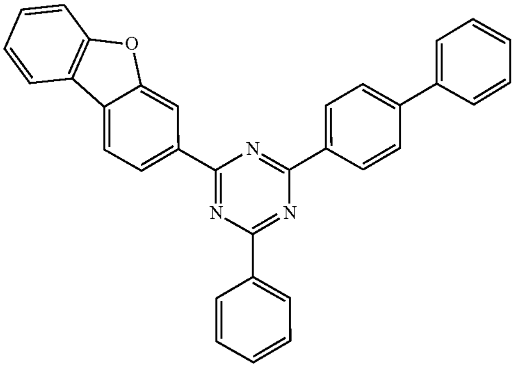
C-281
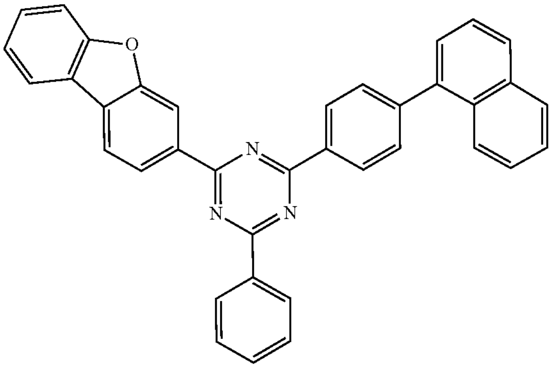

C-282
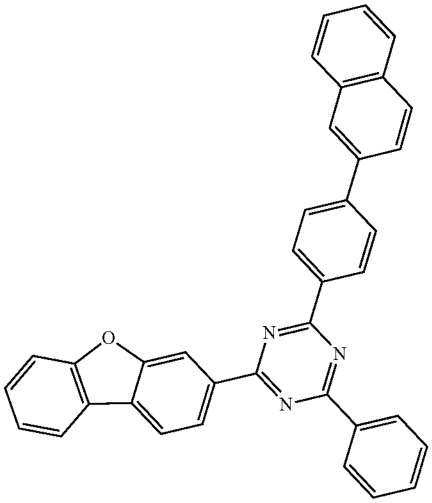
C-283
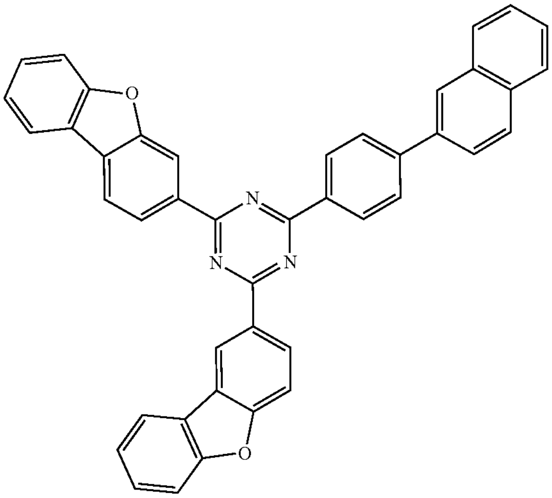
C-284
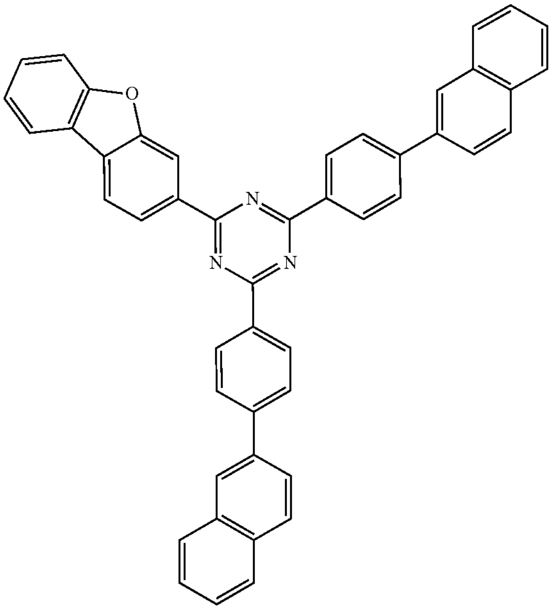
C-285
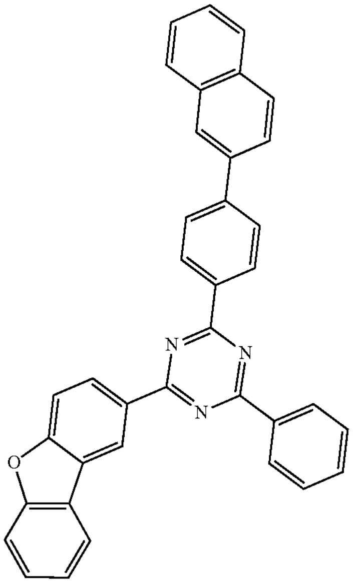
C-286
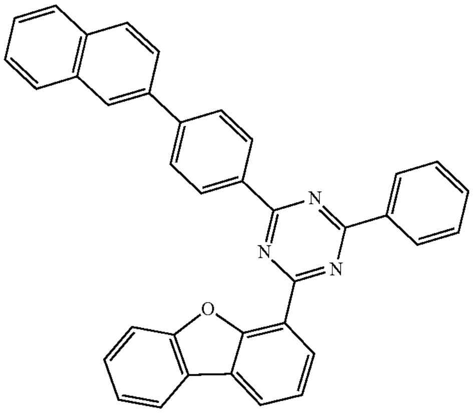
C-287
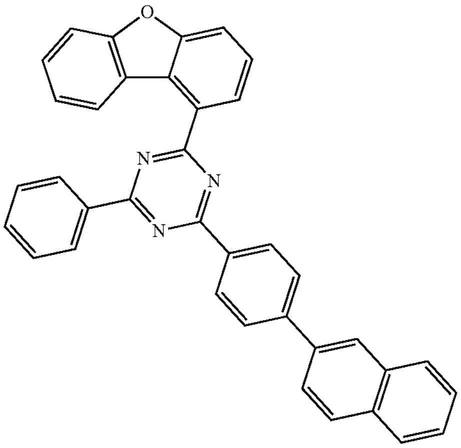

-continued
C-288
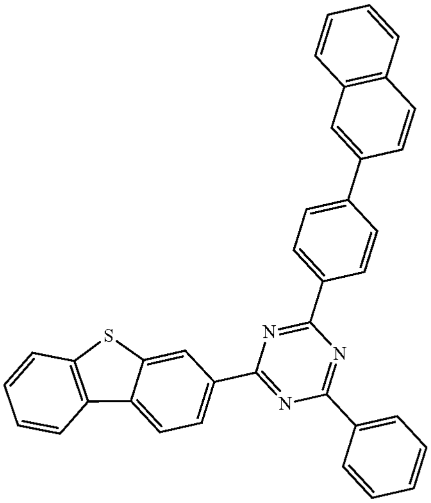
C-289
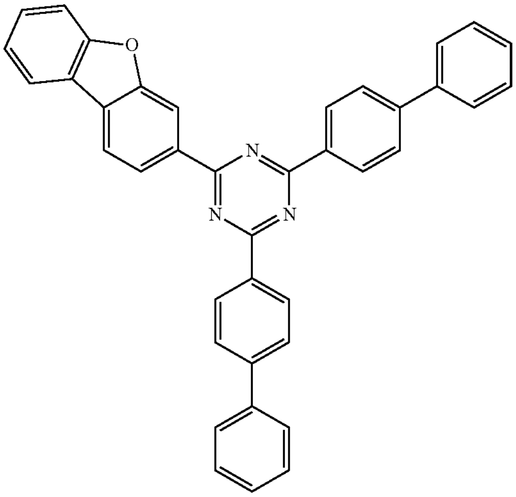
C-290
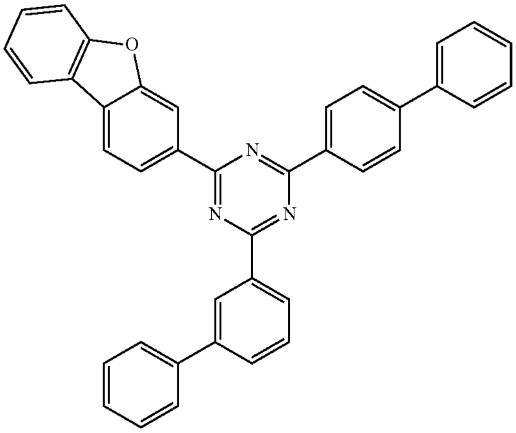
-continued
C-291
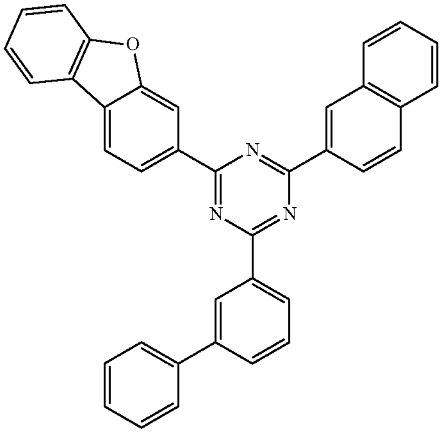
C-292
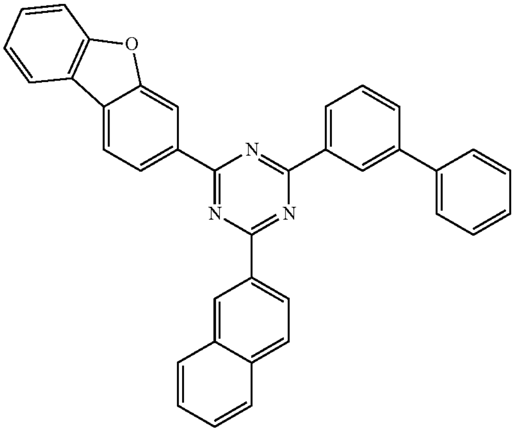
C-293
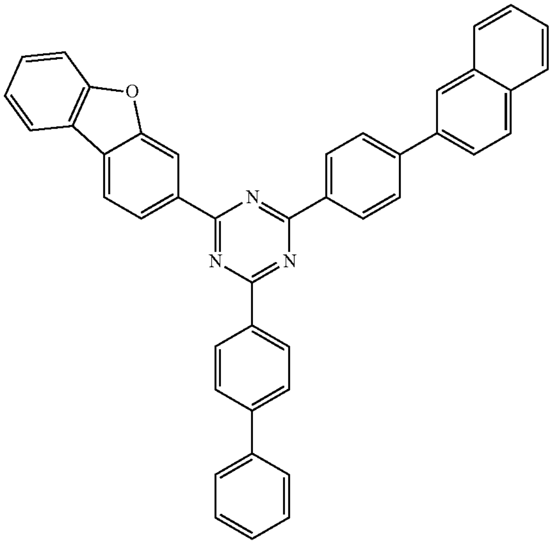

-continued
C-294
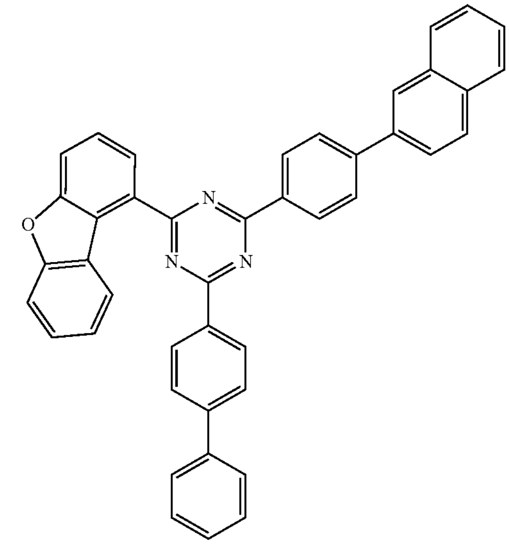
C-295
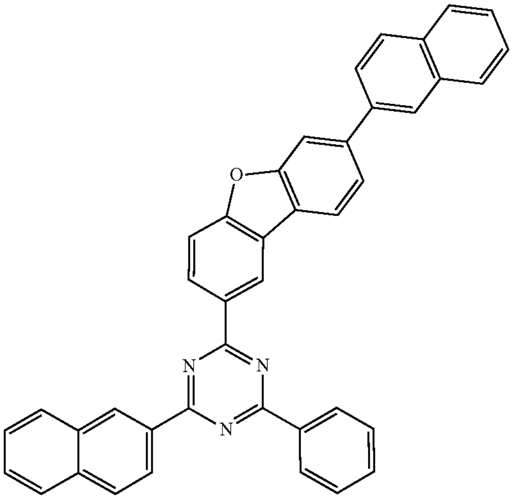
C-296
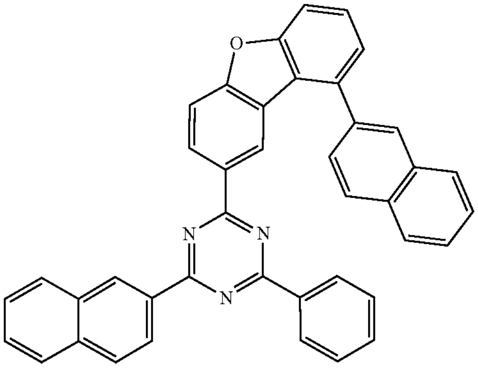
-continued
C-297
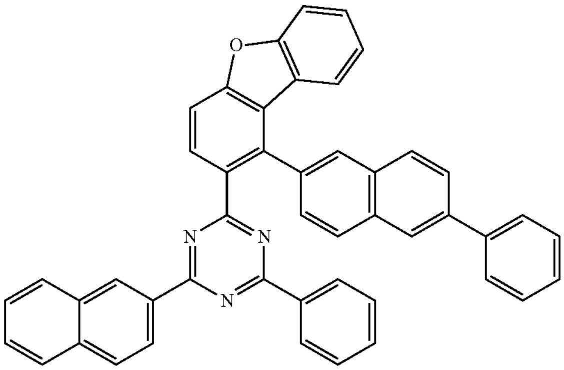
C-298
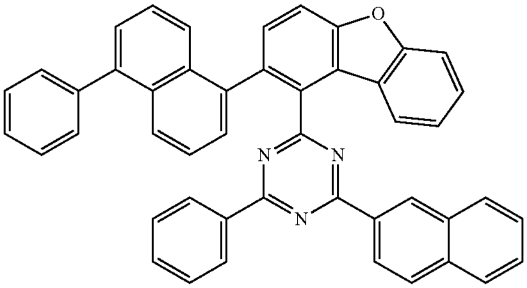
C-299
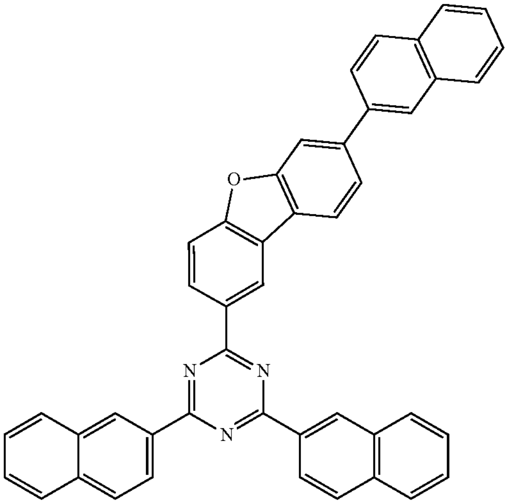
C-300
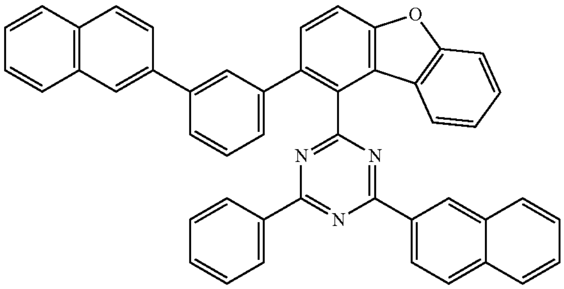

-continued
C-301
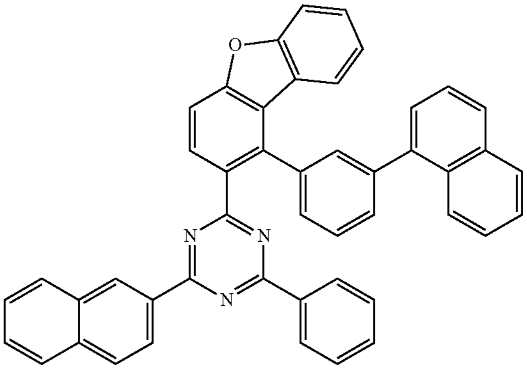
C-302
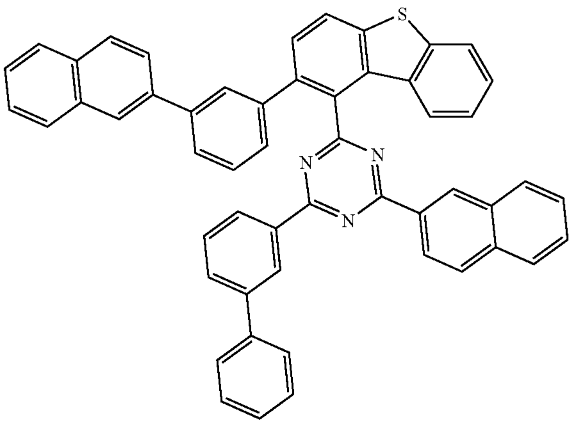
C-303
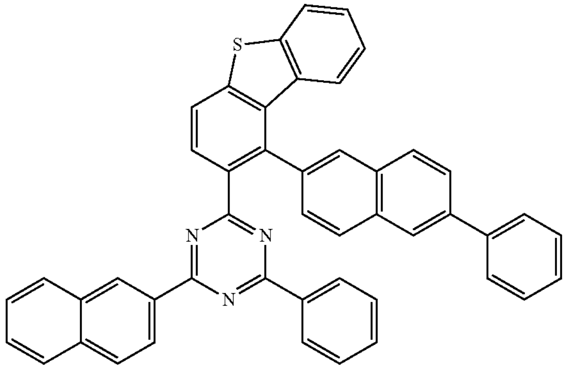
C-304
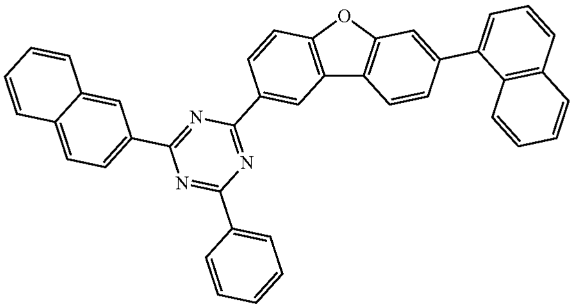
-continued
C-305
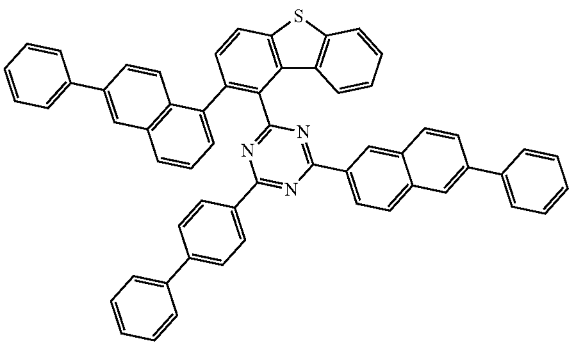
C-306
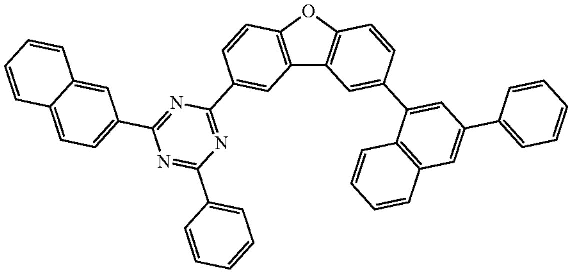
C-307
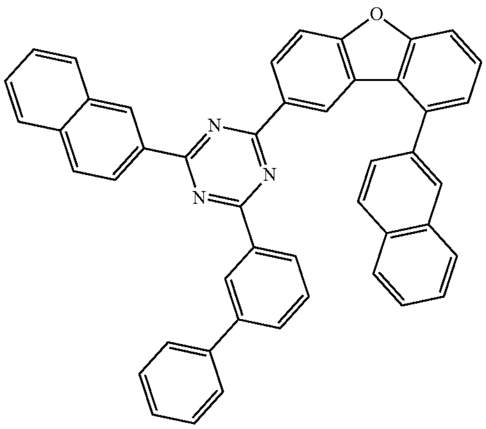
C-308
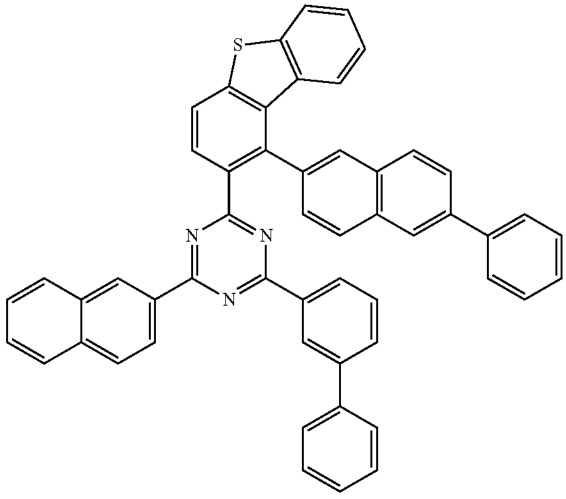

-continued
C-309
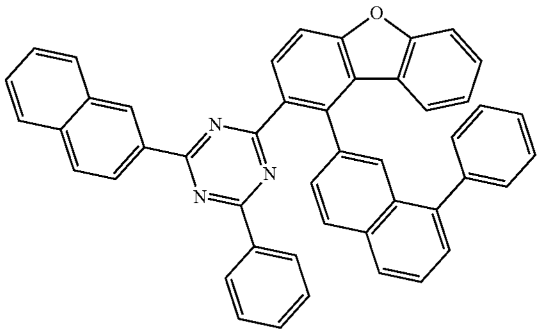
C-310
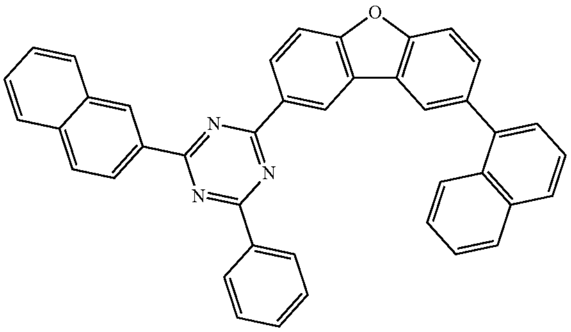
C-311
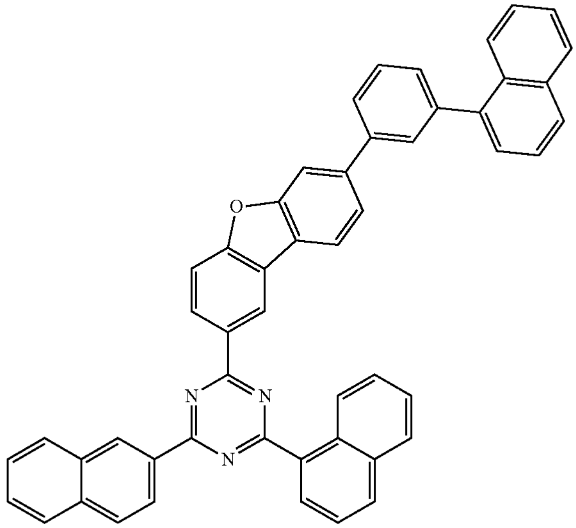
-continued
C-312
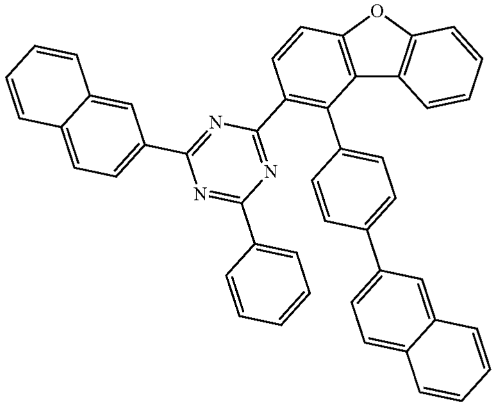
C-313
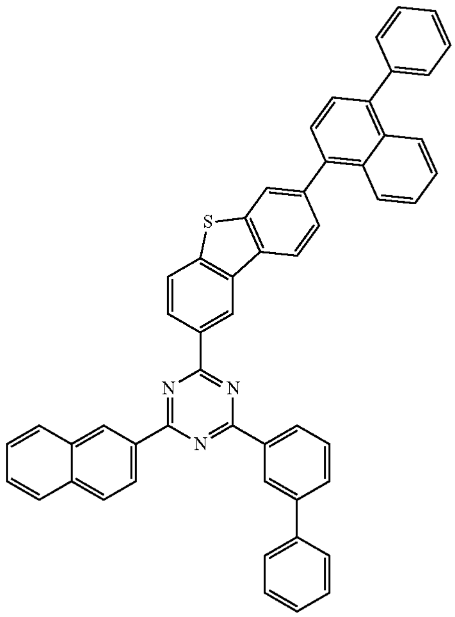
C-314
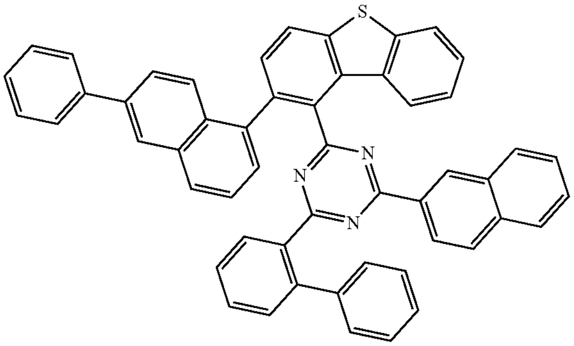

-continued
C-315
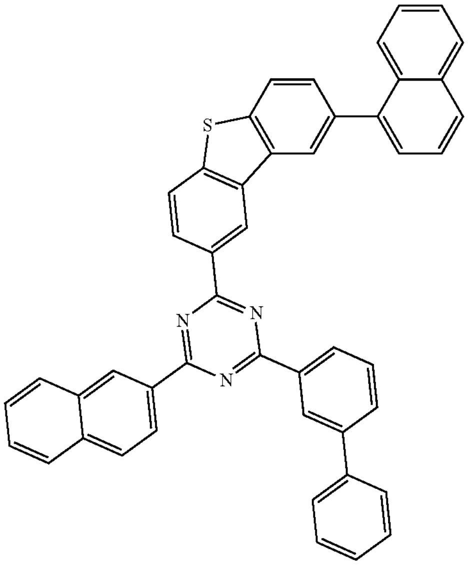
C-316
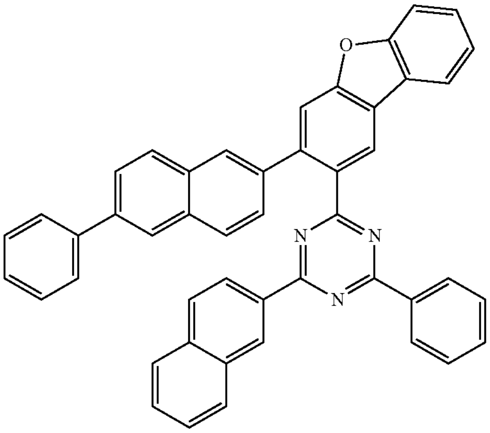
C-317
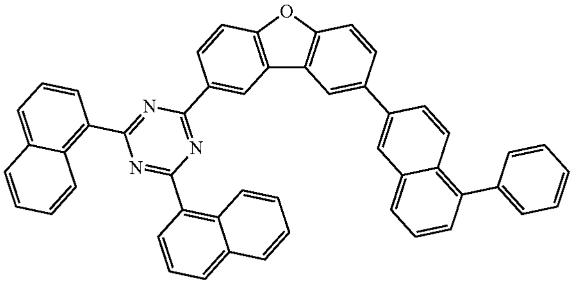
C-318
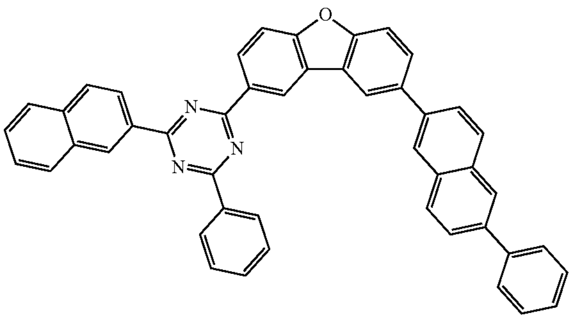
-continued
C-319
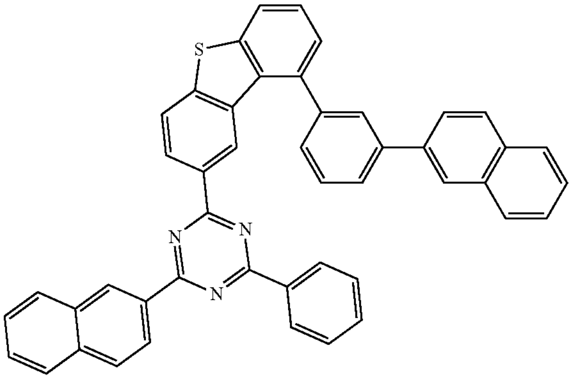
C-320
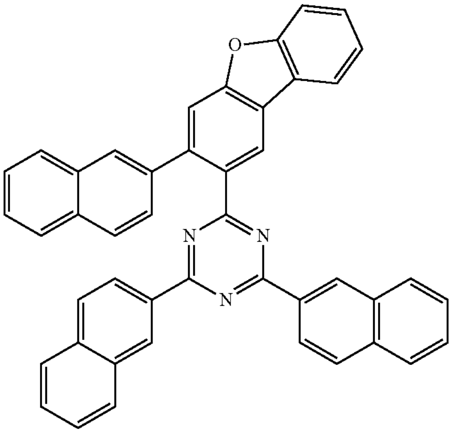
C-321
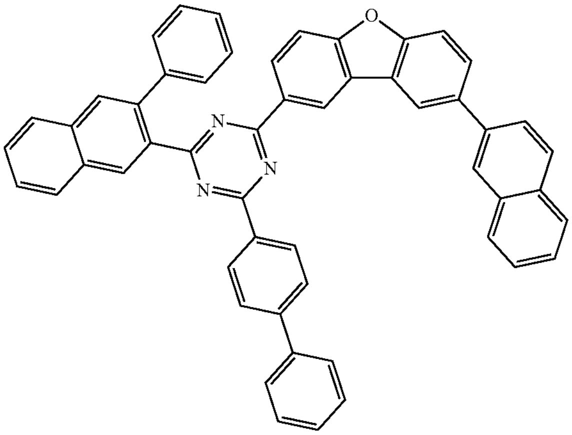

-continued

C-322

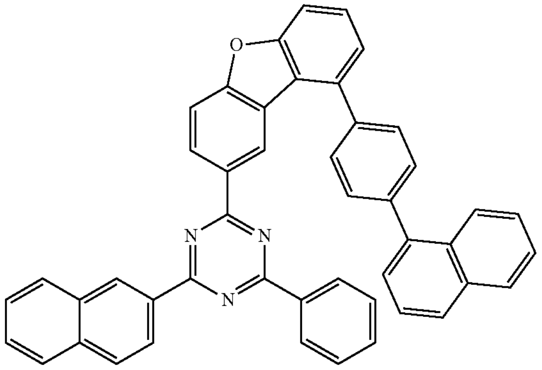

C-323

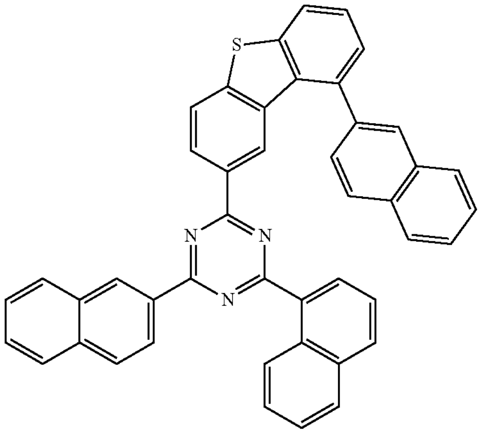

C-324

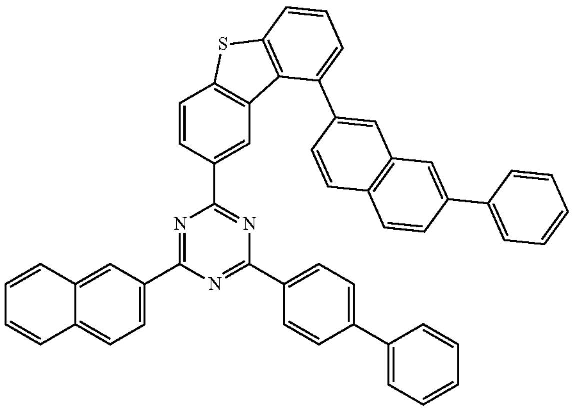

-continued

C-325

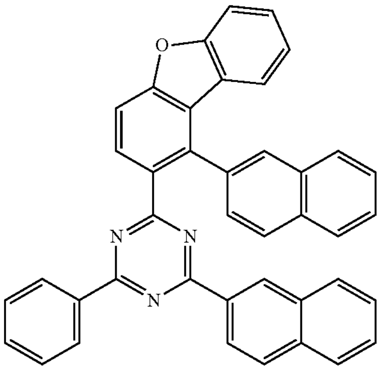

The combination of at least one of compounds H-1 to H-28 and at least one of compounds C-1 to C-325 may be used in an organic electroluminescent device.

According to one embodiment of the present disclosure, the present disclosure may provide the compound represented by formula 1 or the compound represented by formula 2.

Specifically, the present disclosure may provide at least one compound of compounds H-1 to H-28 and compounds C-1 to 0-325.

An organic electroluminescent compound of the present disclosure may be represented by the following formula 2-1.

(2-1)

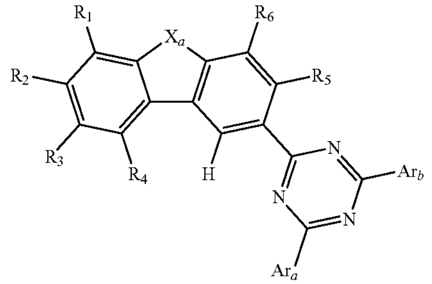

In formula 2-1, $X_a$ represents O or S;

$Ar_a$ and $Ar_b$, each independently, represent a substituted or unsubstituted (C6-C18)aryl, with the proviso that at least one of $Ar_a$ and $Ar_b$ represents a substituted or unsubstituted naphthyl; and $R_1$ to $R_6$, each independently, represent hydrogen, deuterium, a substituted or unsubstituted phenyl, a substituted or unsubstituted naphthyl, or a combination thereof.

For example, $Ar_a$ and $Ar_b$, each independently, may be an unsubstituted phenyl, an unsubstituted biphenyl, an unsubstituted naphthyl, or a naphthyl substituted with a phenyl(s), with the proviso that at least one of $Ar_a$ and $Ar_b$ may be an unsubstituted naphthyl or a naphthyl substituted with a phenyl(s).

For example, $R_1$ to $R_6$, each independently, may be hydrogen, a naphthyl, a naphthylphenyl, or a phenylnaphthyl, with the proviso that at least one of $R_1$ to $R_6$ may be a naphthyl, a naphthylphenyl, or a phenylnaphthyl.

Specifically, the compound represented by formula 2-1 may be exemplified as the following compounds, but is not limited thereto.

-continued
C-295
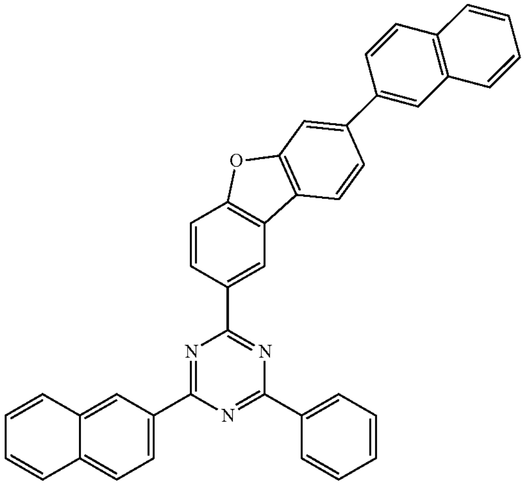
C-296
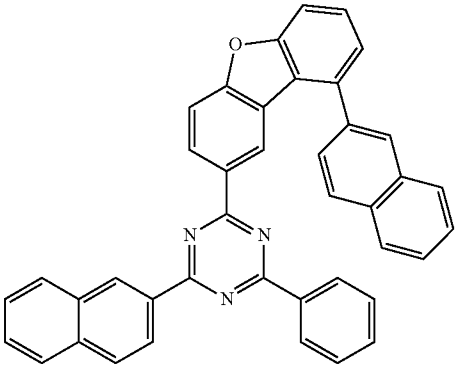
C-299
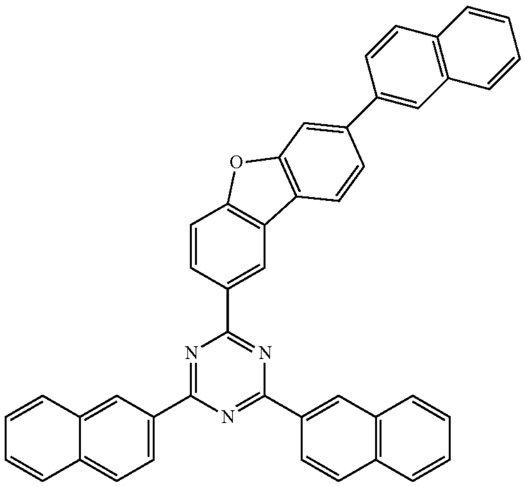
C-304
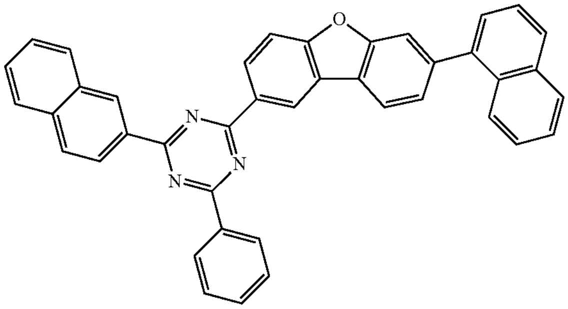
C-306
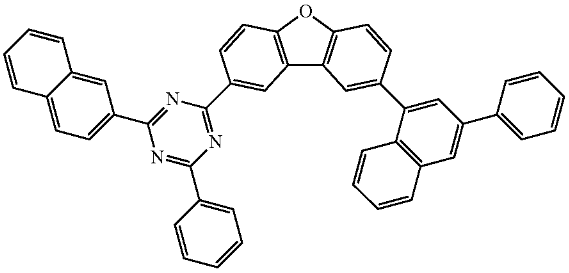
C-307
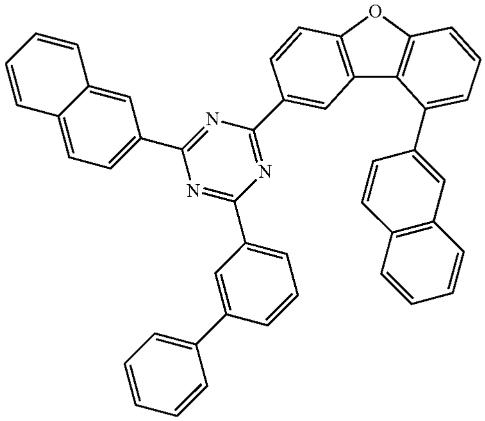
C-310
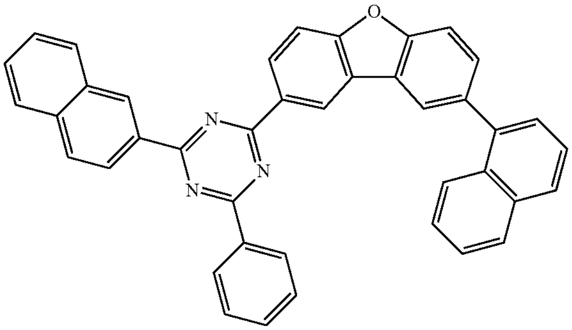

C-311
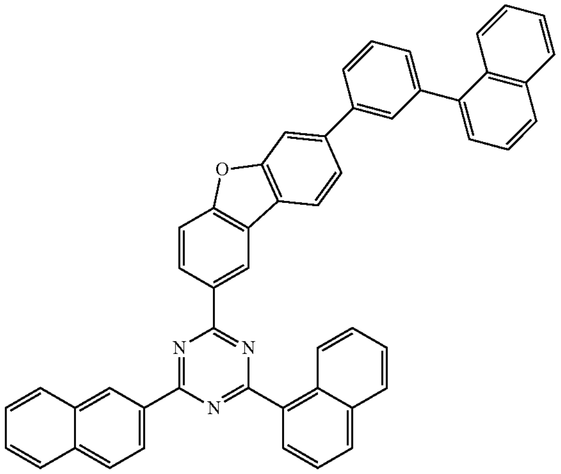
C-313
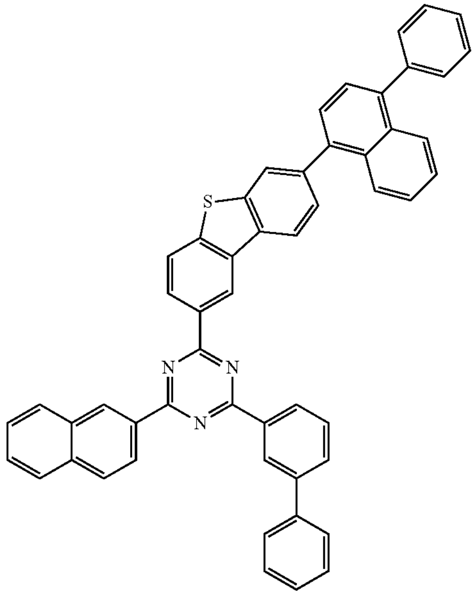
C-315
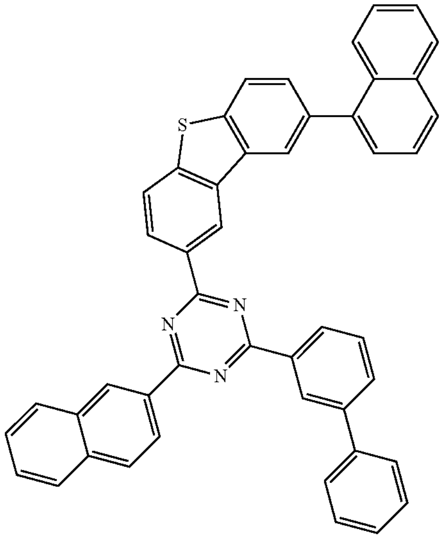
C-317
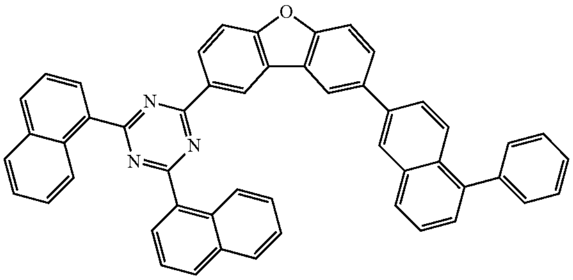
C-318
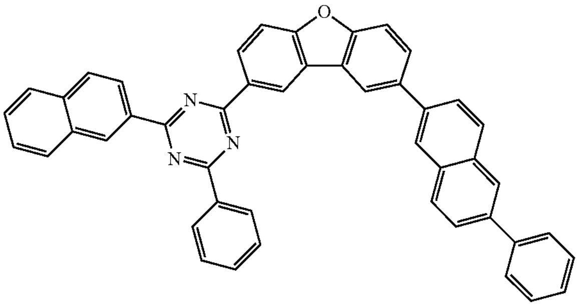
C-319
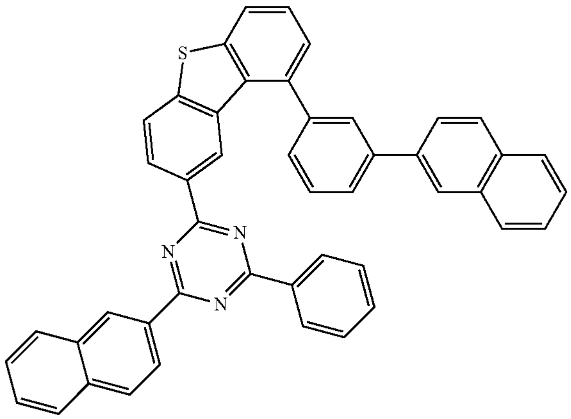
C-320
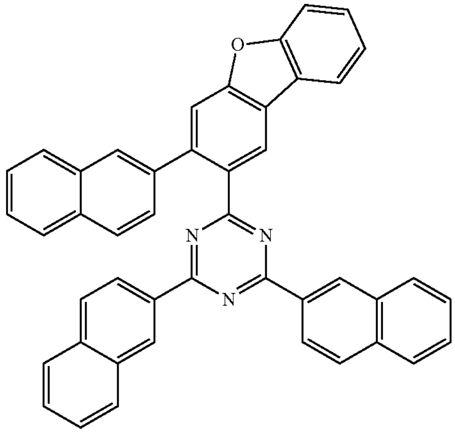

-continued

C-321

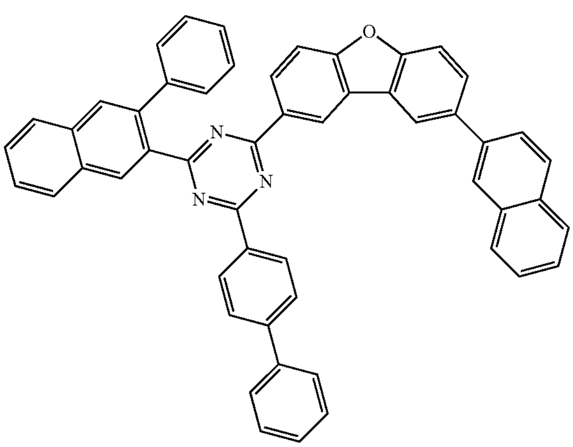

C-322

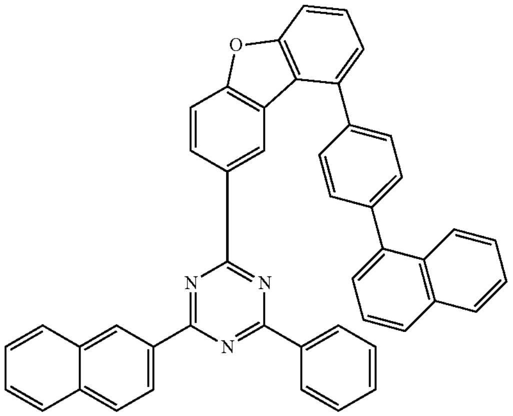

C-323

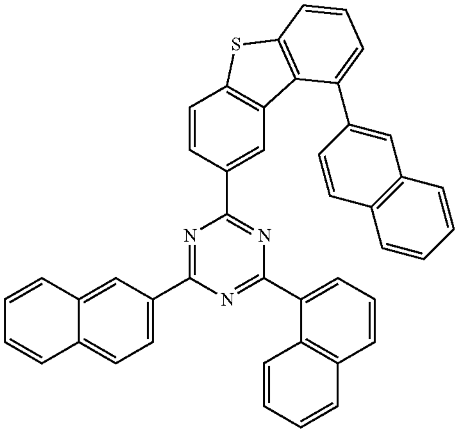

-continued

C-324

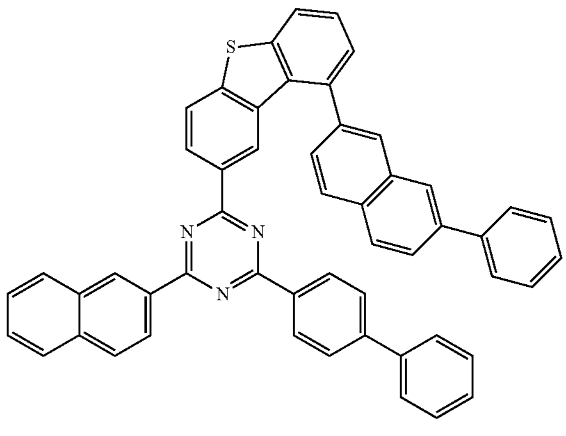

The compound represented by formula 1 according to the present disclosure may be produced by a synthetic method known to one skilled in the art, and for example, by referring to Korean Patent Application Laying-Open No. 2017-0022865 (published on Mar. 2, 2017), etc., but is not limited thereto.

The compound represented by formula 2 of the present disclosure may be produced by a synthetic method known to one skilled in the art. For example, the compound represented by any one of formulas 2-1 to 2-3 may be produced by referring to the following reaction schemes 1 to 3, but is not limited thereto:

[Reaction Scheme 1]

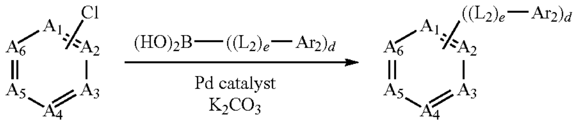

[Reaction Scheme 2]

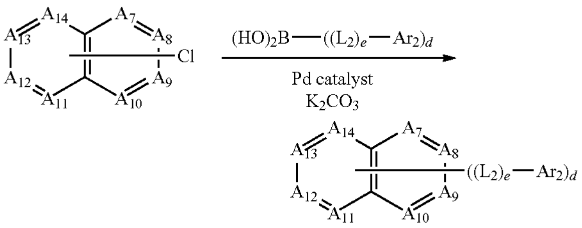

[Reaction Scheme 3]

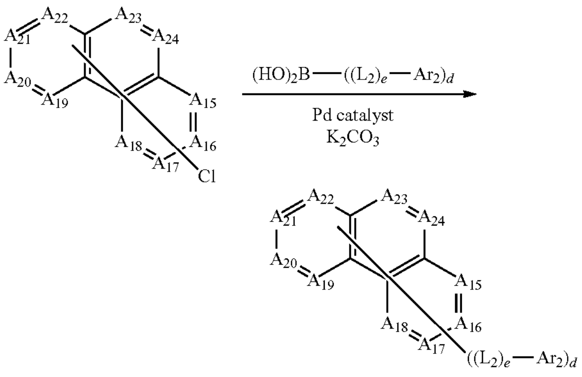

In the reaction schemes, $L_2$, $Ar_2$, d, and e are as defined in formula 2, and $A_1$ to $A_{24}$, are as defined in formulas 2-1 to 2-3.

Although illustrative synthesis examples of the compound represented by formula 2 of the present disclosure are described above, one skilled in the art will be able to readily understand that all of them are based on a Buchwald-Hartwig cross-coupling reaction, an N-arylation reaction, a H-mont-mediated etherification reaction, a Miyaura borylation reaction, a Suzuki cross-coupling reaction, an Intramolecular acid-induced cyclization reaction, a Pd(II)-catalyzed oxidative cyclization reaction, a Grignard reaction, a Heck reaction, a Cyclic Dehydration reaction, an $SN_1$ substitution reaction, an $SN_2$ substitution reaction, a Phosphine-mediated reductive cyclization reaction, etc., and the reactions above proceed even when substituents which are defined in formula 2 above, but are not specified in the specific synthesis examples, are bonded.

An organic electroluminescent device according to the present disclosure has a first electrode, a second electrode, and at least one organic layer between the first electrode and the second electrode.

One of the first and second electrodes may be an anode, and the other may be a cathode. The organic layer comprises a light-emitting layer and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer. The second electrode may be a transflective electrode or a reflective electrode, and may be a top emission type, a bottom emission type, or a both-sides emission type, depending on the materials. In addition, the hole injection layer may be further doped with a p-dopant, and the electron injection layer may be further doped with an n-dopant.

The organic electroluminescent device according to the present disclosure may comprise an anode, a cathode, and at least one organic layer between the anode and cathode in which the organic layer may comprise a plurality of organic electroluminescent materials, including the compound represented by formula 1 as the first organic electroluminescent material, and the compound represented by formula 2 as the second organic electroluminescent material. According to one embodiment of the present disclosure, the organic electroluminescent device according to the present disclosure may comprise an anode, a cathode, and at least one light-emitting layer between the anode and cathode in which the light-emitting layer may comprise the compound represented by formula 1 and the compound represented by formula 2, preferably a plurality of host materials of the present disclosure.

The light-emitting layer includes a host and a dopant, in which the host includes a plurality of host materials and the compound represented by formula 1 may be included as the first host compound of the plurality of host materials, and the compound represented by formula 2 may be included as the second host compound of the plurality of host materials. The weight ratio of the first host compound and the second host compound is about 1:99 to about 99:1, preferably about 10:90 to about 90:10, more preferably about 30:70 to about 70:30, even more preferably about 40:60 to about 60:40, and still more preferably about 50:50.

Herein, the light-emitting layer is a layer from which light is emitted, and may be a single layer or a multi-layer of which two or more layers are stacked. All of the first host material and the second host material may be included in one layer, or the first host material and the second host material may be included in respective different light-emitting layers. According to one embodiment of the present disclosure, the doping concentration of the dopant compound with respect to the host compound in the light-emitting layer may be less than 20 wt %.

The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer. According to one embodiment of the present disclosure, the organic electroluminescent device of the present disclosure may further comprise an amine-based compound besides the plurality of host materials of the present disclosure as at least one of a hole injection material, a hole transport material, a hole auxiliary material, a light-emitting material, a light-emitting auxiliary material, and an electron blocking material. Further, according to one embodiment of the present disclosure, the organic electroluminescent device of the present disclosure may further comprise an azine-based compound besides the plurality of host materials of the present disclosure as at least one of an electron transport material, an electron injection material, an electron buffer material, and a hole blocking material.

The dopant comprised in the organic electroluminescent device of the present disclosure may be at least one phosphorescent or fluorescent dopant, and is preferably at least one phosphorescent dopant. The phosphorescent dopant material applied to the organic electroluminescent device of the present disclosure is not particularly limited, but may be preferably selected from the metallated complex compounds of iridium (Ir), osmium (Os), copper (Cu), and platinum (Pt), more preferably selected from ortho-metallated complex compounds of iridium (Ir), osmium (Os), copper (Cu), and platinum (Pt), and even more preferably ortho-metallated iridium complex compounds.

The dopant comprised in the organic electroluminescent device of the present disclosure may comprise a compound represented by the following formula 101, but is not limited thereto.

(101)

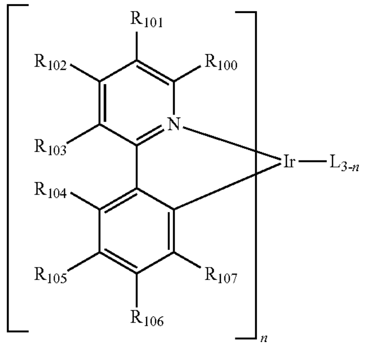

In formula 101, L is selected from the following structures 1 to 3:

[Structure 1]

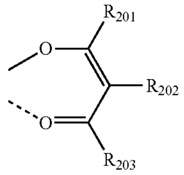

[Structure 2]

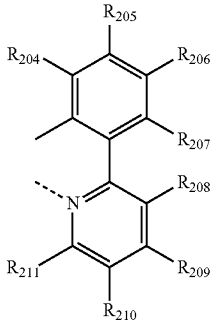

[Structure 3]

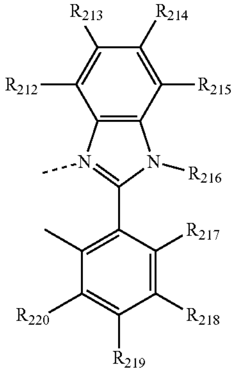

$R_{100}$ to $R_{103}$, each independently, represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or may be linked to an adjacent substituent to form a ring(s), e.g., a substituted or unsubstituted, quinoline, isoquinoline, benzofuropyridine, benzothienopyridine, benzothienoquinoline, or indenoquinoline, together with pyridine;

$R_{104}$ to $R_{107}$, each independently, represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a substituted or unsubstituted (3- to 30-membered)heteroaryl, a cyano, or a substituted or unsubstituted (C1-C30)alkoxy; or may be linked to an adjacent substituent to form a ring(s), e.g., a substituted or unsubstituted, naphthalene, fluorene, dibenzothiophene, dibenzofuran, indenopyridine, benzofuropyridine, or benzothienopyridine, together with benzene;

$R_{201}$ to $R_{220}$, each independently, represent hydrogen, deuterium, a halogen, a (C1-C30)alkyl unsubstituted or substituted with deuterium and/or a halogen(s), a substituted or unsubstituted (C3-C30)cycloalkyl, or a substituted or unsubstituted (C6-C30)aryl; or may be linked to an adjacent substituent to form a ring(s); and n represents an integer of 1 to 3.

The specific examples of the dopant compound are as follows, but are not limited thereto.

D-1

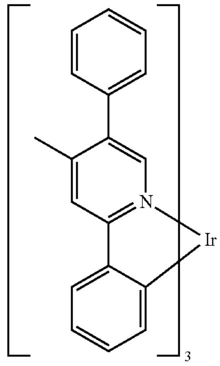

D-2

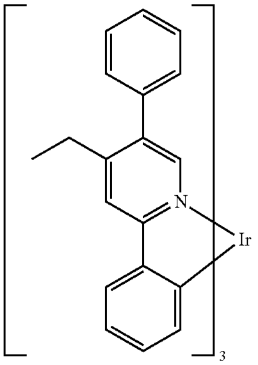

D-3

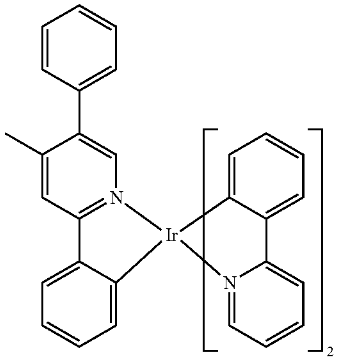

D-4

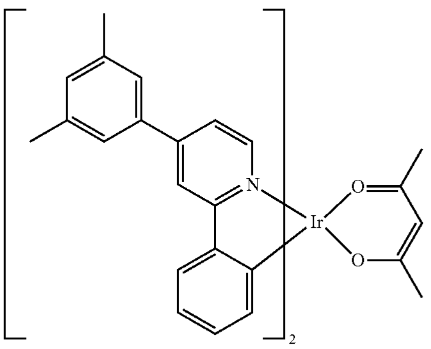

-continued
D-5
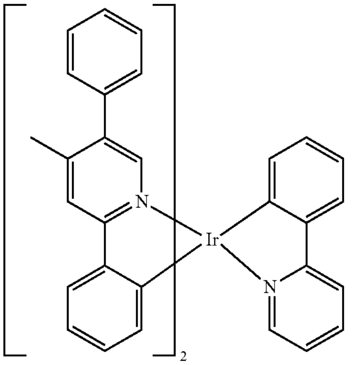
D-6
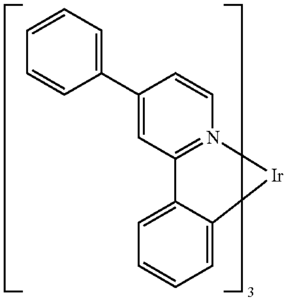
D-7
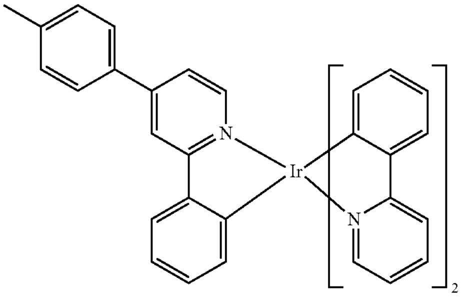
D-8
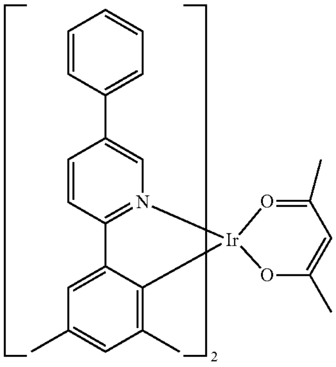
-continued
D-9
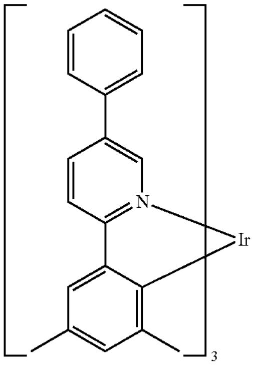
D-10
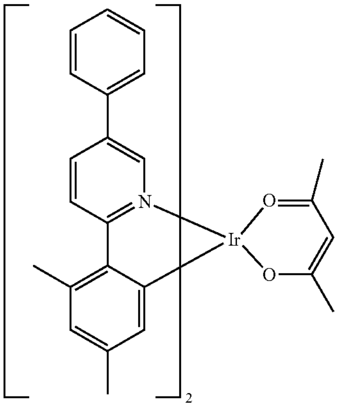
D-11
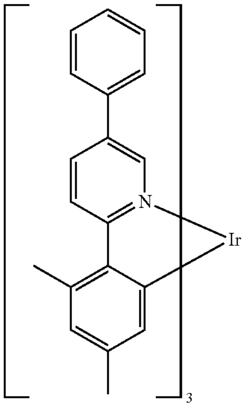
D-12
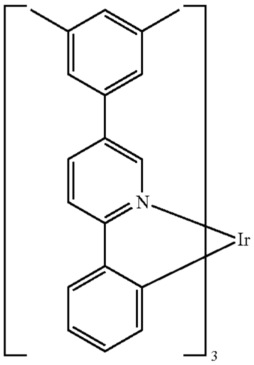

-continued
D-13
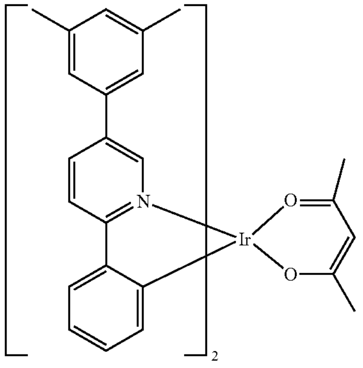
D-14
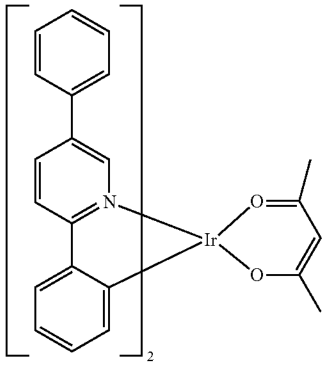
D-15
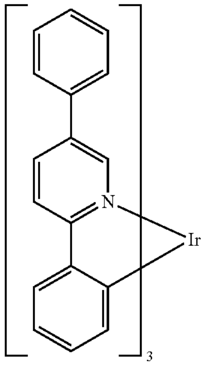
D-16
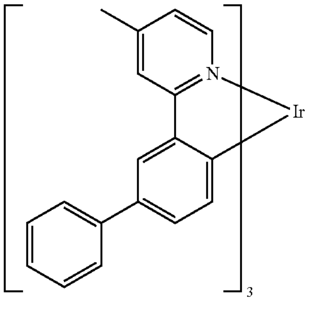
-continued
D-17
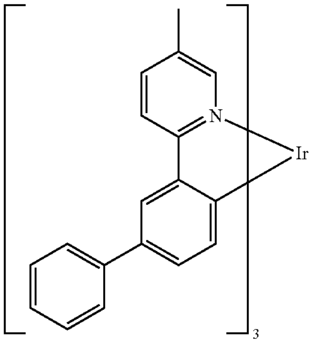
D-18
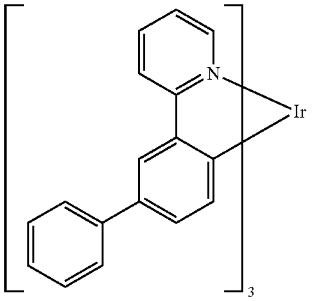
D-19
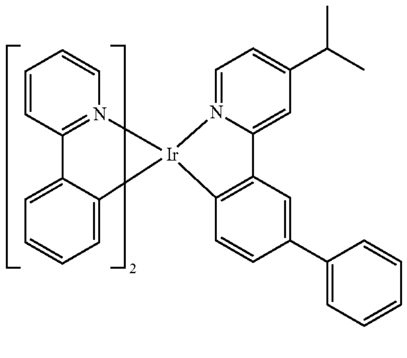
D-20
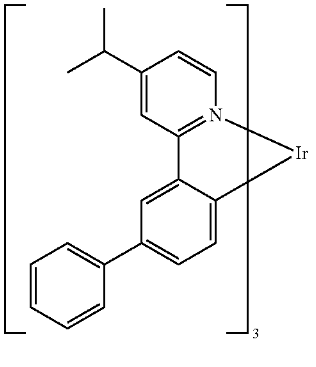

-continued
D-21
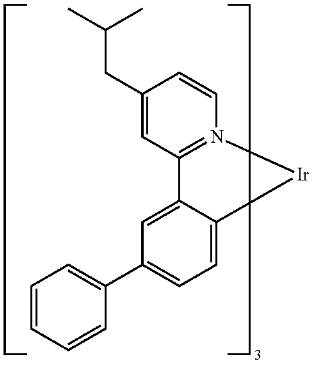
D-22
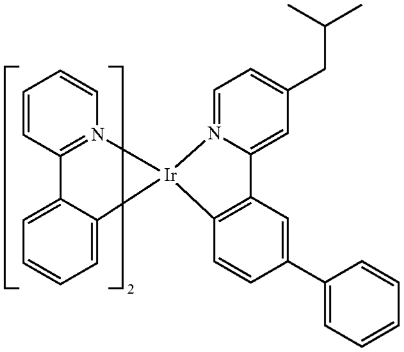
D-23
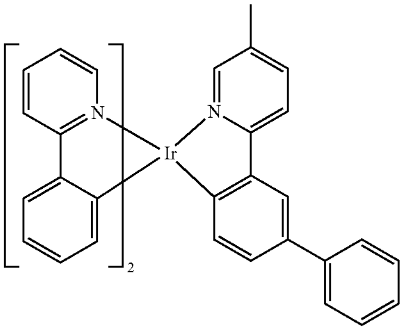
D-24
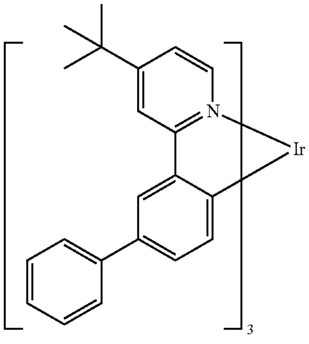
-continued
D-25
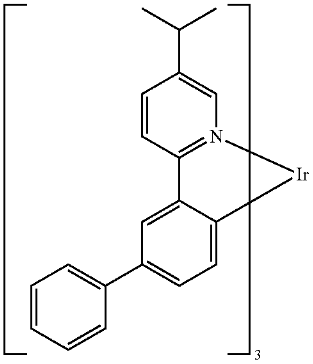
D-26
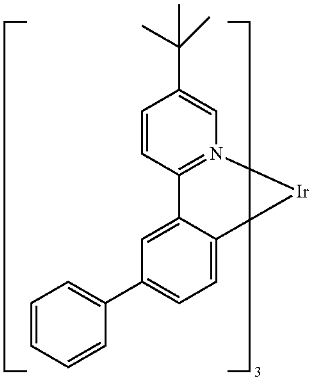
D-27
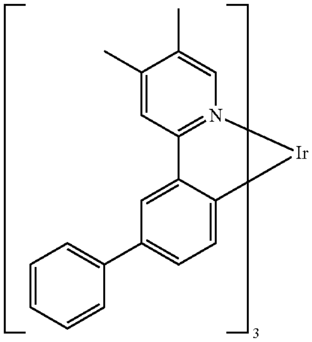
D-28
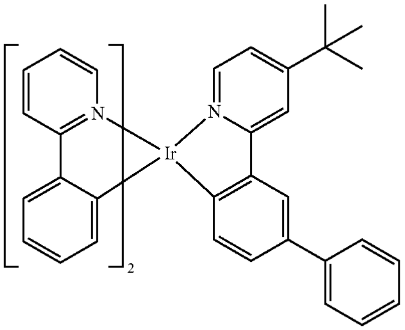

-continued
D-29
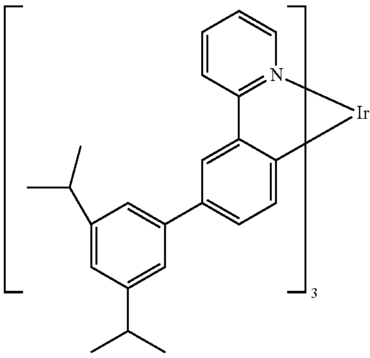
D-30
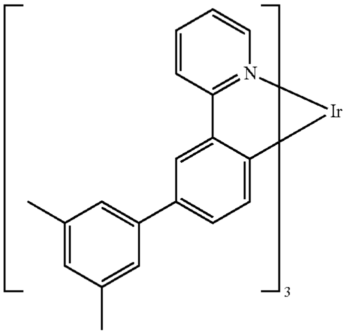
D-31
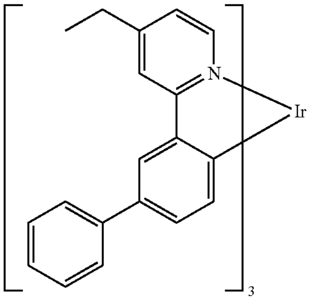
D-32
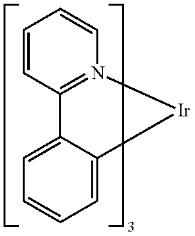
D-33
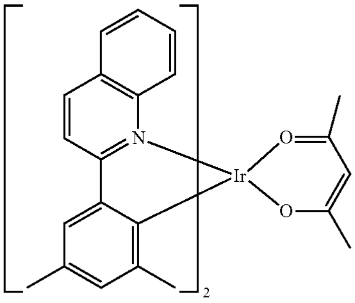
-continued
D-34
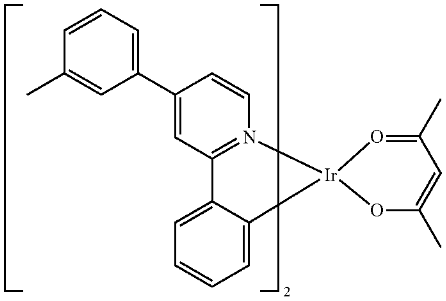
D-35
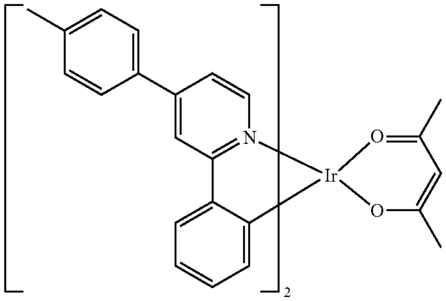
D-36
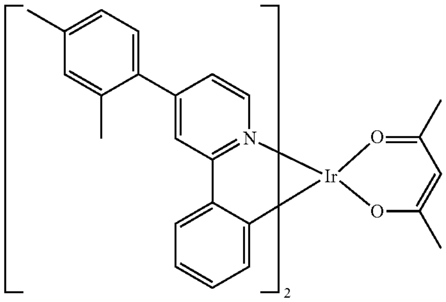
D-37
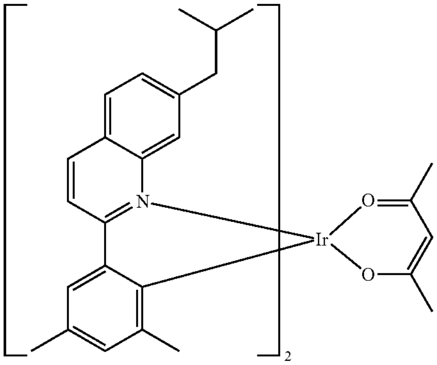
D-38
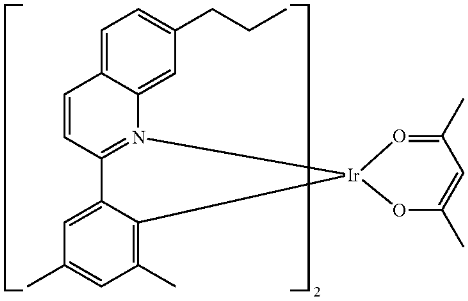

-continued
D-39
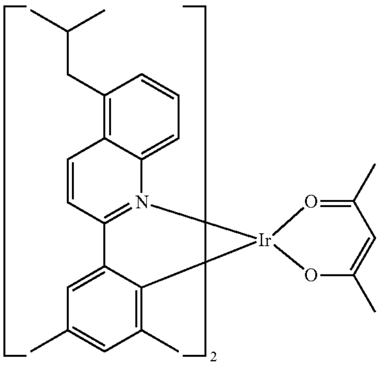
D-40
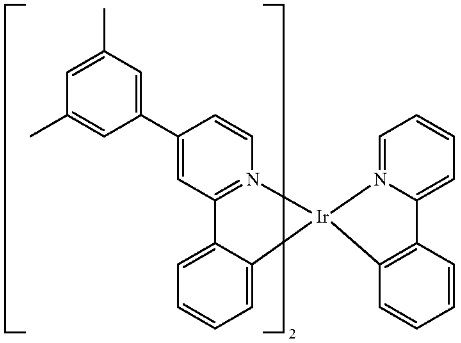
D-41
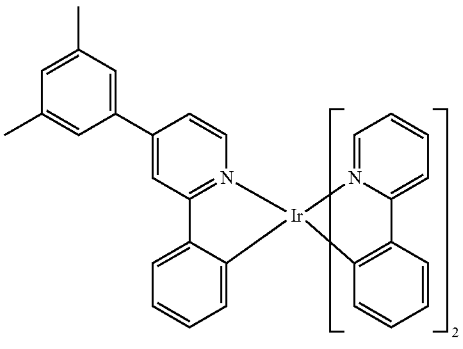
D-42
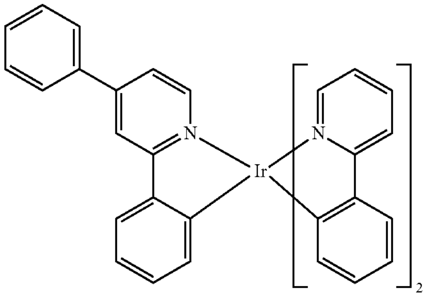
-continued
D-43
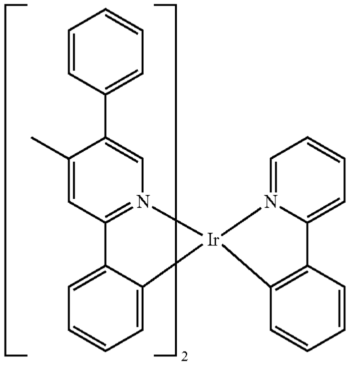
D-44
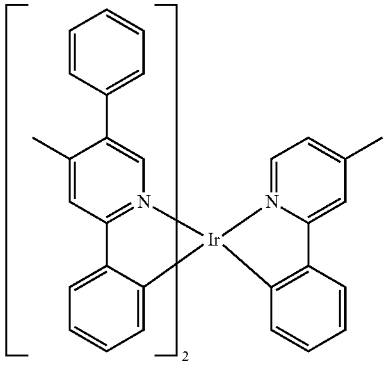
D-45
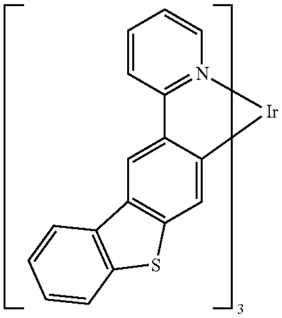
D-46
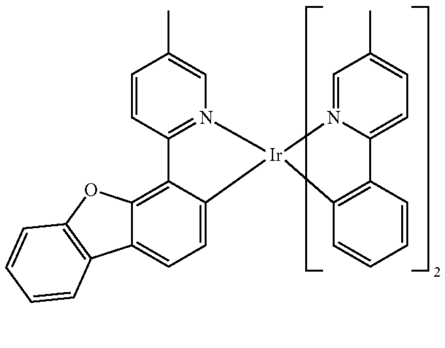

-continued
D-47
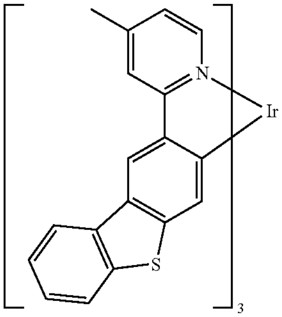
D-48
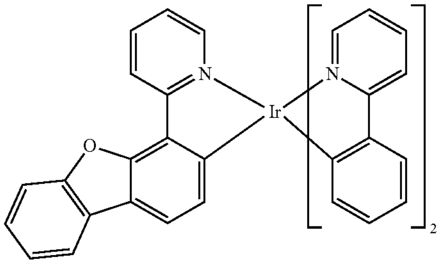
D-49
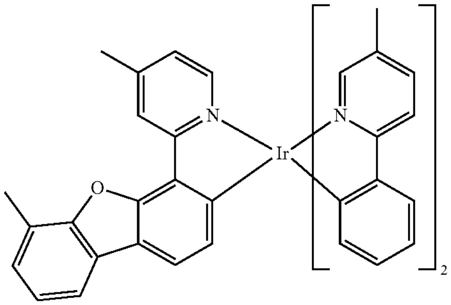
D-50
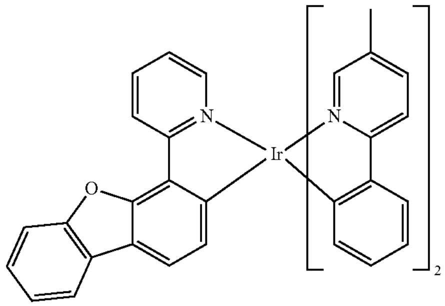
D-51
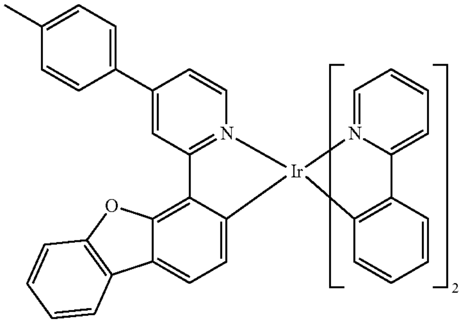
-continued
D-52
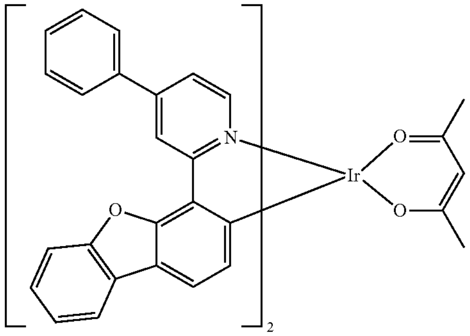
D-53
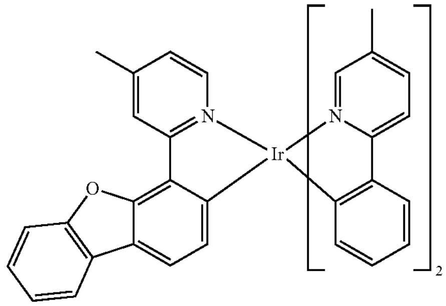
D-54
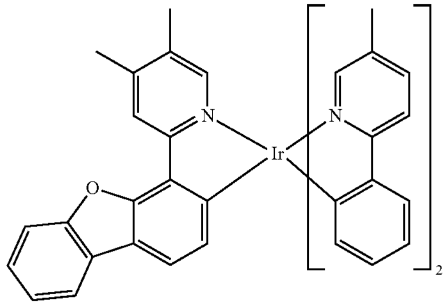
D-55
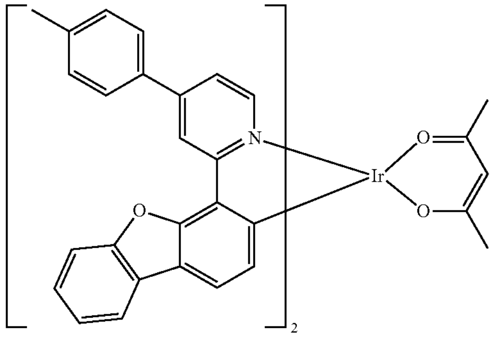
D-56
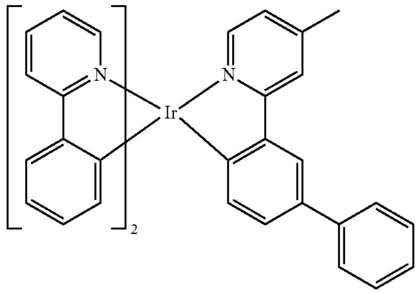

-continued
D-57
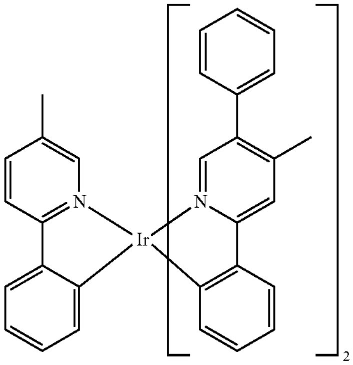
D-58
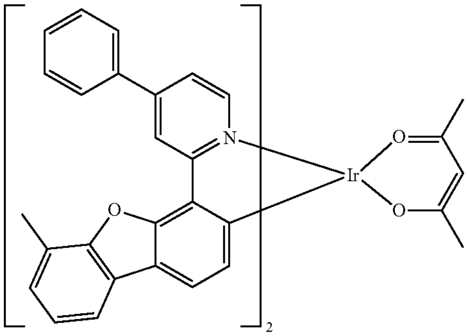
D-59
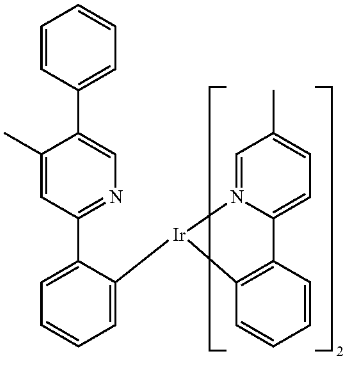
D-60
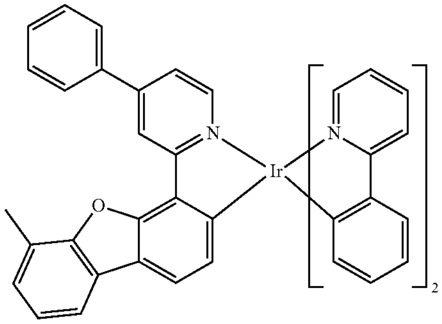
-continued
D-61
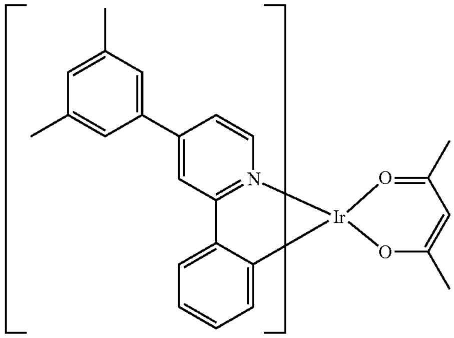
D-62
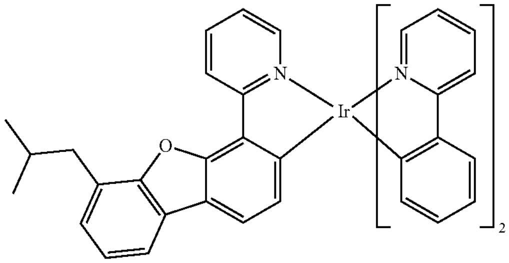
D-63
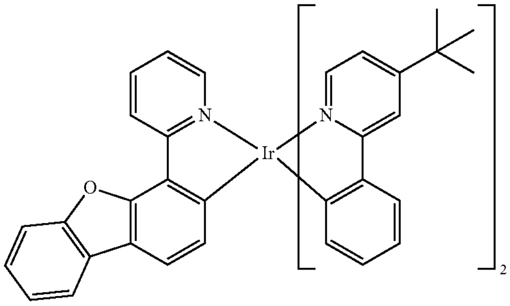
D-64
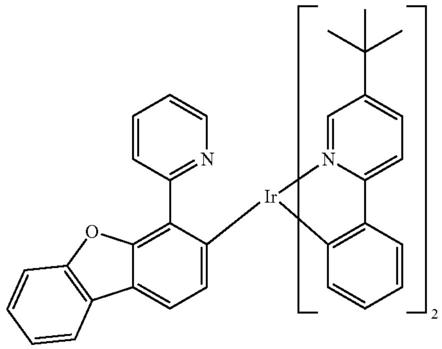

-continued
D-65
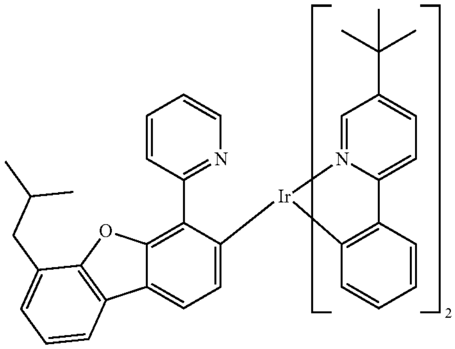
D-66
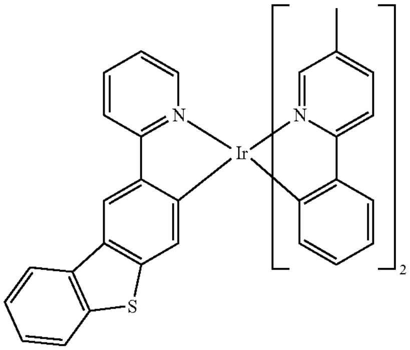
D-67
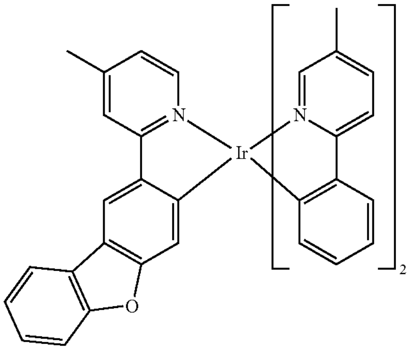
D-68
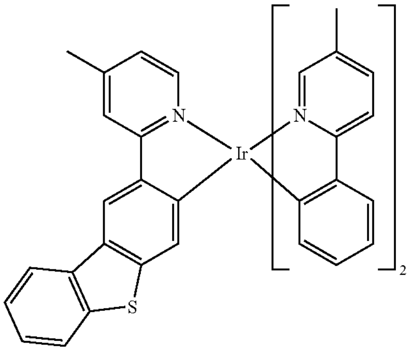
-continued
D-69
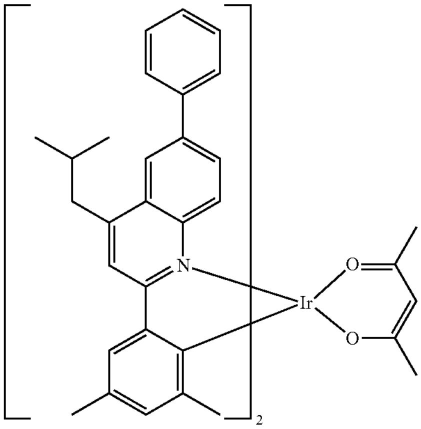
D-70
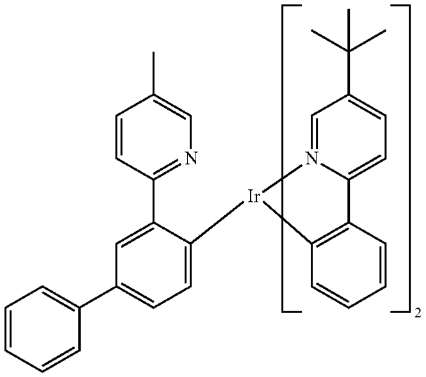
D-71
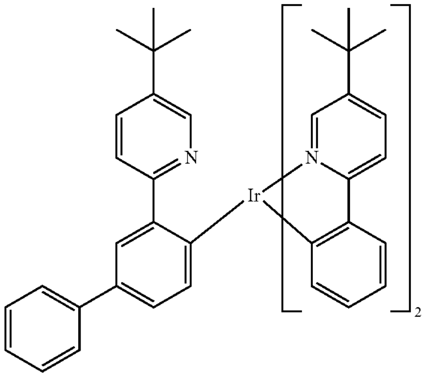
D-72
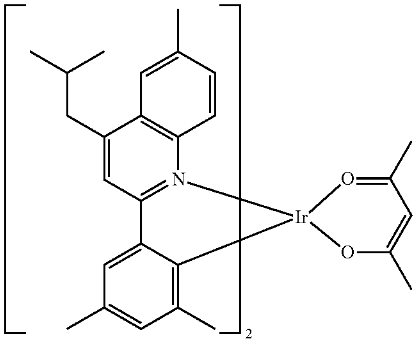

-continued
D-73
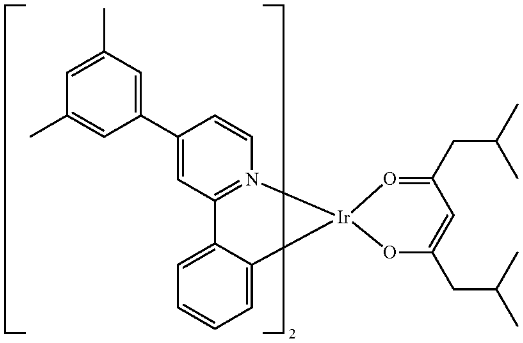
D-74
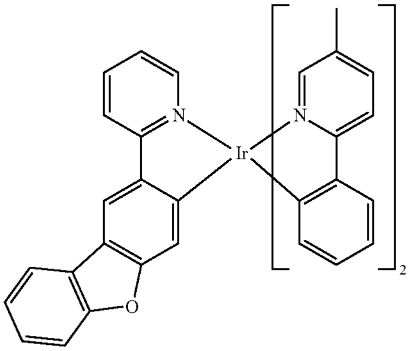
D-75
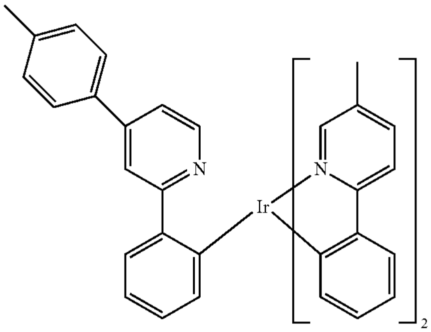
D-76
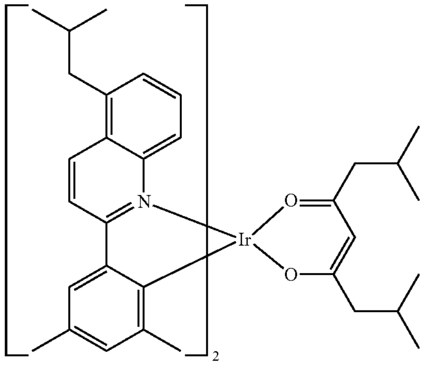
-continued
D-77
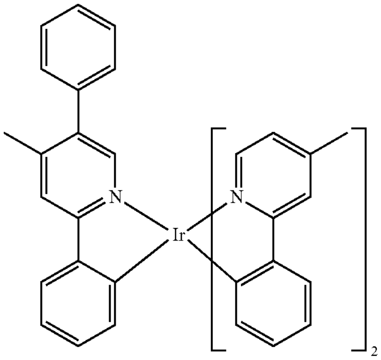
D-78
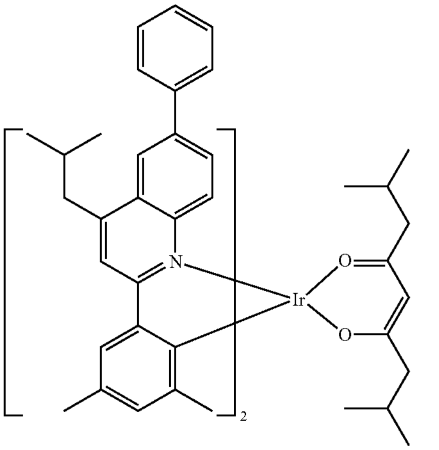
D-79
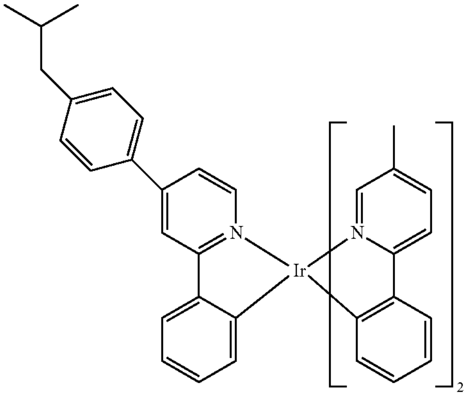
D-80
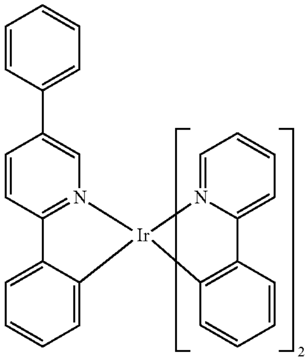

-continued
D-81
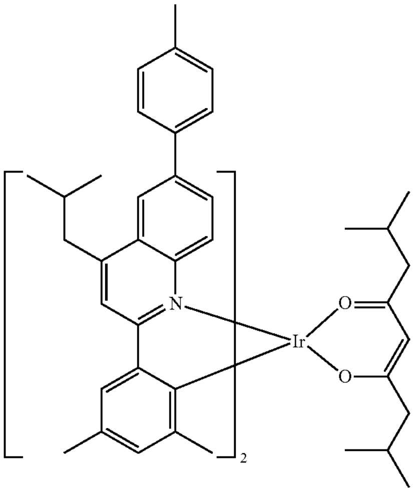
D-82
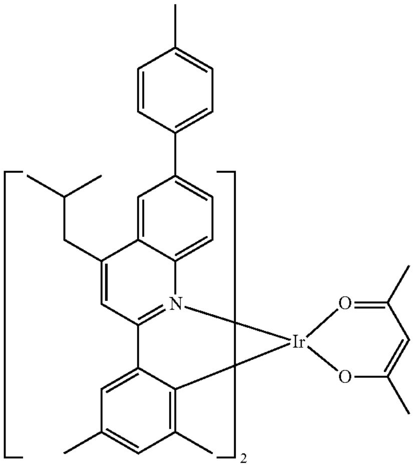
D-83
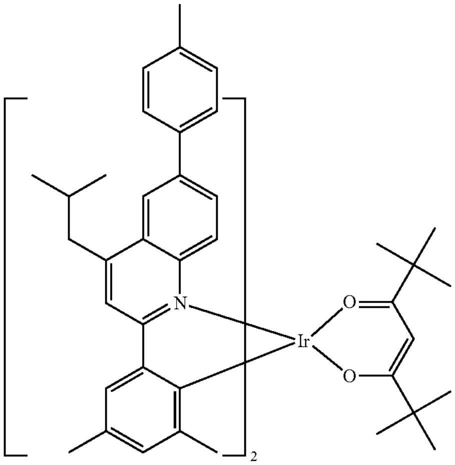
-continued
D-84
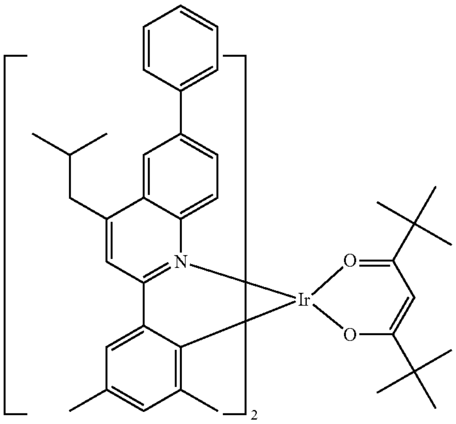
D-85
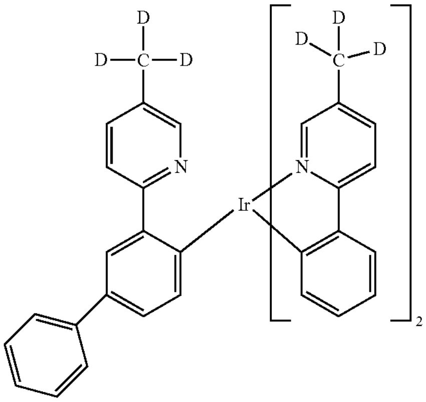
D-86
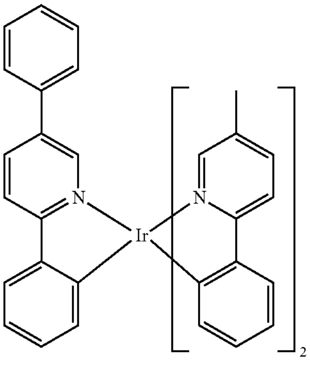
D-87
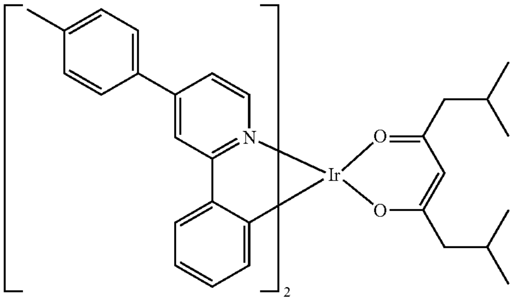

-continued
D-88
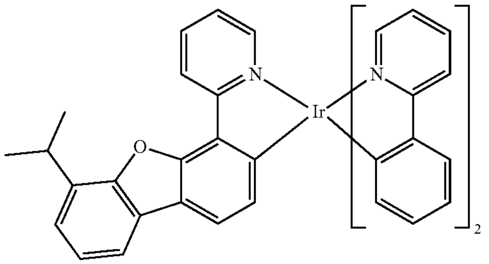
D-89
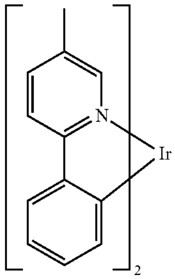
D-90
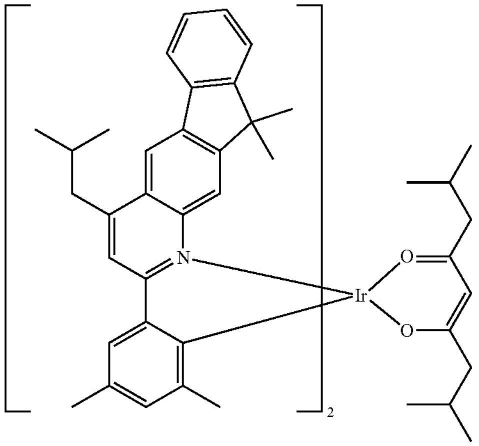
D-91
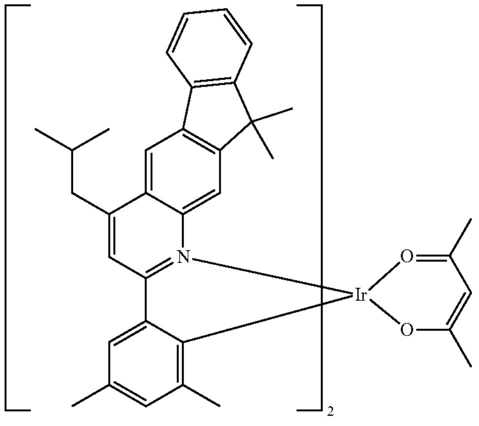
-continued
D-92
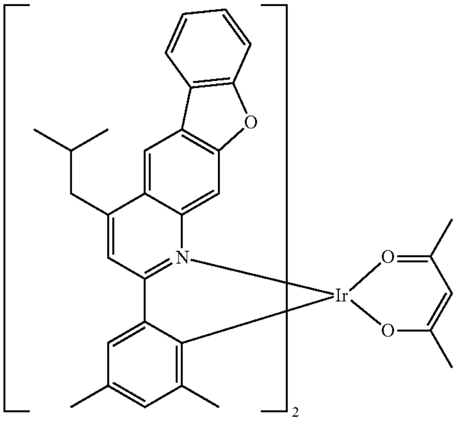
D-93
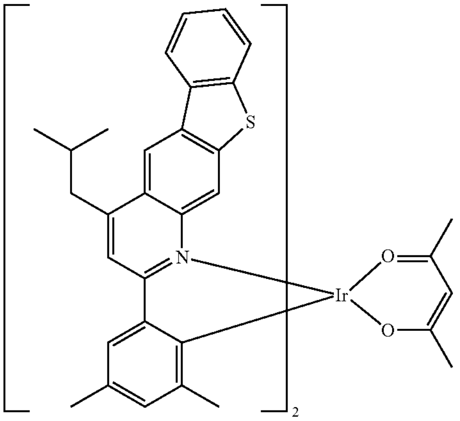
D-94
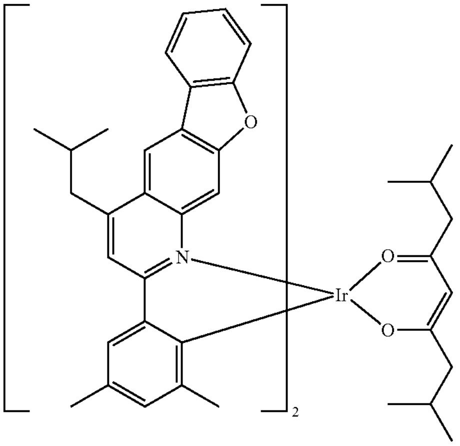

-continued
D-95
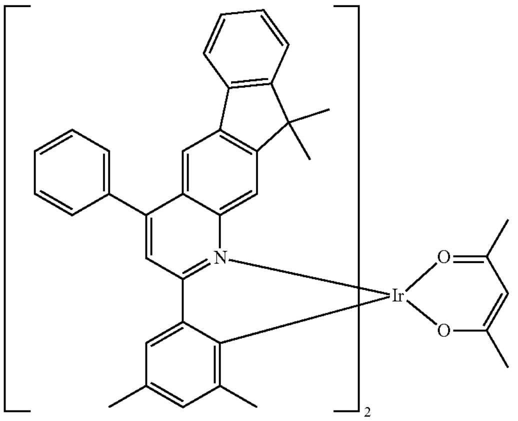
D-96
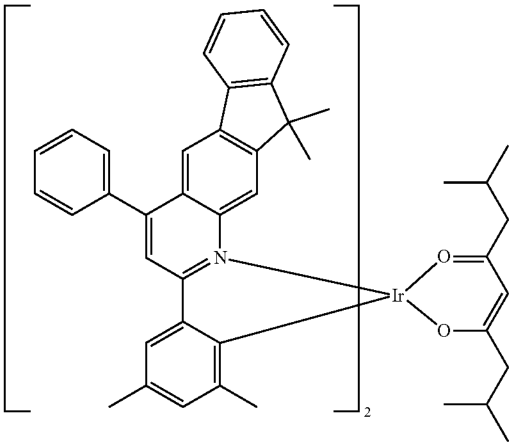
D-97
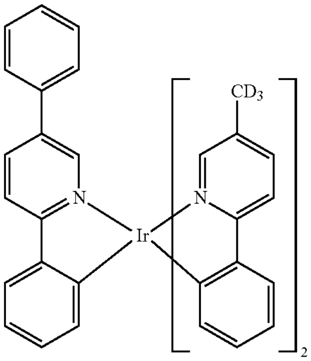
D-98
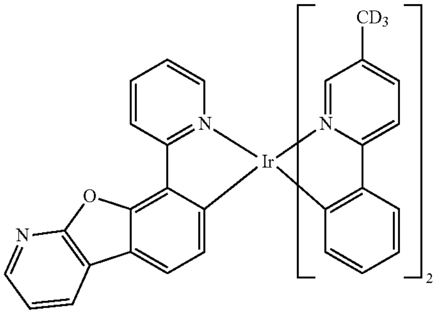
-continued
D-99
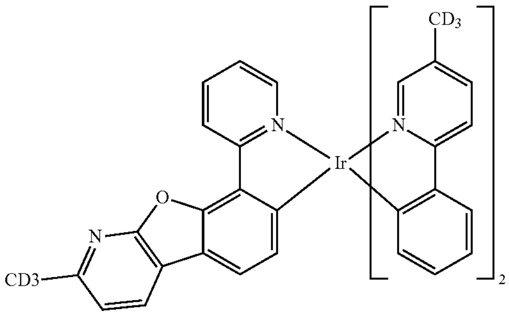
D-100
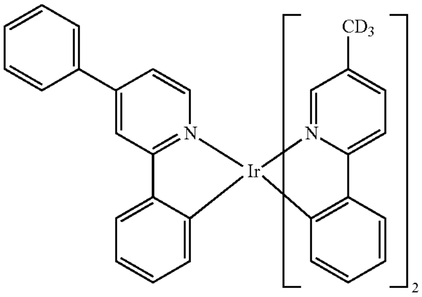
D-101
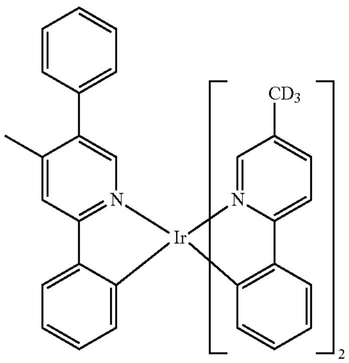
D-102
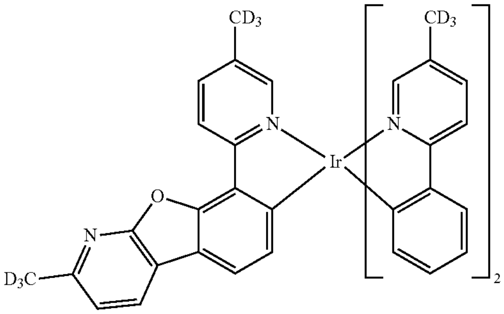

-continued
D-103
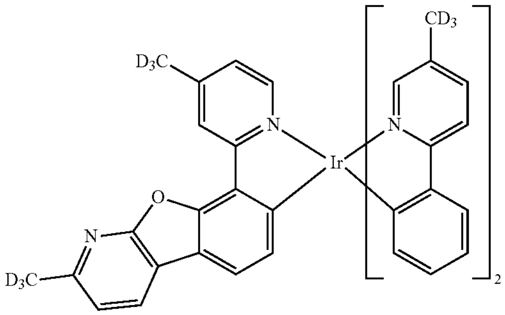
D-104
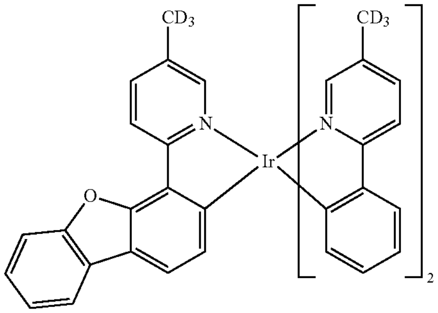
D-105
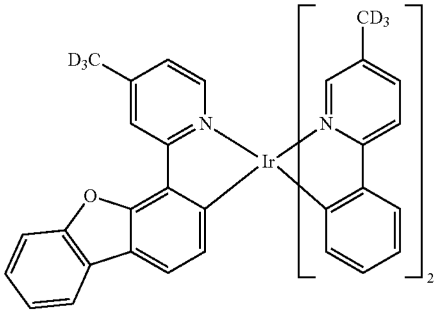
D-106
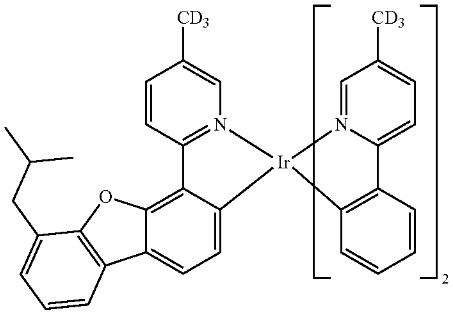
D-107
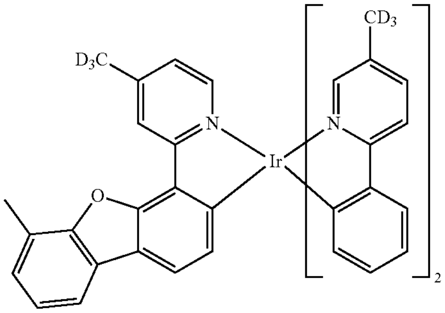
-continued
D-108
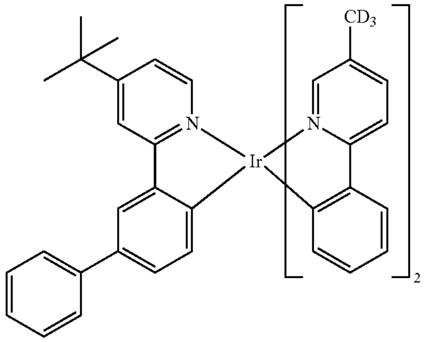
D-109
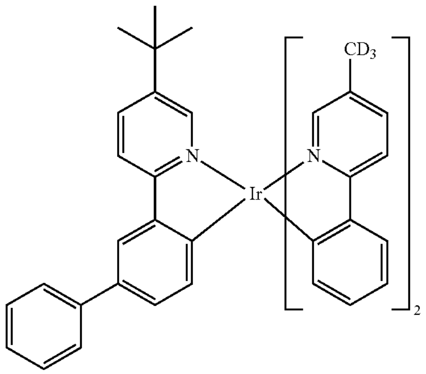
D-110
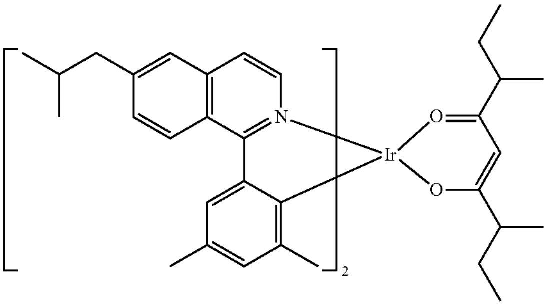
D-111
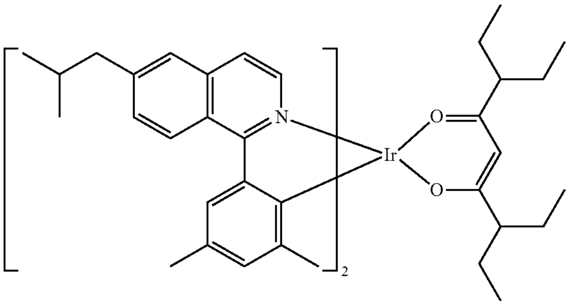

-continued
D-112
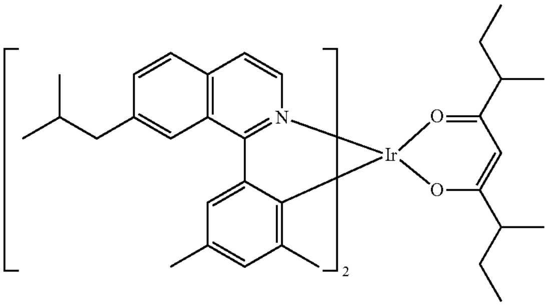
D-113
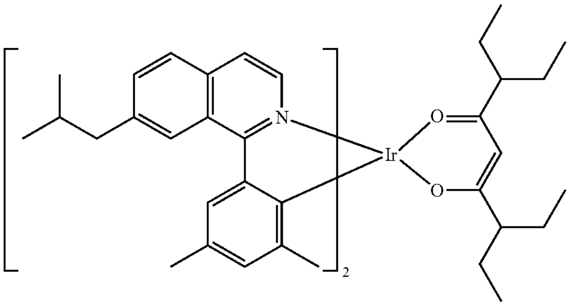
D-114
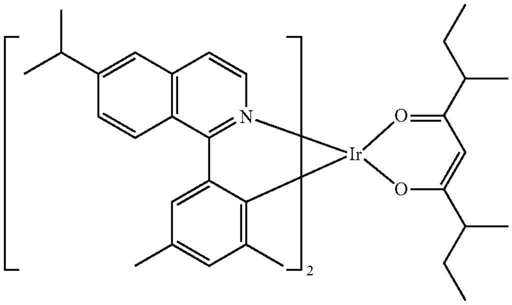
D-115
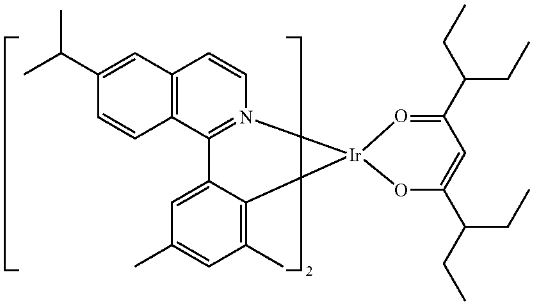
-continued
D-116
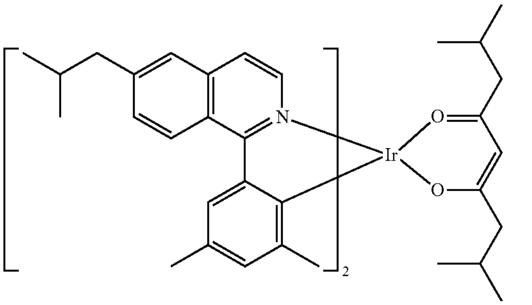
D-117
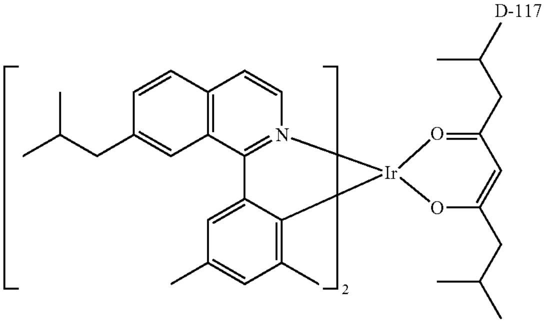
D-118
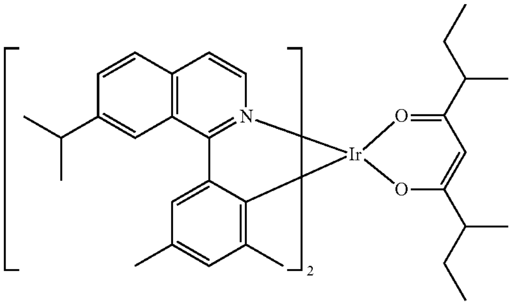
D-119
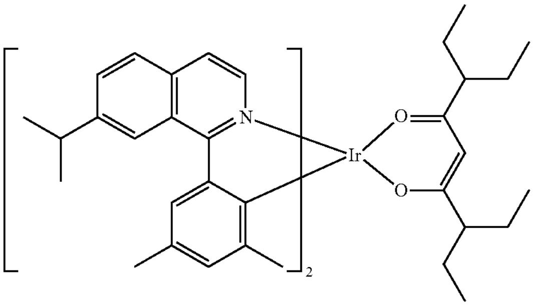

-continued
D-120
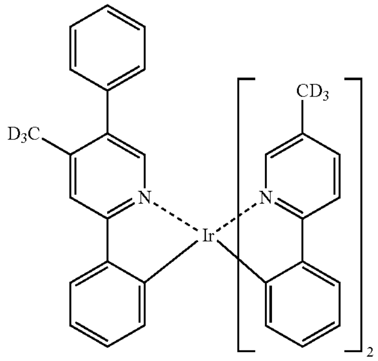
D-121
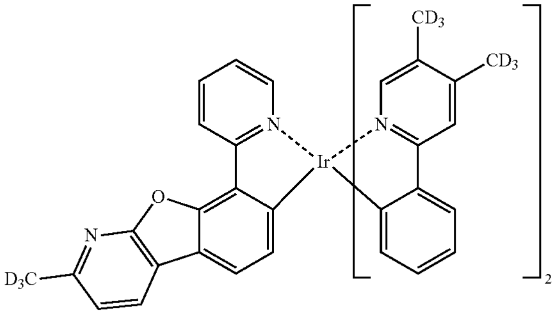
D-122
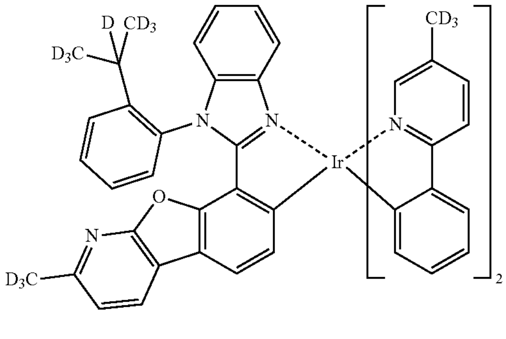
D-123
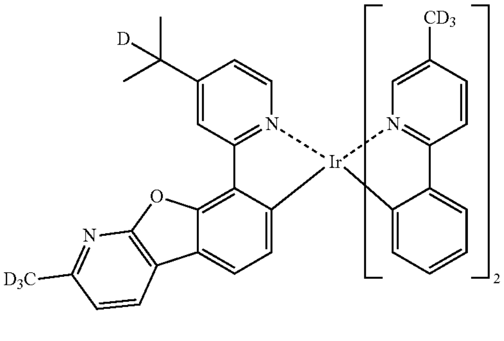
-continued
D-124
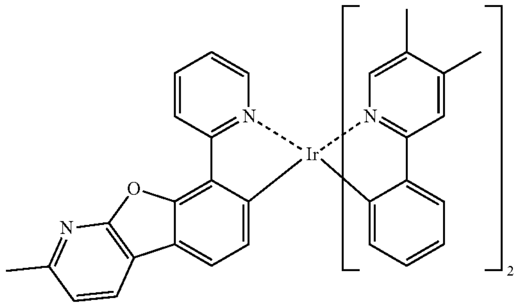
D-125
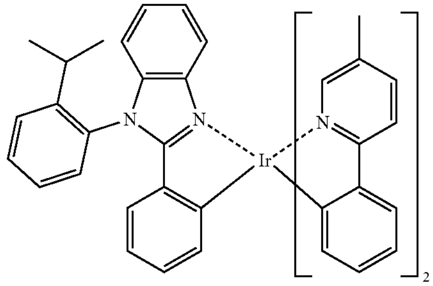
D-126
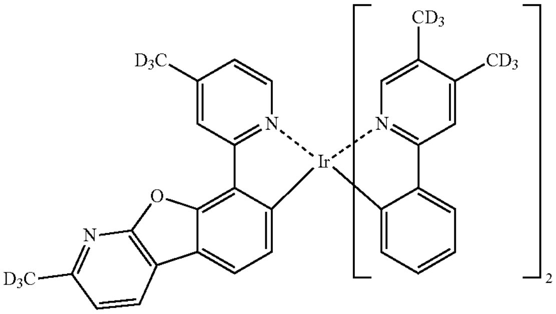
D-127
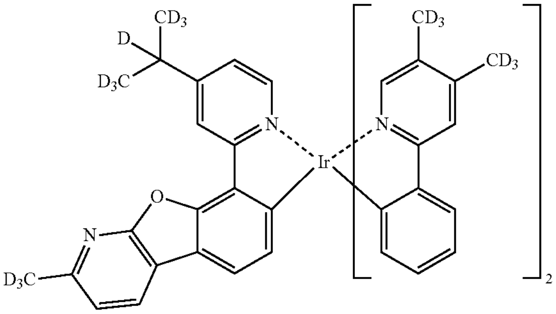
D-128
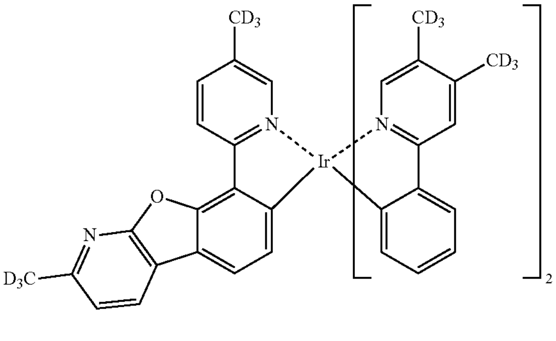

-continued
D-129
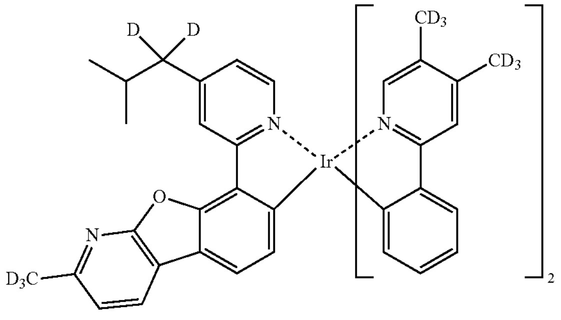
D-130
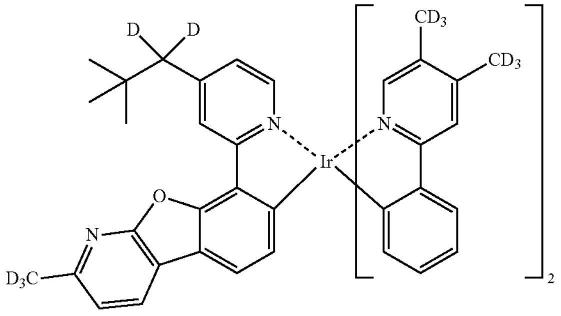
D-131
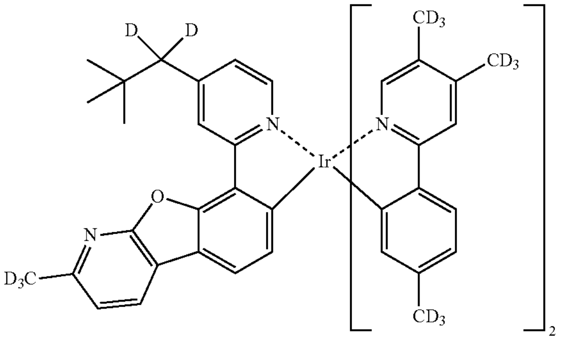
D-132
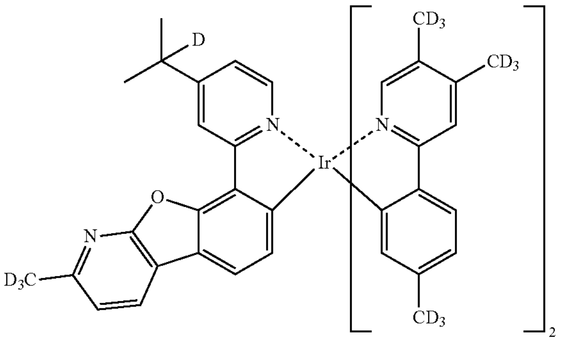
-continued
D-133
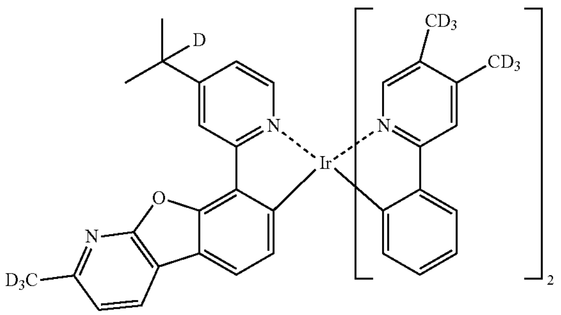
D-134
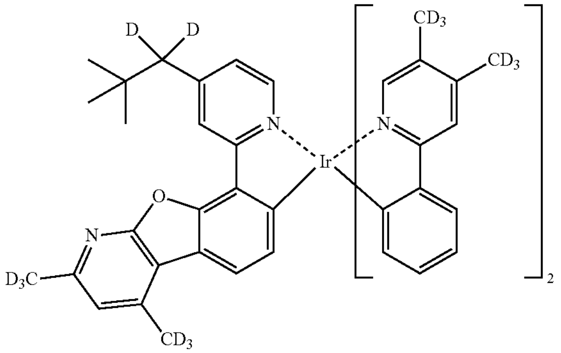
D-135
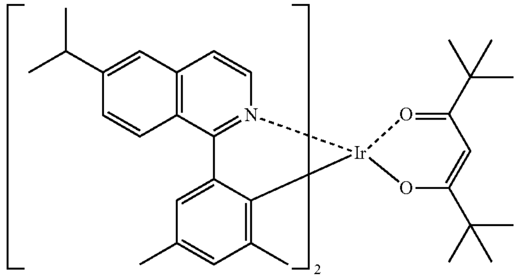
D-136
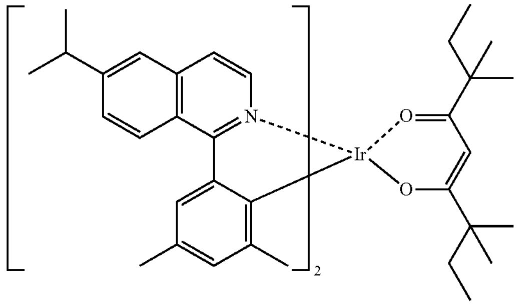

-continued
D-137
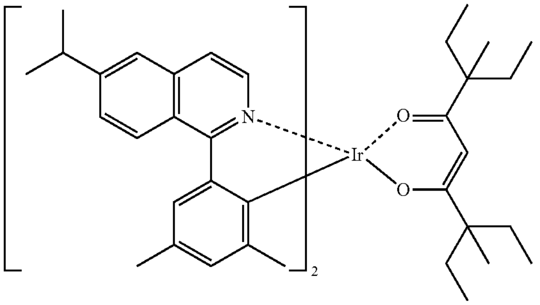
D-138
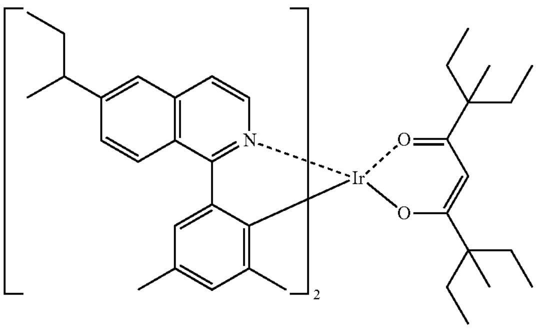
D-139
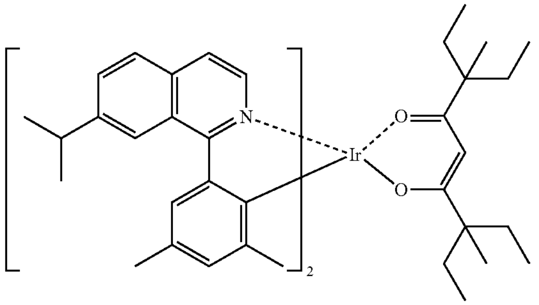
D-140
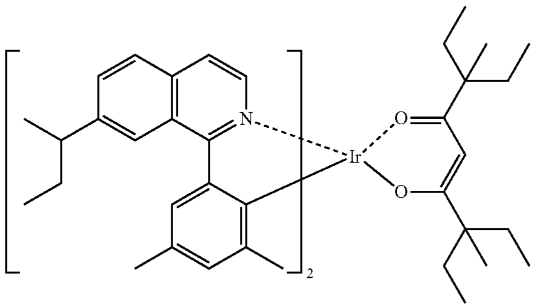
-continued
D-141
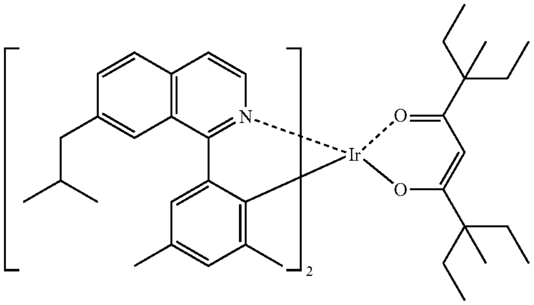
D-142
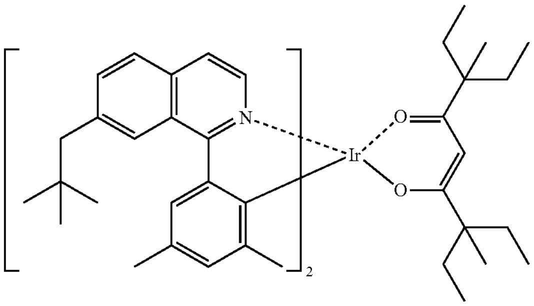
D-143
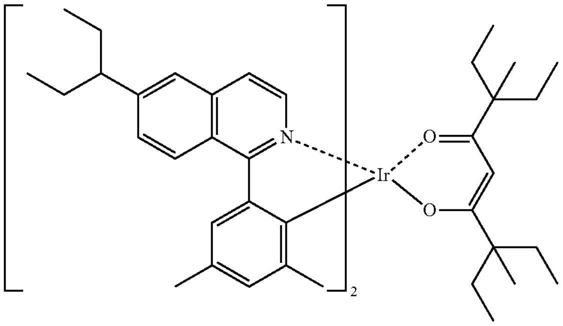
D-144
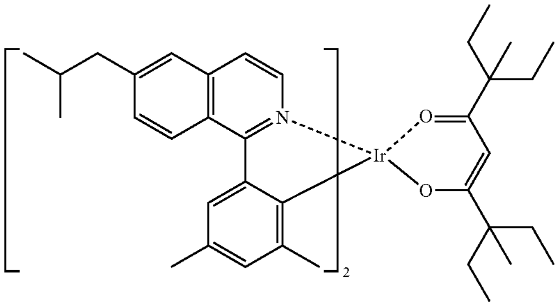

-continued

D-145

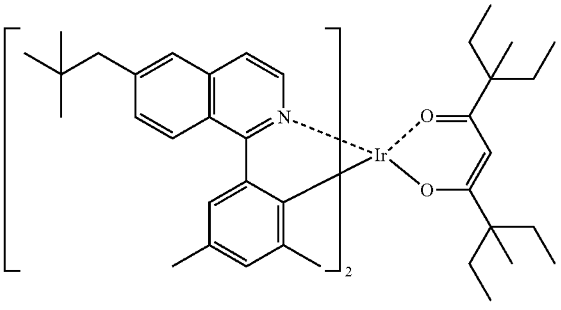

D-146

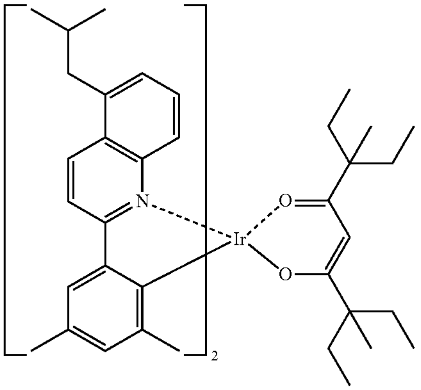

D-147

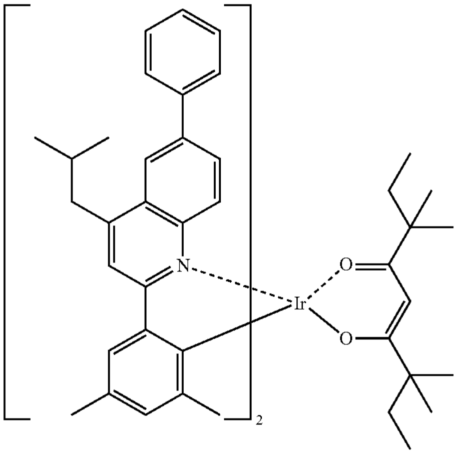

D-148

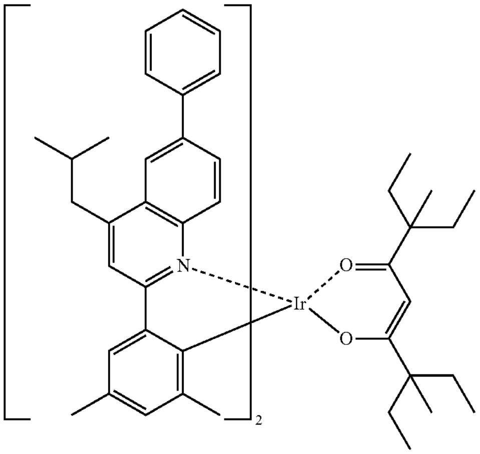

-continued

D-149

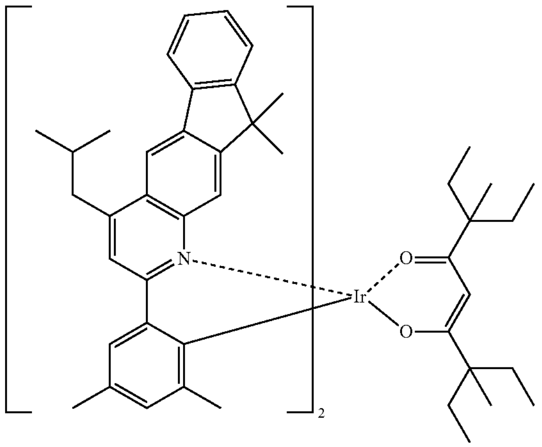

In the organic electroluminescent device of the present disclosure, a hole injection layer, a hole transport layer, an electron blocking layer, or a combination thereof can be used between the anode and the light-emitting layer. The hole injection layer may be multilayers in order to lower the hole injection barrier (or hole injection voltage) from the anode to the hole transport layer or the electron blocking layer, wherein each of the multilayers may use two compounds simultaneously. The hole transport layer or the electron blocking layer may also be multilayers.

An electron buffer layer, a hole blocking layer, an electron transport layer, an electron injection layer, or a combination thereof can be used between the light-emitting layer and the cathode. The electron buffer layer may be multilayers in order to control the electron injection and improve the interfacial properties between the light-emitting layer and the electron injection layer, wherein each of the multilayers may use two compounds simultaneously. The hole blocking layer or the electron transport layer may also be multilayers, wherein each of the multilayers may use a plurality of compounds.

In addition, the organic electroluminescent compound or the plurality of host materials according to the present disclosure may also be used in an organic electroluminescent device comprising a quantum dot (QD).

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slot coating, spin coating, dip coating, flow coating methods, etc., can be used.

When using a wet film-forming method, a thin film can be formed by dissolving or diffusing materials forming each layer into any suitable solvent such as ethanol, chloroform, tetrahydrofuran, dioxane, etc. The solvent can be any one where the materials forming each layer can be dissolved or diffused, and where there are no problems in film-formation capability.

The first and the second host compounds of the present disclosure may be film-formed by the above-listed methods, commonly by a co-evaporation process or a mixture-evaporation process. The co-evaporation is a mixed deposition method in which two or more materials are placed in a respective individual crucible source and a current is applied to both cells at the same time to evaporate the materials. The mixture-evaporation is a mixed deposition method in which two or more materials are mixed in one crucible source before evaporating them, and a current is applied to the cell to evaporate the materials. Further, if the first and the second host compounds are present in the same layer or different layers in an organic electroluminescent device, the two host compounds may individually form films. For example, the second host compound may be deposited after depositing the first host compound.

The present disclosure may provide a display system by comprising the compound represented by formula 2-1 or by using the plurality of host materials comprising the compound represented by formula 1 and the compound represented by formula 2. That is, by using the organic electroluminescent compound or the plurality of host materials of the present disclosure, it is possible to manufacture a display system or a lighting system. Specifically, by using the organic electroluminescent compound or the plurality of host materials of the present disclosure, a display system, for example, a display system for smart phones, tablets, notebooks, PCs, TVs, or cars; or a lighting system, for example an outdoor or indoor lighting system, can be produced.

Hereinafter, the preparation method of the compounds according to the present disclosure and the properties thereof will be explained in detail with reference to the representative compounds of the present disclosure. However, the present disclosure is not limited by the following examples.

Example 1: Preparation of Compound C-295

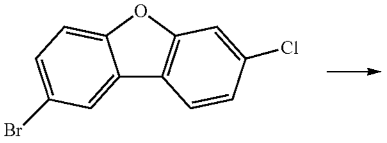

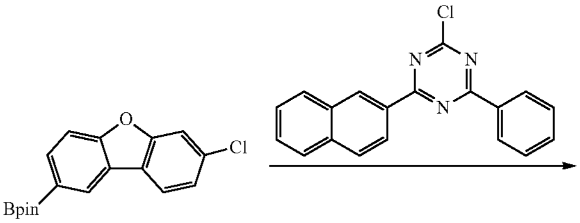

1-1

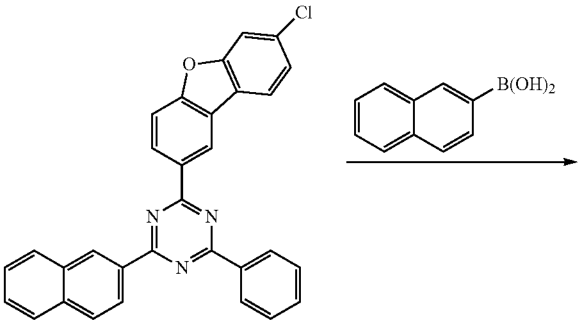

1-2

-continued

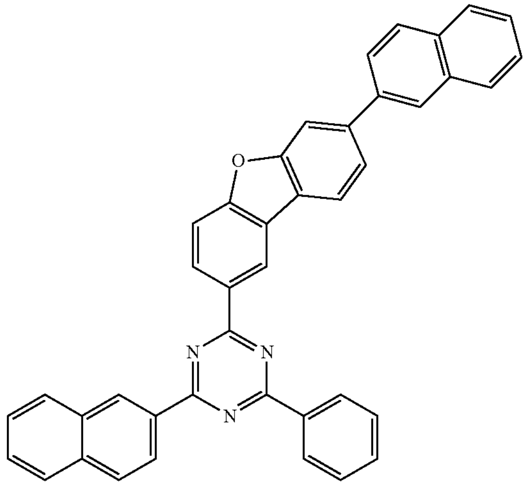

C-295

Synthesis of Compound 1-1

2-bromo-7-chlorodibenzo[b,d]furan (10 g, 35.17 mmol), (4,4,4',4',5,5,5',5'-octamethyl-2,2'-bi(1,3,2-dioxaborolane) (14 g, 53.5 mmol), $PdCl_2(PPh_3)_2$ (2.5 g, 3.57 mmol), and KOAc (8.78 g, 89.25 mmol) were dissolved in 180 mL of 1,4-dioxane in a flask, and the mixture was refluxed at 150° C. for 2 hours. After completion of the reaction, an organic layer was extracted with ethyl acetate, and the residual moisture was removed using magnesium sulfate. The residue was dried, and separated by column chromatography to obtain 9 g of compound 1-1 (yield: 76.8%).

Synthesis of Compound 1-2

Compound 1-1 (9 g, 27.4 mmol), 2-chloro-4(naphthalen-2-yl)-6-phenyl-1,3,5-triazine (9.6 g, 30 mmol), $K_2CO_3$ (9.46 g, 68.5 mmol), and $Pd(PPhs)_4$ (1.58 g, 1.37 mmol) were dissolved in 137 mL of toluene, 68.5 mL of ethanol, and 68.5 mL of water in a flask, and the mixture was refluxed at 140° C. for 12 hours. After completion of the reaction, an organic layer was extracted with ethyl acetate, and the residual moisture was removed using magnesium sulfate. The residue was dried, and separated by column chromatography to obtain 10 g of compound 1-2 (yield: 75.5%).

Synthesis of Compound C-295

Compound 1-2 (5 g, 10.3 mmol), (naphthalen-2-yl)-boronic acid (2.13 g, 12.4 mmol), $Pd_2(dba)_a$(417 mg, 0.515 mmol), S-Phos (423 mg, 1.03 mmol), and NaOtBu (2.5 g, 25.75 mmol) were dissolved in 50 mL of xylene in a flask, and the mixture was refluxed at 160° C. for 1 hour. After completion of the reaction, an organic layer was extracted with ethyl acetate, and the residual moisture was removed using magnesium sulfate. The residue was dried, and separated by column chromatography to obtain 3.8 g of compound C-295 (yield: 64.1%).

| | MW | M.P. |
|---|---|---|
| C-295 | 575.2 | 295° C. |

Example 2: Preparation of Compound C-304

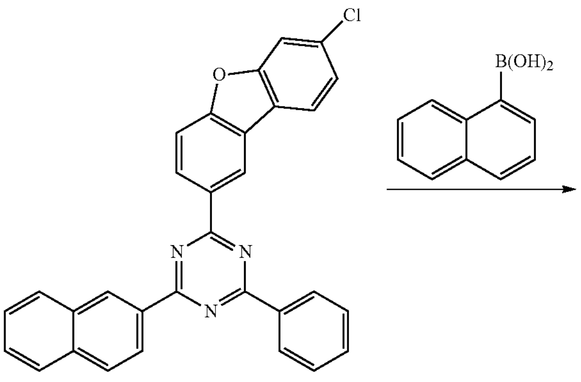

1-2

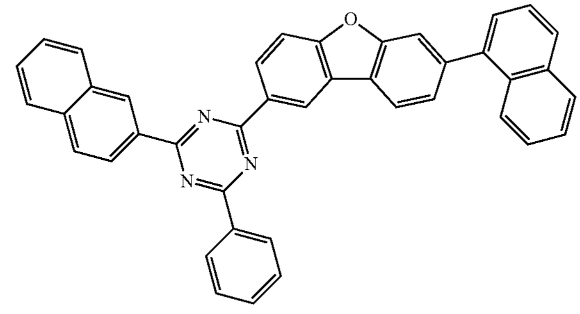

C-304

Compound 1-2 (5 g, 10.3 mmol), (naphthalen-2-yl)-boronic acid (2.13 g, 12.4 mmol), $Pd_2(dba)_3$ (417 mg, 0.515 mmol), S-Phos (423 mg, 1.03 mmol), and NaOtBu (2.5 g, 25.75 mmol) were dissolved in 50 mL of xylene in a flask, and the mixture was refluxed at 160° C. for 2 hours. After completion of the reaction, an organic layer was extracted with ethyl acetate, and the residual moisture was removed using magnesium sulfate. The residue was dried, and separated by column chromatography to obtain 1.1 g of compound C-304 (yield: 18.6%).

| | MW | M.P. |
|---|---|---|
| C-304 | 575.2 | 239.5° C. |

Example 3: Preparation of Compound C-296

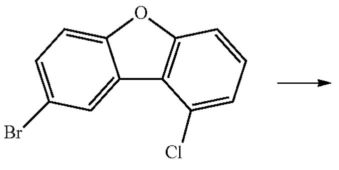

-continued

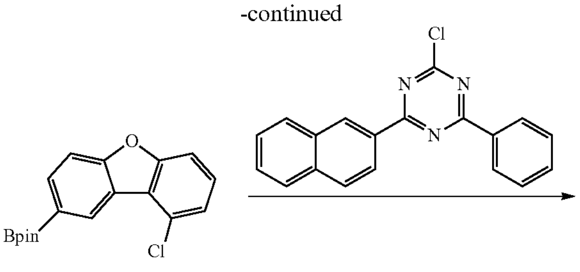

3-1

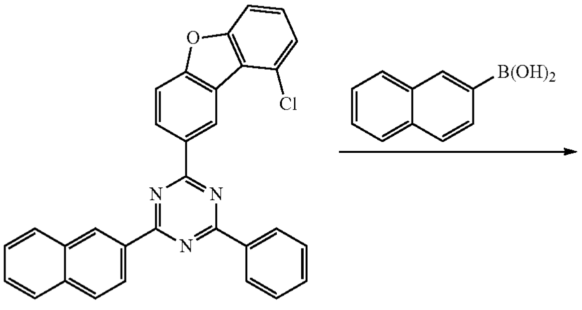

3-2

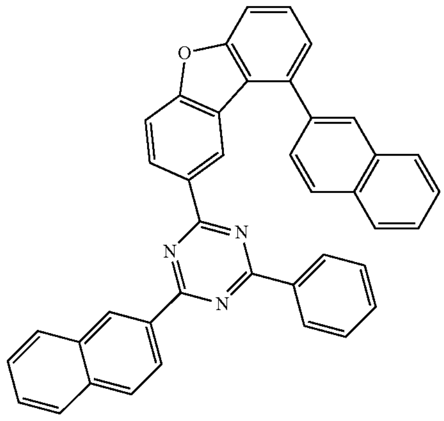

C-296

Synthesis of Compound 3-1

8-bromo-1-chlorodibenzo[b,d]furan (10 g, 35.17 mmol), (4,4,4',4',5,5,5',5-octamethyl-2,2-bi(1,3,2-dioxaborolane) (14 g, 53.5 mmol), $PdCl_2(PPh_3)_2$ (2.5 g, 3.57 mmol), and KOAc (8.78 g, 89.25 mmol) were dissolved in 180 mL of 1,4-dioxane in a flask, and the mixture was refluxed at 150° C. for 4 hours. After completion of the reaction, an organic layer was extracted with ethyl acetate, and the residual moisture was removed using magnesium sulfate. The residue was dried, and separated by column chromatography to obtain 9.2 g of compound 3-1 (yield: 78.5%).

Synthesis of Compound 3-2

Compound 3-1 (9.2 g, 28 mmol), 2-chloro-4(naphthalen-2-yl)-6-phenyl-1,3,5-triazine (10.2 g, 32.2 mmol), $K_2CO_3$ (9.67 g, 70 mmol), and $Pd(PPh_3)_4$ (1.61 g, 1.4 mmol) were dissolved in 140 mL of toluene, 70 mL of ethanol, and 70 mL of water in a flask, and the mixture was refluxed at 140° C. for 4 hours. After completion of the reaction, an organic layer was extracted with ethyl acetate, and the residual moisture was removed using magnesium sulfate. The residue was dried, and separated by column chromatography to obtain 10 g of compound 3-2 (yield: 73%).

Synthesis of Compound C-296

Compound 3-2 (5 g, 10.3 mmol), (naphthalen-2-yl)-boronic acid (2.13 g, 12.4 mmol), $Pd_2(dba)_3$ (417 mg, 0.515 mmol), S-Phos (423 mg, 1.03 mmol), and $K_3PO_4$ (5.47 g, 25.75 mmol) were dissolved in 50 mL of xylene in a flask, and the mixture was refluxed at 16° C. for 3 hours. After completion of the reaction, an organic layer was extracted with ethyl acetate, and the residual moisture was removed using magnesium sulfate. The residue was dried, and separated by column chromatography to obtain 4.5 g of compound C-296 (yield: 75.9%).

| | MW | M.P. |
|---|---|---|
| C-296 | 575.2 | 227.4° C. |

Example 4: Preparation of Compound C-325

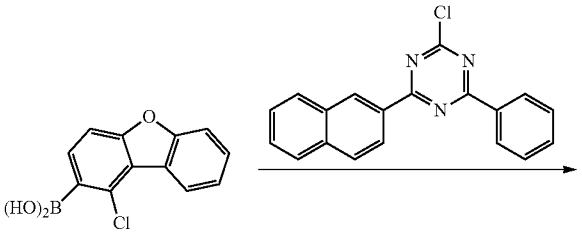

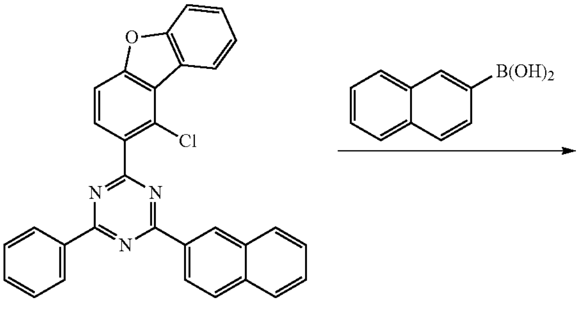

4-1

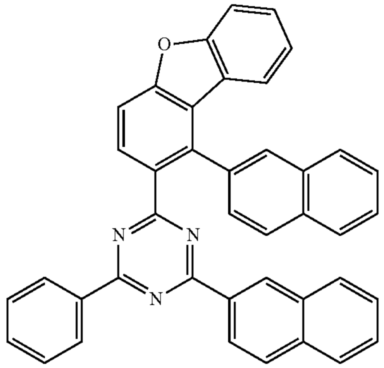

C-325

Synthesis of Compound 4-1

(1-chlorodibenzo[b,d]furan-2-yl)boronic acid (10 g, 20.6 mmol), 2-chloro-4(naphthalen-2-yl)-6-phenyl-1,3,5-triazine (14 g, 44.4 mmol), $K_2CO_3$ (14 g, 101.5 mmol), and $Pd(PPh_3)_4$ (2.4 g, 2.03 mmol) were dissolved in 200 mL of toluene, 100 mL of ethanol, and 100 mL of water in a flask, and the mixture was refluxed at 140° C. for 1 hour. After completion of the reaction, an organic layer was extracted with ethyl acetate, and the residual moisture was removed using magnesium sulfate. The residue was dried, and separated by column chromatography to obtain 10 g of compound 4-1 (yield: 87.9%).

Synthesis of Compound C-325

Compound 4-1 (7 g, 14.48 mmol), (naphthalen-2-yl)-boronic acid (3.74 g, 21.7 mmol), $Pd_2(dba)_3$ (663 mg, 0724 mmol), S-Phos (595 mg, 1.448 mmol), and $K_3PO_4$ (7.7 g, 36.2 mmol) were dissolved in 72 mL of xylene in a flask, and the mixture was refluxed at 160° C. for 1 hour. After completion of the reaction, an organic layer was extracted with ethyl acetate, and the residual moisture was removed using magnesium sulfate. The residue was dried, and separated by column chromatography to obtain 4.6 g of compound C-325 (yield: 55.2%).

| | MW | M.P. |
|---|---|---|
| C-325 | 575.2 | 265.1° C. |

Example 5: Preparation of Compound C-312

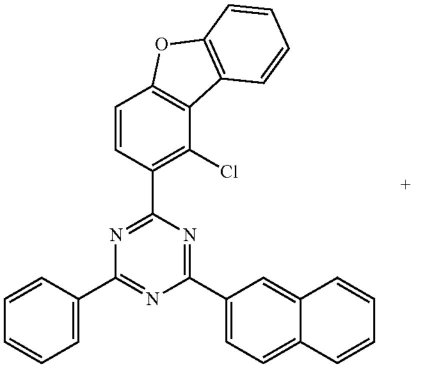

4-1

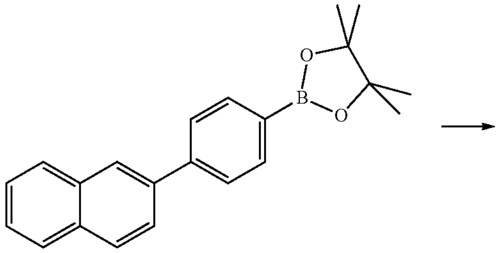

5-1

-continued

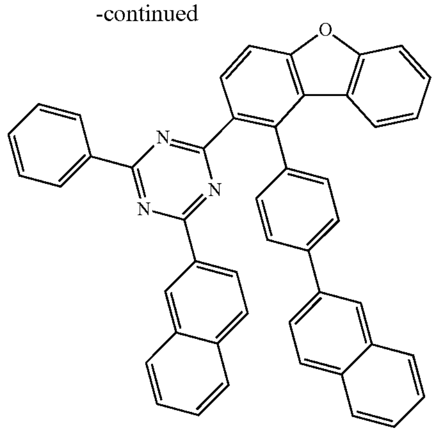

C-312

Compound 4-1 (4.2 g, 8.69 mmol), compound 5-1 (3.1 g, 9.56 mmol), $Pd(PPh_3)_4$ (502 mg, 0.434 mmol), and $K_2CO_3$ (3 g, 21.75 mmol) were dissolved in 50 mL of toluene, 25 mL of ethanol, and 25 mL of water in a flask, and the mixture was refluxed at 130° C. for 8 hours. After completion of the reaction, an organic layer was extracted with ethyl acetate, and the residual moisture was removed using magnesium sulfate. The residue was dried, and separated by column chromatography to obtain 1.8 g of compound C-312 (yield: 31.8%).

| | MW | M.P. |
|---|---|---|
| C-312 | 651.23 | 201.6° C. |

Hereinafter, a method of producing an organic electroluminescent device (OLED) comprising the organic electroluminescent compound or the plurality of host materials according to the present disclosure and the properties thereof will be explained in detail with reference to the representative compounds of the present disclosure. However, the present disclosure is not limited by the following examples.

Device Examples 1 to 6: Producing a Red OLED Deposited with the Plurality of Host Materials According to the Present Disclosure as Hosts OLEDs according to the present disclosure were produced. A transparent electrode indium tin oxide (ITO) thin film (10 O/sq) on a glass substrate for an OLED (GEOMATEC CO., LTD., Japan) was subjected to an ultrasonic washing with acetone and isopropyl alcohol, sequentially, and then was stored in isopropyl alcohol. The ITO substrate was then mounted on a substrate holder of a vacuum vapor deposition apparatus. Compound HI-1 shown in Table 3 was introduced into a cell of the vacuum vapor deposition apparatus, and compound HT-1 shown in Table 3 was introduced into another cell of the vacuum vapor deposition apparatus. The two materials were evaporated at different rates, and compound HI-1 was deposited in a doping amount of 3 wt % based on the total amount of compound HI-1 and compound HT-1 to form a hole injection layer having a thickness of 10 nm on the ITO substrate. Next, compound HT-1 was deposited on the hole injection layer to form a first hole transport layer having a thickness of 80 nm. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows: The first host compound and the second host compound shown in Table 1 below were introduced into two cells of the vacuum vapor depositing apparatus as hosts, and compound D-39 was introduced into another cell as a dopant. The two host materials were evaporated at a rate of 1:1 and the dopant material was simultaneously evaporated at a different rate, and the dopant was deposited in a doping amount of 3 wt % based on the total amount of the hosts and the dopant to form a light-emitting layer having a thickness of 40 nm on the second hole transport layer. Compound ET-1 and compound EI-1 were evaporated in a weight ratio of 50:50 to form an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced. All the materials used for producing the OLED were purified by vacuum sublimation at $10^{-8}$ torr.

Comparative Examples 1 to 5: Producing an OLED Comprising the Comparative Compound as a Host OLEDs were produced in the same manner as in Device Example 1, except that the host compound shown in Table 1 below was used alone as a single host of the light-emitting layer.

The driving voltage, luminous efficiency, and light-emitting color at a luminance of 1,000 nit, and the time taken for luminance to decrease from 100% to 95% at a luminance of 5,000 nit (lifetime; T95) of the OLEDs produced in Device Examples 1 to 6 and Comparative Examples 1 to 5 are provided in Table 3 below.

TABLE 1

| | First Host | Second Host | Driving Voltage [V] | Luminous Efficiency [cd/A] | Light-Emitting Color | Lifetime T95 [hr] |
|---|---|---|---|---|---|---|
| Device Example 1 | H-25 | C-223 | 3.2 | 33.0 | Red | 300 |
| Device Example 2 | H-25 | C-225 | 3.2 | 33.5 | Red | 452 |
| Device Example 3 | H-25 | C-279 | 3.0 | 33.9 | Red | 466 |
| Device Example 4 | H-5 | C-224 | 3.4 | 33.9 | Red | 216 |
| Device Example 5 | H-1 | C-228 | 2.9 | 34.2 | Red | 326 |
| Device Example 6 | H-1 | C-223 | 3.0 | 34.3 | Red | 514 |
| Comparative Example 1 | — | C-223 | 3.7 | 27.3 | Red | 19 |
| Comparative Example 2 | — | C-279 | 3.1 | 27.7 | Red | 35 |
| Comparative Example 3 | — | C-225 | 3.5 | 26.8 | Red | 31 |
| Comparative Example 4 | — | C-224 | 3.6 | 29.4 | Red | 31 |
| Comparative Example 5 | — | C-228 | 3.3 | 26.2 | Red | 21 |

From Table 1 above, it can be seen that the OLEDs comprising a plurality of host materials comprising a specific combination of compounds according to the present disclosure have excellent driving voltage, luminous efficiency, and/or lifetime properties. Such a result is remarkably improved effects, compared to the OLED using each of the first host and the second host alone.

Comparative Example 6: Producing an OLED Comprising the Comparative Compound as a Host An OLED was produced in the same manner as in Device Example 1, except that the host compound shown in Table 2 below was used alone as a host of the light-emitting layer.

Device Examples 7 to 9: Producing a Red OLED Deposited with the Compound According to the Present Disclosure as a Host OLEDs were produced in the same manner as in Comparative Example 6, except that the host compound shown in Table 2 below was used alone as a host of the light-emitting layer.

The driving voltage, power efficiency, and light-emitting color at a luminance of 1,000 nit of the OLEDs produced in Comparative Example 6 and Device Examples 7 to 9 are provided in Table 2 below.

TABLE 2

| | Host | Driving Voltage [V] | Power Efficiency [lm/W] | Light-Emitting Color |
|---|---|---|---|---|
| Comparative Example 6 | Compound X | 4.0 | 19.7 | Red |
| Device Example 7 | C-304 | 3.5 | 23.5 | Red |
| Device Example 8 | C-295 | 3.5 | 22.1 | Red |
| Device Example 9 | C-296 | 3.2 | 22.0 | Red |

From Table 2 above, it can be seen that the OLEDs comprising the compound according to the present disclosure have excellent driving voltage and power efficiency properties, compared to the OLED comprising the comparative compound.

The compounds used in the Device Examples and the Comparative Examples are shown in Table 3.

TABLE 3

| | |
|---|---|
| Hole Injection Layer/ Hole Transport Layer | 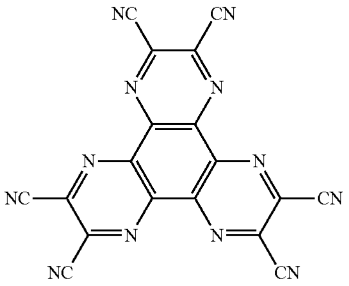 [SMILES: N#Cc1nc2c3nc(C#N)c(C#N)nc3c3nc(C#N)c(C#N)nc3c2nc1C#N] HI-1 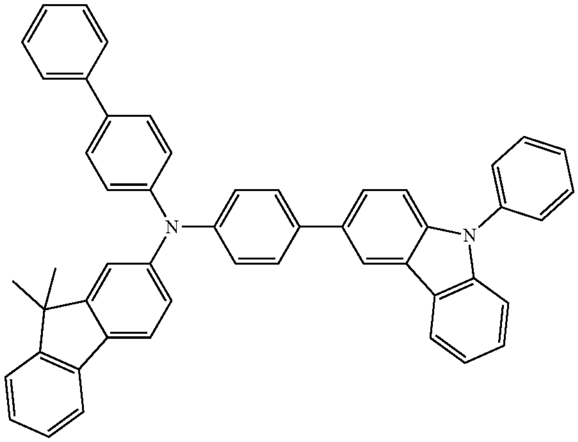 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] HT-1 |

TABLE 3-continued
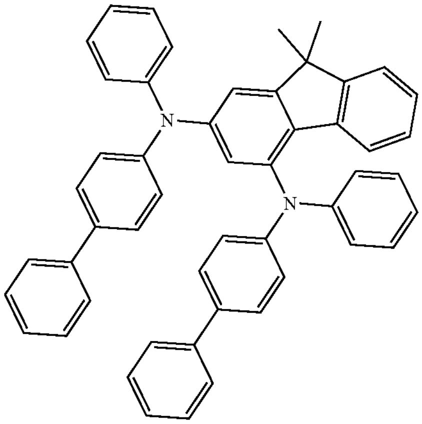 [SMILES: CC1(C)c2ccccc2-c2c(N(c3ccccc3)c3ccc(-c4ccccc4)cc3)cc(N(c3ccccc3)c3ccc(-c4ccccc4)cc3)cc21]
HT-2
Light-Emitting Layer
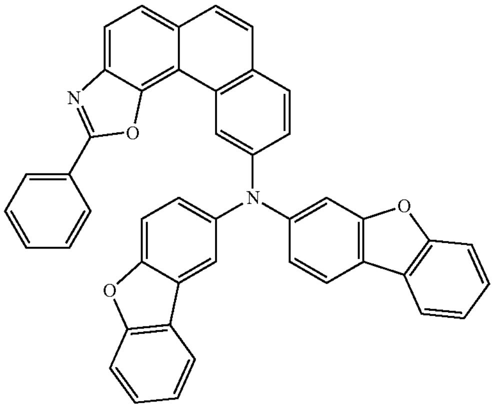 [SMILES: c1ccc(-c2nc3ccc4ccc5ccc(N(c6ccc7c(c6)oc6ccccc67)c6ccc7oc8ccccc8c7c6)cc5c4c3o2)cc1]
H-25
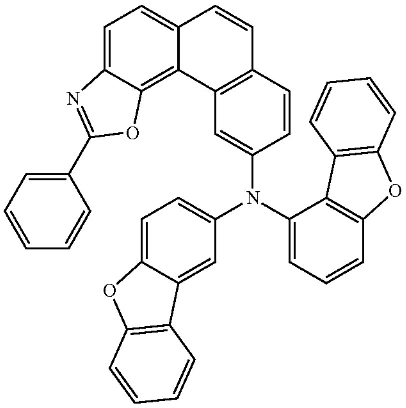 [SMILES: c1ccc(-c2nc3ccc4ccc5ccc(N(c6ccc7oc8ccccc8c7c6)c6cccc7oc8ccccc8c67)cc5c4c3o2)cc1]
H-5

TABLE 3-continued
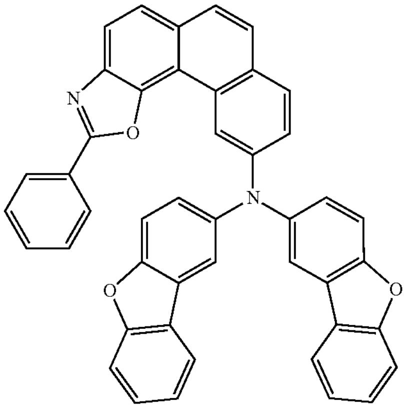 [SMILES: c1ccc(-c2nc3ccc4ccc5ccc(N(c6ccc7oc8ccccc8c7c6)c6ccc7oc8ccccc8c7c6)cc5c4c3o2)cc1]
H-1
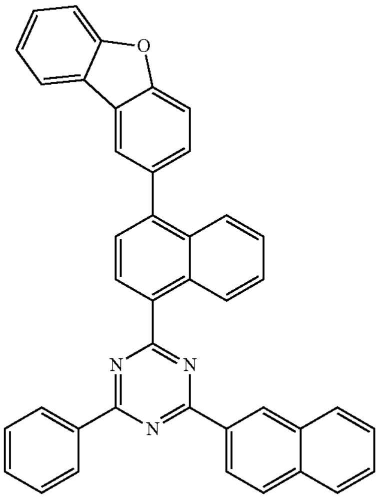 [SMILES: c1ccc(-c2nc(-c3ccc4ccccc4c3)nc(-c3ccc(-c4ccc5oc6ccccc6c5c4)c4ccccc34)n2)cc1]
C-228
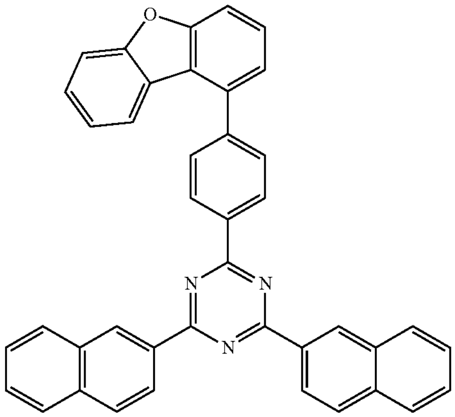 [SMILES: c1ccc2cc(-c3nc(-c4ccc(-c5cccc6oc7ccccc7c56)cc4)nc(-c4ccc5ccccc5c4)n3)ccc2c1]
C-223

TABLE 3-continued
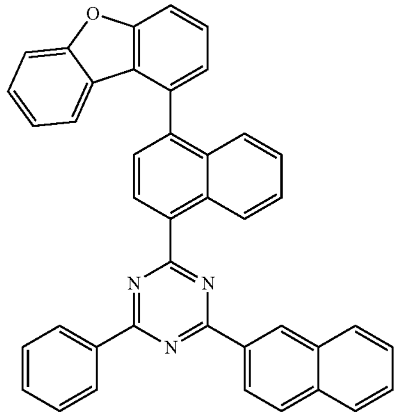 [SMILES: c1ccc(-c2nc(-c3ccc4ccccc4c3)nc(-c3ccc(-c4cccc5oc6ccccc6c45)c4ccccc34)n2)cc1]
C-224
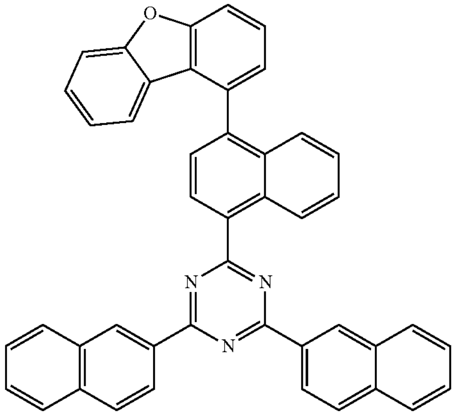 [SMILES: c1ccc2cc(-c3nc(-c4ccc5ccccc5c4)nc(-c4ccc(-c5cccc6oc7ccccc7c56)c5ccccc45)n3)ccc2c1]
C-225
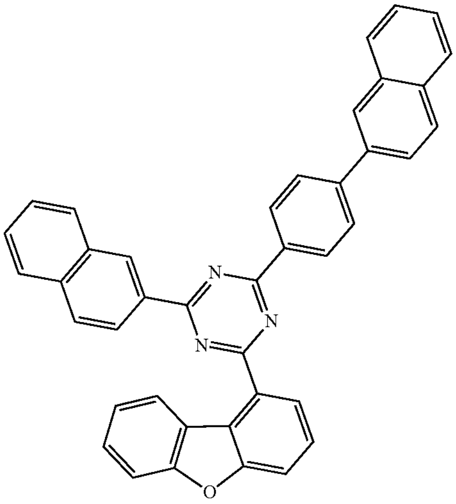 [SMILES: c1ccc2cc(-c3ccc(-c4nc(-c5ccc6ccccc6c5)nc(-c5cccc6oc7ccccc7c56)n4)cc3)ccc2c1]
C-279

TABLE 3-continued
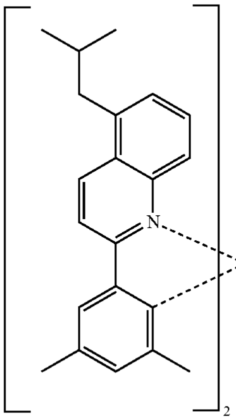
D-39
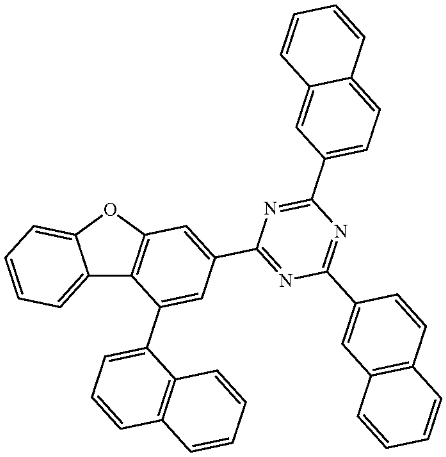 [SMILES: c1ccc2cc(-c3nc(-c4ccc5ccccc5c4)nc(-c4cc(-c5cccc6ccccc56)c5c(c4)oc4ccccc45)n3)ccc2c1]
Compound X
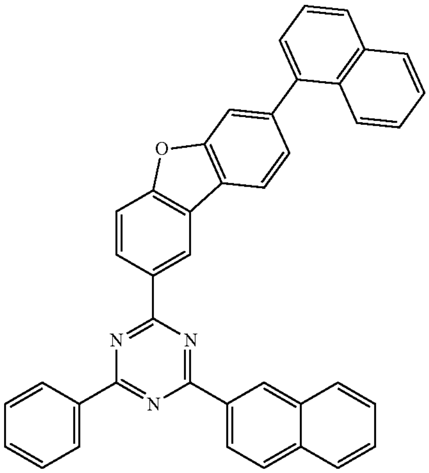 [SMILES: c1ccc(-c2nc(-c3ccc4ccccc4c3)nc(-c3ccc4oc5cc(-c6cccc7ccccc67)ccc5c4c3)n2)cc1]
C-304

TABLE 3-continued
| | |
|---|---|
| | 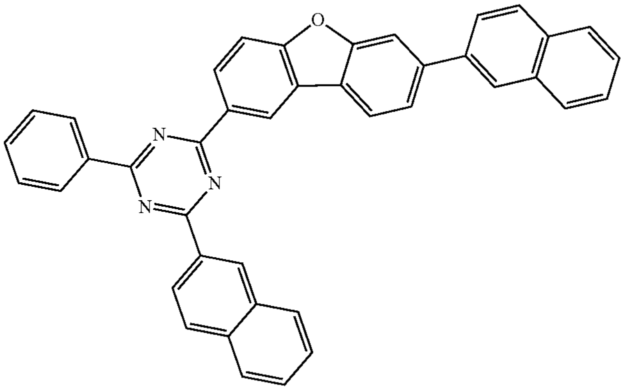 [SMILES: c1ccc(-c2nc(-c3ccc4ccccc4c3)nc(-c3ccc4oc5cc(-c6ccc7ccccc7c6)ccc5c4c3)n2)cc1] C-295 |
| | 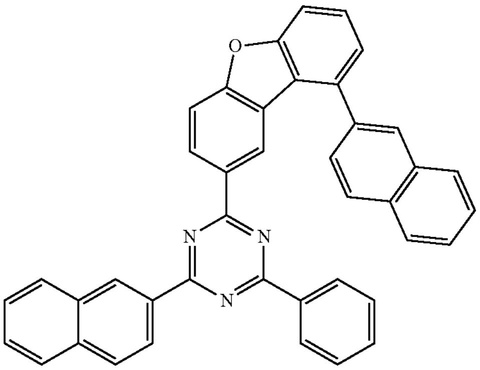 [SMILES: c1ccc(-c2nc(-c3ccc4ccccc4c3)nc(-c3ccc4oc5cccc(-c6ccc7ccccc7c6)c5c4c3)n2)cc1] C-296 |
| Electron Transport Layer/ Electron Injection Layer | 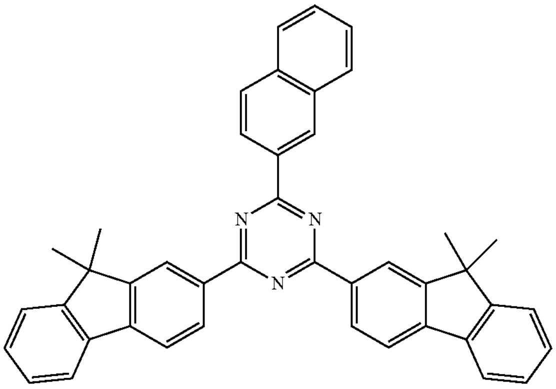 [SMILES: CC1(C)c2ccccc2-c2ccc(-c3nc(-c4ccc5c(c4)C(C)(C)c4ccccc4-5)nc(-c4ccc5ccccc5c4)n3)cc21] ET-1 |
| | 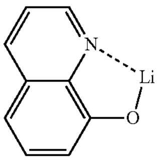 EI-1 |

The invention claimed is:

1. A plurality of host materials comprising a first host material comprising a compound represented by the following formula 1-2, and a second host material comprising a compound represented by the following formula 2:

(1-2)

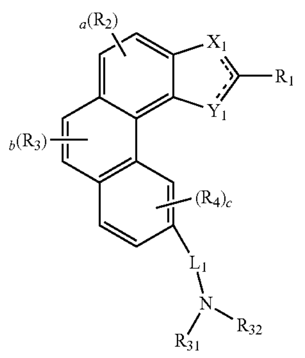

in formula 1, $X_1$ represents —N=;

$Y_1$ represents —O— or —S—;

$L_1$ represents a single bond, or a substituted or unsubstituted (C6-C30)arylene;

$R_{31}$ and $R_{32}$, each independently, represent a substituted or unsubstituted dibenzofuranyl, a substituted or unsubstituted dibenzothiophenyl, a substituted or unsubstituted benzofuropyridyl, a substituted or unsubstituted benzonaphthofuranyl, or a substituted or unsubstituted benzonaphthothiophenyl;

$R_1$ represents a substituted or unsubstituted (C6-C30)aryl, or a substituted or unsubstituted (3- to 30-membered) heteroaryl;

$R_2$ to $R_4$, each independently, represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring group of a (C3-C30) aliphatic ring(s) and a (C6-C30) aromatic ring(s), or $-L_3-N(Ar_1)(Ar_2)$; or may be linked to an adjacent substituent to form a ring(s);

$L_3$, each independently, represents a single bond, a substituted or unsubstituted (C6-C30)arylene, or a substituted or unsubstituted (3- to 30-membered)heteroarylene;

$Ar_1$ and $Ar_2$, each independently, represent hydrogen, a substituted or unsubstituted (C1-C30)alkyl, a substituted or unsubstituted (C2-C30)alkenyl, a substituted or unsubstituted fused ring group of a (C3-C30) aliphatic ring(s) and a (C6-C30) aromatic ring(s), a substituted or unsubstituted (C6-C30)aryl, or a substituted or unsubstituted (3- to 30-membered)heteroaryl; and a and b, each independently, represent an integer of 1 or 2, and c represents an integer of 1 to 3, where if a to c are an integer of 2 or more, each of $R_2$, each of $R_3$, and each of $R_4$ may be the same or different;

$$Har—((L_2)_e—Ar_2)_d \quad (2)$$

in formula 2,

HAr represents a substituted with deuterium or unsubstituted (3- to 20-membered)heteroaryl containing a nitrogen atom(s);

$L_2$, each independently, represents a substituted with deuterium or unsubstituted phenylene;

$Ar_2$, each independently, represents a phenyl unsubstituted or substituted with deuterium, a naphthyl unsubstituted or substituted with deuterium, a phenylnaphthyl unsubstituted or substituted with deuterium or a naphthylphenyl unsubstituted or substituted with deuterium;

wherein one of $Ar_2$ represents a phenylnaphthyl unsubstituted or substituted with deuterium or a naphthylphenyl unsubstituted or substituted with deuterium;

d represents an integer of 2 to 3, where each of $((L_2)_e-Ar_2)$ may be the same or different;

e represents an integer of 0 to 1; and

* represents a site linked to $L_2$.

2. The plurality of host materials according to claim 1, wherein the substituents of the substituted alkyl, the substituted alkenyl, the substituted aryl, the substituted arylene, the substituted heteroaryl, the substituted heteroarylene, the substituted heteroaryl containing a nitrogen atom(s), the substituted cycloalkyl, the substituted alkoxy, the substituted trialkylsilyl, the substituted dialkylarylsilyl, the substituted alkyldiarylsilyl, the substituted triarylsilyl, and the substituted fused ring group of an aliphatic ring(s) and an aromatic ring(s), each independently, are at least one selected from the group consisting of deuterium; a halogen; a cyano; a carboxyl; a nitro; a hydroxyl; a phosphineoxide; a (C1-C30) alkyl; a halo(C1-C30)alkyl; a (C2-C30)alkenyl; a (C2-C30) alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of a (C1-C30) alkyl(s) and a (3- to 30-membered)heteroaryl(s); a tri(C1-C30)alkylsilyl; a tri(C6-C30)arylsilyl; a di(C1-C30)alkyl (C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono- or di-(C1-C30)alkylamino; a mono- or di-(C2-C30)alkenylamino; a (C1-C30)alkyl(C2-C30)alkenylamino; a mono- or di-(C6-C30)arylamino; a (C1-C30)alkyl(C6-C30)arylamino; a mono- or di-(3- to 30-membered)heteroarylamino; a (C1-C30)alkyl(3- to 30-membered)heteroarylamino; a (C2-C30) alkenyl(C6-C30)arylamino; a (C2-C30)alkenyl(3- to 30-membered)heteroarylamino; a (C6-C30)aryl(3- to 30-membered)heteroarylamino; a (C1-C30)alkylcarbonyl; a (C1-C30)alkoxycarbonyl; a (C6-C30)arylcarbonyl; a (C6-C30)arylphosphine; a di(C6-C30)arylboronyl; a di(C1-C30) alkylboronyl; a (C1-C30)alkyl(C6-C30)arylboronyl; a (C6-C30)aryl(C1-C30)alkyl; and a (C1-C30)alkyl(C6-C30)aryl.

3. The plurality of host materials according to claim 1, wherein the formula 2 is represented by at least one of the following formulas 2-1 to 2-3:

(2-1)

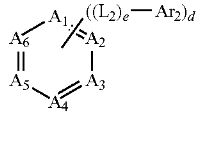

-continued (2-2)

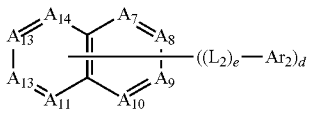

(2-3)

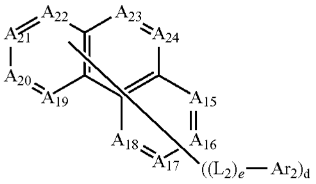

wherein $A_1$ to $A_{24}$, each independently, represent $CR_{10}$ or N, in which at least one of $A_1$ to $A_6$ represents N, at least one of $A_7$ to $A_{14}$ represents N, and at least one of $A_{15}$ to $A_{24}$ represents N;

$R_{10}$, each independently, represents hydrogen or $-L_2-Ar_2$, where if a plurality of $R_{10}$'s are present, each of $R_{10}$ may be the same or different; and $L_2$, $Ar_2$, d, and e are as defined in claim 1.

4. The plurality of host materials according to claim 1, wherein the compound represented by formula 1-2 is at least one selected from the following compounds:

H-1

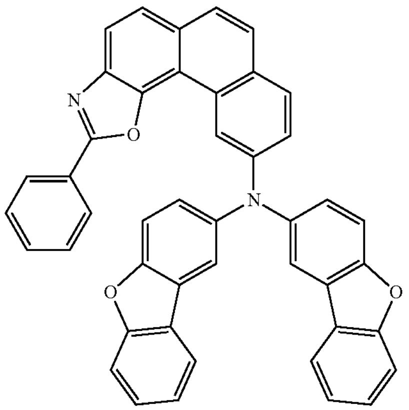

H-2

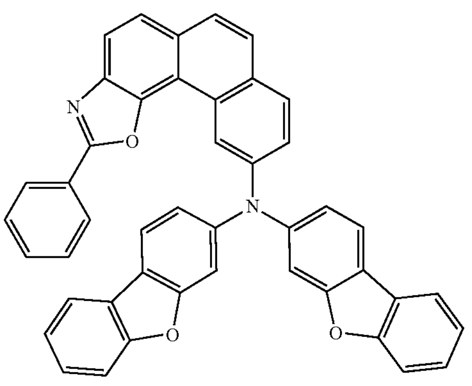

-continued

H-3

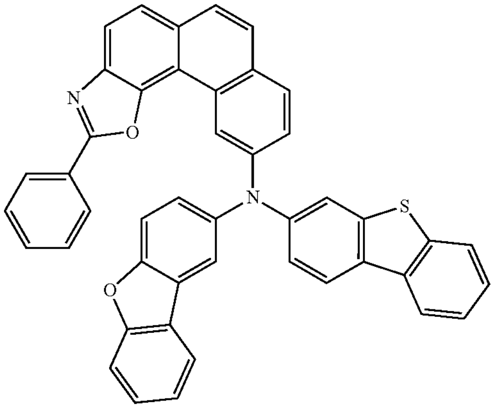

H-4

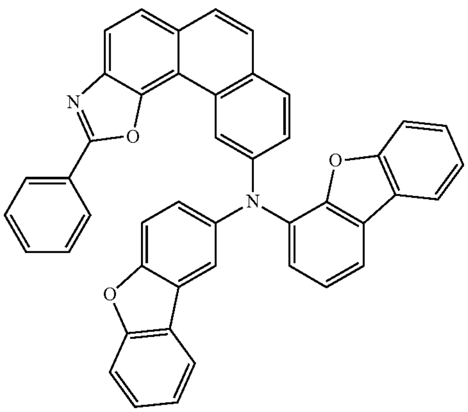

H-5

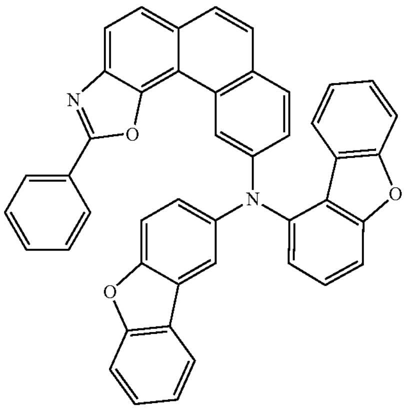

H-6

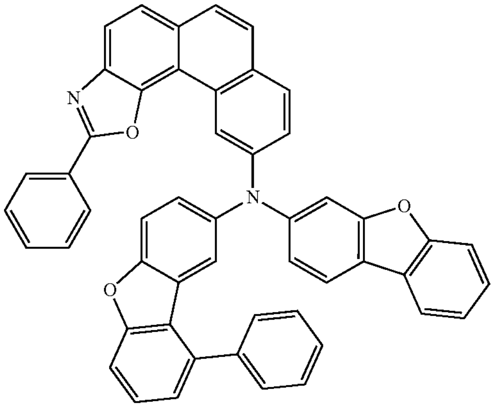

-continued
H-7
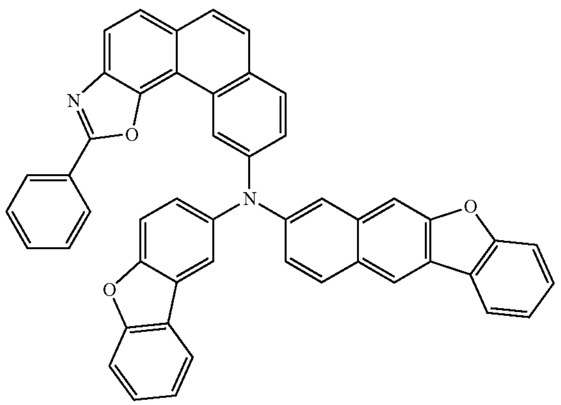
H-8
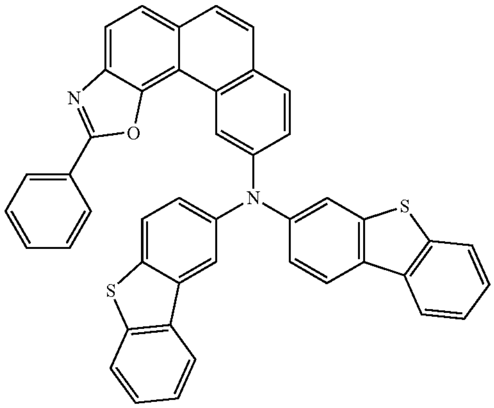
H-9
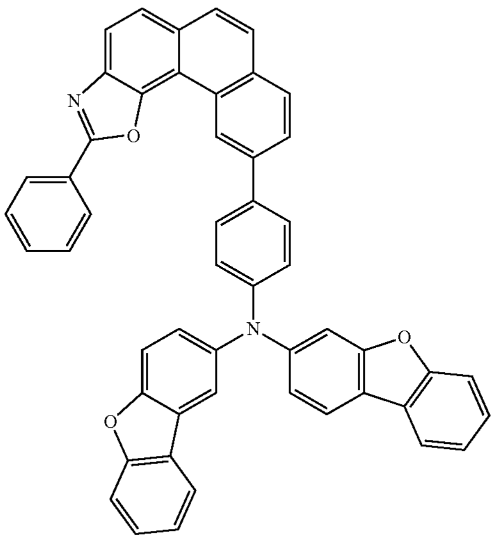
-continued
H-10
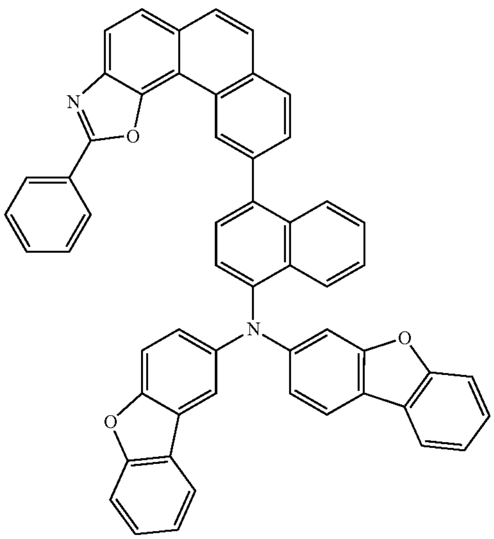
H-11
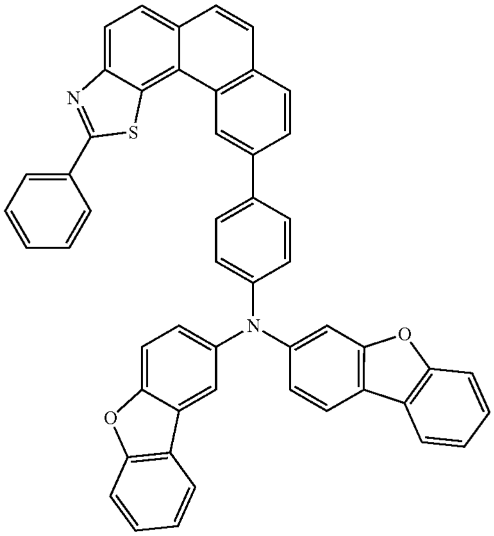
H-12
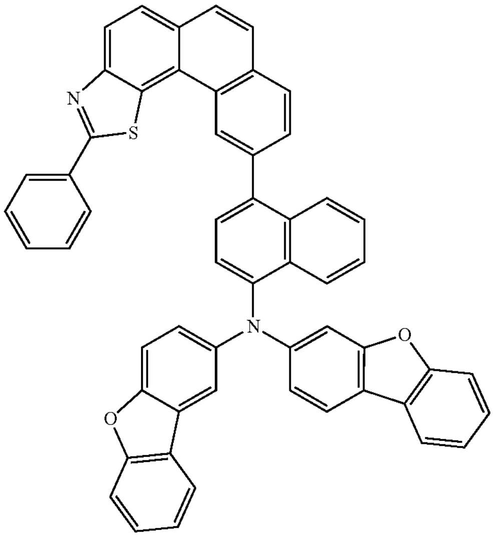

-continued
H-13
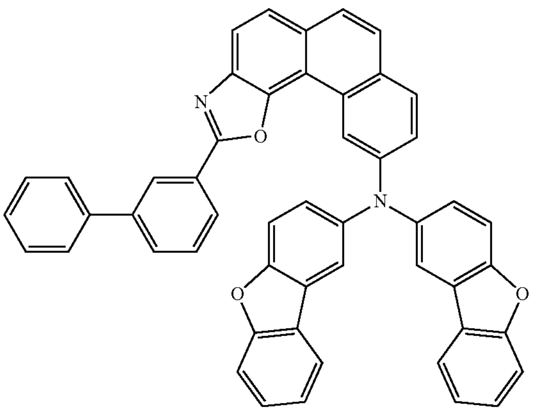
H-14
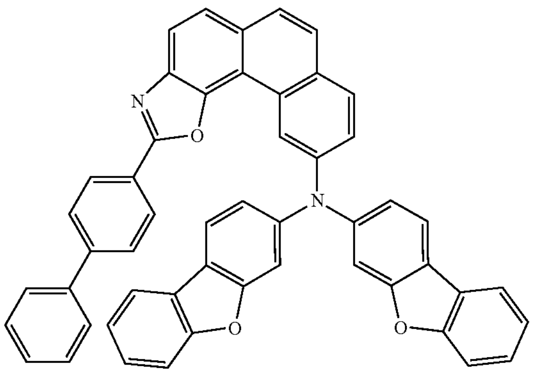
H-15
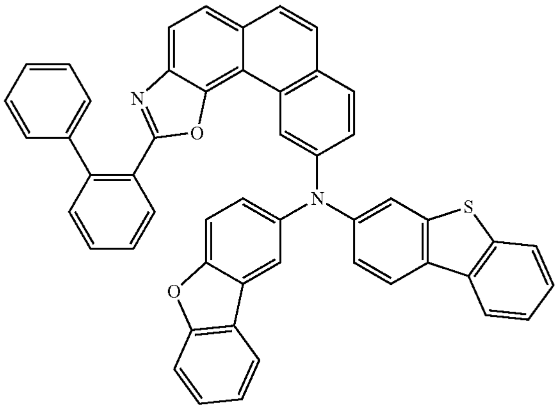
-continued
H-16
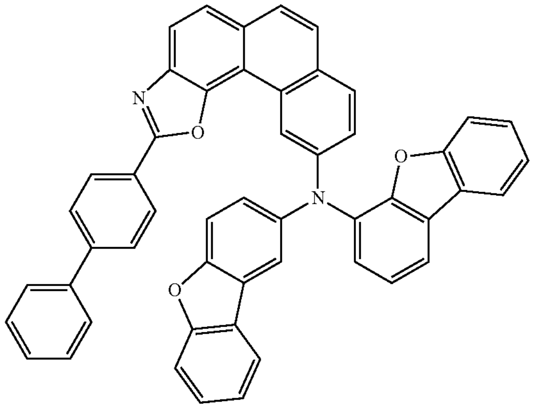
H-17
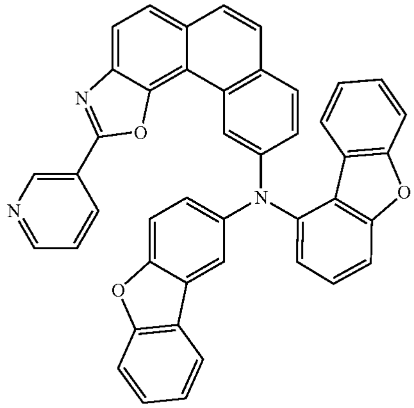
H-18
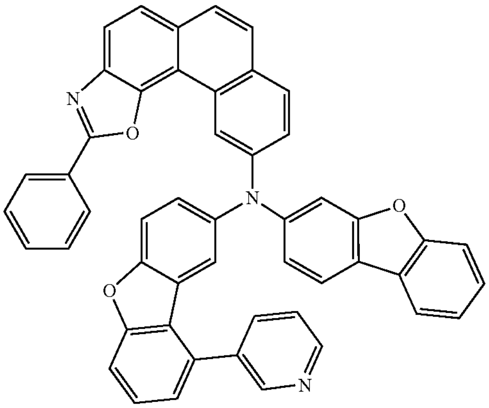

-continued
H-19
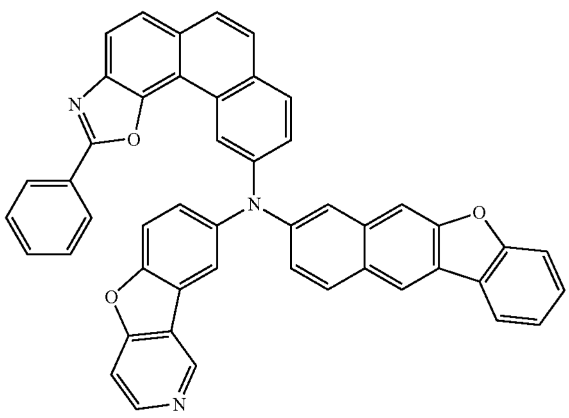
H-20
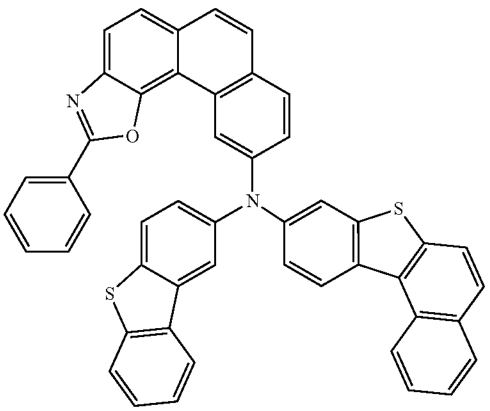
H-25
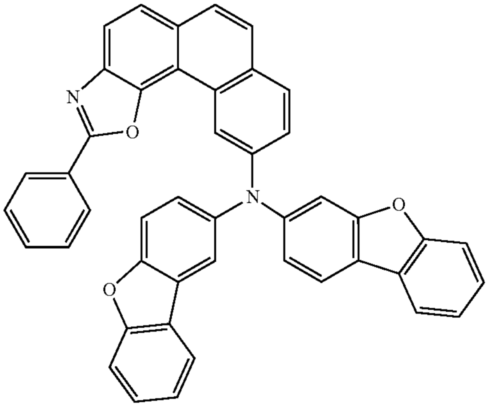
-continued
H-26
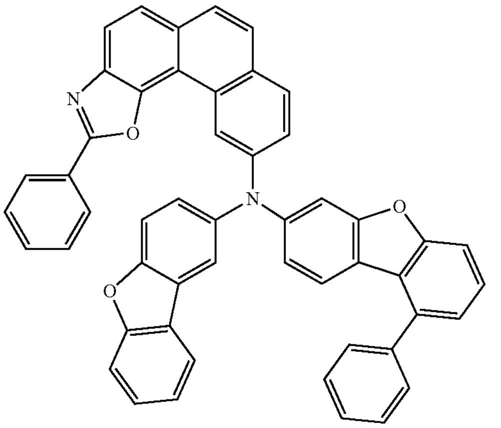
and
H-27
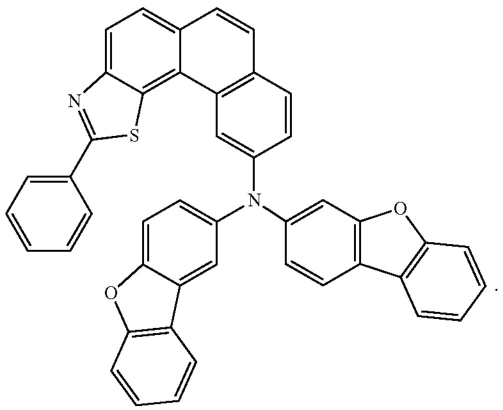
.
5. The plurality of host materials according to claim 1, wherein the compound represented by formula 2 is at least one selected from the following compounds:
C-2
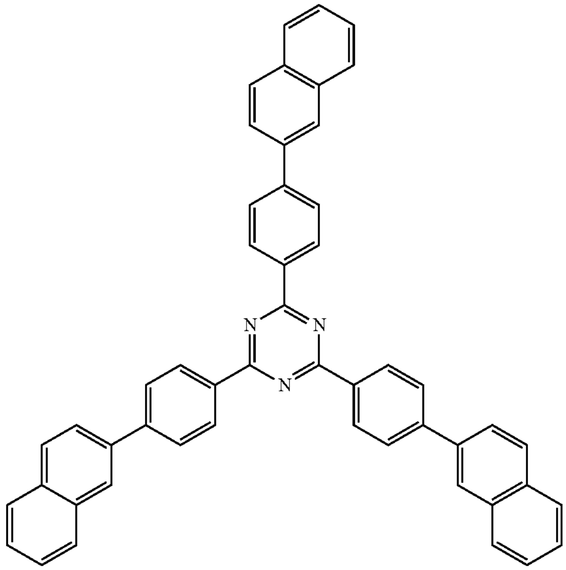

-continued
C-3
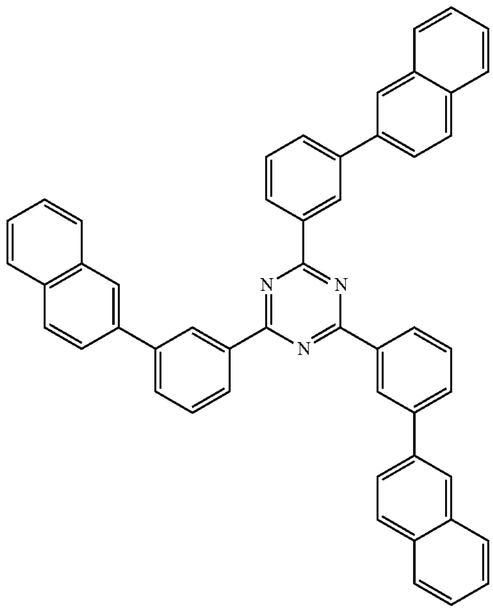
C-4
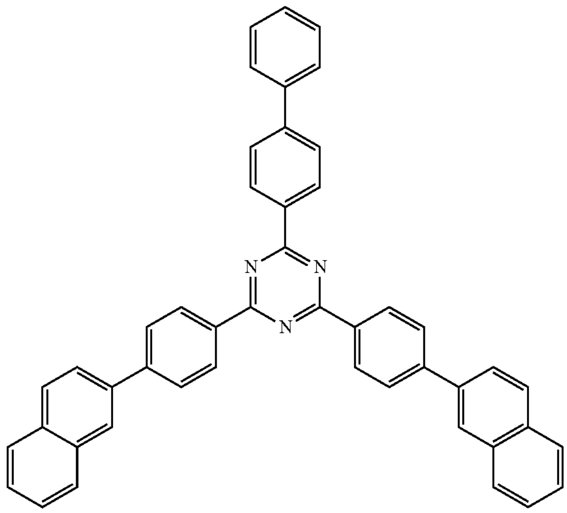
-continued
C-6
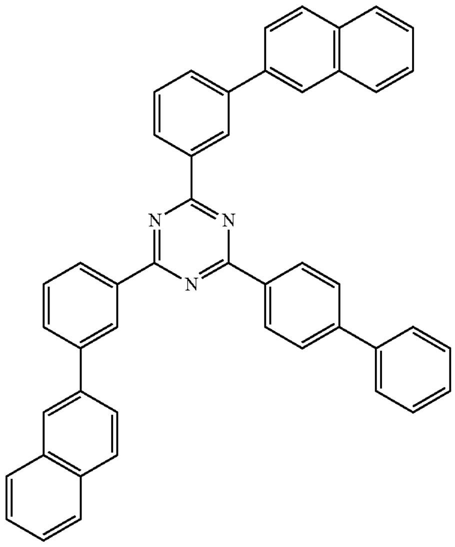
C-7
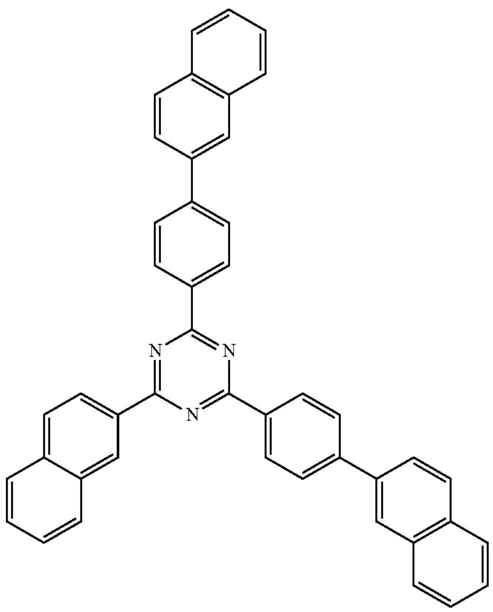

-continued
C-8
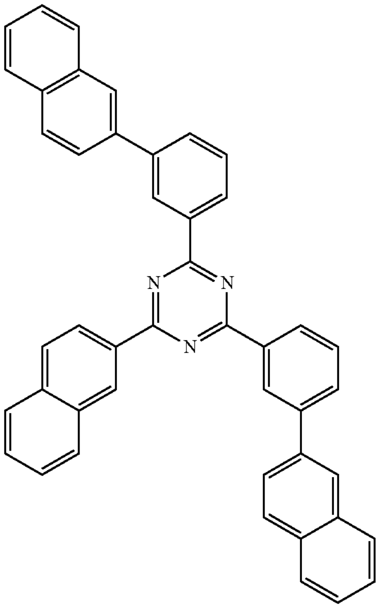
C-12
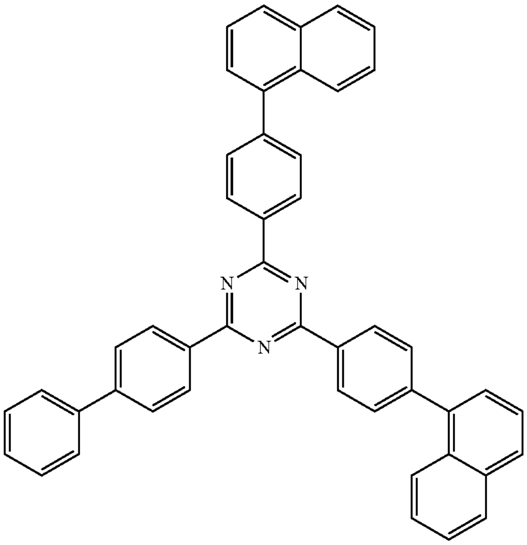
C-14
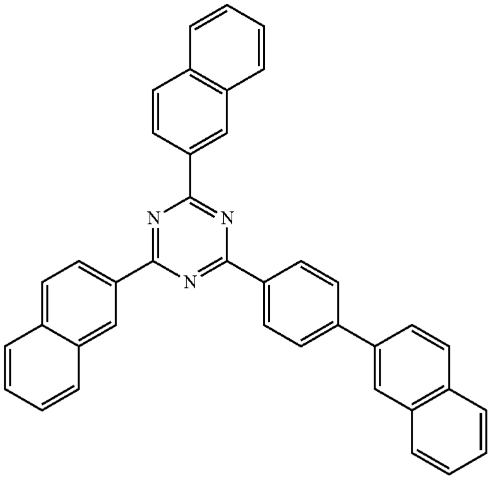
-continued
C-15
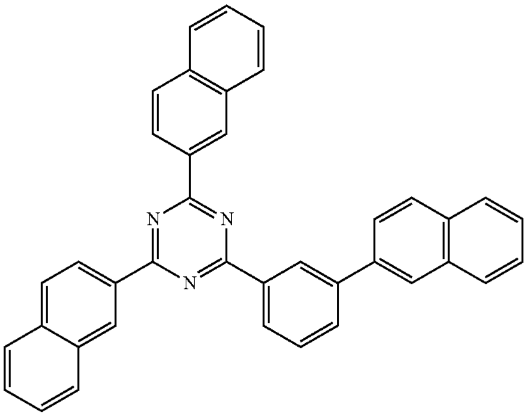
C-34
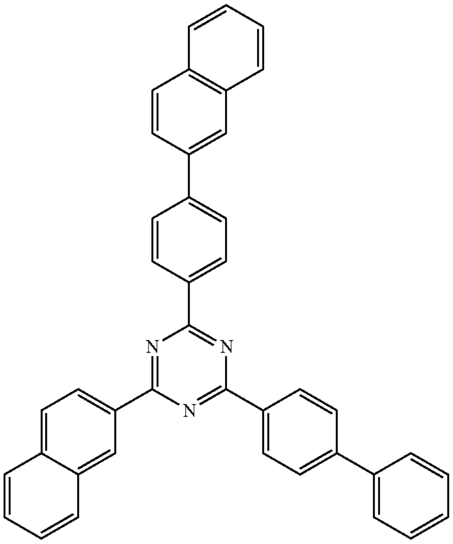
C-35
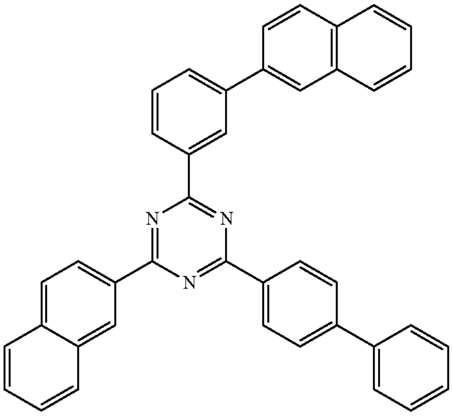

-continued
C-38
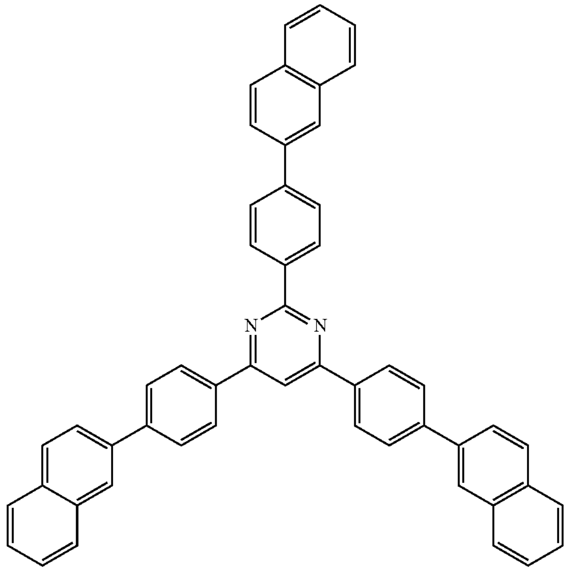
C-39
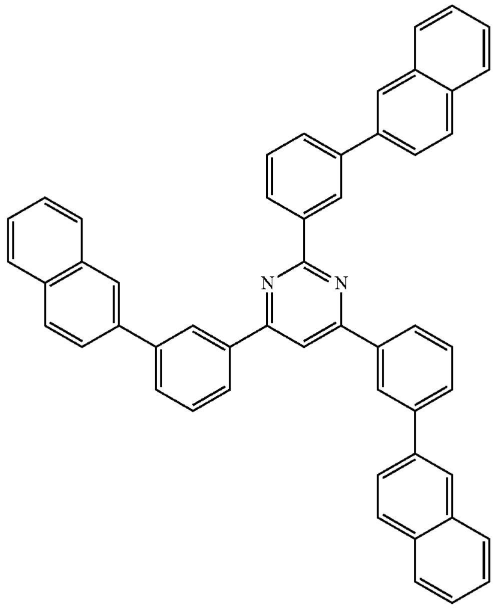
-continued
C-40
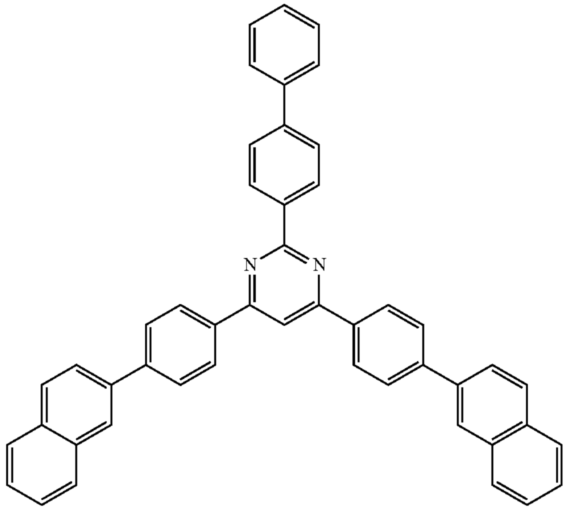
C-42
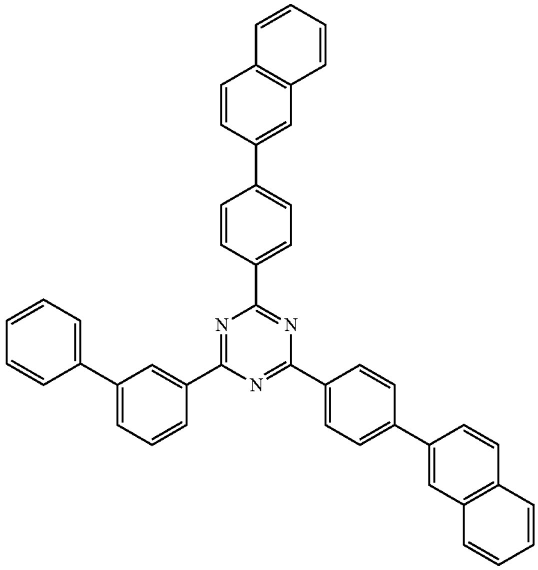
C-44
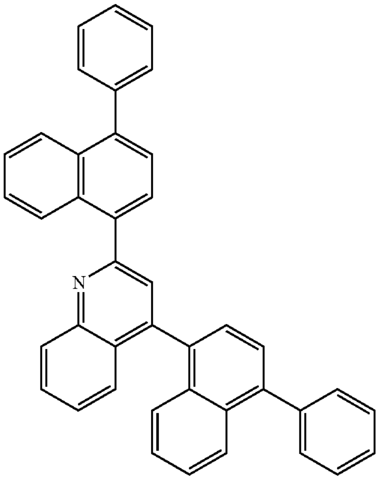

-continued
C-50
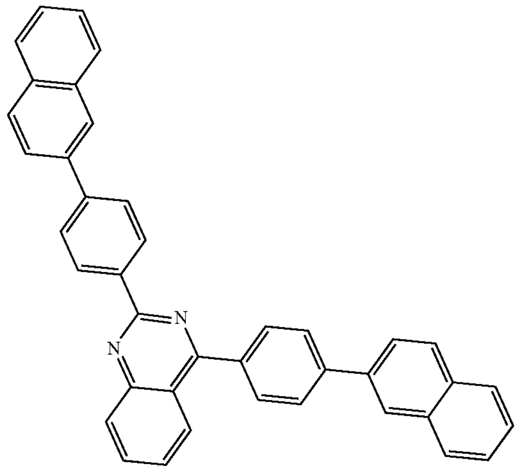
C-79
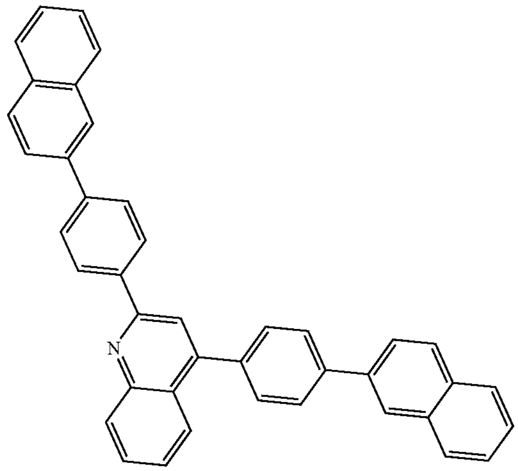
C-87
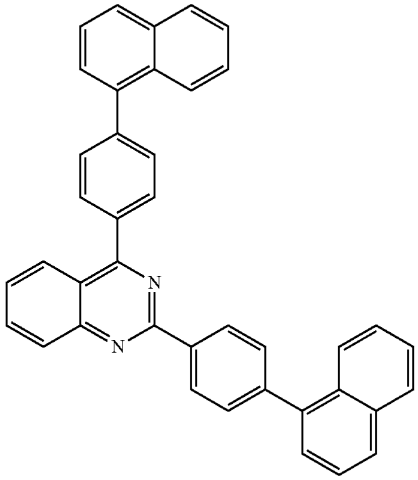
-continued
C-88
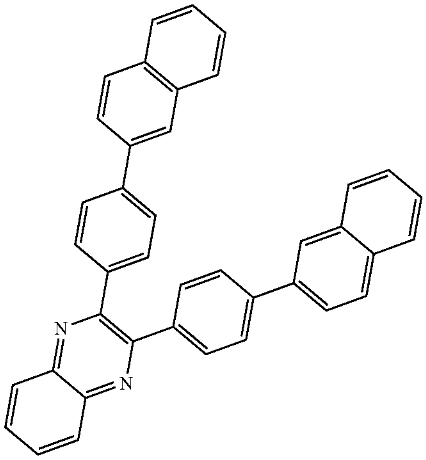
C-91
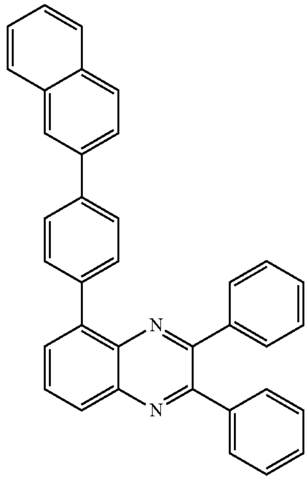
C-93
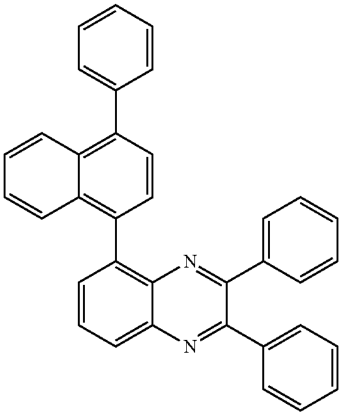

-continued
C-96
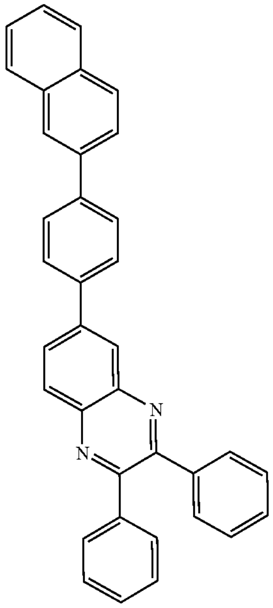
C-98
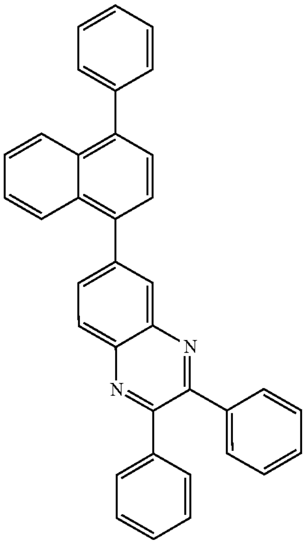
-continued
C-101
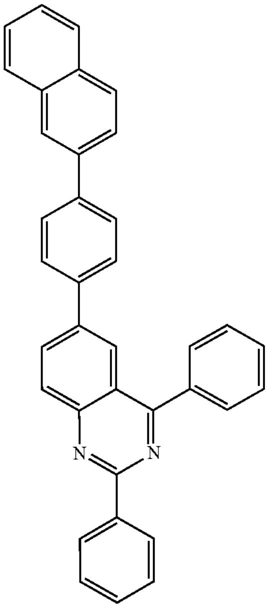
and
C-103
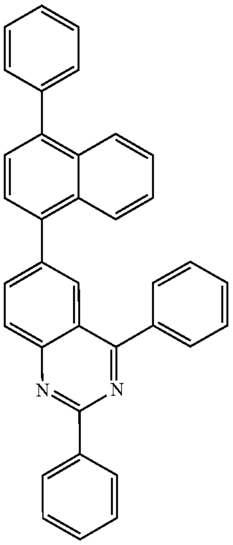
.
6. An organic electroluminescent device comprising an anode, a cathode, and at least one light-emitting layer between the anode and the cathode, wherein at least one of the light-emitting layers comprises the plurality of host materials according to claim 1.
* * * * *